(12) United States Patent
Sheppard

(10) Patent No.: US 8,964,451 B2
(45) Date of Patent: Feb. 24, 2015

(54) MEMORY CELL SYSTEM AND METHOD

(76) Inventor: Douglas P. Sheppard, Trophy Club, TX (US)

( * ) Notice: Subject to any disclaimer, the term of this patent is extended or adjusted under 35 U.S.C. 154(b) by 489 days.

(21) Appl. No.: 13/416,923

(22) Filed: Mar. 9, 2012

(65) Prior Publication Data

US 2012/0230130 A1 Sep. 13, 2012

Related U.S. Application Data

(60) Provisional application No. 61/451,031, filed on Mar. 9, 2011, provisional application No. 61/452,845, filed on Mar. 15, 2011, provisional application No. 61/476,098, filed on Apr. 15, 2011, provisional application No. 61/483,544, filed on May 6, 2011.

(51) Int. Cl.

| G11C 11/00 | (2006.01) |
|---|---|
| G11C 11/412 | (2006.01) |
| G11C 8/14 | (2006.01) |
| G11C 11/418 | (2006.01) |
| G11C 7/10 | (2006.01) |
| G11C 7/06 | (2006.01) |
| G11C 7/00 | (2006.01) |
| G11C 7/08 | (2006.01) |

(52) U.S. Cl.
CPC ............... *G11C 11/412* (2013.01); *G11C 7/10* (2013.01); *G11C 7/06* (2013.01); *G11C 7/00* (2013.01); *G11C 7/08* (2013.01); *G11C 8/14* (2013.01); *G11C 11/418* (2013.01)
USPC ............... 365/154; 365/156; 365/189.011

(58) Field of Classification Search
CPC ............... G11C 7/00; G11C 7/06; G11C 7/08; G11C 7/10
USPC ................... 365/154, 156, 189.011
See application file for complete search history.

(56) References Cited

U.S. PATENT DOCUMENTS

| 4,189,785 | A | 2/1980 | Rapp | |
|---|---|---|---|---|
| 5,375,086 | A | 12/1994 | Wahlstrom | |
| 5,831,896 | A | 11/1998 | Lattimore et al. | |
| 6,940,746 | B2 | 9/2005 | Kushida | |
| 7,046,544 | B1* | 5/2006 | Shimanek | 365/154 |
| 7,787,286 | B2* | 8/2010 | Thomas | 365/154 |
| 2003/0147271 | A1 | 8/2003 | Jo | |
| 2004/0114422 | A1 | 6/2004 | Yabe | |

* cited by examiner

*Primary Examiner* — Toan Le
(74) *Attorney, Agent, or Firm* — David W. Carstens; Kevin M. Klughart; Carstens & Cahoon, LLP

(57) ABSTRACT

A memory cell system/method incorporating reduced transistor counts and/or improved design-for-manufacturability (DFM) is disclosed. The system/method incorporates cross-coupled feedthru (3410)/feedback (3420) amplifiers to implement memory cell state memory, wherein the feedback amplifier incorporates a multi-state output drive capability (3423) allowing the memory cell to be read/written using only one access device (3430) connected to the output (3412) of the feedthru (3410) amplifier. The multi-state output drive capability (3423) modulates the feedback amplifier (3420) drive strength to enable reading/writing of the feedthru amplifier (3410) state with greatly reduced memory cell input fan-in requirements. The invention anticipates replacement of traditional DP/8T/6T/4T memory cell structures with corresponding 6T/6T/5T/3T memory cell configurations, resulting in a 16%-25% transistor reduction depending on memory array application context.

26 Claims, 96 Drawing Sheets

Prior Art

5T MEMORY CELL GROUP
(FIG. 49,50)

Group of 5T write & read memory cells
in the row direction having:

- A common WVDDS (write VDD switch)
- A common Word Line (WL)
- A separate Bit Line (BL) for each column

1900

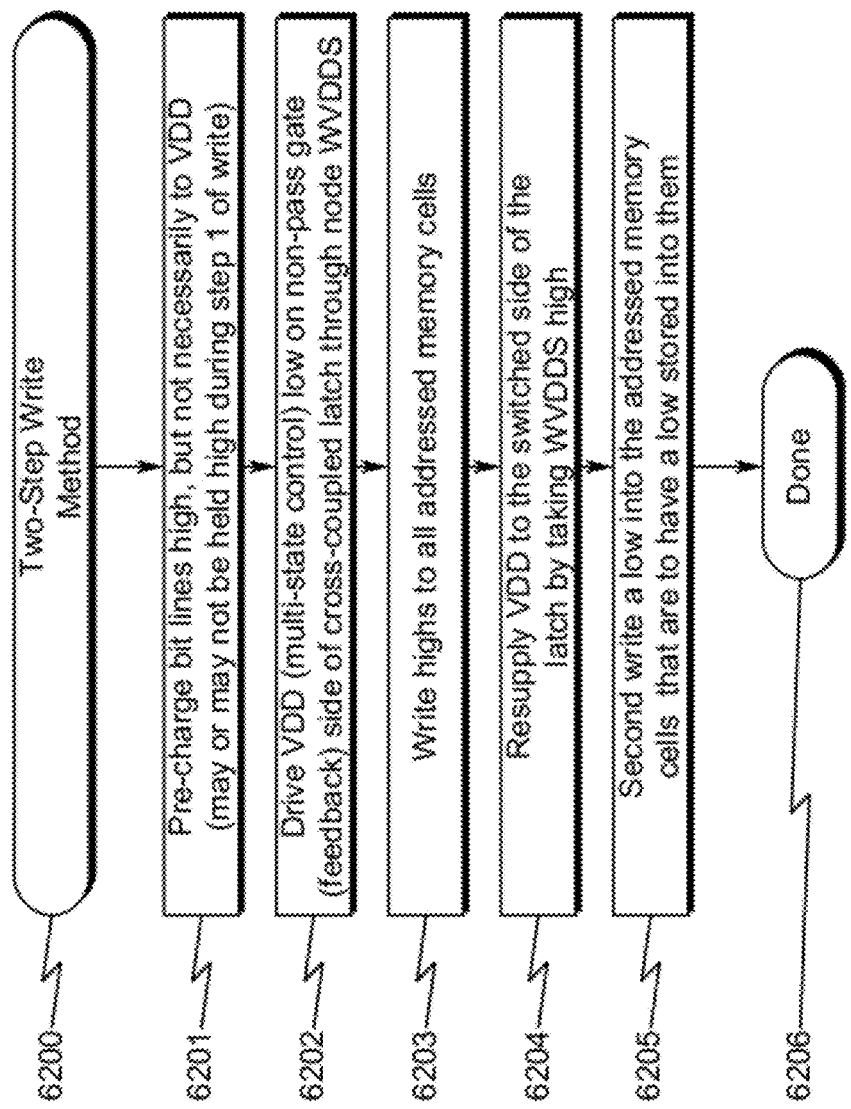

FIG. 62

6200 — Two-Step Write Method
6201 — Pre-charge bit lines high, but not necessarily to VDD (may or may not be held high during step 1 of write)
6202 — Drive VDD (multi-state control) low on non-pass gate (feedback) side of cross-coupled latch through node WVDDS
6203 — Write highs to all addressed memory cells
6204 — Resupply VDD to the switched side of the latch by taking WVDDS high
6205 — Second write a low into the addressed memory cells that are to have a low stored into them
6206 — Done

MEMORY CELL SYSTEM AND METHOD

CROSS REFERENCE TO RELATED APPLICATIONS

Applicant claims benefit pursuant to 35 U.S.C. §119 and hereby incorporates by reference Provisional patent application for "IMPROVED MEMORY CELL", Ser. No. 61/451, 031, filed electronically with the USPTO on Mar. 9, 2011.

Applicant claims benefit pursuant to 35 U.S.C. §119 and hereby incorporates by reference Provisional patent application for "MEMORY CELL", Ser. No. 61/452,845, filed electronically with the USPTO on Mar. 15, 2011.

Applicant claims benefit pursuant to 35 U.S.C. §119 and hereby incorporates by reference Provisional patent application for "5T SINGLE PORT SRAM UTILIZING EASY-WRITE WITH IMPROVED NOISE MARGIN", Ser. No. 61/476,098, filed electronically with the USPTO on Apr. 15, 2011.

Applicant claims benefit pursuant to 35 U.S.C. §119 and hereby incorporates by reference Provisional patent application for "METHOD FOR WRITING AND READING A MEMORY WITH ENHANCED DFM", Ser. No. 61/483, 544, filed electronically with the USPTO on May 6, 2011.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to memory cell systems and methods. While not limitive of the invention teachings, the present invention may in some circumstances be advantageously applied to areas including but not limited to U.S. Patent Classifications 365/149; 365/154; 365/156; 365/203; 365/189.05; 365/189.04; 326/49; 327/199; 327/51; 365/230.06; 307/290.

PRIOR ART AND BACKGROUND OF THE INVENTION

Memory Array Architecture Overview (0100)

The current architecture used to configure large memory arrays is generally illustrated in FIG. 1 (0100), wherein the memory array (0101) is addressed by a multi-bit row address (0102) and column address (0103) decoders. These circuits are used in conjunction with read/write circuits (0104) and sense amplifiers (0105) to read/write the contents of a memory cell (0110) contained within the memory array (0101). Within this context the individual memory cells (0110) are accessed via bit lines (true (0111) and complement (0112)) as well as a word line (0113). Activation of the true/complement bit lines (0111, 0112) in conjunction with the appropriate word select line (0113) individually addresses the memory cell (0110) within a particular row and permits read/write access to the particular memory cell (0110).

Static 6T Memory Cell Architecture Overview (0200)

Within the memory array architecture of FIG. 1 (0100), the individual memory cells (0110) have traditionally taken the form of a pair of cross-coupled CMOS inverters (0221, 0222) as generally depicted in FIG. 2 (0200) in the implementation of fully static memory (SRAM) arrays. These cross-coupled inverters (0221, 0222) are accessed for read/write by a bit lines (true (0211) and complement (0212)) as well as a word line (0213). The bit lines (0211, 0212) access the cross-coupled inverter memory cell (0221, 0222) via respective pass gates (0231, 0232) that operate in conjunction with the bit lines (0211, 0212) and word line (0213).

This architecture is commonly referred to as a "6T cell" architecture as it requires six active transistors for its implementation.

Non-Static 4T Memory Cell Architecture Overview (0300)

Within the memory array architecture of FIG. 1 (0100), the individual memory cells (0110) may also take the form of a pair of cross-coupled NMOS inverters (0321, 0322) as generally depicted in FIG. 3 (0300) in the implementation, of non-static memory arrays. These cross-coupled inverters (0321, 0322) are accessed for read/write by a bit lines (true (0311) and complement (0312)) as well as a word line (0313). The bit lines (0311, 0312) access the cross-coupled inverter memory cell (0321, 0322) via respective pass gates (0331, 0332) that operate in conjunction with the bit lines (0311, 0312) and word line (0313).

The major difference in this architecture as compared with that of FIG. 2 (0200) is that high value resistors (0323, 0324) operate as loads to their respective N-channel transistors within the inverters (0321, 0322). These high value resistors may be implemented with polysilicon, depletion transistors, modified ion implantation profiles, or other fabrication methodologies common to the semiconductor industry. While this memory cell is not fully static and does consume power in the idle state, it can achieve manufacturing area advantage over some fully static designs as depicted in FIG. 2 (0200).

This architecture is commonly referred to as a "4T cell" architecture as it requires four active transistors for its implementation.

Generalized Memory Cell Architecture Overview (0400)

The combination of memory array architecture in FIG. 1 (0100) and memory cell architecture in FIG. 2 (0200) and FIG. 3 (0300) can be more fully generalized as depicted in FIG. 4 (0400) to characterize the prior art. Here it can be seen that the feedthru (0221, 0321) and feedback (0222, 0322) inverters have been abstracted as generalized inverters (0421, 0422) with appropriate power supply connections depicted.

Note that in some abstractions the power supply (VDD/VCC) and reference ground (VSS/GND) connections may be omitted and assumed as included by the context of the schematic.

This memory cell abstraction can be applied to a variety of other static/non-static memory cell configurations that implement other functions such as dual-port (DP) memories, FIFOs, and the like.

Memory Cell Abstraction (0500)

The generalized memory cell architecture of FIG. 4 (0400) may be further abstracted as indicated in FIG. 5 (0500) wherein the pass gates (0231, 0232, 0331, 0332, 0431, 0432) are replaced by generalized switches (0531, 0532).

Switch Abstraction (0600)

The replacement of pass gates (0231, 0232, 0331, 0332, 0431, 0432) by switches (0531, 0532) as abstracted in FIG. 5 (0500) may also take the form of traditional transmission gates (0610, 0620) with associated control inputs (0611, 0621) as generally illustrated in FIG. 6 (0600). Within this context the switching functionality is more robust than that allowed by traditional single transistor pass gates (0231, 0232, 0331, 0332, 0431, 0432) at the expense of a four-fold increase in the overall transistor count. While this approach is not generally practical for large memory arrays, it can have application in some state memory logic functions as detailed below.

Ancillary Memory Cell Applications

While memory arrays and their associated cells have been traditionally associated with architectures depicted in FIG. 1 (0100) and FIG. 2 (0200), other forms have been used in some circumstances.
Transparent Latch (0700)
FIG. 7 (0700) illustrated a traditional transparent digital latch configuration in which the cross-coupled inverters are switched using transmission gates in response to a latching clock signal (CLK). This topology provides for state memory context to be achieved, albeit at a greatly increased transistor count.
D-Flip-Flop (0800)
As generally illustrated in FIG. 8 (0800), the transparent latch of FIG. 7 (0700) may be augmented to implement a traditional D-flip-flop having state memory dictated by input clock (CLK) transitions to the device. These two types of state memories are just examples of many variations on a theme that are taught by the prior art.

Background Context Suitable for Invention Application

While the present invention may have significant advantages in the application to static and non-static memory array designs, the previously discussed background context has been presented solely to indicate that the present invention as described herein may be applied to a wide variety of contexts in which "state memory" is required within the overall design. Thus, while the present invention has wide application in the design large memory arrays, as indicated above it is not strictly limited, to this particular application.

Memory Array Design Context (0900)

The memory array as depicted in FIG. 1 (0100) typically consists of columns of Bit Lines (0111, 0112) and rows of Word Lines (0113). A row of the array is accessed by taking one of the Word Lines (0113) high while all others are low. Taking the Word Line (0113) high turns on the pass gates of every memory cell (0110) on that row which in turn will pass the internal state of the memory cell latch to the Bit Lines (0111, 0112). The state of the true side is passed to its own bit true (BT) Bit Line (0111), and the compliment side is passed to its own bit compliment (BC) side (0112). All Bit Lines (0111, 0112) are initially pre-charged high, and all Word Lines (0113) are initially low.

This structure is illustrated in more detail by the system block diagram of FIG. 9 (0900) wherein the memory cell (0910) has been generalized to comprise a Bit Line (T) (BT), Bit Line (C) (BC), and a Word Line (WL).

Overview of Prior Art Memory Array Design Challenges

The traditional 6T (six transistor) SRAM memory cell generally illustrated in FIG. 2 (0200) has always had to deal with conflicting requirements of being easy to write to an opposite state and yet not be susceptible to flipping during a read. This is called READ DISTURB which occurs when accessing the sensitive internal latch of the memory cell causes it to lose its stored data. This tradeoff of write-ability vs. read is one of the reasons that the traditional 6T memory cell requires two (2) pass gates (PG) (0231, 0232) as illustrated in FIG. 2 (0200). A conflicting design requirement is often fabrication area, as a major requirement of the memory cell is for it to be as small as possible. Generally speaking, the fewer transistors required by the memory cell the smaller the overall physical size of the memory cell.

The design and production of the SRAM has always required that the noise margin of the memory cell (also referred to as the "bit cell") be designed around. Reading the memory cell caused the sensitive internal nodes of the latch (0223, 0224) to be coupled to the highly capacitive Bit Lines (0211, 0212) through the pass gates (PG) (0231, 0232) thus exposing the cell to the possibility of being disturbed. Thus, any time the memory cell is accessed (pass gate (0231, 0232) turned on) it is in danger. Throughout the history of the SRAM, designers have tried to design around this problem which gets increasingly worse as the process technology continues to shrink and the transistor variation relative to each other increases. In fact, it has become severe enough that some current memory cell designs actually have to use more than six transistors per memory cell.

What is commonly called READ DISTURB actually occurs during a write as well as during a read—any time that the memory cell is accessed. Conventional memory archtectures access every memory cell along a given Word Line (0213), with each Word Line potentially having many (128, 256, 512, 1024, ...) attached memory cells.

The READ DISTURB issue is further exasperated due the requirement that during a write the cell must be able to flip from an opposite state to the desired state to be written. By assuring that the cell can be written, the design is often in conflict with a requirement that the design to be intolerant to READ DISTURB. One design requirement is typically traded off against the other when using the traditional approach.

Read Disturb

The possibility of the cell being flipped by exposing its low side to the pre-charged high Bit Line when the shared Word Line along a given row is taken high is called READ DIS- TURB. The 6 transistors in the memory cell should be as small as possible to reduce the area of the overall memory since it can have millions of memory cells. Very small transistors within the memory cell means that they have very weak drive which can be overcome by the highly capacitive Bit Lines and pull the internal state of the cell in the opposite direction causing it to lose the state that is stored in it.

Memory Cell Read Disturb (1000)

The architecture of a memory cell undergoing READ DISTURB is generally illustrated in FIG. 10 (1000).

Internal Memory Cell Voltages (1100)

The internal memory cell voltages for a memory cell undergoing READ DISTURB are generally illustrated in FIG. 11 (1100), wherein activation of the Word Line (1101) results in a low side kickup voltage spike (1102) at the memory cell. Note that this voltage spike (1102) occurs for ALL memory cells in the row addressed by the Word Line.

The only way to increase the memory cell margin to READ DISTURB is to adjust the drive strength between the pass gate (PG) (1131) and the pull down (PD) (1126) such that the low side of the cell can't be pulled up so high that it causes the cell to flip. As the drive strength of the pull down (1126) is increased relative to the pass gate (1131) the ability to keep a low on the low side of the memory cell increases thereby increasing the noise margin of the memory cell. The relationship of the pull down (1126) drive strength vs. the pass gate (1131) drive strength is called the BETA RATIO ($\beta_R$) and is defined as follows:

$$\beta_R = \frac{I_{PD}}{I_{PG}} = \frac{\left(\frac{W_{PD}}{L_{PD}}\right)}{\left(\frac{W_{PG}}{L_{PG}}\right)}$$

Where W and L are the effective transistor gate width and length respectively for the pull-down (PD) and pass-gate (PG) devices.

Read Disturb BETA RATIO Sensitivity (1200)

The READ DISTURB behavior as a function of BETA RATIO can be best illustrated by the waveforms depicted in FIG. 12 (1200), wherein a larger BETA RATIO (1210) configuration is compared to a smaller BETA RATIO (1220) configuration. In both situations the Word Line (1230) is ramped from low-to-high and the depicted waveforms indicate a larger BETA RATIO configuration (1210) maintains the memory cell bit state (1212) while the smaller BETA RATIO configuration (1220) trips the memory cell bit state (1222). This memory cell sensitivity to BETA RATIO often results in larger memory cell array size to accommodate additional transistor sizing required by this design requirement for stable memory cell state in response to READ DISTURB behavior.

Writing the Memory Cell (1300)

The traditional 6T memory cell is written to the opposite state by pulling the high side of the latch low—it cannot be written by pulling the low side high because of it needing to be protected against READ DISTURB. It is limited by how high it can eventually pull, which is the supply voltage (VDD) minus a N-channel threshold voltage (VTN) or (VDD−VTN). Also, the BETA RATIO is increased to assure that no READ DISTURB occurs, and the low side of the latch cannot be pulled high enough to cause the cell to flip when a write to the opposite state is required. Therefore, a write of the memory cell to the opposite state can only occur by pulling the high side of the latch low. It is this requirement that requires that both the true and compliment sides of the latch be accessed by a bit true (BT) Bit Line and a bit compliment (BC) Bit Line, respectively.

An efficient array design will usually have many columns on a given row that will far exceed the number of Bits Per word (BPW) that is on the output of the memory array. As an example a memory array may have a configuration that requires 1 BPW, but 512 columns may be configured on each row. Thus, when a write cycle is initiated the 1 bit to be written will be forced onto the decoded column to write just that single memory cell location, but 512 memory cells are accessed on the addressed row (pass gates turned on) at one time. This means that on the selected Word Line 511 memory cells are being read while the 1 decoded column for which the write is occurring. Thus, the 511 memory cells that are not being written are exposed to READ DISTURB even though a write is occurring.

This behavior can be best illustrated by viewing the signal waveforms of FIG. 13 (1300), wherein the Word Line (write) activation pulse (1310) is illustrated along with the corresponding Bit Line 0 output (1320) and the loading effect on the remaining unaddressed 511 Bit Lines (1330). As can be seen by this illustration, the read loading effect on the unwritten 511 bit lines (1330) is significant and accounts for the real possibility of READ DISTURB among the other memory cells within the memory array.

The dynamic switching associated with this behavior can also result in significant dynamic power consumption, since every column has a voltage, swing on either the BT or BC Bit Line. Adding this dynamic power consumption with the usually rail-to-rail voltage swing on the Bit Lines being written can result in the write cycle consuming more power than the read cycle in the memory array. None that the number of Bit Lines being written is dependent on the number of Bits Per Word (BPW). Thus, if there are many bits per word such as 16, 32 or 64 BPW this would equate to a significant amount of dynamic power consumption within the memory array. This dynamic power consumption represents a significant barrier to low power consumption in modern 8/16/32/64-bit processors that incorporate embedded memory as well as conventional large capacity externally addressed memory systems.

Prior Art VDD/VSS Memory Cells

Several attempts have been disclosed by the prior art that attempt to reduce the overall memory cell area by eliminating one of the Pass Gates that are used to access the memory cell. Two of these approaches will now be discussed.

U.S. Pat. No. 5,831,896 (1400),

As generally illustrated in FIG. 14 (1400), this U.S. patent discloses a cross-coupled inverter pair that has VSS switched on the feedback inverter in conjunction with separate WORD LINE READ (1412, 1422) and WORD LINE WRITE (1413, 1423) control signals. This memory architecture enables the entire word row during a write and/or read operation and while the VSS switching (1415, 1425) permits easier writing of the memory cell, it also subjects the entire row to READ DISTURB during the process of a read operation.

Sharing virtual ground during a write can create a condition where it could be difficult to write a high into one of the memory cells within the same group. This condition can occur based on what is being written and what was previously stored in the memory cells as generally illustrated in FIG. 14 (1400).

The lack of Bit True (BT) and Bit Complement (BC) Bit Lines in this design can also result in poorer noise immunity than traditional 6T memory cell designs, as the sensed Bit Line voltage in this design is referenced to digital VSS ground, which can contain significant noise. This is in contrast to traditional 6T designs in which the BT/BC signal lines may be differentially sensed irrespective of VDD/VSS noise.

U.S. Pat. No. 6,940,746—VDD Switching (1500)

As generally illustrated in FIG. 15 (1500), this patent discloses VDD switching in FIG. 15 (1500) of the feedback inverter within the memory cell (1501, 1502). The approach taken by this patent disclosure is to reduce the feedback inverter strength by reducing its VDD strength and thus permitting the pass gate to be driven, by the Bit Line (1511) to write the memory cell (1501, 1502). This is typically accomplished by switching the VDD line to an alternate voltage during write cycles.

U.S. Pat. No. 6,940,746—VSS Switching (1600)

This patent discloses VSS switching in FIG. 16 (1600) of the feedback inverter within the memory cell (1601, 1602). The approach taken by this patent disclosure is to reduce the feedback inverter strength by reducing its VSS strength and thus permitting the pass gate to be driven by the Bit Line (1611) to write the memory cell (1601, 1602). This is typically accomplished by switching the VSS lines to an alternate voltage during write cycles.

U.S. Pat. No. 6,940,746—READ DISTURB

These VDD/VSS switching architecture still suffer from READ DISTURB issues in that during read cycles the Bit Line drags down all, the memory cells in a given selected Word Line with the potential of flipping the memory cells to an indeterminate state. This drawback requires that this architecture undergo similar BETA RATIO tradeoffs as discussed previously.

Conflicts Between Read and Write

As can be seen from the above discussion, in is important for a memory cell, to be stable during a read and writeable during a write cycle, but this presents conflicting constraint on the memory cell. These opposing requirements have always presented the designer and manufacturer with having to make tradeoffs with the hope that there would be enough noise margin that will make it possible to produce a yieldable memory that is reliable over the variation in the manufacturing process as well as the variation in conditions such as temperature and voltage. In fact it has become more difficult to continue to reduce the voltage of the memory cell (VDD) as much as can be done with logic circuits, because this also makes in difficult for the memory cell to stay stable.

This problem has gotten substantially worse as the transistors continue to shrink with each new reduction in feature sizes of the process. The new generation of submicron processes have problems with transistors characteristics not matching—even when they are in the same memory cell right next to each other. This can have a big effect on the BETA RATIO of the memory cell, because the threshold voltage (VT) of the Pull Down can be different than the threshold voltage (VT) of the Pass Gate. There can be other variations as well that can shift, the drive strength of either the pull down or pass gate in different directions, and again this variation is getting much more difficult to deal with in the newer fabrication processes causing the semiconductor industry to have to seek other solutions in order to be able to have a reliable and yieldable memory.

From the above discussion it is evident that there is a clear need to improve writing and reading a memory that is easy to write without trading off the opposing requirement to protect against READ DISTURB, thereby improving Design For Manufacturability (DFM). In addition to improving write and read reliability it is important that the resulting physical size of the memory cell/array not be increased to achieve these goals, with a long-felt industry need to make the overall memory cell/array even smaller than existing prior art designs.

Deficiencies in the Prior Art

The prior art as detailed above suffers from the following deficiencies:

The prior art SRAM memory cells suffer from poor Design For Manufacturability (DFM) in that they are prone to yield and other failures due to variations in the transistor manufacturing and fabrication process.

The prior art 5T memory cell architectures rely on parallel connection of bit lines to a given memory cell, resulting in poor READ DISTURB performance.

The prior art tradeoffs with respect to the sizing of pass gates and pulldown devices within a given memory cell often result in unwanted and inefficient transistor sizing tradeoffs that increase memory cell sizing requirements for a given memory array.

The prior art implementations of 6T memory cells and their associated arrays are particularly prone to yield/performance problems associated with variations in manufacturing process and/or supply voltage variations.

The prior art implementations of 6T memory cells suffers from poor static power consumption with submicron geometries in part due to pass gate leakage currents associated with each memory cell.

The prior art implementations of 6T memory cells suffers from poor dynamic power consumption with submicron geometries in part due to bit line capacitance associated with each memory cell.

While some of the prior art may teach some solutions to several of these problems, the core issues of reducing the area of memory cells while improving design for manufacturability have not been addressed by the prior art.

OBJECTIVES OF THE INVENTION

Accordingly, the objectives of the present invention are (among others) to circumvent the deficiencies in the prior art and affect the following objectives:

(1) Provide for a memory cell system and method that minimizes memory cell area.

(2) Provide for a memory cell system and method that reduces or eliminates the stability of the memory cell as a function of BETA RATIO.

(3) Provide for a memory cell system and method that permits mass erasure of a memory array in response to a predetermined event.

(4) Provide for a memory cell system and method that reduces the number of transistors required to implement a memory array.

(5) Provide for a memory cell system and method that increases the design for manufacturability (DFM) of the memory cell and associated memory arrays using the memory cell.

(6) Provide for a memory cell system and method that permits smaller geometry transistors to be used to construct the memory cell.

(7) Provide for a memory cell system and method that permits a reduction of static power consumed by a memory array by minimizing the number of Bit Line Pass Gates associated with a given memory cell.

(8) Provide for a memory cell system and method that permits a reduction of dynamic power consumed by a memory array by minimizing the number of Bit Lines associated with a given memory cell.

(9) Provide for a memory cell system and method that permits a reduction of dynamic power consumed by a memory array by utilizing a single Bit Line to access a given memory cell.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

A memory cell system/method incorporating a reduced transistor count and/or improved design-for-manufacturability (DFM) is disclosed. The system/method incorporates cross-coupled feedthru/feedback amplifiers to implement the state memory component of the memory cell, wherein the feedback amplifier incorporates a multi-state output drive capability allowing the memory cell to be set/reset using only one access device connected to the input of the feedthru amplifier.

The multi-state output drive capability modulates the feedback amplifier drive strength to enable setting/resetting of the feedthru amplifier state with greatly reduced memory cell input fan-in requirements.

The invention anticipates the replacement of traditional 8T/6T/4T memory cell, structures with corresponding 6T/5T/3T memory cell configurations, resulting in an overall transistor reduction ranging from 16%-25% depending on memory array application context.

The disclosed memory cell is typically incorporated into memory arrays in which the memory cells may be written with or without the use of pass gates within the Word Line selectors and also in some circumstance written using a multiple step MULTI-WRITE procedure.

BRIEF DESCRIPTION OF THE DRAWINGS

For a fuller understanding of the advantages provided by the invention, reference should be made to the following detailed description together with the accompanying drawings wherein:

FIG. 62 illustrates an exemplary method flowchart detailing a TWO-STEP-WRITE for writing the 5T memory cell;

DESCRIPTION OF THE PRESENTLY PREFERRED EXEMPLARY EMBODIMENTS

Figure 1:
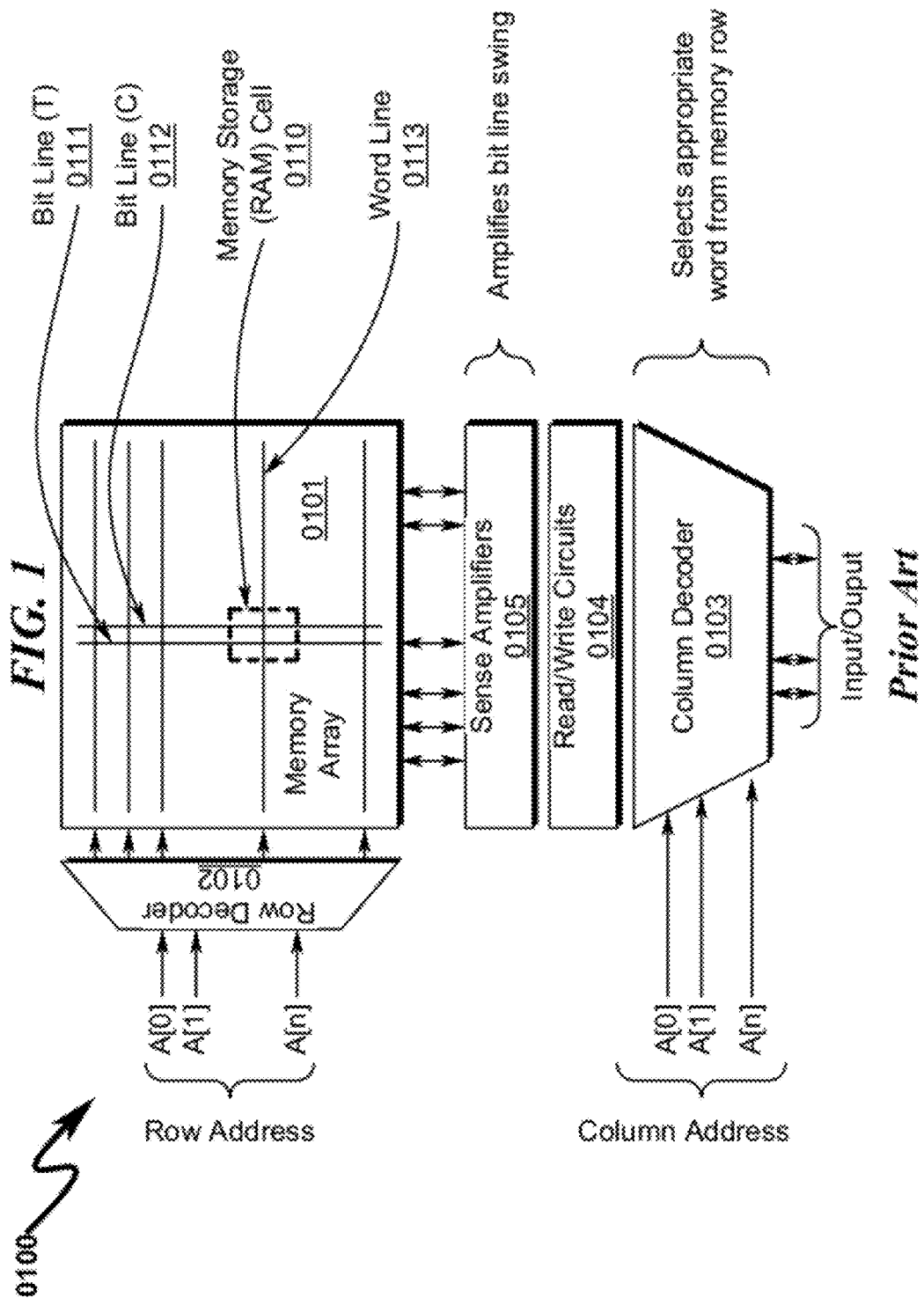
FIG. 1 illustrates a prior art memory array architecture system block diagram.

While this invention is susceptible of embodiment in many different forms, there is illustrated in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a MEMORY CELL SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but nod to others.

Amplifier not Limitive

The present invention anticipates a wide variety of application environments in which the disclosed system/method may operate. Within this context, the feedthru and feedback amplifiers that constitute the memory cell storage methodology may take many forms, some of which may include inverting and non-inverting amplifiers. While traditional CMOS static memory systems utilize cross-coupled inverting amplifiers to achieve two stable states within the memory cell, the present invention may also be implemented using non-inverting amplifiers in some embodiments.

Multi-State Output Drive Control not Limiting

The present invention utilizes a feedback amplifier that incorporates a multi-state output drive control feature enabling selective enablement or the current sourcing/sinking capability of the feedback amplifier output circuitry. This selective enablement of output sourcing/sinking drive capability may take many forms, but is generally anticipated to encompass a wider implementation range than traditional "tri-state" drive control circuitry. For example, the output drive modulation is specifically anticipated to include one or more of the following capabilities:

Removing current sourcing capability from the feedback amplifier (i.e. switching or disconnecting the power supply source to the amplifier);

Removing current sinking capability from the feedback amplifier (i.e. switching or disconnecting the power supply ground to the amplifier);

Modulating the threshold voltage for a PMOS transistor associated with the current sourcing capability of the feedback amplifier to limit the current sourcing capability of the feedback amplifier;

Modulating the threshold voltage for a NMOS transistor associated with the current sinking capability of the feedback amplifier to limit the current sinking capability of the feedback amplifier;

One skilled in the art will recognize that these techniques may be used individually or may be combined together in some preferred embodiments.

Logic Levels not Limitive

The present invention places no restriction on the sense of logic levels within, the context of the present invention. Thus, logic "true/false" and/or "1/0" levels may be represented by high/low voltage levels or low/high logic levels without loss of generality. Furthermore, representative memory state conditions may be represented equally well by voltage levels and/or current levels and/or charge levels without loss of generality. Within context of this disclosure, it will be assumed that the normal convention of a logic zero (0) ("false") being represented by a low voltage and a logic one (1) ("true") being represented by a higher voltage will be used within this document as a framework at discussion, with the understanding that these conventions are not limitive of the scope of the claimed invention.

Complementary Devices not Limitive

The present invention may utilize a variety of devices that have complementary functional forms. For example, CMOS devices may be implemented using N-channel and dechannel devices, BJTs may be implemented using NPN and PNP devices, etc. The present invention specifically anticipates that any implementation described and claimed herein may also be implemented using complementary technologies without loss of generality. Furthermore, the present invention specifically anticipates that complementary elements crossing technology boundaries may be combined to form claimed elements within some present invention embodiments. Thus, for example, the present invention anticipates the combination of MOS and bipolar technologies (BiCMOS) to be utilized in some preferred embodiments of the present invention.

Inverting Amplifier Implementation not Limitive

The present invention anticipates a wide variety of implementations, some incorporating cross-coupled inverting feedthru/feedback amplifiers. The present invention makes no limitation on the implementation of these inverting amplifiers. For example, the use of conventional CMOS inverters is anticipated when implementing fully static 5T/6T memory cell designs as detailed herein. Additionally, non-static 3T/4T memory cell designs may also be implemented using NMOS technology, wherein the inverter loads are configured using high value resistors, depletion mode loads, and the like. The present invention anticipates in some embodiments these fully-static/non-static methodologies may be integrated or mixed within a given memory cell. Additionally, while the use of single-ended amplifiers is thought to be optimal in many preferred embodiments of the invention, the invention may be implemented using differential and/or double-ended amplifier designs.

One skilled in the art will recognize that the above teachings may also be applied to a wide variety of complementary fabrication processes as well as scenarios that are outside the realm of conventional MOS manufacturing processes.

4T/3T Memory Cell Optimization

The present invention permits an area space reduction within the context of traditional 4T memory cells. Since the present invention permits elimination of the traditional pass gate associated with the output of the feedthru amplifier, the total transistor count associated with the memory cell is reduced from 4 (one input pass gate, two transistors associated with the cross-coupled inverters, two load resistors, and an output pass gate) to 3 (one input pass gate, two transistors associated with the cross-coupled inverters, two load resistors). This represents a 25% reduction in overall transistor area consumed by the present invention 3T memory cell in this application environment.

6T/5T Memory Cell Optimization

The present invention permits an area space reduction within the context of traditional 6T memory cells. Since the present invention permits elimination of the traditional pass gate associated with the output of the feedthru amplifier, the total transistor count associated with the memory cell is reduced from 6 (one input pass gate, four transistors associated with the cross-coupled inverters, and an output pass gate) to 5 (one input pass gate, four transistors associated with the cross-coupled inverters). This represents a 16% reduction in overall transistor area consumed by the present invention 5T memory cell in this application environment.

8T/6T Memory Cell Optimization

The present invention permits an area space reduction within the context of traditional 8T dual port memory cells. Since the present invention permits elimination of the traditional pass gate associated with the output of the feedthru amplifier, the total transistor count associated with the memory cell is reduced from 8 (two input pass gates, four transistors associated with the cross-coupled inverters, and two output, pass gates) to 6 (two input pass gates, four transistors associated with the cross-coupled inverters). This represents a 25% reduction in overall transistor area consumed by the present invention 8T memory cell in this application environment.

MULTI-WRITE not Limitive

The present invention describes variety of methodologies in which the present invention memory cell embodiments may be written. These techniques will be generally described by the term "MULTI-WRITE" to indicate these memory cell write capabilities. This may include but is not limited to the use of one-step writes, two-step writes, multi-step writes, writes using VDD switching, writes using VSS switching, or any combination of the above techniques. Thus, the term MULTI-WRITE should be given its broadest possible interpretation within this definition scope.

Power Supply Polarity not Limitive

The present invention describes a variety of methodologies in which the present invention memory cell embodiments utilize power supply sources indicated by VDD/VCC and VSS/GND. One skilled in the art will recognize that power supply polarity may be generalized within the context of the disclosed invention to include other nomenclature and other polarities, as well as multiple power supplies having multiple voltage values. The present invention specifically anticipates this generalization within the scope of the claimed invention and the claims definitions herein.

Electrical Reversal not Limitive

The present invention describes a variety of methodologies in which the present invention memory cell embodiments utilize various means to switch VDD/VCC and VSS/GND to the feedback amplifier in a cross-coupled amplifier configuration in order to maintain a stable memory state. Within this context the term "electric reversal" or "electrical reversal" or "electrically reversed" will be used to mean a change in the designated signal from VSS-to-VDD or from VDD-to-VSS, as appropriate within the context. While one skilled in the art will recognize that power supply polarity may be generalized within the context of the disclosed invention to include other nomenclature and other polarities, the general scope of this term is used to indicate a logic reversal of the designated signal. The present invention specifically anticipates that this generalization within the scope of the claimed invention will include voltage swings that are not fully rail-to-rail, but which may include partial transitions to fractions of the VDD/VCC voltage.

System SubCircuit Overview

The present invention relates generally to memory systems and specifically memory arrays. The disclosed invention may be constructed in a wide variety of ways using a wide variety of both circuit fabrication techniques as well, as the use of a wide variety of subcircuits in combination. To better understand the architectural scope of the present invention it is instructive to review block diagrams of how these subcircuit elements are arranged and how they may be combined to form various embodiments of the invention. A brief discussion of the various subcircuits that may comprise the present invention in its various embodiments follows.

System Subcircuit Overview (1700)

Figure 17:
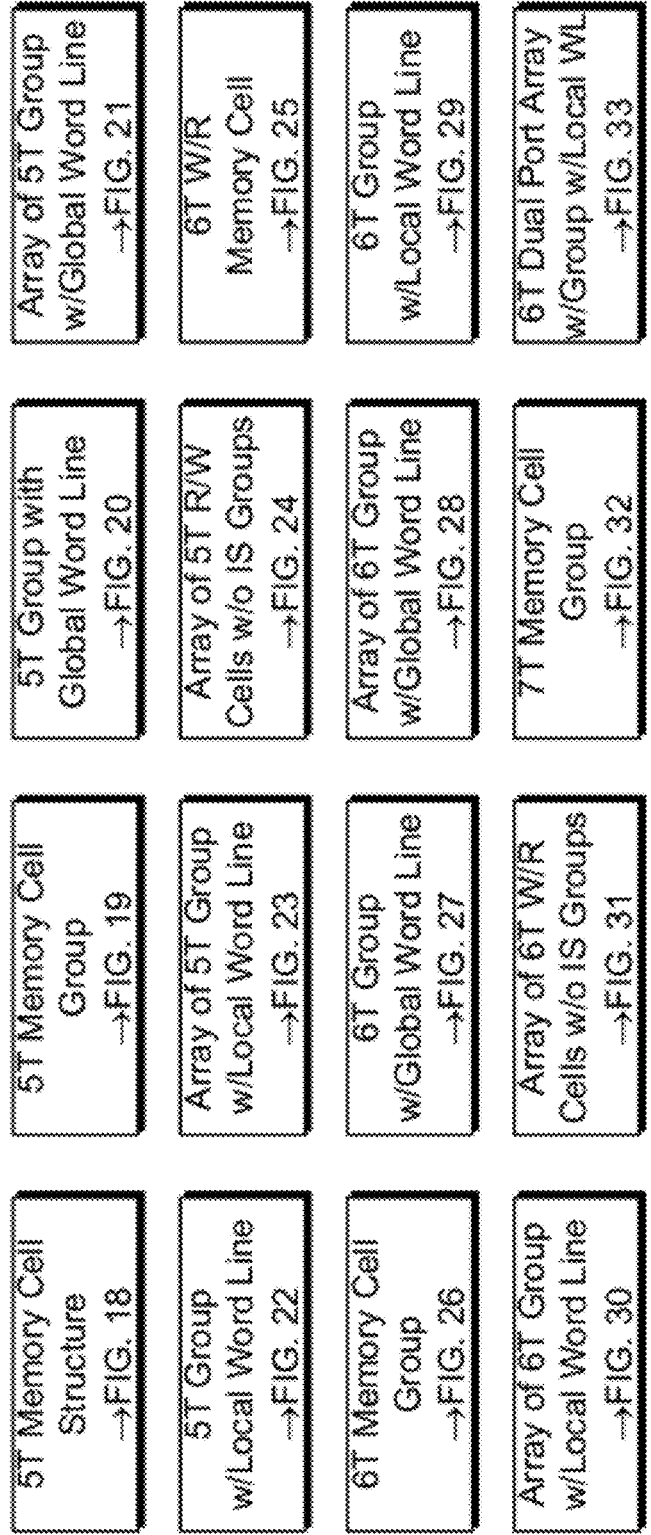
FIG. 17 illustrates an exemplary system block diagram of various preferred subcircuits associated with the present invention.

FIG. 17 (1700) illustrates an exemplary system block diagram of various preferred major embodiment subcircuits associated with the present invention.

5T Memory Cell Structure (1800)

Figure 18:
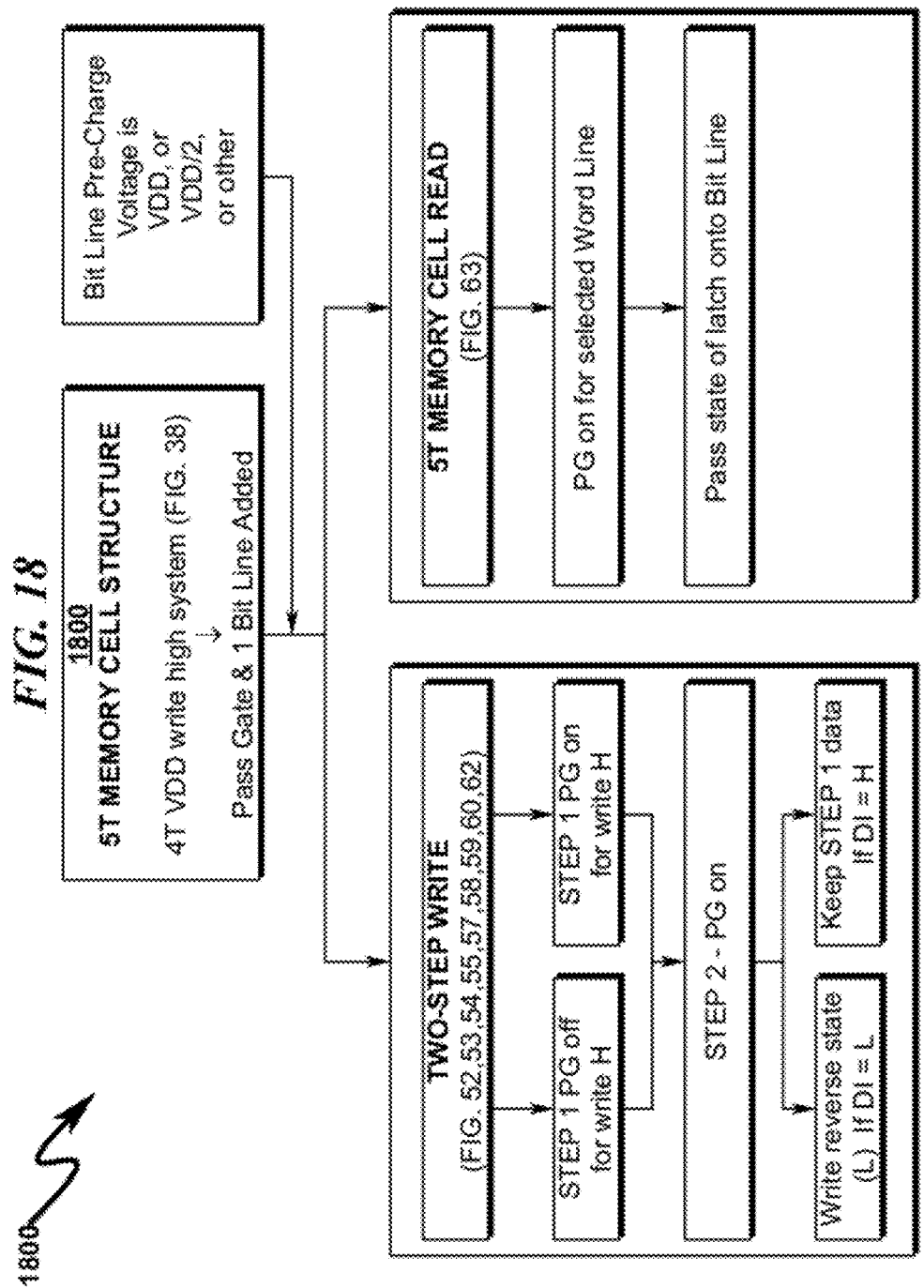
FIG. 18 illustrates a block diagram of an exemplary 5T memory cell structure useful in some preferred embodiments of the present invention.

FIG. 18 (1800) illustrates a block diagram of an exemplary 5T memory cell structure.

5T Memory Cell Group (1900)

Figure 19:
FIG. 19 illustrates a block diagram of an exemplary 5T memory cell group useful in some preferred embodiments of the present invention.

FIG. 19 (1900) illustrates a block diagram of an exemplary 5T memory cell group.

5T Group with Global Word Line (2000)

Figure 20:
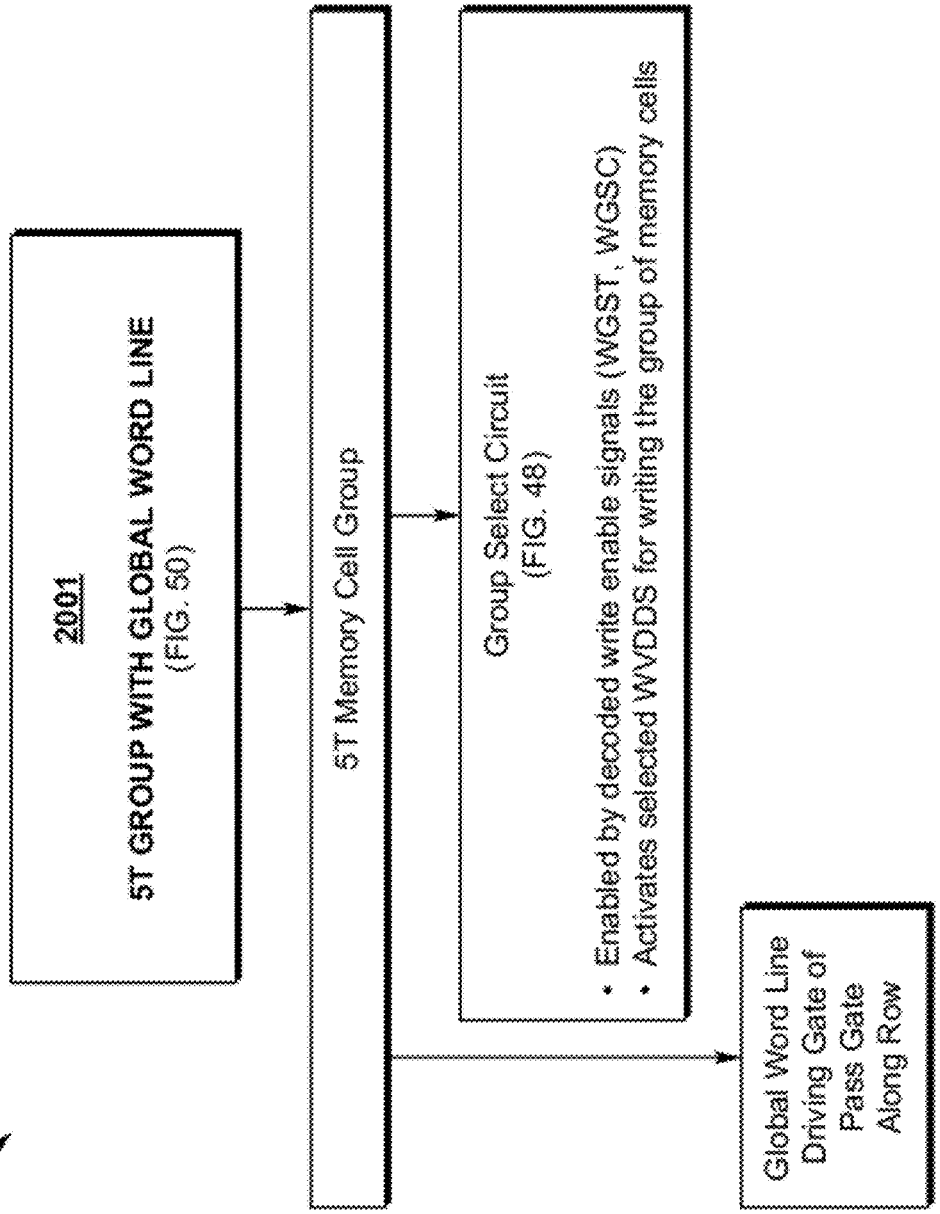
FIG. 20 illustrates a block diagram of an exemplary 5T group with global word line useful in some preferred embodiments of the present invention.

FIG. 20 (2000) illustrates a block diagram of an exemplary 5T group with global word line.

Array of 5T Groups with Global Word Line (2100)

Figure 21:
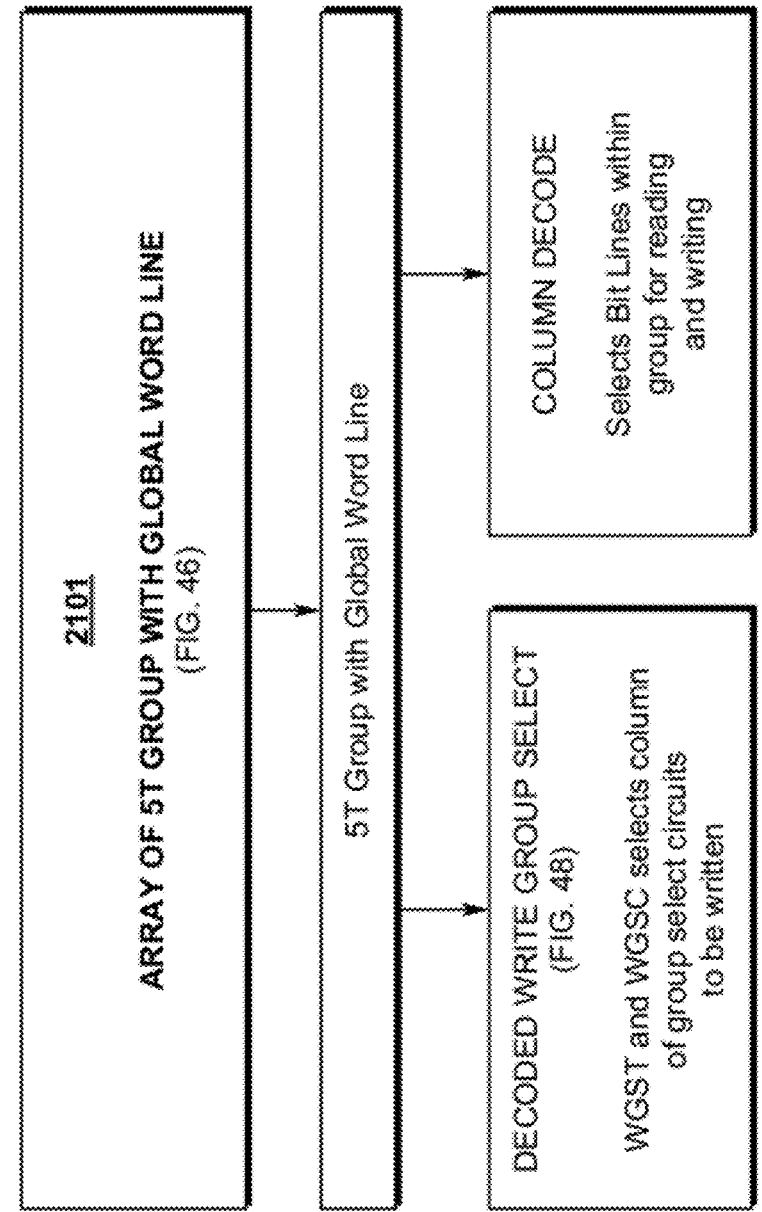
FIG. 21 illustrates a block diagram of an exemplary array of 5T groups with global word line useful in some preferred embodiments of the present invention.

FIG. 21 (2100) illustrates a block diagram of an exemplary array of 5T groups with global word line.

5T Group with Local Word Line (2200)

Figure 22:
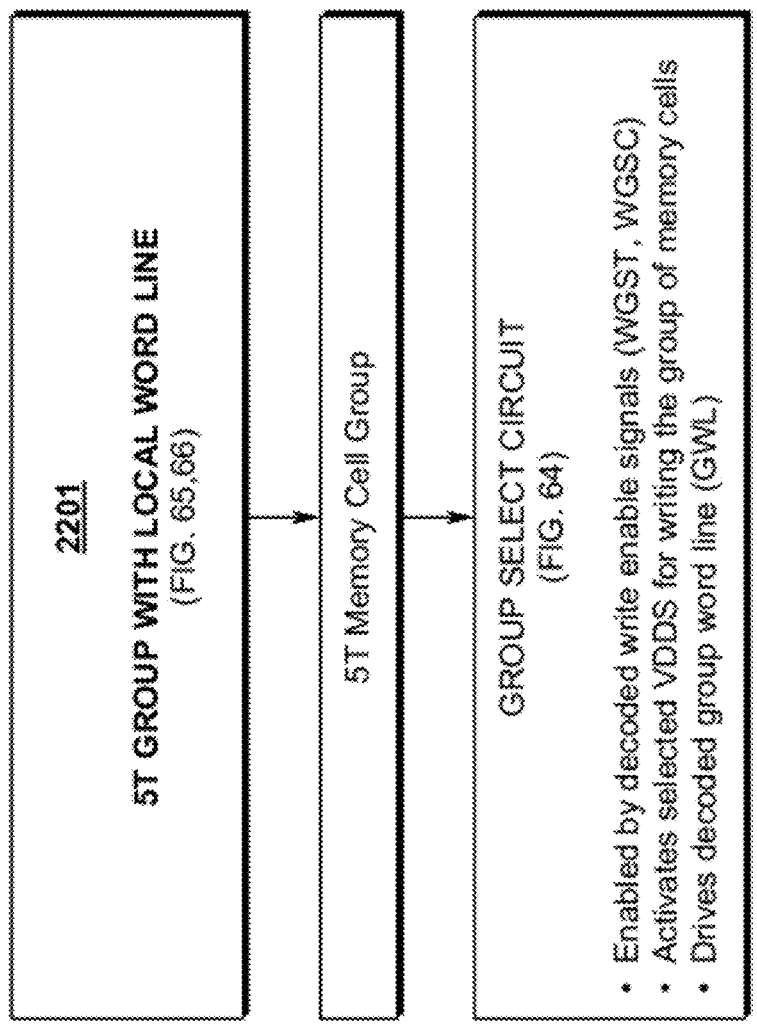
FIG. 22 illustrates a block diagram of an exemplary 5T group with local word line useful in some preferred embodiments of the present invention.
Figure 23:
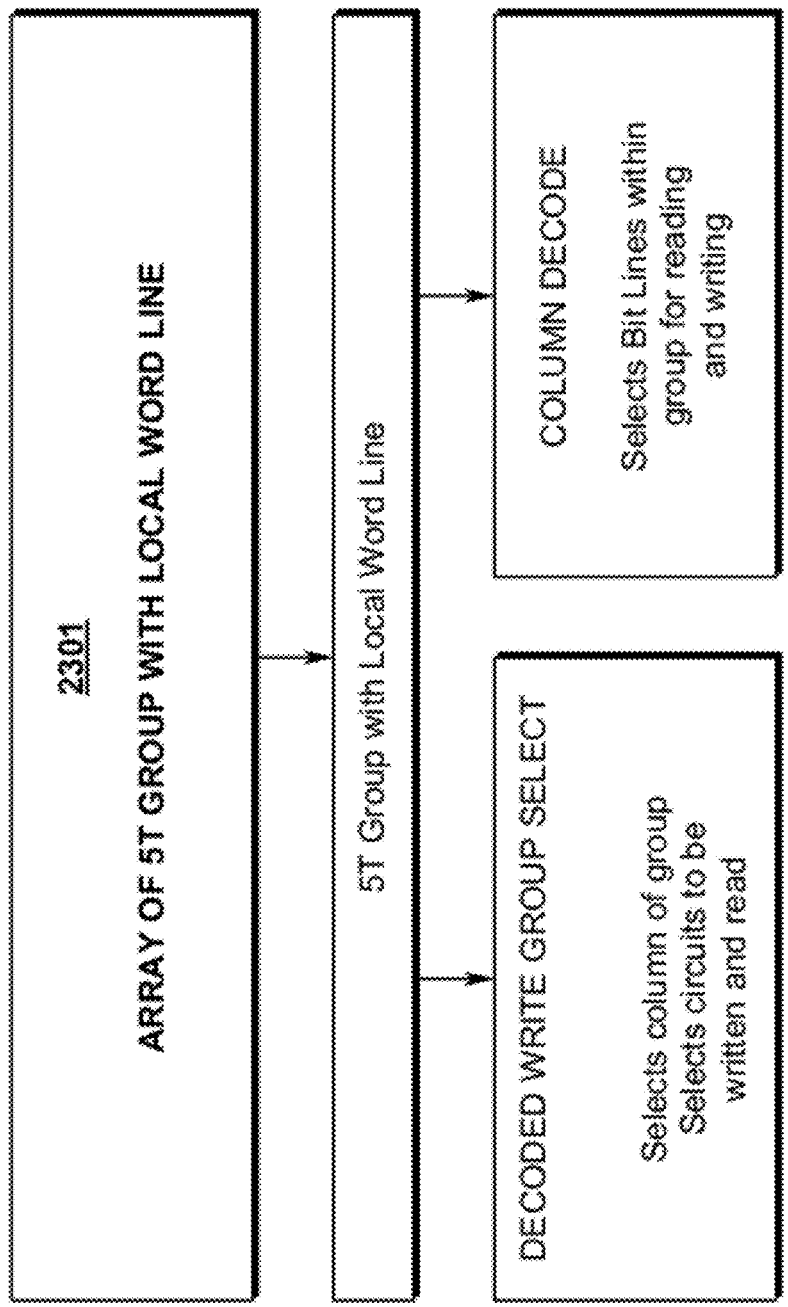
FIG. 23 illustrates a block diagram of an exemplary array of 5T groups with local word line useful in some preferred embodiments of the present invention.
Figure 24:
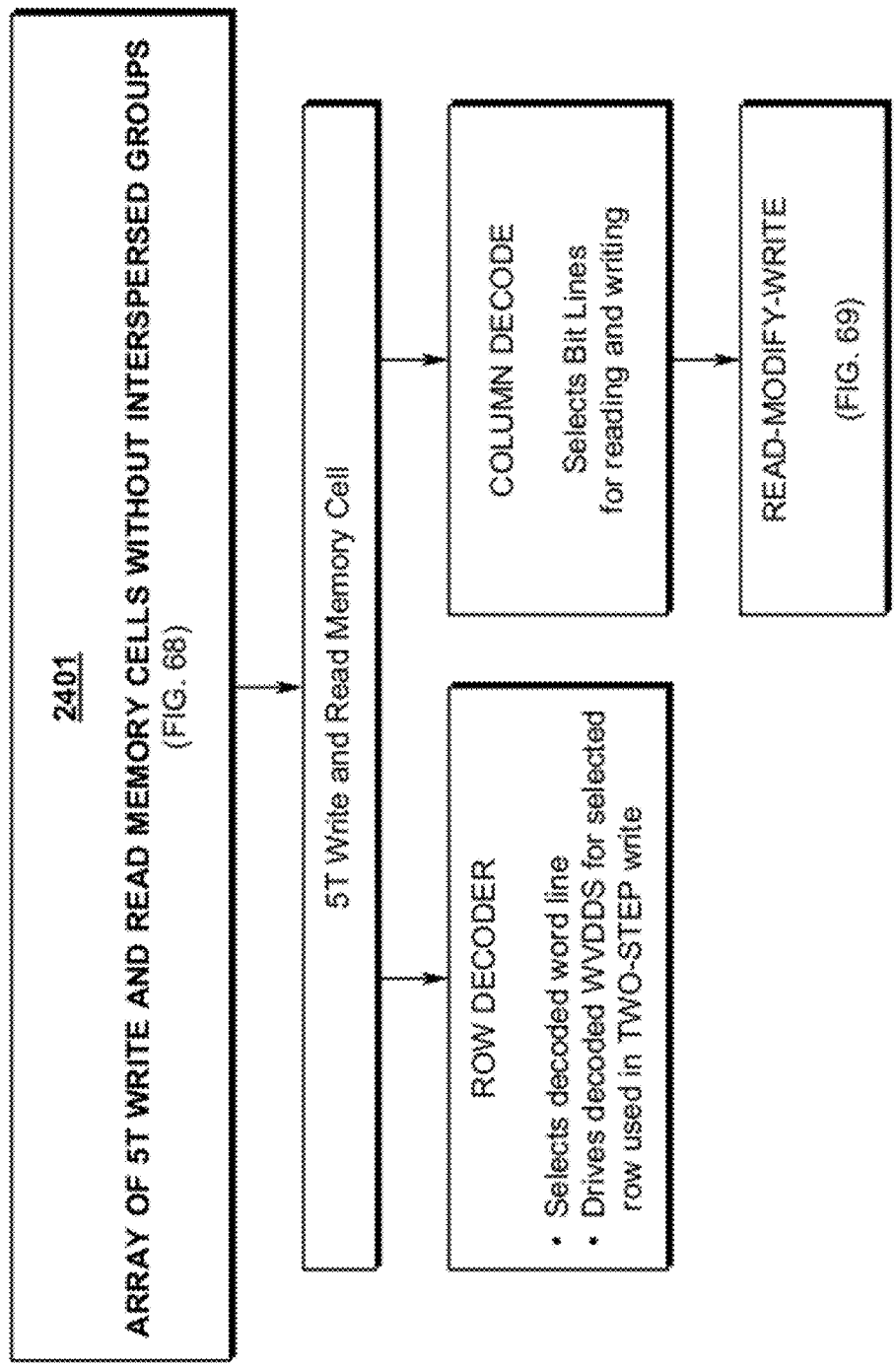
FIG. 24 illustrates a block diagram of an exemplary array of 5T write and read memory cells without interspersed groups useful in some preferred embodiments of the present invention.
Figure 25:
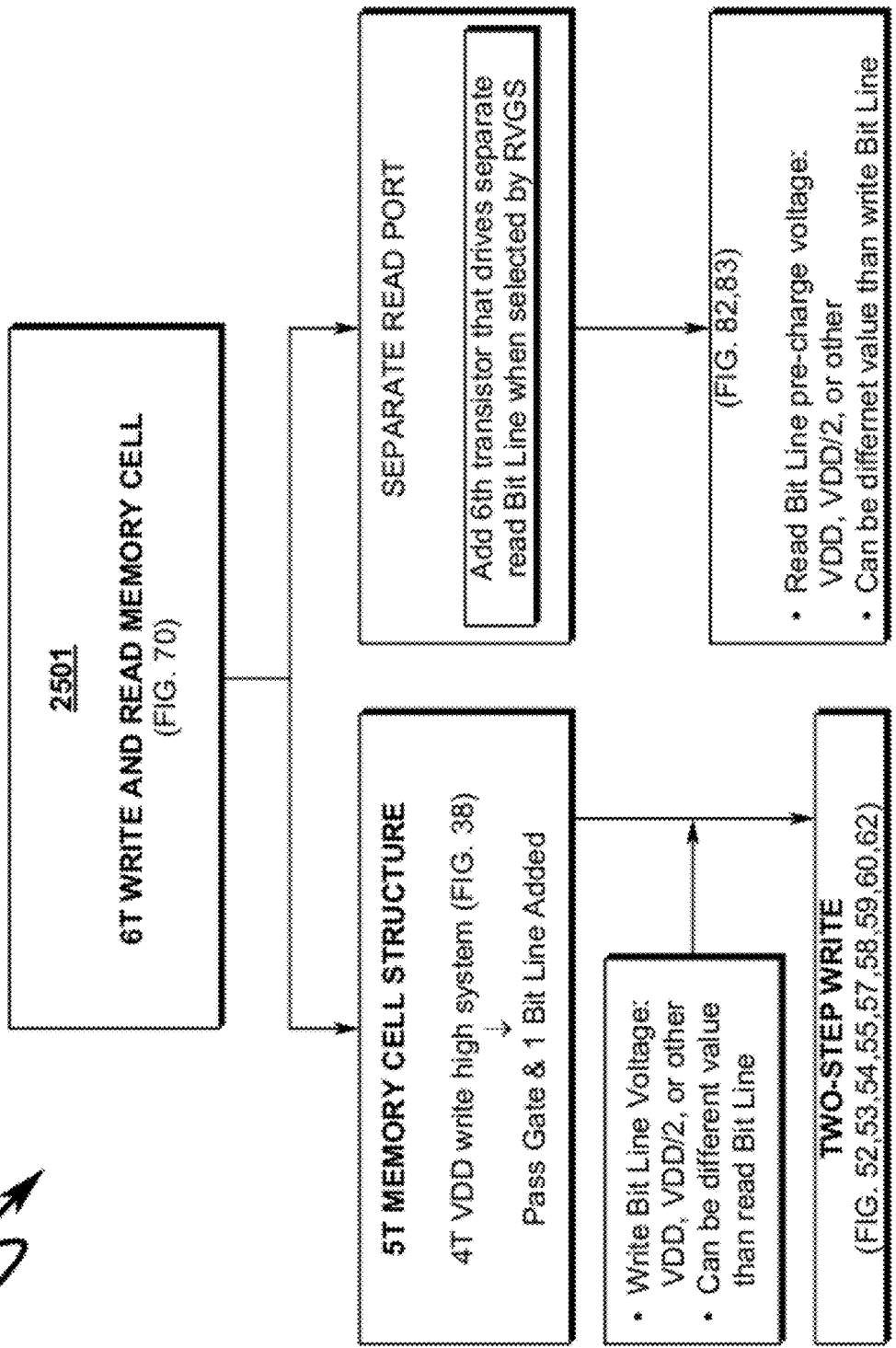
FIG. 25 illustrates a block diagram of an exemplary 6T write and read memory cell useful in some preferred embodiments of the present invention.
Figure 27:
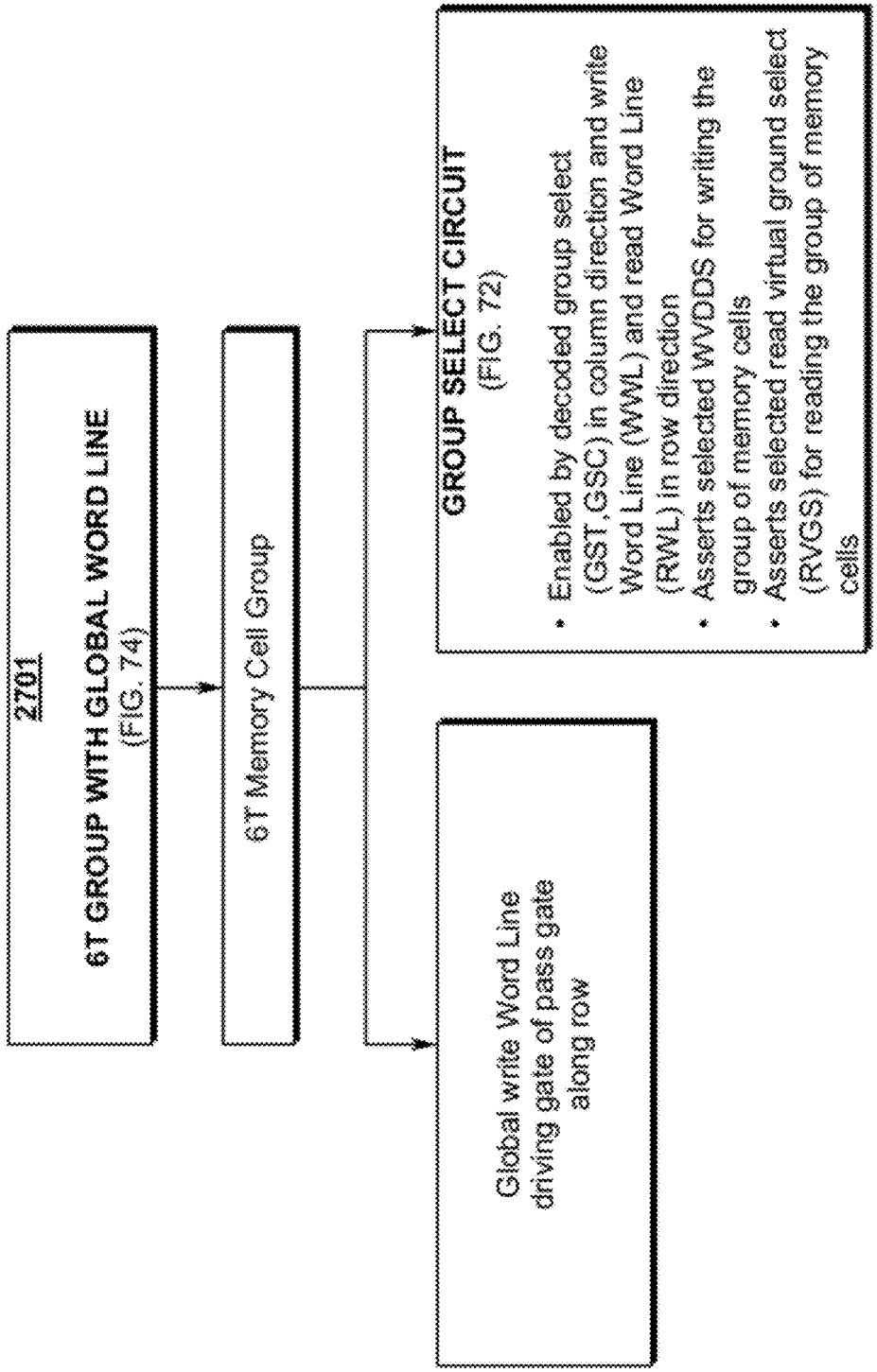
FIG. 27 illustrates a block diagram of an exemplary 6T group with global word line useful in some preferred embodiments of the present invention.
Figure 28:
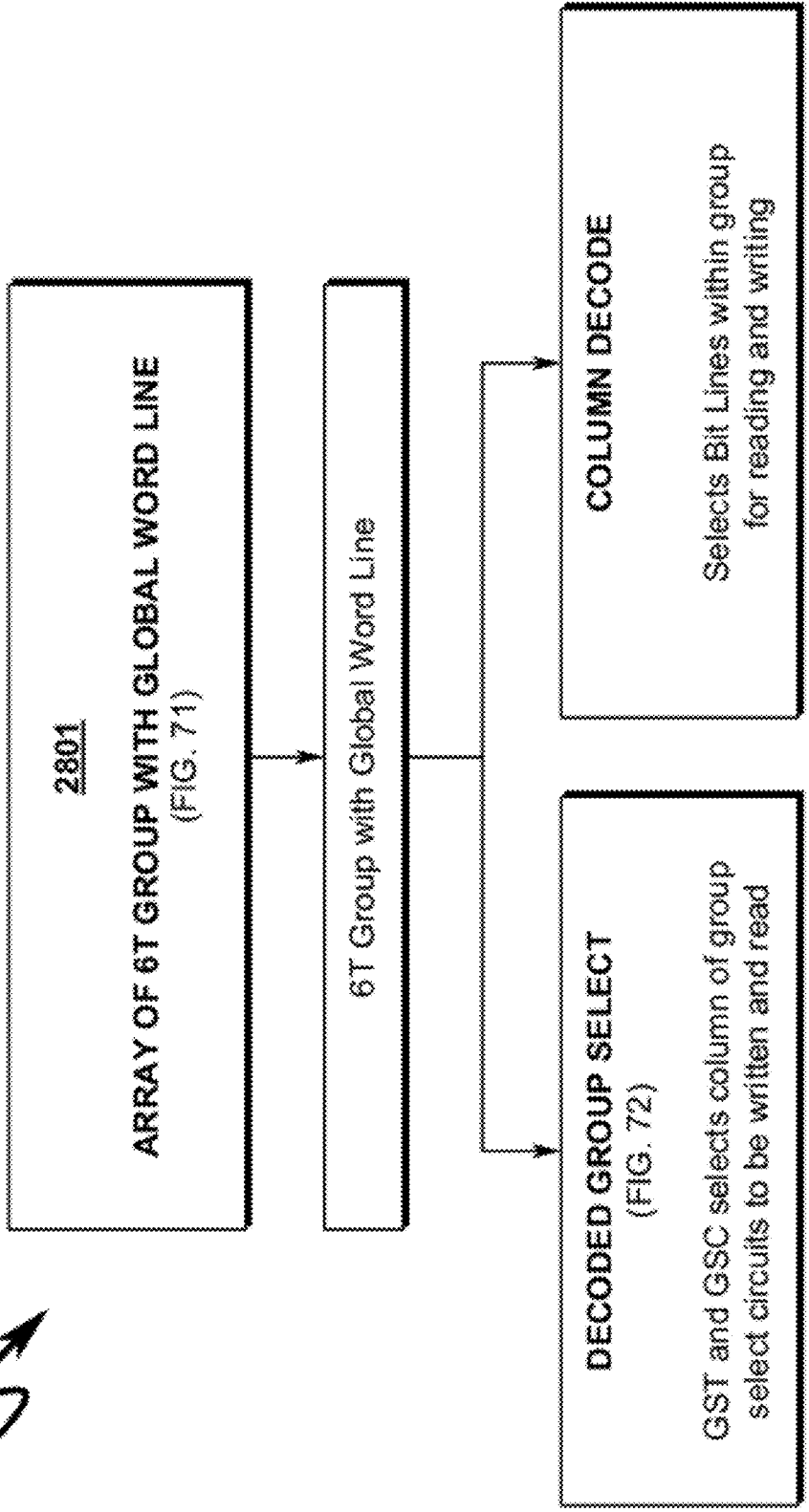
FIG. 28 illustrates a block diagram of an exemplary array of 6T groups with global word line useful in some preferred embodiments of the present invention.
Figure 30:
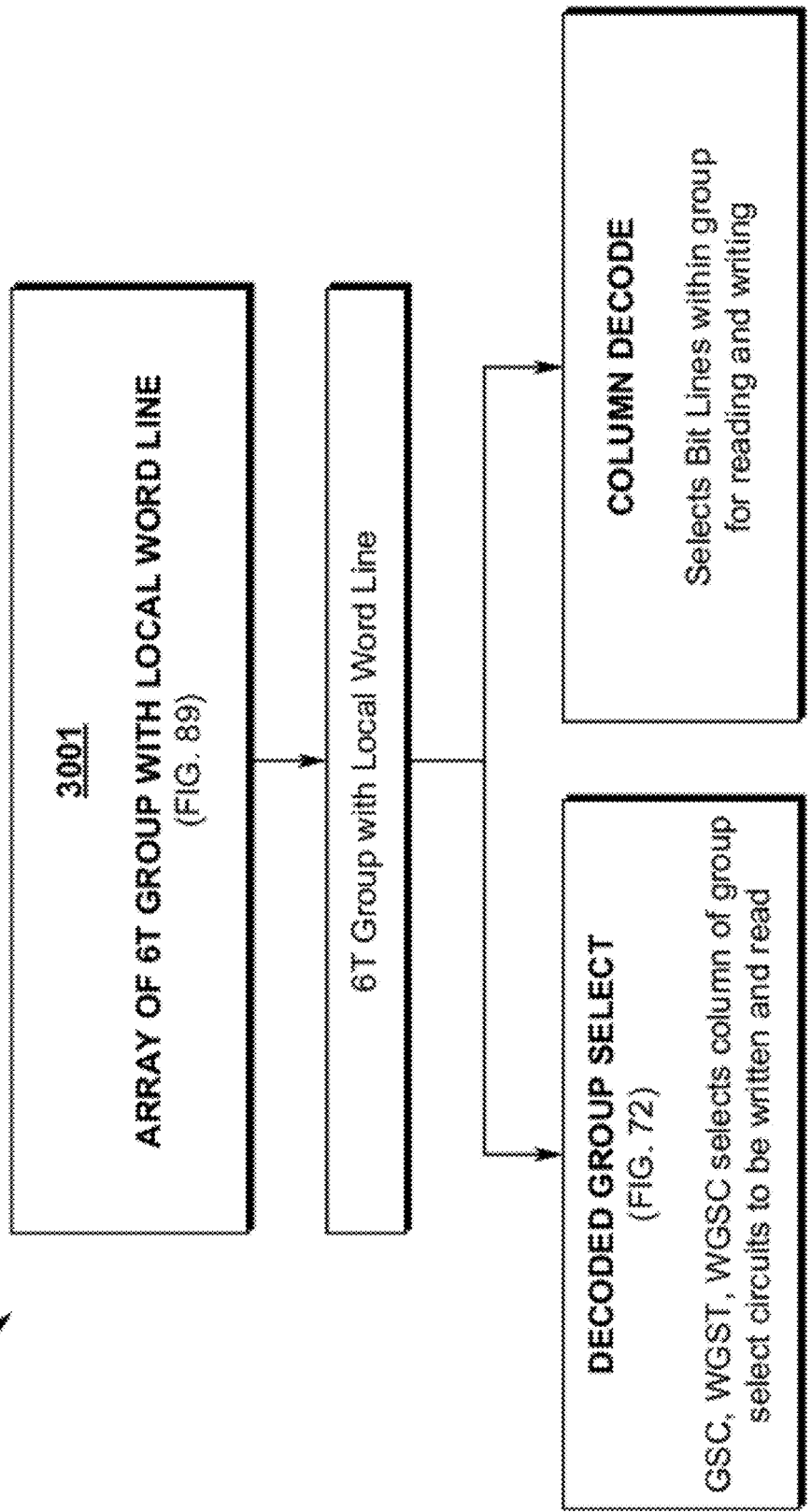
FIG. 30 illustrates a block diagram of an exemplary array of 6T groups with local word line useful in some preferred embodiments of the present invention.
Figure 31:
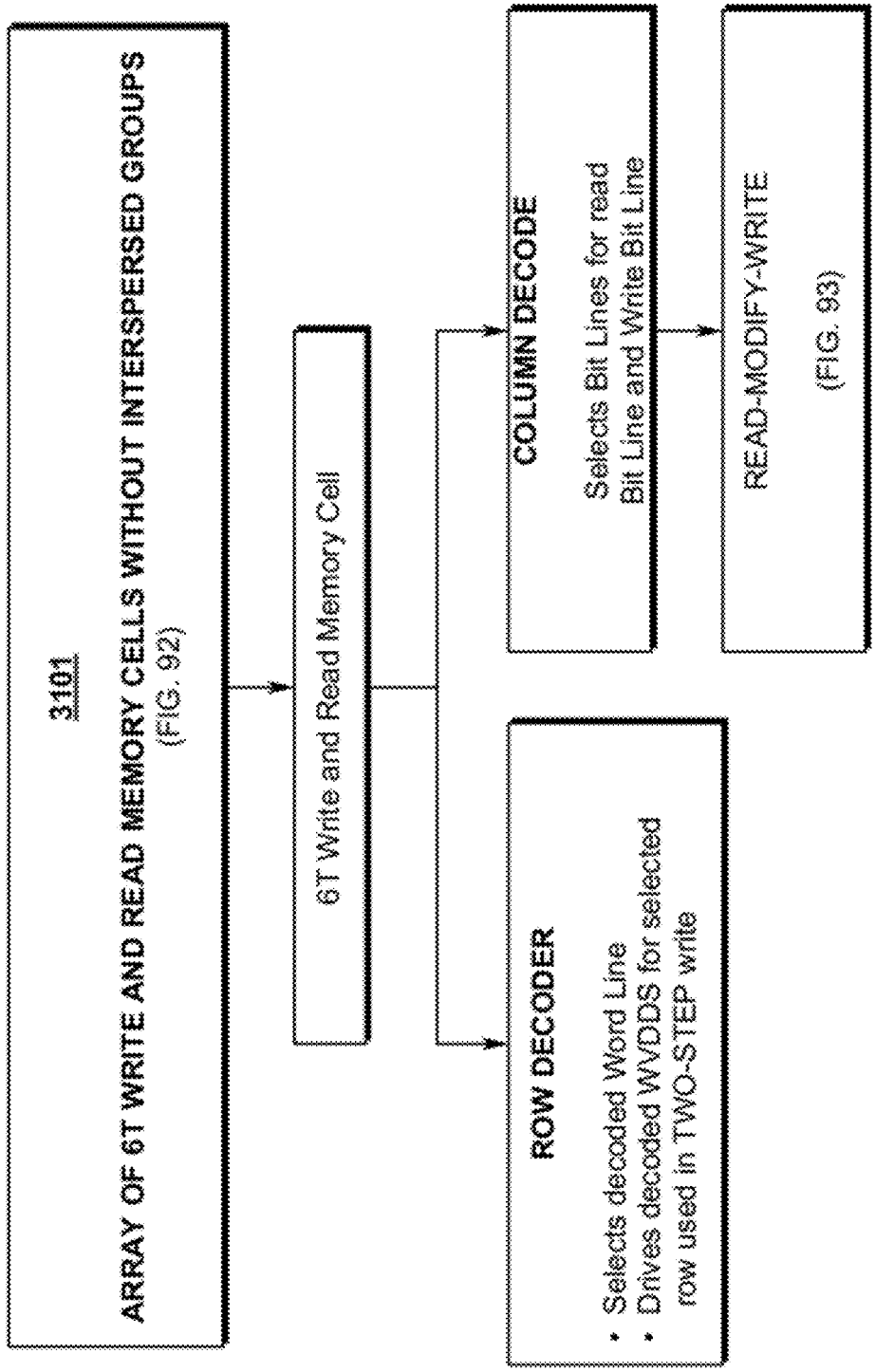
FIG. 31 illustrates a block diagram of an exemplary array of 6T write and read memory cells without interspersed groups useful in some preferred embodiments of the present invention.
Figure 32:
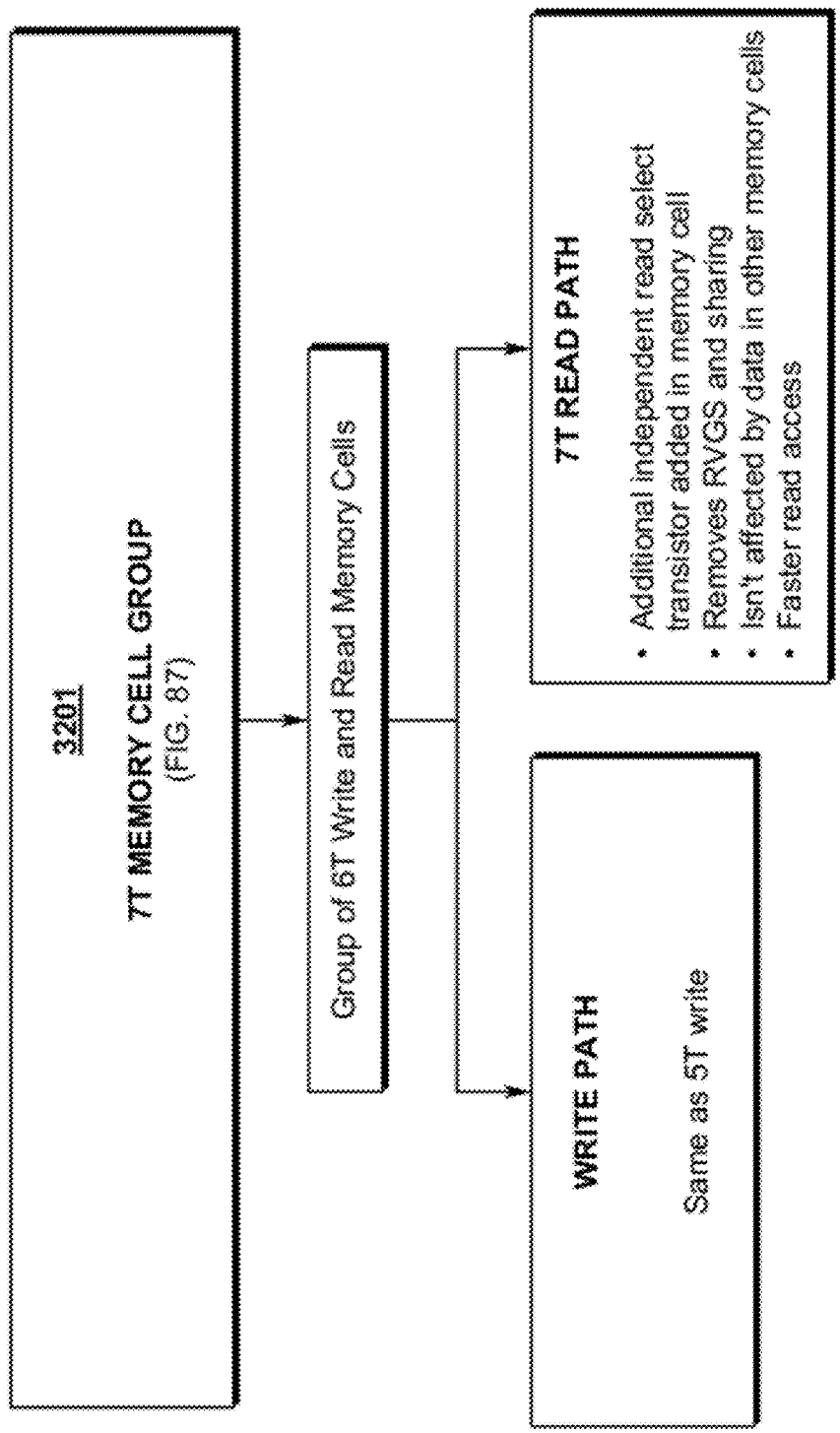
FIG. 32 illustrates a block diagram of an exemplary 7T memory cell group useful in some preferred embodiments of the present invention.
Figure 33:
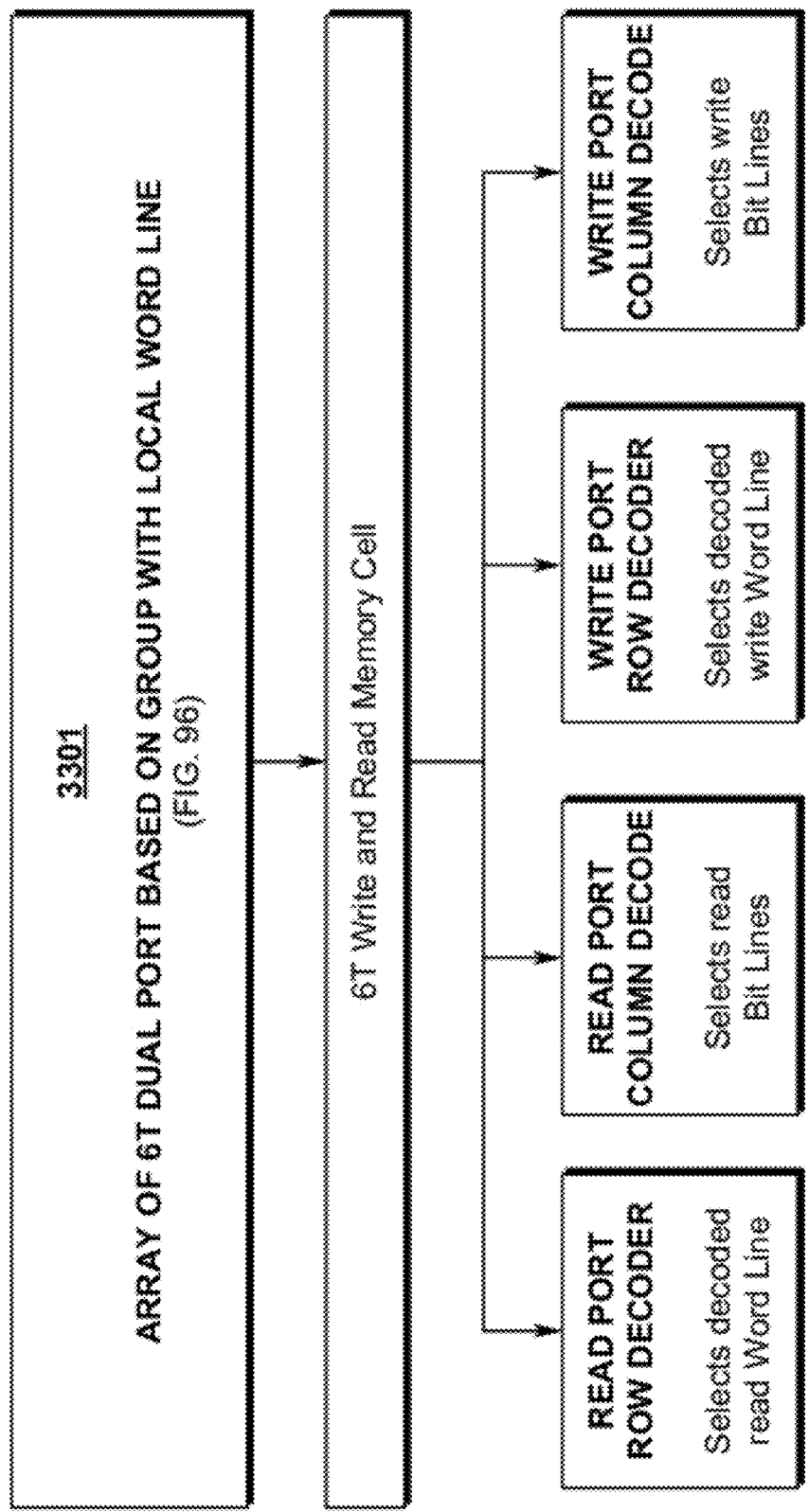
FIG. 33 illustrates a block diagram of an exemplary array of 6T dual port based on group with local word line useful in some preferred embodiments of the present invention.

FIG. 22 (2200) illustrates a block diagram of an exemplary 5T group with local word line.
Array of 5T Groups with Local Word Line (2300)
FIG. 23 (2300) illustrates a block diagram of an exemplary array of 5T groups with local word line.
Array of 5T Write and Read Memory Cells w/o Interspersed Groups (2400)
FIG. 24 (2400) illustrates a block diagram of an exemplary array of 5T write and read memory cells without interspersed groups.
6T Write and Read Memory Cell (2500)
FIG. 25 (2500) illustrates a block diagram of an exemplary 6T write and read memory cell.
6T Memory Cell Group (2600)
FIG. 26 (2600) illustrates a block diagram of an exemplary 6T memory cell group.
6T Group with Global Word Line (2700)
FIG. 27 (2700) illustrates a block diagram of an exemplary 6T group with global word line.
Array of 6T Groups with Global Word Line (2800)
FIG. 28 (2800) illustrates a block diagram of an exemplary array of 6T groups with global word line.
6T Group with Local Word Line (2900)
FIG. 29 (2900) illustrates a block diagram of an exemplary 6T group with local word line.
Array of 6T Groups with Local Word Line (3000)
FIG. 30 (3000) illustrates a block diagram of an exemplary array of 6T groups with local word line.
Array of 6T Write and Read Memory Cells (3100)
FIG. 31 (3100) illustrates a block diagram of an exemplary array of 6T write and read memory cells without interspersed groups.
7T Memory Cell Group (3200)
FIG. 32 (3200) illustrates a block diagram of an exemplary 7T memory cell group.
Array of 6T Dual Port Based on Group with Local Word Line (3300)
FIG. 33 (3300) illustrates a block diagram of an exemplary array of 6T dual port based on group with local word line.

System Memory Cell Overview (3400)

Figure 34:
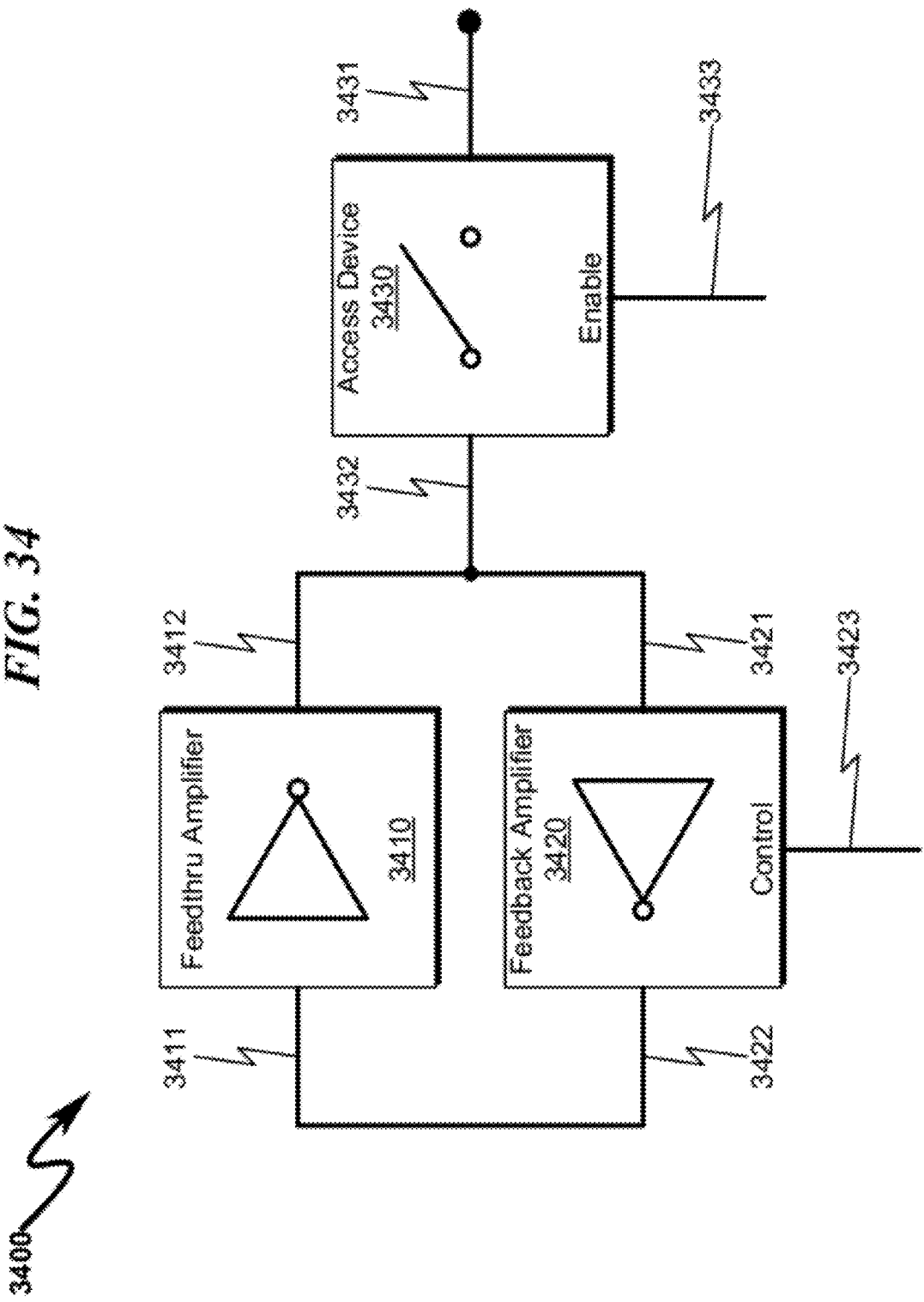
FIG. 34 illustrates a block diagram of an exemplary high level overview of the memory cell structure used within the present invention.

The present invention system may be broadly described as depicted in FIG. 34 (3400). In this broad system block diagram, the present invention incorporates a feedthru amplifier (3410) having input (3411) and output terminals (3412); a feedback amplifier (3420) having input (3421), output (3422), and control (3423) terminals; and an access device (3430) having input (3431), output (3432), and enable (3433) terminals.

Note that this configuration generally differs from the prior art in that the access device (3430) is connected to the output of the feedthru amplifier (3410) rather than the output of the feedback amplifier (3420). Additionally, the operation of the control input (3423) on the feedback amplifier (3420) in the present invention differs from the prior art in that this control input (3423) is used to force a write to the memory cell, by virtue of its influence on the drive strength of the feedback amplifier (3420). Specifically, the control input (3423) in the present invention is typically used to control or drive the power supply (VDD/VCC or VSS/GND) reversed electrical state, forcing a change in the state of the memory cell during a write operation. Thus, in contrast to the prior art, the control port (3423) is used to WRITE the state of the memory cell, not aid the access device (3430) in setting the state of the memory cell. This modified write operation may be used in conjunction with a TWO-STEP-WRITE sequence to permit read/write access to the memory cell without the drawbacks typically associated with READ DISTURB in conventional prior art designs.

MULTI-WRITE Embodiment

Figure 35:
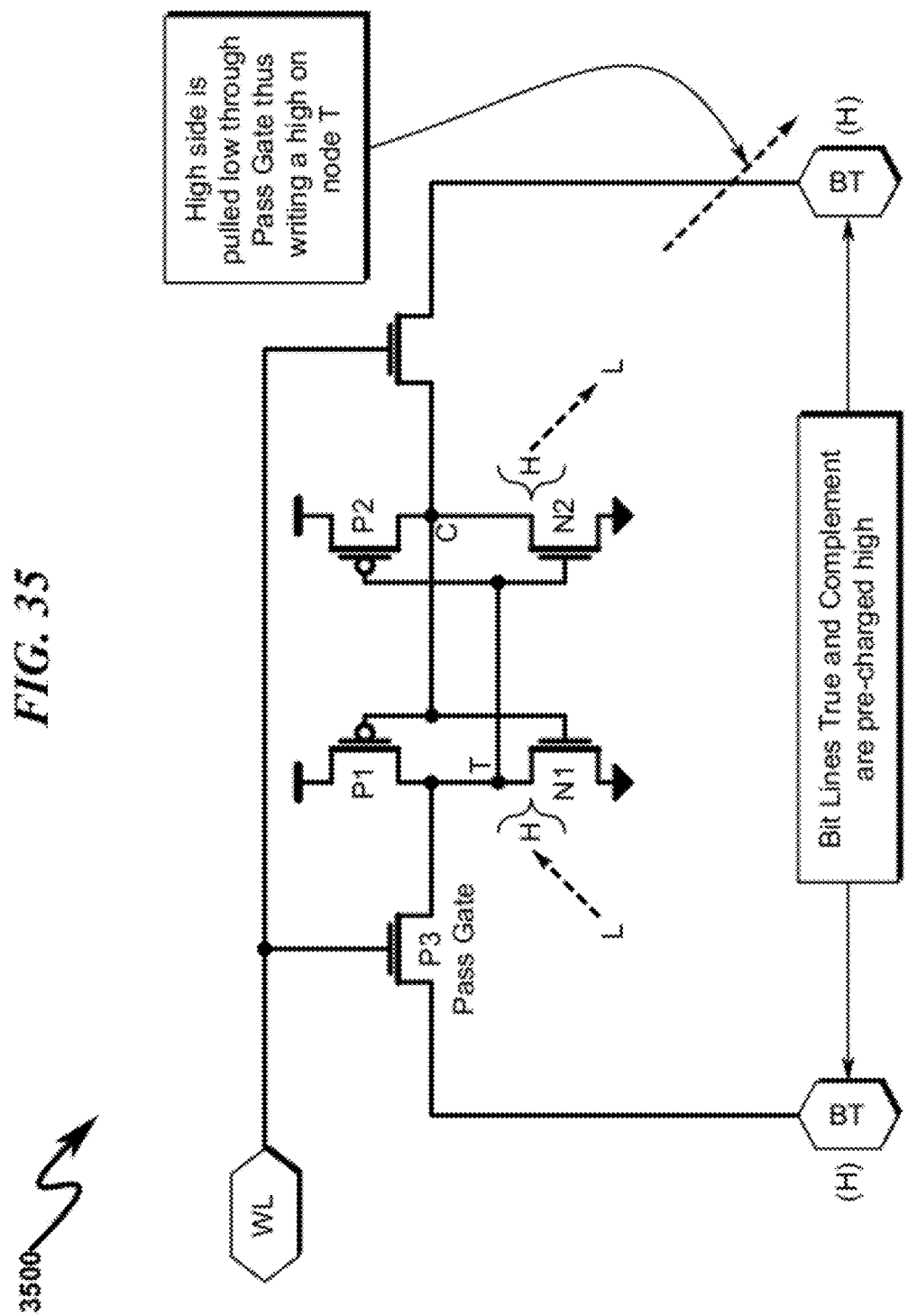
FIG. 35 illustrates writing a high against a stored low in the traditional 6T memory cell requires access to high side.
Figure 36:
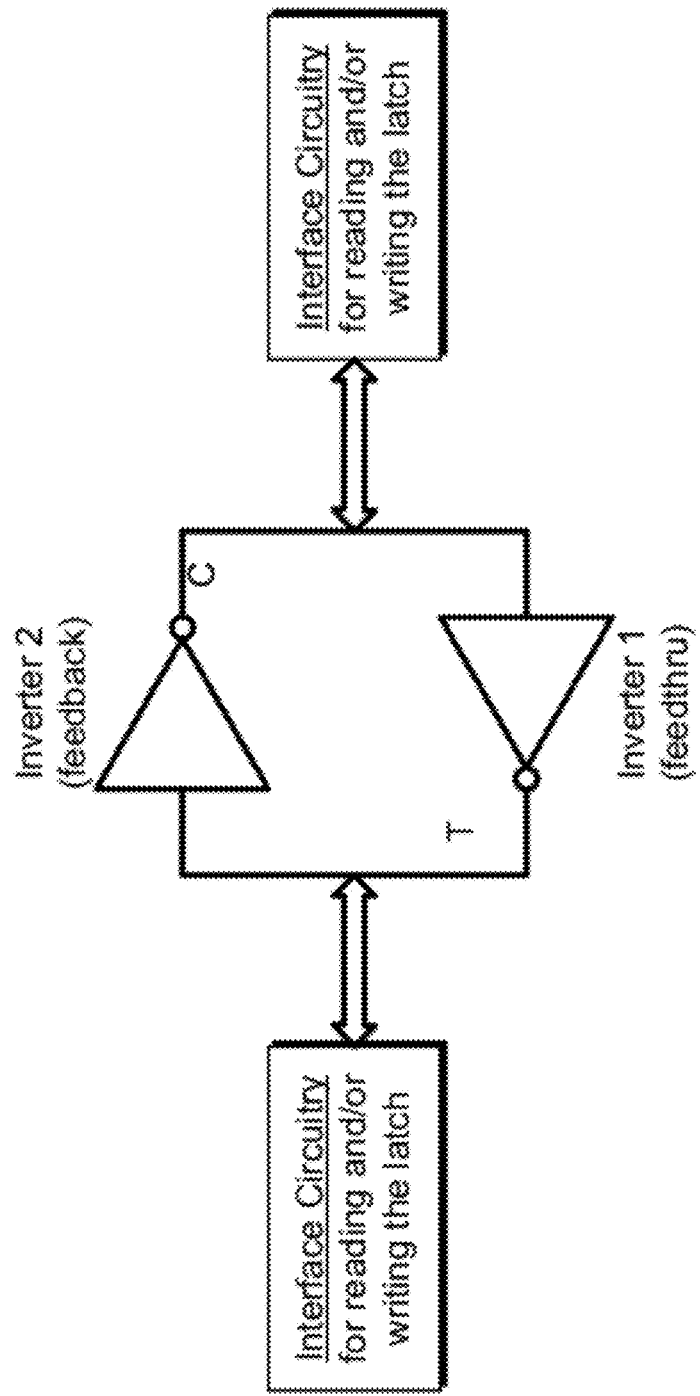
FIG. 36 illustrates an internal cross coupled latch of memory cell and interface circuitry.

Traditional Latch Write-1 Challenges (3500)
As mentioned in the Background Section, writing a "1" in the traditional 6T memory cell is difficult and requires a second Pass Gate to always have the ability to pull the high side low as shown in FIG. 35 (3500).
Cross-Coupled Latch Overview (3600)
A fundamental characteristic is the ability to easily write a high ("1) or low ("0") into the cross coupled latch that makes up many different types of memory cells. A logic schematic of the cross coupled latch without the pass gates is illustrated in FIG. 36 (3600).

Figure 37:
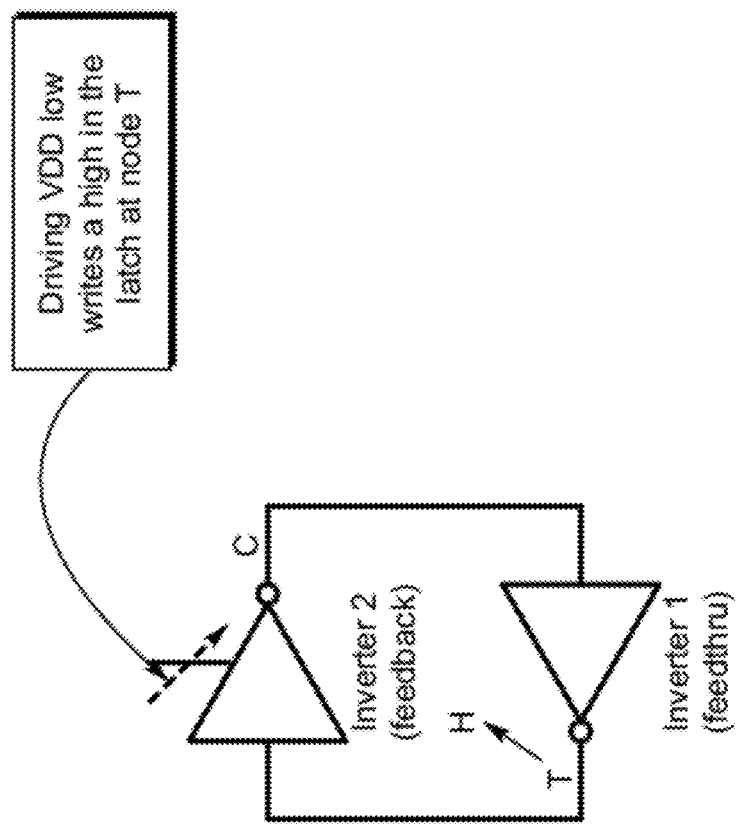
FIG. 37 illustrates driving VDD low forces a high on node T of the latch.
Figure 38:
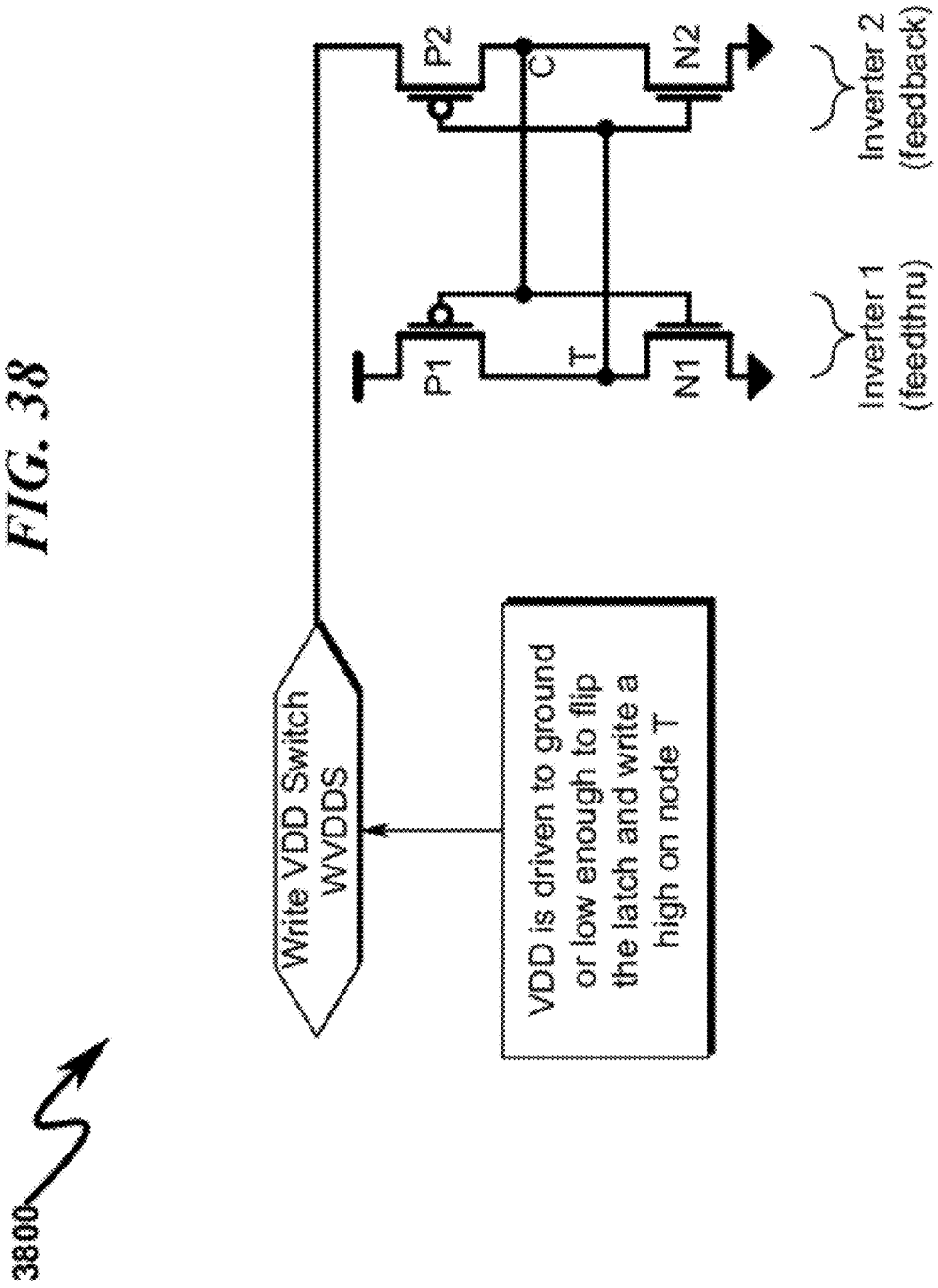
FIG. 38 illustrates a transistor level schematic of the memory latch with a switched VDD configuration.
Figure 39:
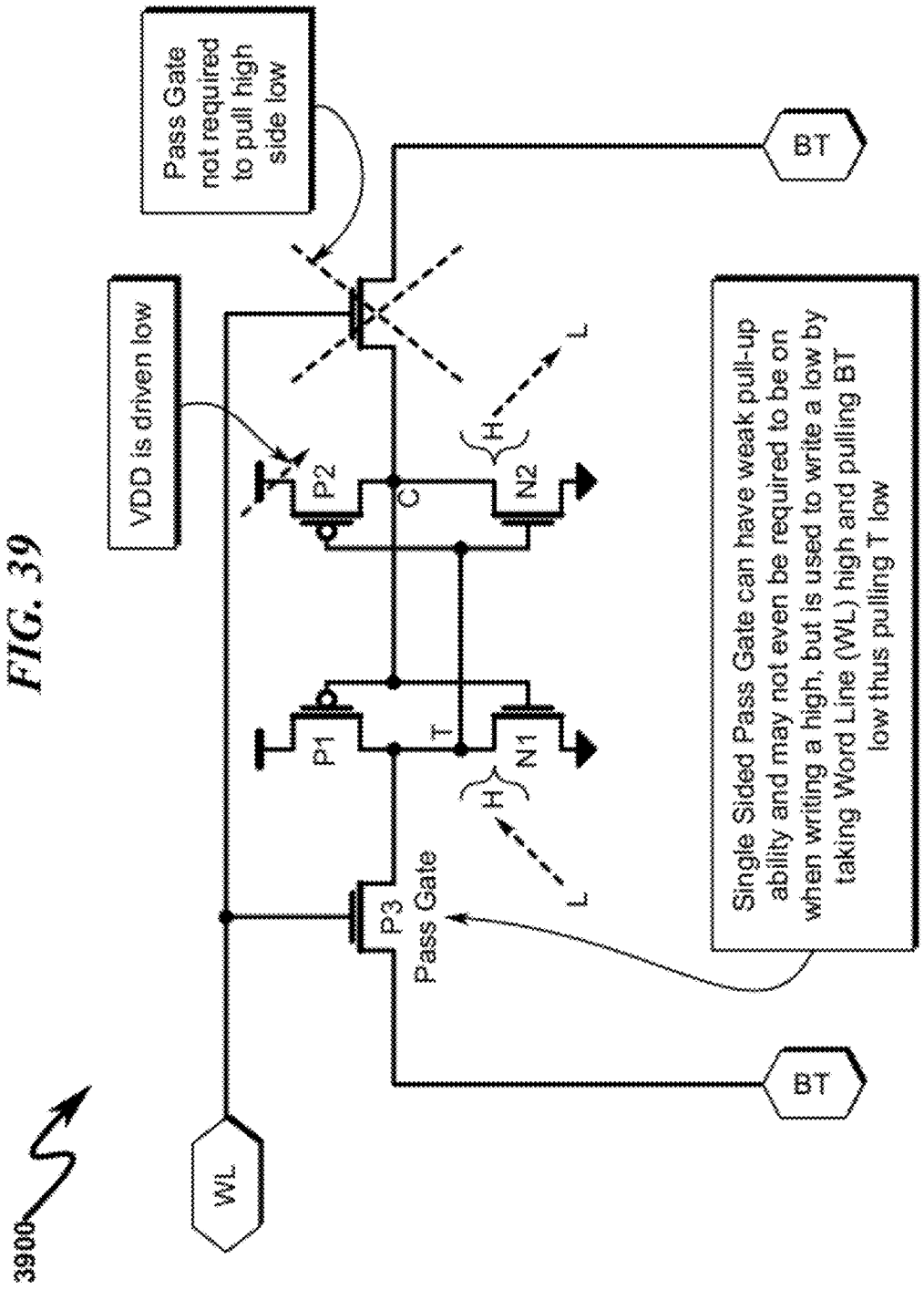
FIG. 39 illustrates an embodiment of writing a high against a stored low.
Figure 40:
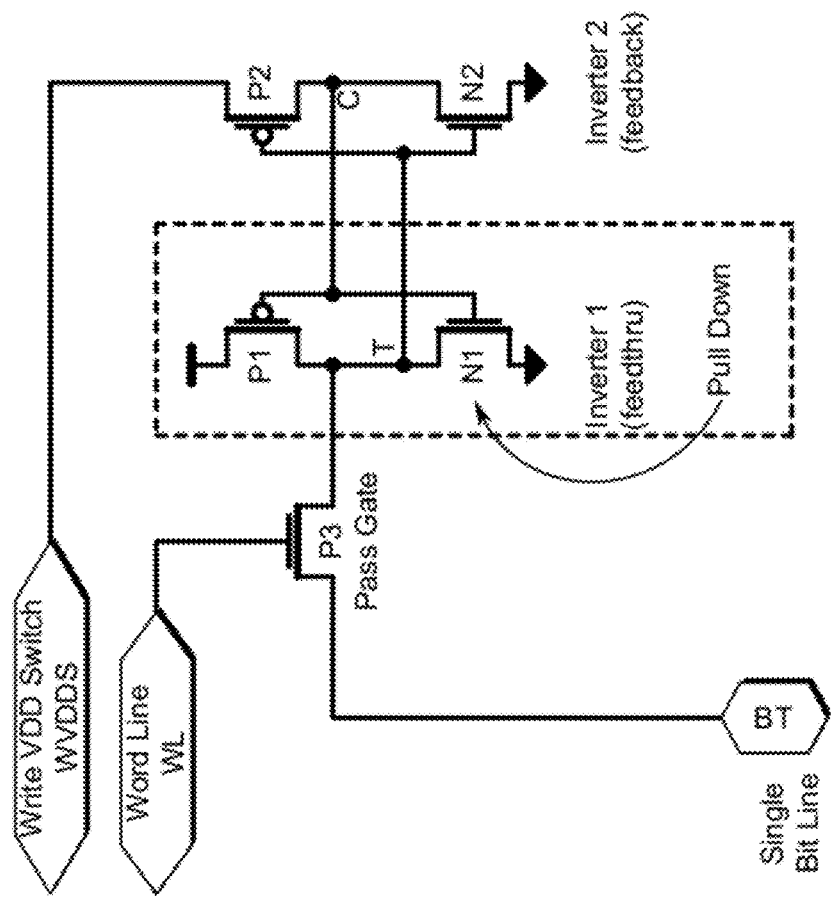
FIG. 40 illustrates a 5T memory cell utilizing switched VDD with a single pass gate.
Figure 41:
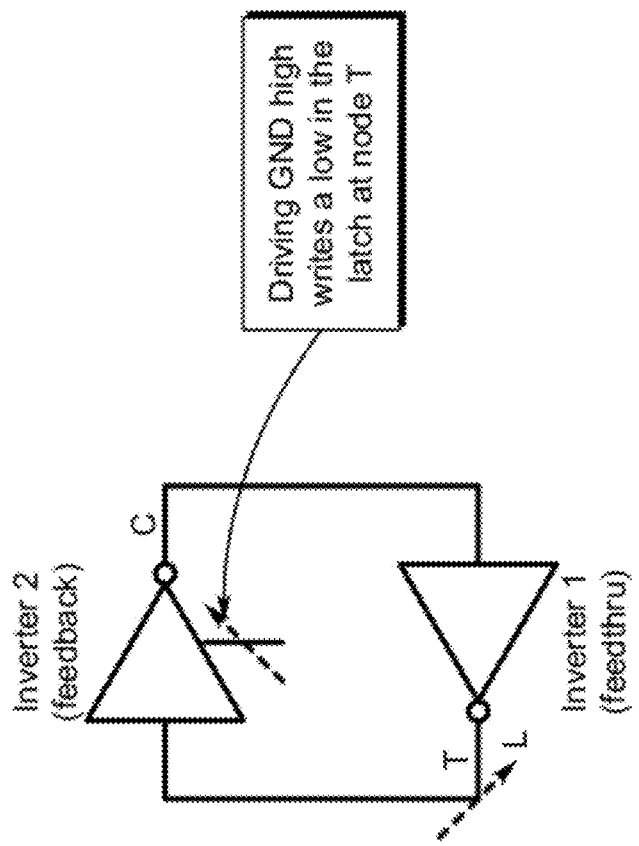
FIG. 41 illustrates driving ground high forces a low on node T of the latch.
Figure 42:
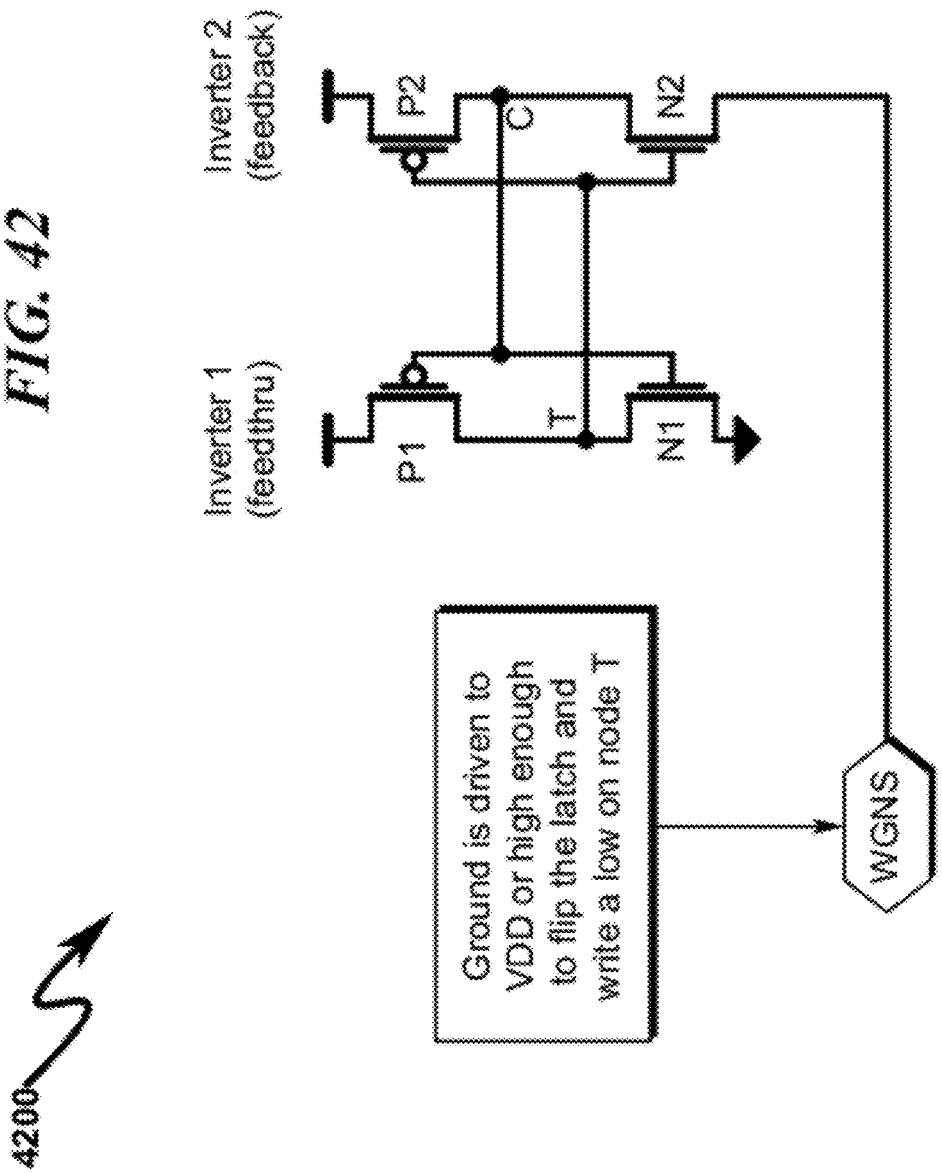
FIG. 42 illustrates a transistor level schematic of latch utilizing switched ground.

Reading and writing the memory cell latch has traditionally been achieved through additional circuitry that either passes the state of the latch out to be read or forces a high or a low onto the internal nodes of the latch (true (T), complement (C)) to the desired state of either a high or a low. An important embodiment is the ability to accomplish writing the more difficult state, such as a high in this case, even with weak interface circuitry, without requiring any involvement by the Interface Circuitry or in another embodiment minor assistance. This means that the issues with the N-channel Pass Gate losing drive as it pulls up and the conflicting need for it to have weak drive relative to the Pull Down to prevent READ DISTURB are eliminated. Writing the more difficult state is achieved by switching the power to the inverter to the opposite voltage such as, driving VDD to Ground or driving Ground to VDD on one of the two inverters in the latch then returning it back to the supply power voltage.
Generalized Latch Write (3700)
Writing a high in the latch through switching VDD low is generally illustrated in FIG. 37 (3700).
Latch Write Detail (3800)
FIG. 38 (3800) illustrates a detailed implementation of the VDD latch write.
Switched VDD Latch Overcomes Latch Writing Difficulty (3900)
The difficulty in writing a high in the traditional 6T memory cell shown in FIG. 18 (1800) is eliminated with the switched VDD embodiment generally illustrated in FIG. 39 (3900). This configuration eliminates the need to have a second Pass Gate that accesses the high side thus allowing for single-sided write and removes the conflicting constraints of READ DISTURB vs. write-ability thereby, improving DFM.
Exemplary 5T Memory Cell with VDD Write (4900)
As mentioned previously, writing a low is easy, because the N-channel has full drive strength (VGS=VDD) and therefore, can pull low against, the P-channel device P1. P1 can also be sized to have less drive than the Pass Gate to aid in writing a low. The embodiment of the 5T memory cell is illustrated in FIG. 40 (4000) and is discussed in a later section.
Exemplary 5T Memory Cell with VSS Write (4100)
In another preferred embodiment switching GNU high can write a low ("0") into the memory cell as generally illustrated in FIG. 41 (4100). This would be the desirable approach if the interface circuitry has more difficulty writing a low. As an example, a P-channel Pass Gate would have difficulty pulling low, but can pull high with much more drive.
Exemplary 5T Memory Cell Detail with VSS Write (4200)
A preferred exemplary embodiment of the previously described VSS write memory cell is generally illustrated in FIG. 42 (4200). As seen from this and previous embodiments, the MULTI-WRITE embodiments are not limited to switching either the GND or VDD of the second (feedback) inverter. It can also be used instead on the first (feedthru) inverter based on the requirements and limitations to the interface circuitry that connects the true (T) and complement (C) nodes of the latch. Choosing to switch the power supply on the second (feedback) inverter or the first (feedthru) inverter will depend on what type of interface circuitry that is used and how it best interfaces with the internal nodes of the latch.

5T Memory Cell Summary (4300)

Figure 43:
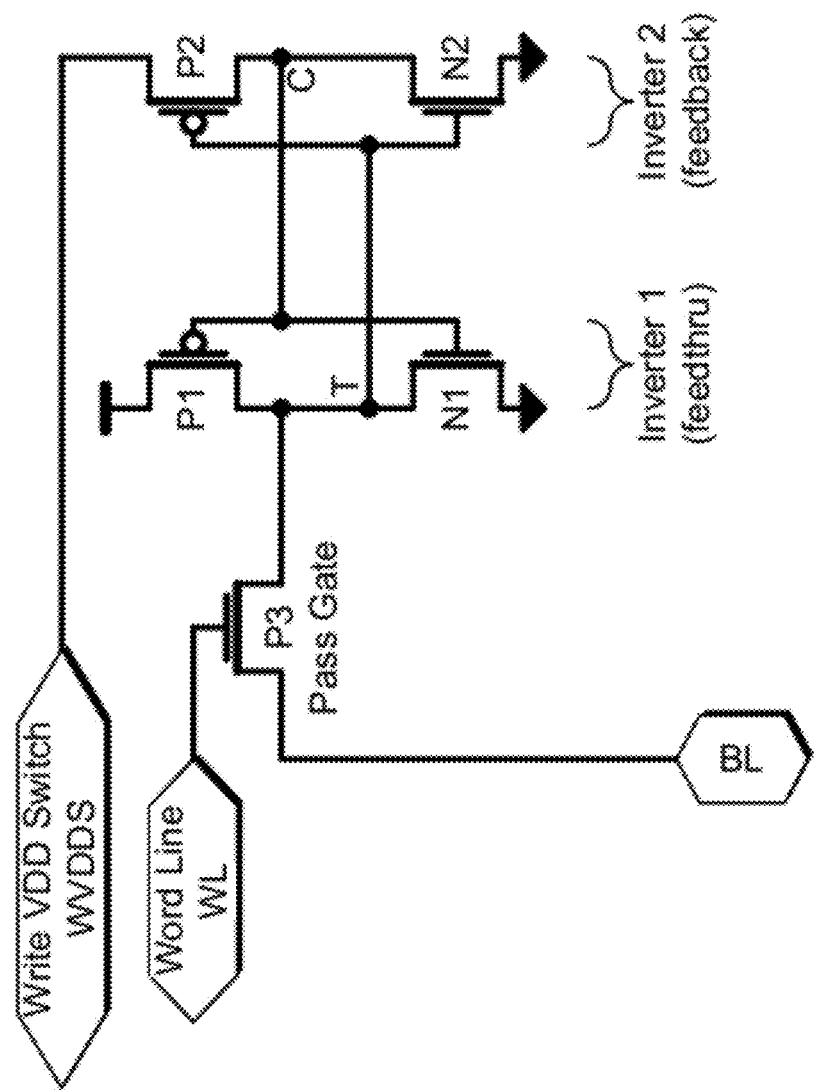
FIG. 43 illustrates 5T SRAM memory cell (bit cell) with single-sided access and switched VDD to second inverter.

The present invention discloses an embodiment referred to herein as MULTI-WRITE that makes writing the memory very easy, and in fact can be done with a single sided write where only one pass gate is required, thus reducing the number of transistors within the memory cell from 6 to 5. This also allows the memory cell to be adjusted more to prevent READ DISTURB without trading off write-ability by removing the conflicts between READ DISTURB and write. This 5T memory cell is illustrated in FIG. 43 (4300).

Some of the other preferred embodiments taught by the present invention include but are not limited to the following:
Easy One-Sided Write
TWO-STEP-WRITE;
Flexibility to use different Bit Line voltage levels and conditions during write and read;
Ability to write a high in the memory cell even if the Word Line is low thus keeping the Pass Gate off;
Array Implementation with Global Word mines;
Array Implementation with Group Word Lines;
Array dynamic and leakage power reduction which includes the flexibility to reduce the voltage swing on the Bit Lines.
Embodiments listed above may be implemented in memory arrays utilizing a Global Word Line as well as modified into memory arrays utilizing a Group Word Line.

These preferred embodiments will be discussed below, but are by no means limitive of the scope of the present invention.

One-Sided Write (MULTI-WRITE)

A major first step is to make the writing of the memory cell very easy without adding transistors that would make it bigger, and in fact can make the memory cell smaller by eliminating one of the transistors. Having the ability to write the memory cell without needing to consider READ DISTURB and its sizing issues of the Pull Down vs. the Pass Gate removes the tradeoff required between the conflicts of READ DISTURB vs. write. The one-sided write can be used in many different types of memory cells that include a latch to hold data such as Register Files, Single Port, Dual Port, Multiports, CAMs, and the like.

Figure 11:
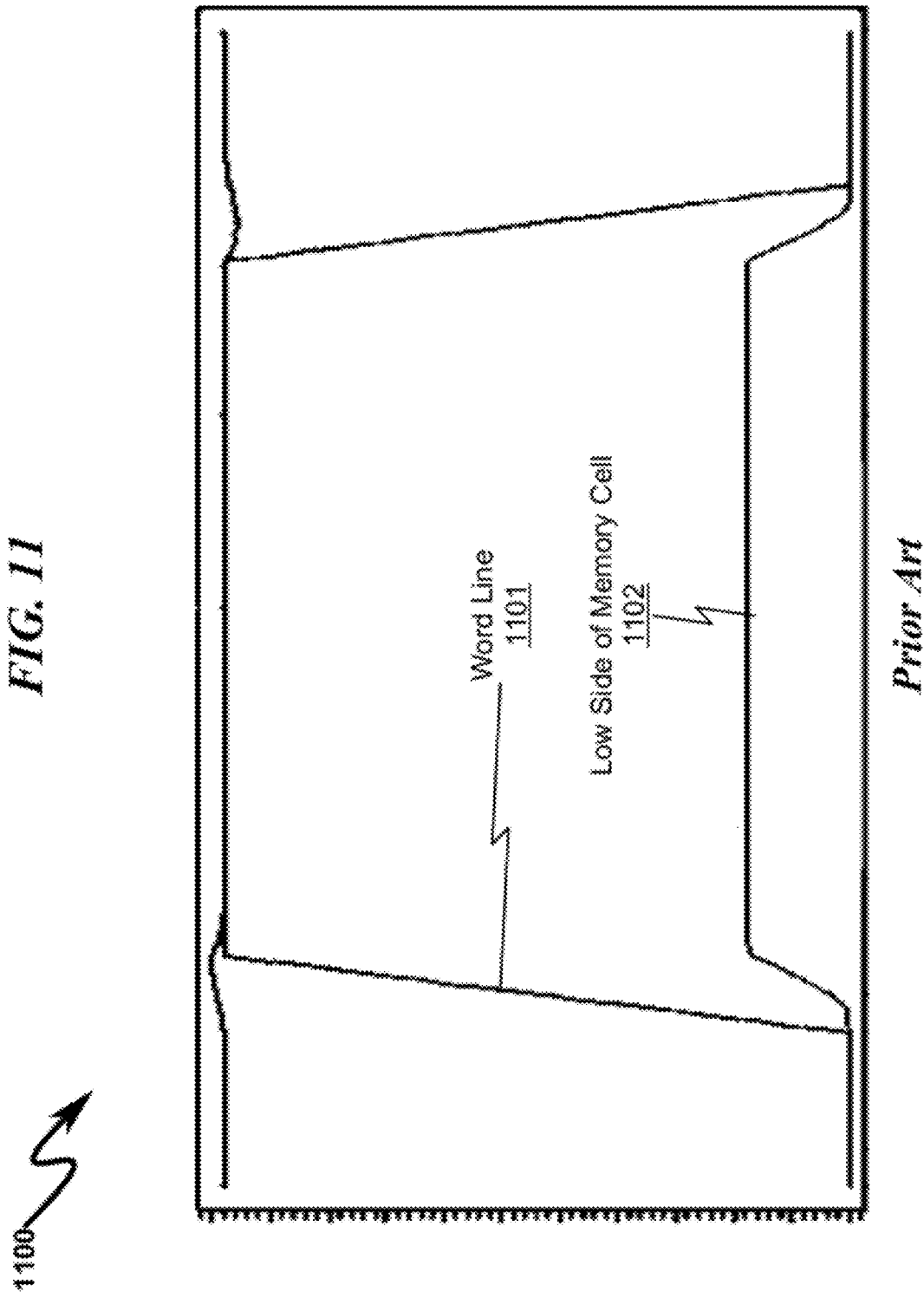
FIG. 11 illustrates internal memory cell waveforms of a 6T memory cell undergoing READ DISTURB behavior.
Figure 12:
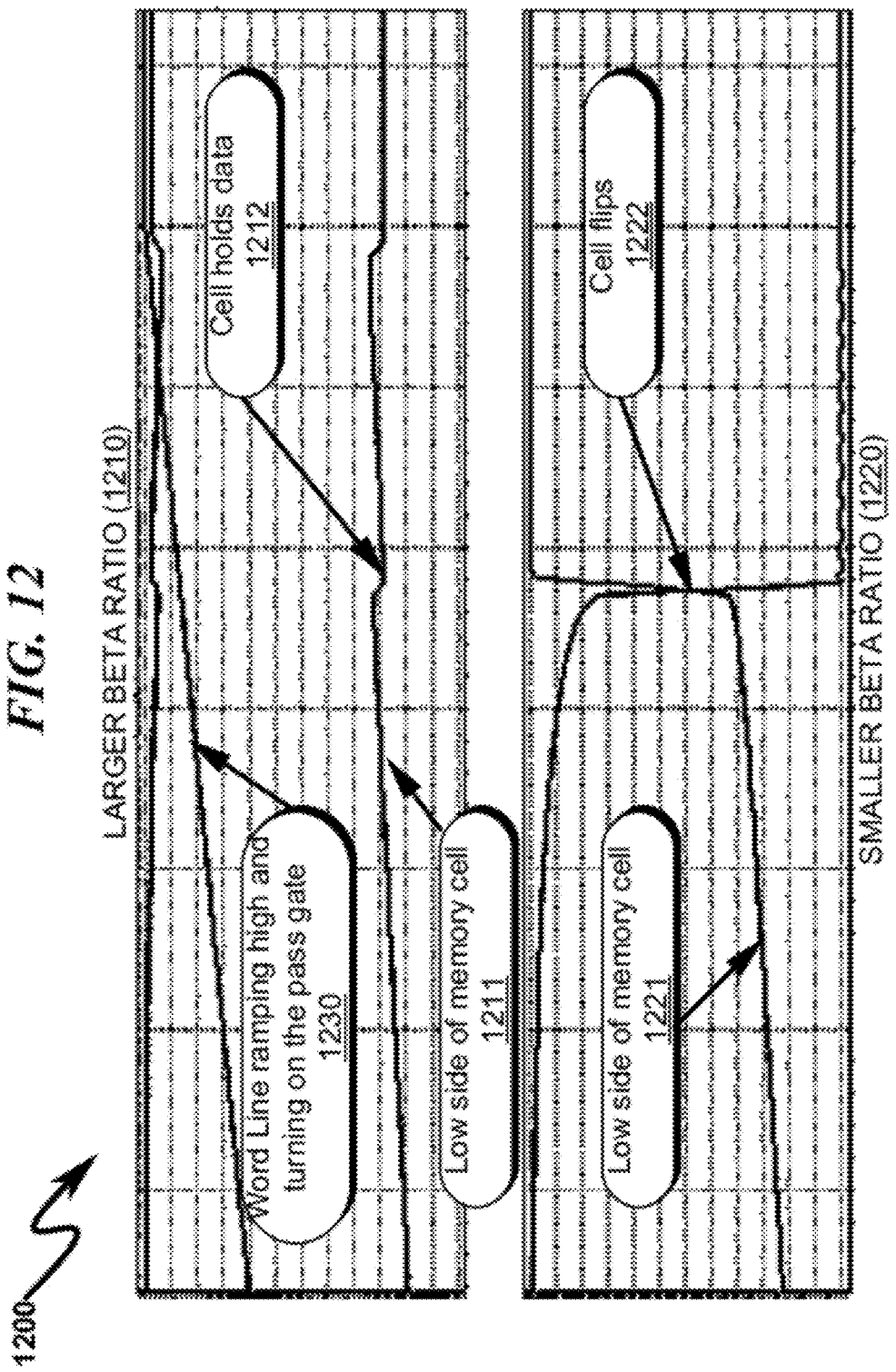
FIG. 12 illustrates the effect of varying BETA RATIOs within a 6T memory cell undergoing READ DISTURB behavior.
Figure 13:
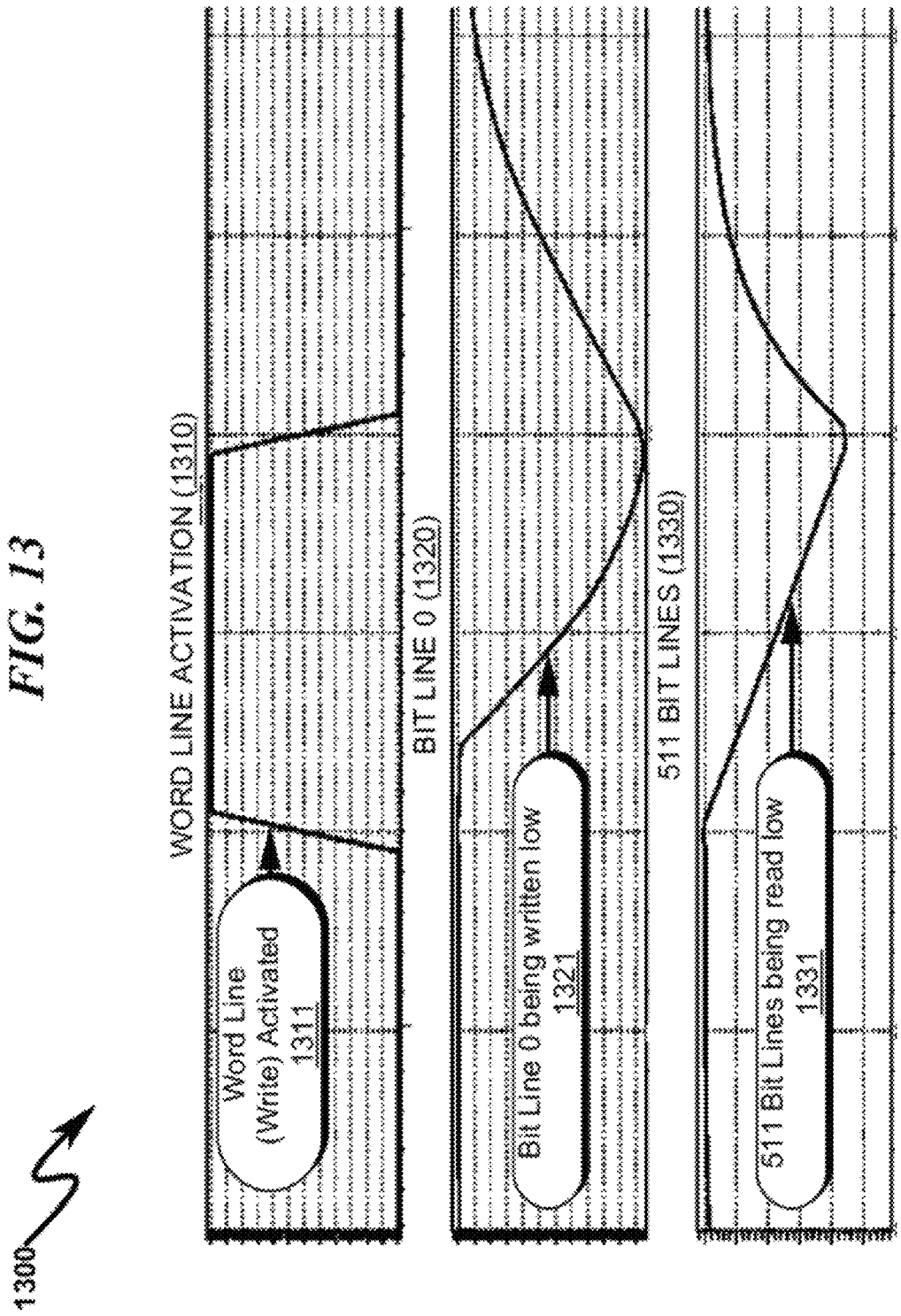
FIG. 13 illustrates a 1 Bit-Per-Word (BPW) memory cell write cycle with Bit Line 0 written low while all other 511 Bit Lines undergoing READ DISTURB behavior as they are being pulled low as if being read.
Figure 14:
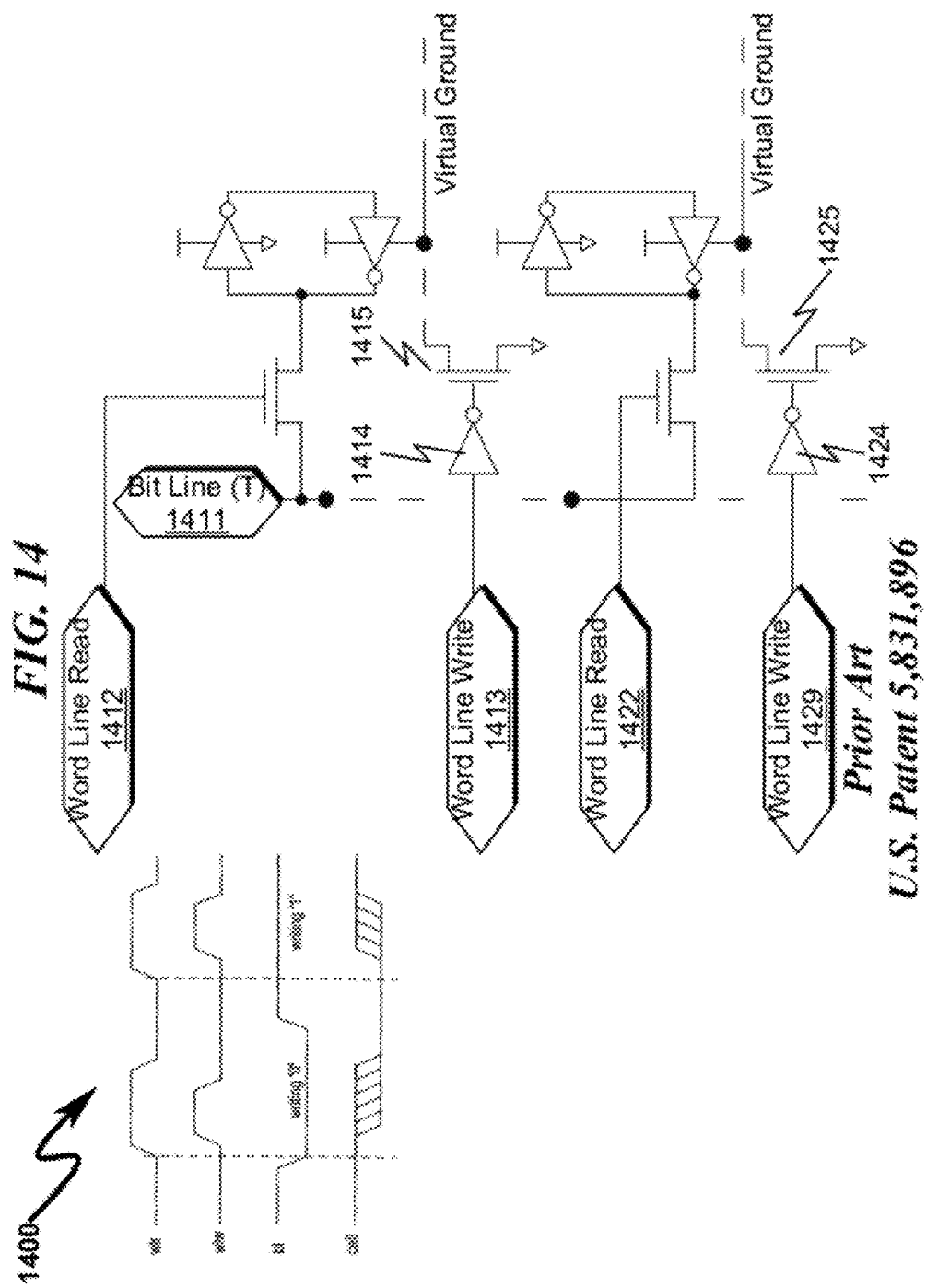
FIG. 14 illustrates a 5T memory cell incorporating single-ended/double-ended VDD switching as taught by U.S. Pat. No. 5,831,896.
Figure 15:
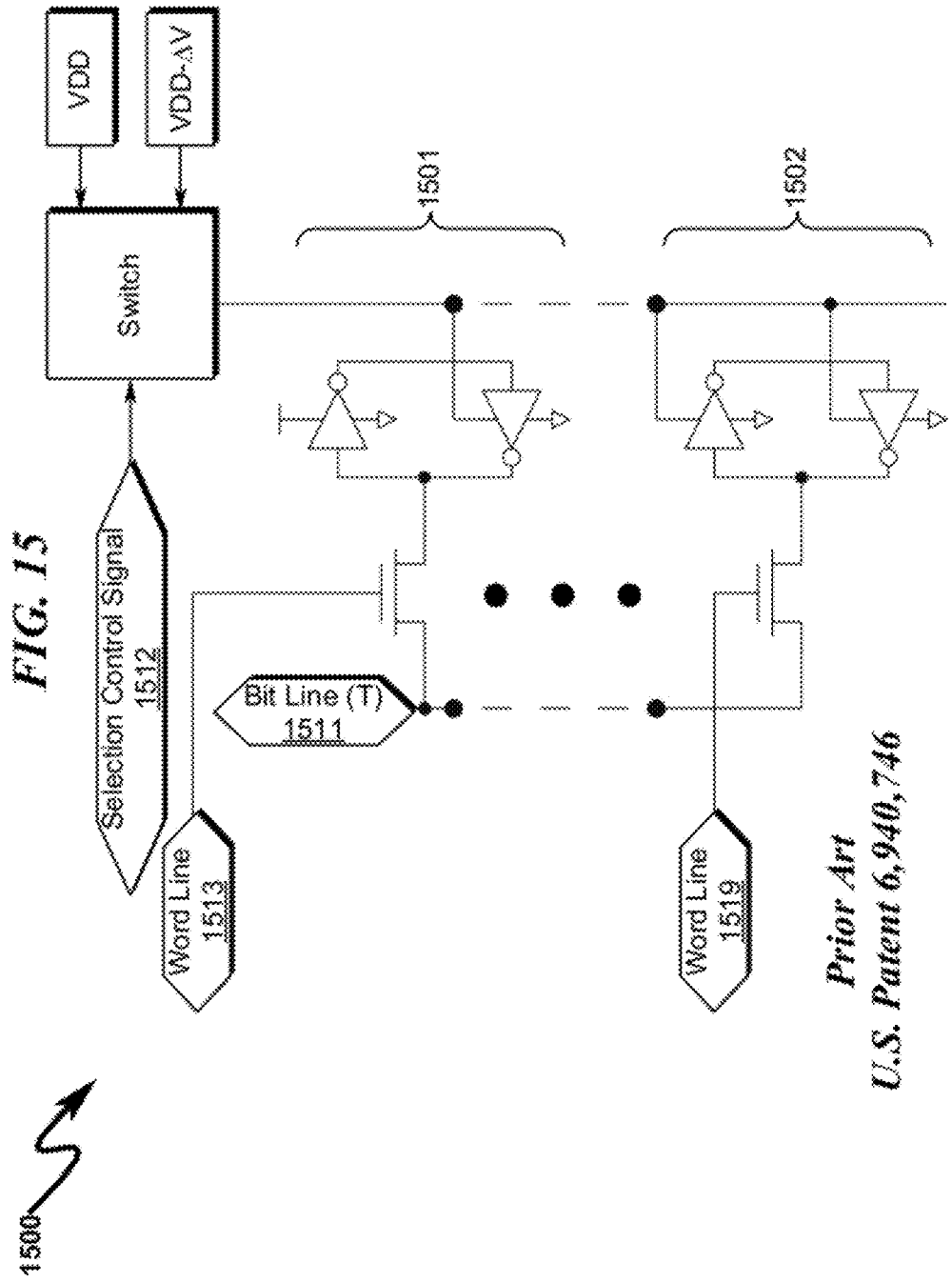
FIG. 15 illustrates a 5T memory cell incorporating single-ended/double-ended VSS switching as taught by U.S. Pat. No. 6,940,746.
Figure 16:
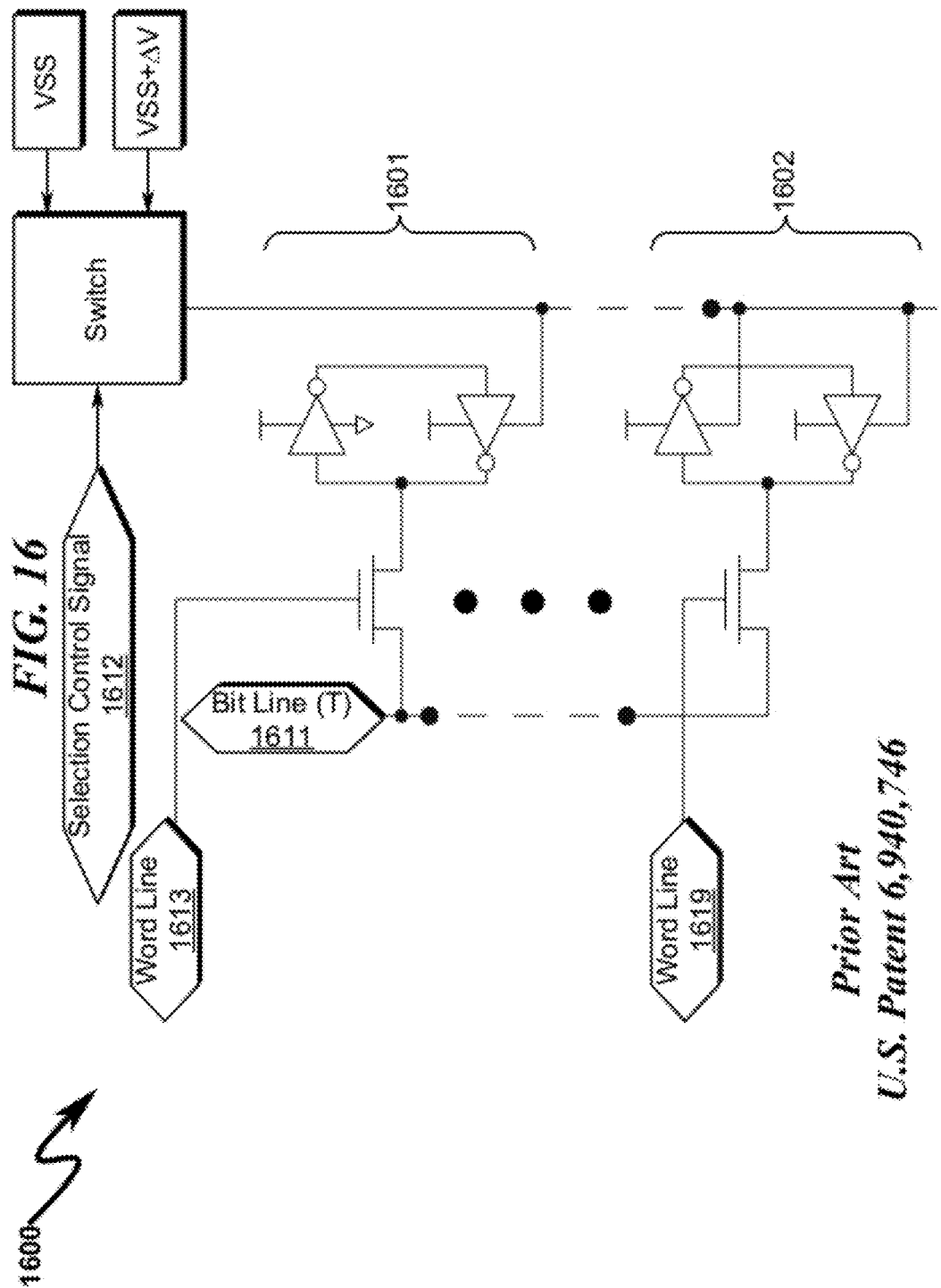
FIG. 16 illustrates 5T memory cell incorporating single-ended. VSS switching as taught by U.S. Pat. No. 5,831,896.
Figure 26:
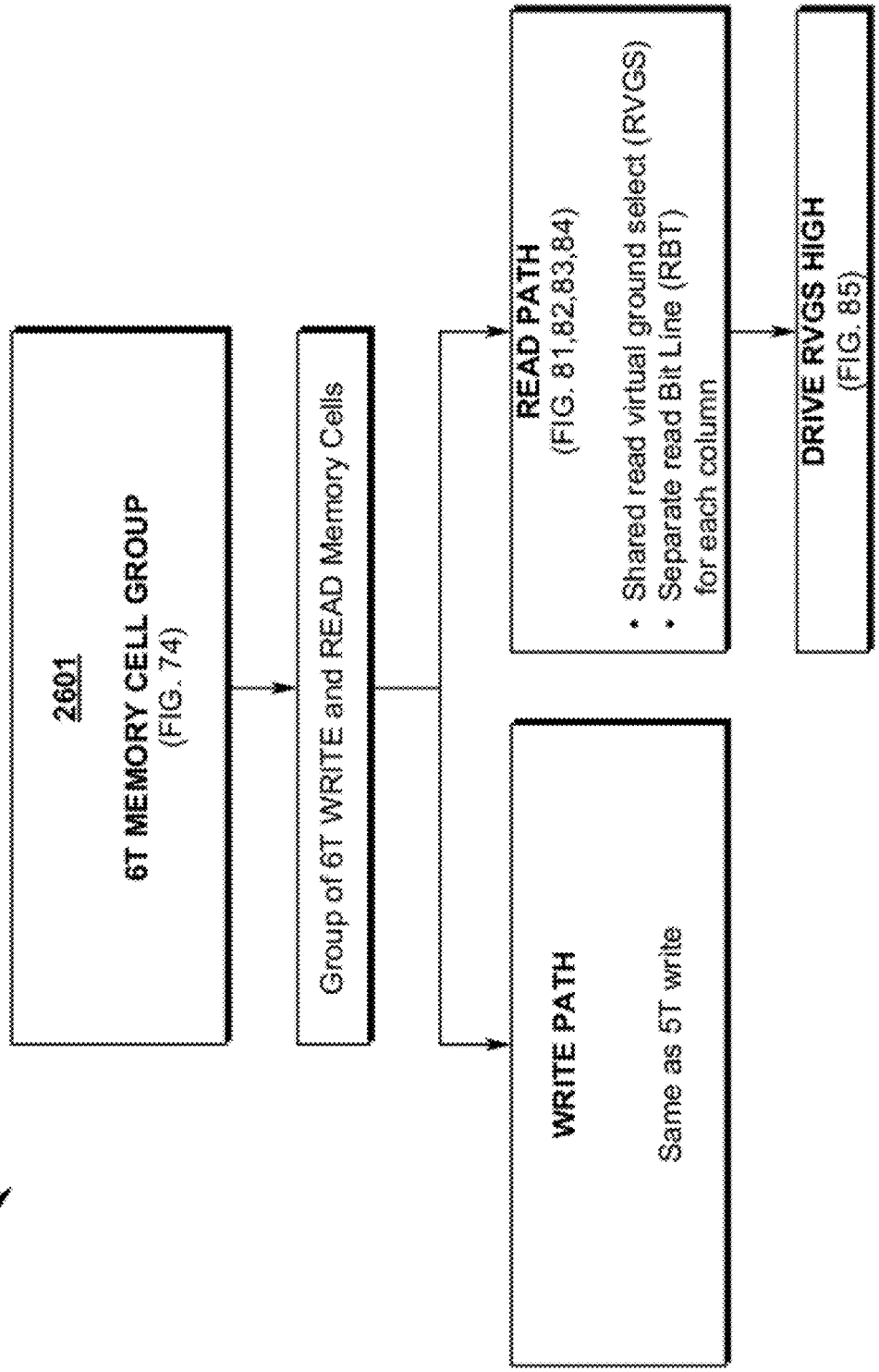
FIG. 26 illustrates a block diagram of an exemplary 6T memory cell group useful in some preferred embodiments of the present invention.

As mentioned in the Background Section, a single-sided write can't be done to the traditional 6T memory cell shown in FIG. 11 (1100), because there must be access to both the true and complement sides of the latch, and the only way a cell can be written in the traditional 6T SRAM memory cell is to pull the high side low when writing opposite data. This limitation is not present in the disclosed 5T SRAM memory cell, which has the ability of a single-sided write, thus eliminating the $2^{nd}$ pass gate. Therefore, an embodiment that uses a new method of writing a high into a memory cell that had a low previously stored is disclosed herein. This embodiment overcomes the limited pull-up ability of the N-channel pass gate since, by pulling its source high, it begins to turn itself off and therefore loses its drive strength. Also, it is limited by how high it can eventually pull which is the supply voltage (VDD) minus a N-channel threshold voltage (VTN) or (VDD−VTN) (VDD−VTN). The 5T memory cell with a virtual VDD switch on the inverter (Inverter 2) that is not connected to the Pass Gate for the write is illustrated in FIG. 26 (2600).

Storing a high in the memory cell, can be achieved simply by taking the virtual VDD (WVDDS) on inverter 2 low which in turn caused node t to go high if it is low or to remain high if a high was previously stored. This may not even require turning on the pass gate and accessing the state on the Bit Line, thereby creating alternatives for writing a high by using a method that drives the virtual VDD of inverter 2 low and/or using the state on the Bit Line to influence node C. Once this step is complete then the virtual source signal on inverter 2 can now be re-applied, thus holding the stored state high.

The opposite can be achieved by driving the ground of Inverter 2 high thus writing a low on node t. The point is that by just switching and driving the source of P2 low or the source of N2 high a low or a high can be written into the memory cell creating great flexibility as to how the memory cell can be written and making the write very easy.

Power gating the inverter that is not used to drive the Bit Line is desirable to switching a virtual, ground of inverter 1, because the path to pulling the Bit Line low during a read would have to go through 2 N-channel transistors thus requiring a much larger transistor switch to pull to ground on the shared virtual ground to prevent READ DISTURB.

The ability to write a high into the memory cell without having to have a full voltage swing on the Bit Line or even requiring that the Word Line be high to turn on the Pass Gate are additional embodiments. Writing the traditional memory cell required that there be a full voltage swing where both the bit true and bit complement Bit Lines are first pre-charged high to VDD then one side must be pulled all the way to ground to pull the high side low enough to flip the cell. Limiting the high voltage level required in this embodiment provides 2 very important benefits:

It reduces the array power that is burned during a write, because the delta voltage is much smaller thus reducing dv/dt.

Reduces the READ DISTURB that can occur on the rest of the memory cells along the row.

This creates great flexibility in lowering the high voltage on the Bit Line and/or reducing the drive strength of the Pass Gate. In fact, the design could be adjusted to substantially reduce the high voltage on the Bit Line especially if the Pass Gate remains off during the portion of the write when VDD is switched low for the initial step of writing a high. Keeping the Pass Gate off will prevent the lower high on the Bit Line from actually impeding the transition to a high on internal node of the latch (t in this case). Reducing the high voltage on the Bit Line can allow for the possibility to greatly reduce the power due to the voltage swing on the Bit Lines.

Writing a low through the Pass Gate is easy, because pulling the Bit Line to ground will pull the source of the Pass Gate to ground, and since it is an N-channel transistor, it will be able to pull node t to ground with good drive to overcome the P-channel of the inverter which can be sized to have reduced drive if necessary.

Exemplary Memory Cell Writing High when Low Previously Stored (4400)

Figure 44:
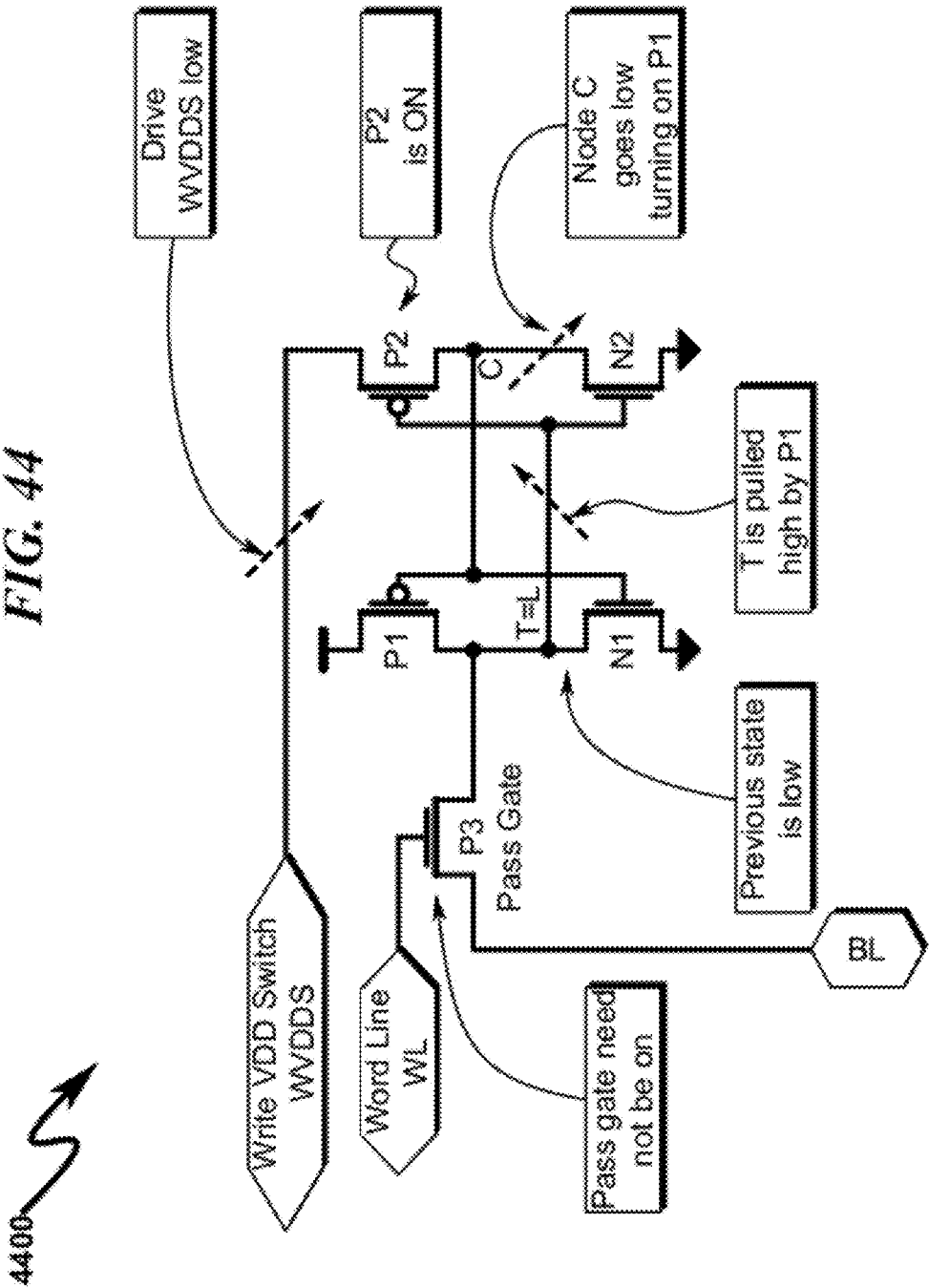
FIG. 44 illustrates writing a high when previous stored state was low.

An example of writing a high when a low was previously stored is generally illustrated in FIG. 44 (4400).

Exemplary Memory Cell Writing High when High Previously Stored (4500)

Figure 45:
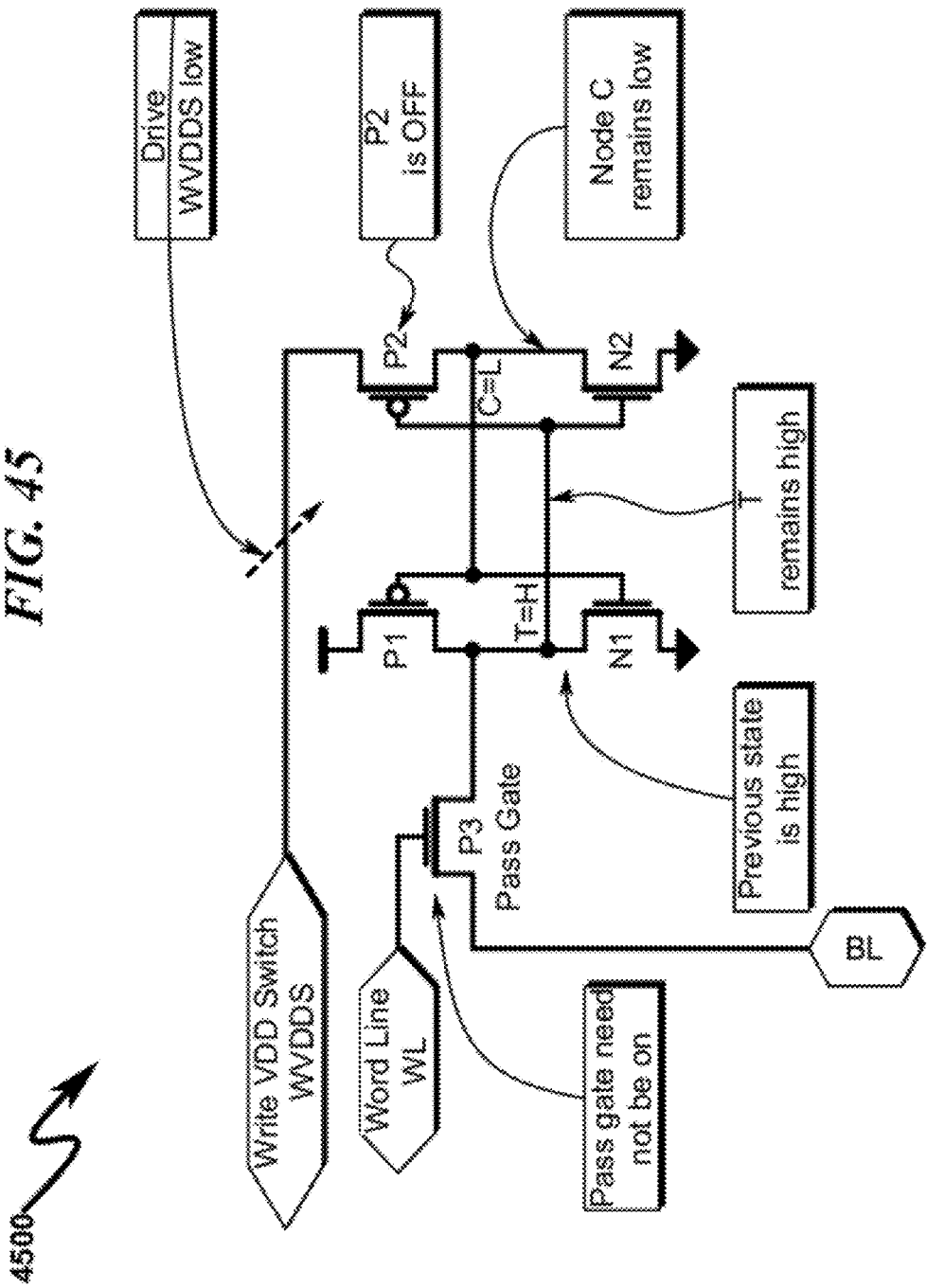
FIG. 45 illustrates writing a high when previous stored state was high.

An example of writing a high when a high was previously stored is generally illustrated in FIG. 45 (4500).

Memory Array Cells and Control Structure (4600)

Figure 46:
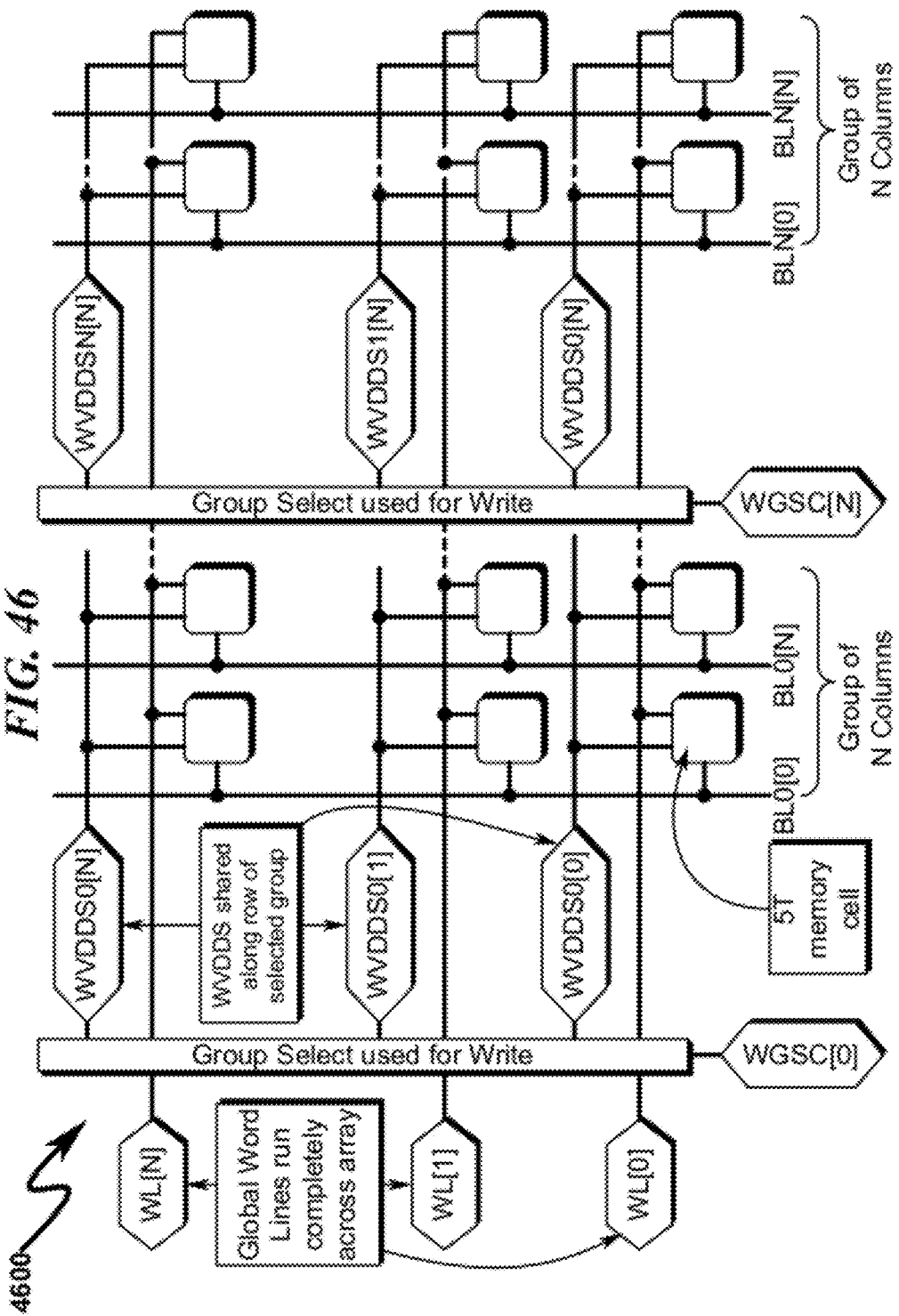
FIG. 46 illustrates an array of 5T memory cell with global word lines.

The circuits utilized to create the array of memory cells and its control by the Group Select circuitry are shown in FIG. 46 (4600) and following. Most of the initial drawings (FIG. 46 (4600)) and following) and the discussions below are based on the Global Word Line approach, but the approaches and designs can apply to the Group Word Line approach as well. An important point is that the MULTI-WRITE embodiment and its structure within the array opens up many avenues to adjust the design based on the process that it will be built in and the goal for that particular memory product.

The general array structure consist of stepping Groups in rows and columns where each group is made up of a group of memory cells controlled and selected, by a Group Select that is based on the logical combination of the selected Word Line and a group decode. The number of memory cells along the row within the group can vary depending on the design goal for the architecture. If the number of memory cells within a group are equal to the Bits Per Word (BPW) then a read-modify-write is not required, because every memory cell that is exposed to VDD being driven low are going to be written with the state dictated by the Data In pins. If the number of bits to be written are greater than the BPW then a read-modify-write or other methods can be used to rewrite the previously stored data back into the memory cells that were not intended to be written. This approach allows for more memory cells to be within a group than there are Bits Per Word which can reduce the number of group select, circuits that are required and thus reduce the physical size of the array.

A top level view of the array is generally illustrated in FIG. 46 (4600).

Group Select Decoder (4700)

Figure 47:
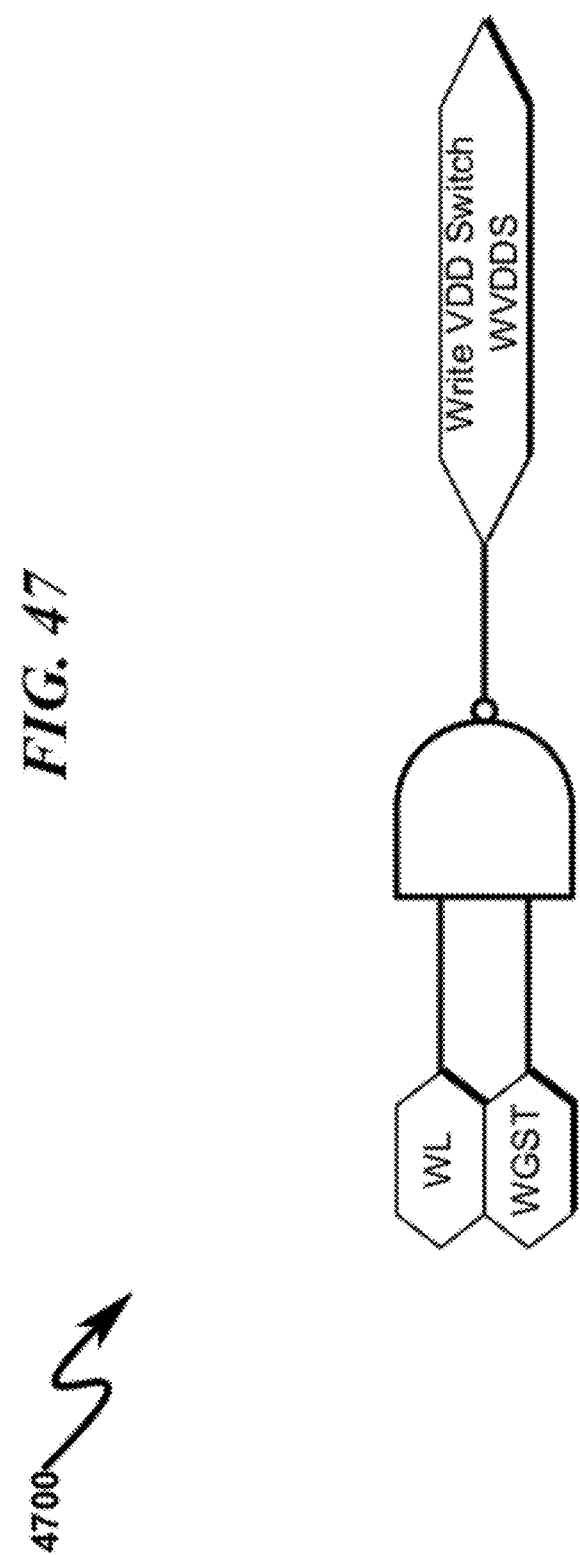
FIG. 47 illustrates group select decoder creates write VDD switch.

The Group Select Decoder that creates a write VDD switch is generally illustrated in FIG. 47 (4700). The Group Select circuitry for a write is the logical combination of the active Word Line (WL) and the particular group of columns to be accessed when a write occurs. Although, the schematic shown in FIG. 47 (4700) is a simple NAND gate, other arrangement of transistors could be used to achieve the same logical results.

Group Select Decoder Detail (4800)

Figure 48:
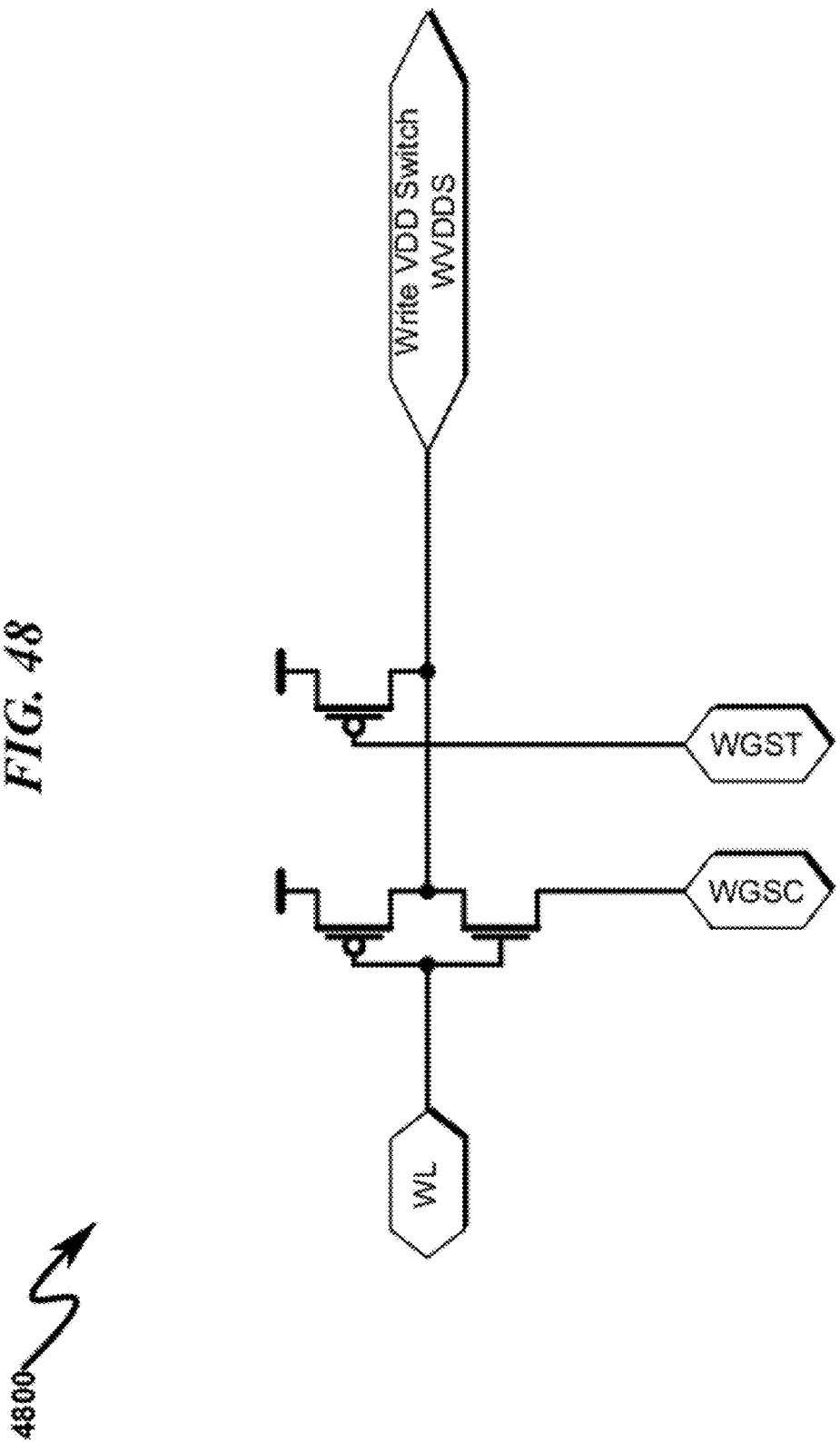
FIG. 48 illustrates transistor implementation of the group select circuit for creating WVDSS.

An exemplary 3-transistor Group Select Decoder detailed circuit implementation that creates a write VDD switch (WVDDS) is generally illustrated in FIG. 48 (4800).

Exemplary Memory Array Detail (4900)

Figure 29:
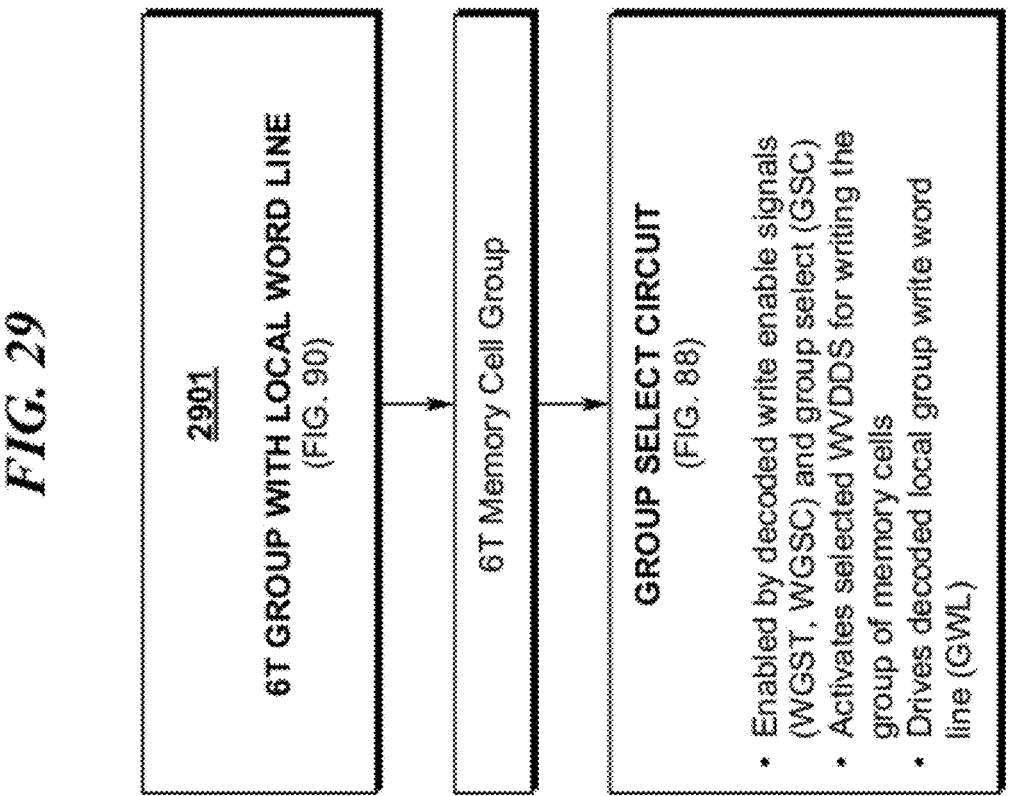
FIG. 29 illustrates a block diagram of an exemplary 6T group with local word line useful in some preferred embodiments of the present invention.
Figure 49:
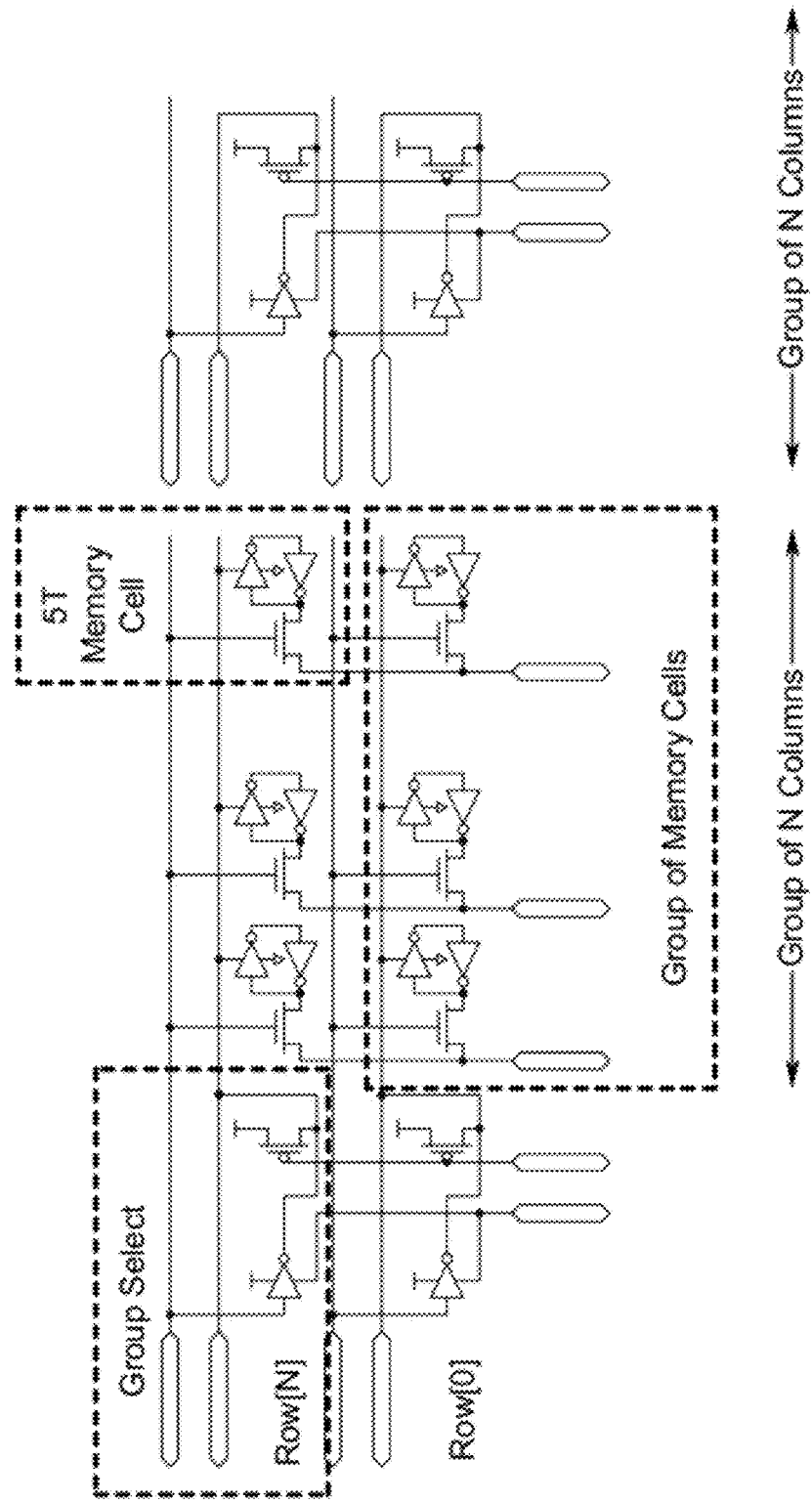
FIG. 49 illustrates internal transistors from array in FIG. 46.

An exemplary memory array implementing these VDD switching techniques is generally illustrated in FIG. 49 (4900) and illustrates the internal transistors for the icons in FIG. 29 (2900).

Memory Cell Access (5000)

Figure 50:
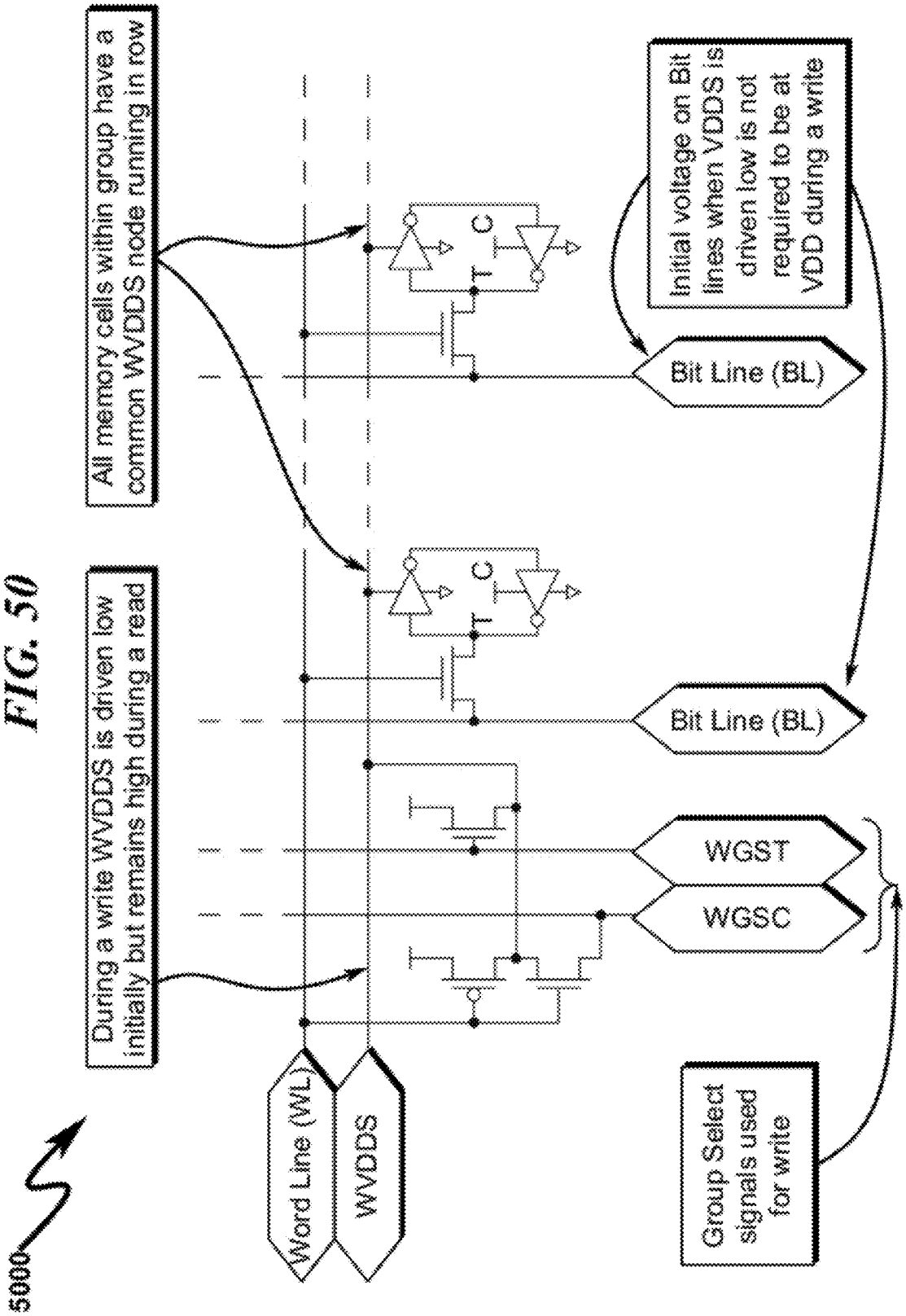
FIG. 50 illustrates schematic of single group of 5T memory cells.

An important element of many preferred embodiments is the method used to access the memory cell within the array. The connections and functions that are formed between the Group Select circuitry and the row of a group of memory cells are shown in FIG. 50 (5000). In this context, all virtual VDD nodes (WVDDS) within the selected group are shared and driven low when a write occurs, because every cell within the group will be written (A Read-Modify-Write technique or other techniques can be used for cases where it is desired to have a group that has more columns than the number of bits to be written). The WGS true (T)/complement (C) signals if decoded to be asserted are used during a write to drive WVDDS low during a write and to hold it high during a read.

Bit Line Current Path During WVDDS Low (5100)

Figure 51:
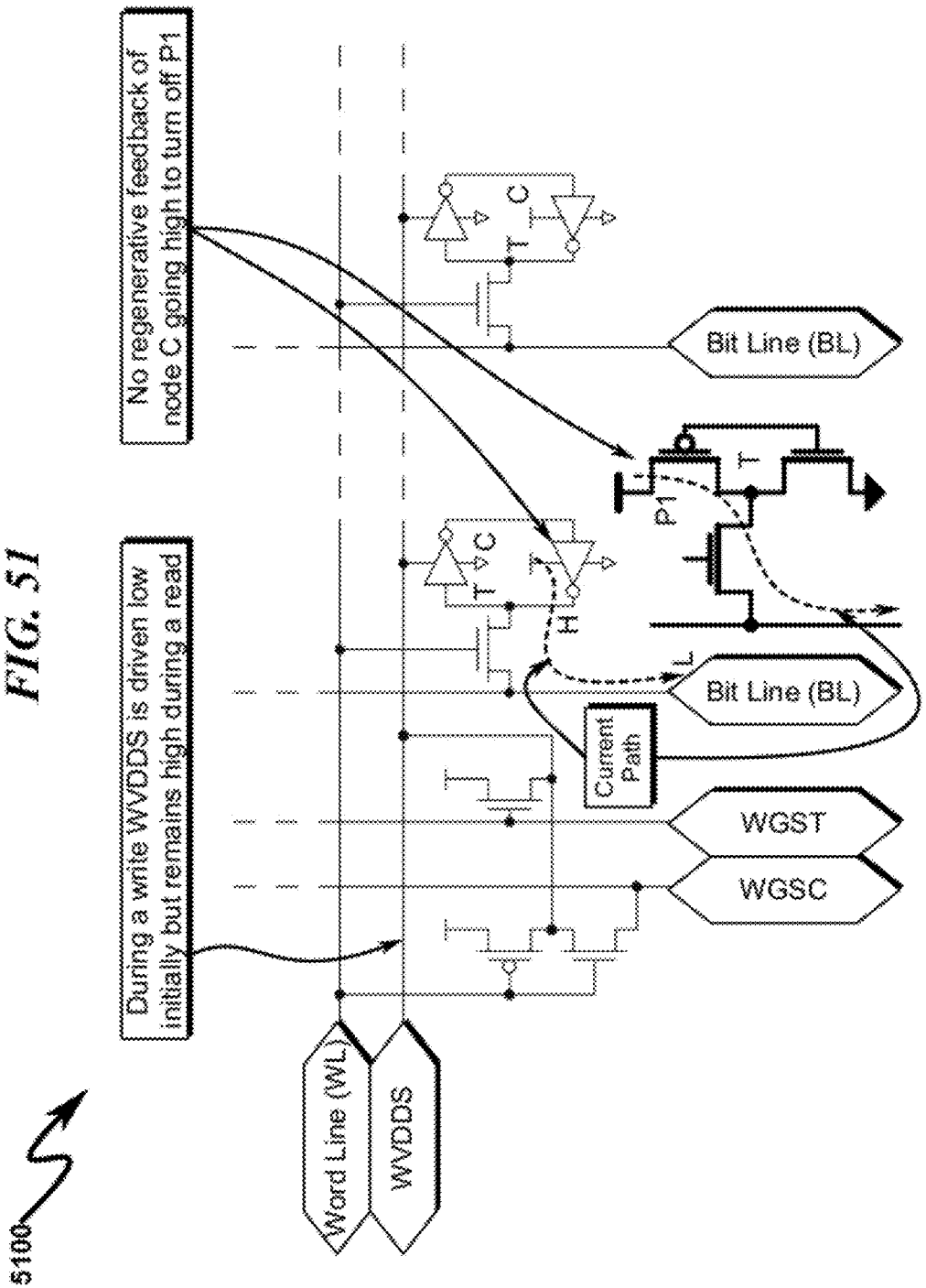
FIG. 51 illustrates current path if the bit line is driven low while WVDDS is driven low.

Pulling the Bit Line low at the same time that WVDDS is being driven low may briefly create unacceptable levels of power consumption. An example of this is illustrated in FIG. 51 (5100).

There are alternatives to the timing of the Bit Line vs. when WVDDS goes low at the start of a write. The Bit Line can be forced to its high or low state at the start when WVDDS is going low so that it will be ready to write as soon as possible. The brief current path illustrated in FIG. 51 (5100) may be an acceptable tradeoff if the highest priority is to have the write be as fast as possible.

TWO-STEP Write Waveforms (5200) (5300) (5400)

Figure 52:
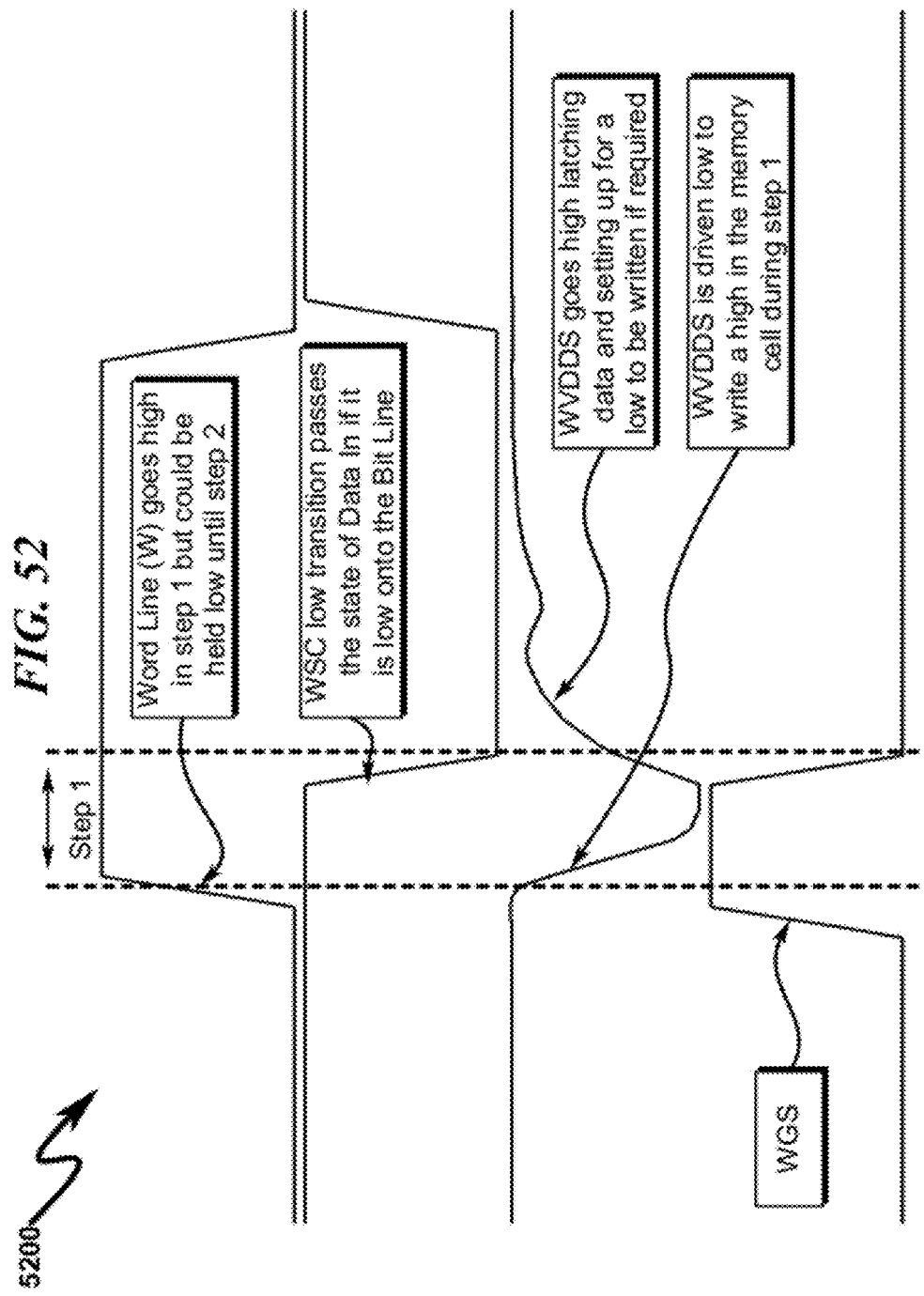
FIG. 52 illustrates waveforms demonstrating a TWO-STEP-WRITE with bit line pre-charged at VDD/2 which is used for a read.
Figure 53:
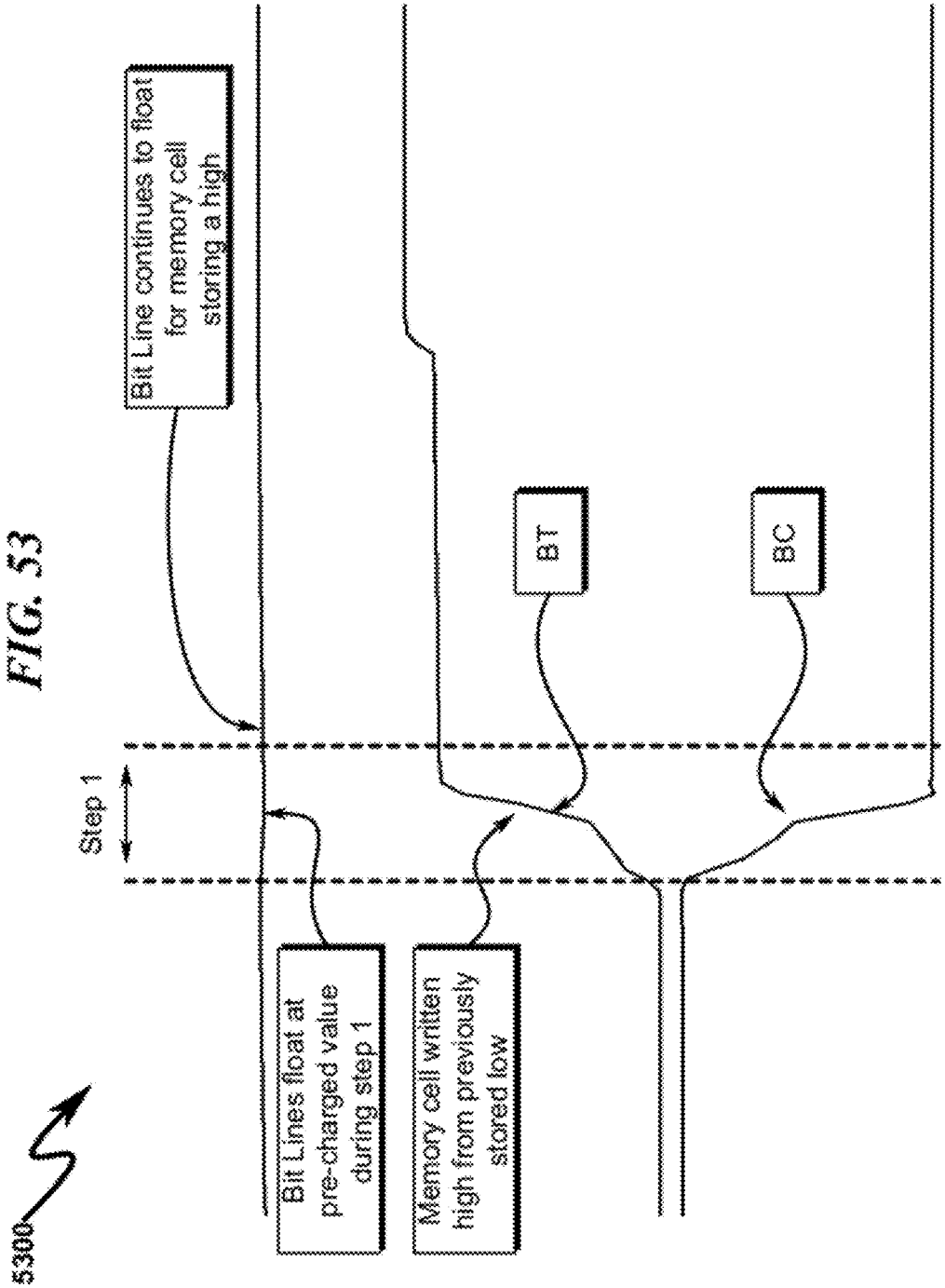
FIG. 53 illustrates waveforms demonstrating a TWO-STEP-WRITE with bit line pre-charged at VDD/2 which is used for a read.
Figure 54:
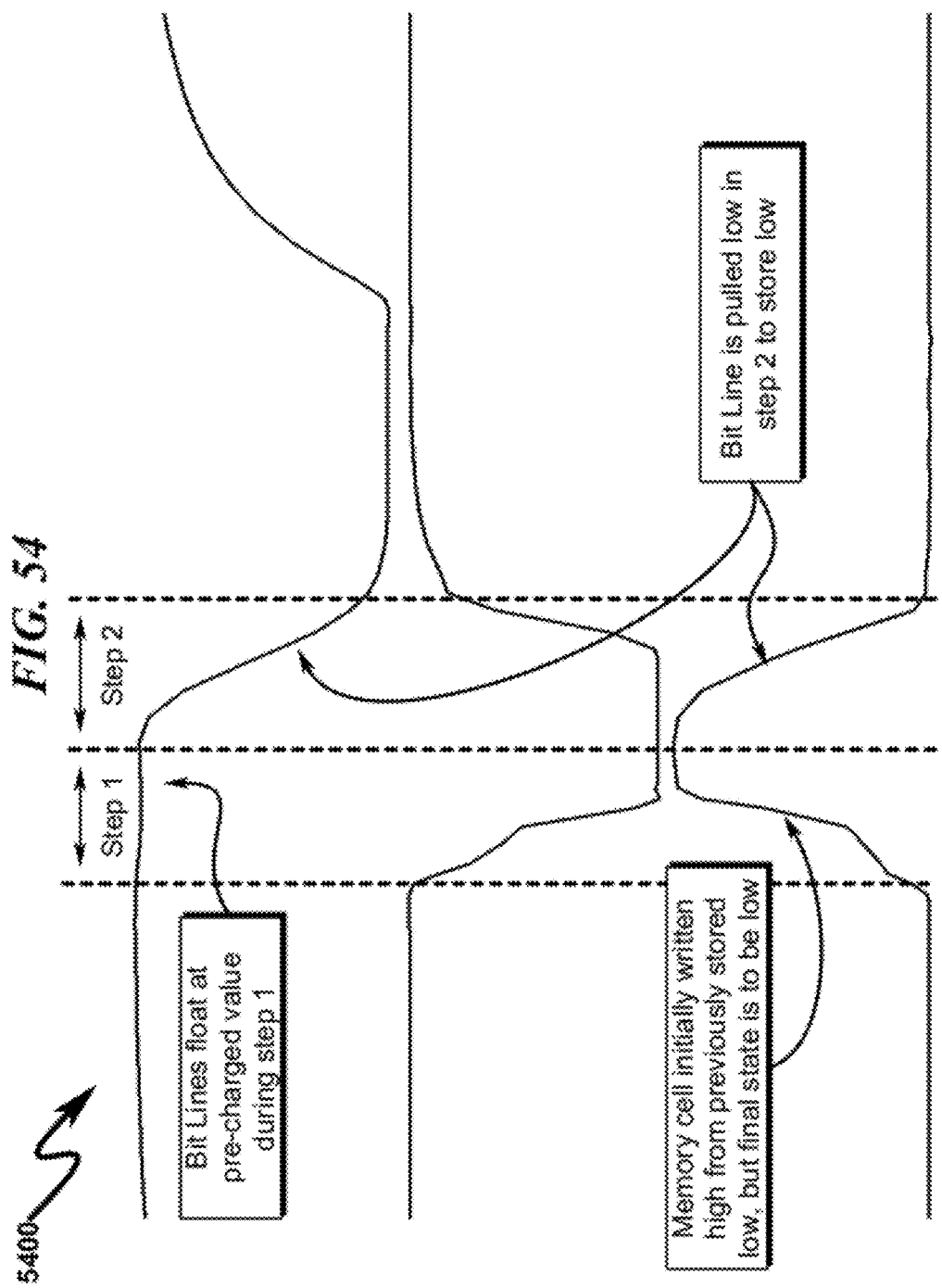
FIG. 54 illustrates waveforms demonstrating a TWO-STEP-WRITE with bit line pre-charged at VDD/2 which is used for a read.

This current path can be eliminated by either having a separate Word Line driving the Pass Gate that is low during the first portion of write when WVDDS is low or not pulling the Bit Line low until the first stage of the write is complete and WVDDS goes back high. The waveforms illustrated in FIG. 52 (5200), FIG. 53 (5300), and FIG. 54 (5400) show the latter which is another embodiment called a TWO-STEP-WRITE.

TWO-STEP Write Schematic (5500)

Figure 55:
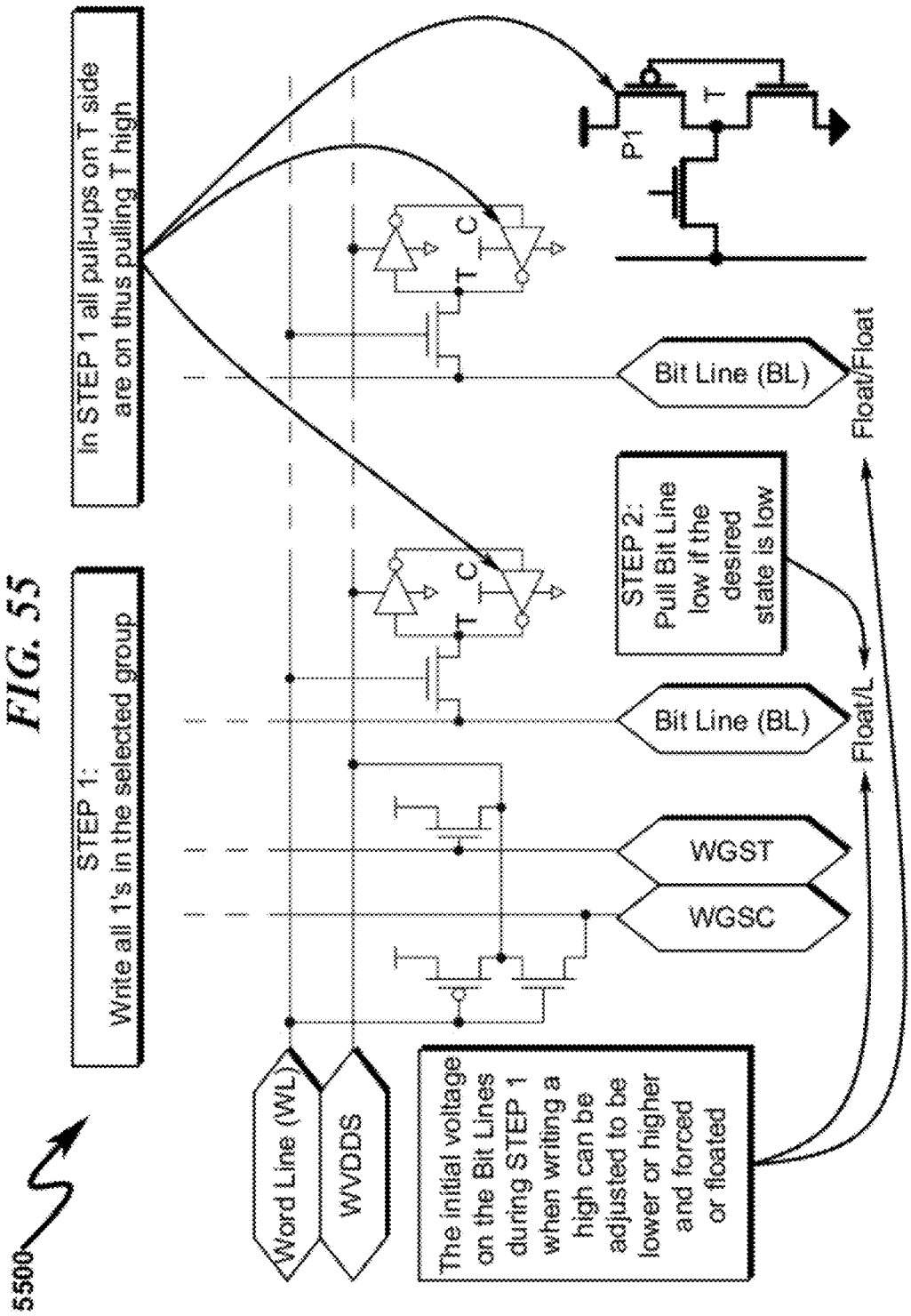
FIG. 55 illustrates an exemplary schematic circuit diagram of a single group demonstrating a TWO-STEP-WRITE with bit lines pre-charged to VDD/2.

As can be seen in the timing waveforms referenced in the previous section and schematic shown in FIG. 55 (5500), the only goal of step 1 of the TWO-STEP-WRITE is to write a high in every memory cell that shares WVDDS within the selected group by taking WVDDS low which doesn't necessarily require that the Bit Line be pulled all the way to VDD. In this example the Bit Lines float at the pre-charged value that is use for a read during step 1, but other values for the high voltage on the Bit Lines can be chosen based on the process and design goals.

Exemplary TWO-STEP Write Logic (5600)

Figure 56:
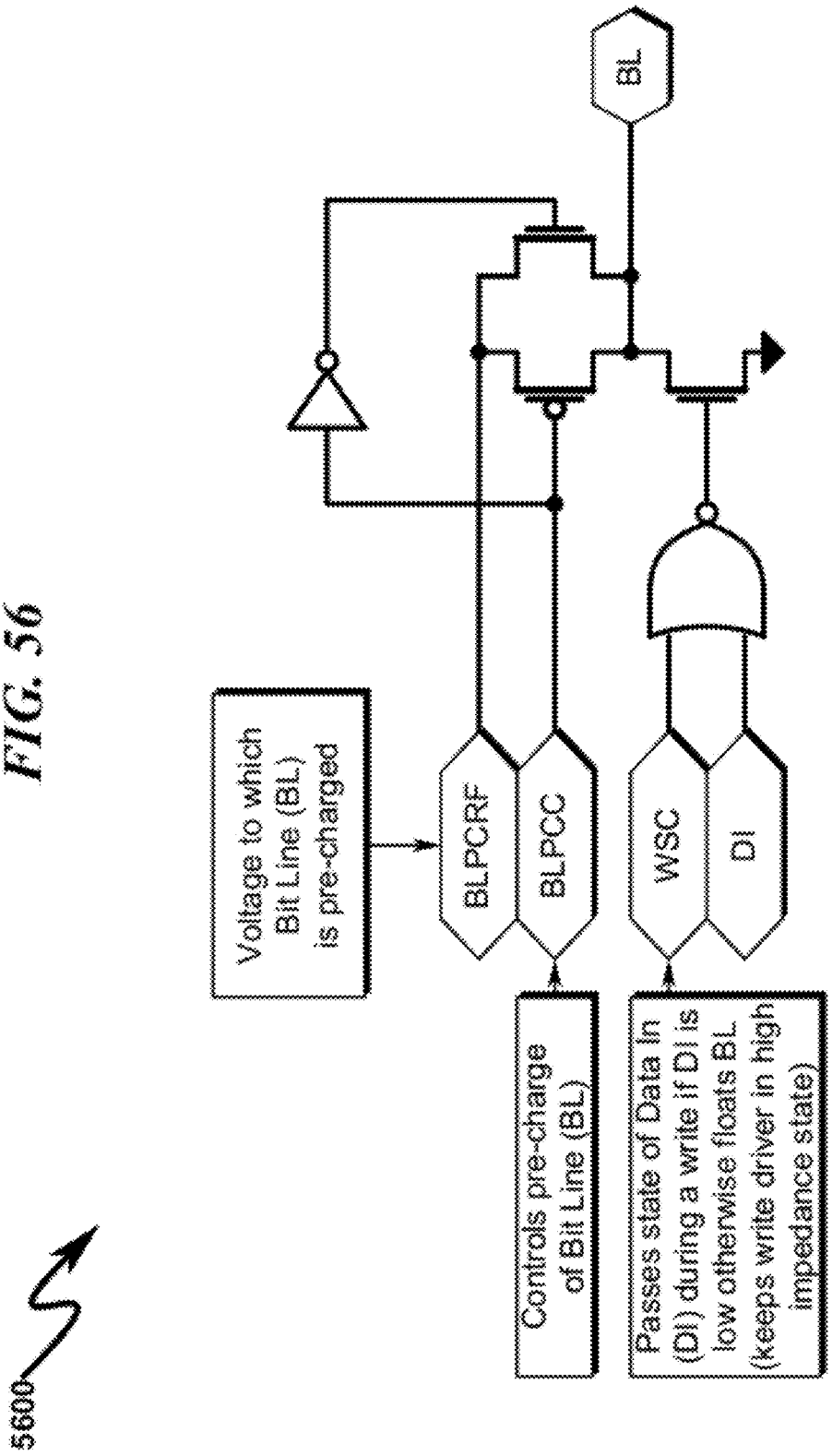
FIG. 56 illustrates an exemplary schematic circuit diagram that controls pre-charge of bit lines and passing data in (if low) onto bit lines during a write.

An example of a circuit that only pulls the Bit Line Low when Data In (DI) is low is generally illustrated in FIG. 56 (5600).

Alternative TWO-STEP Write Methodology (5700)

Figure 57:
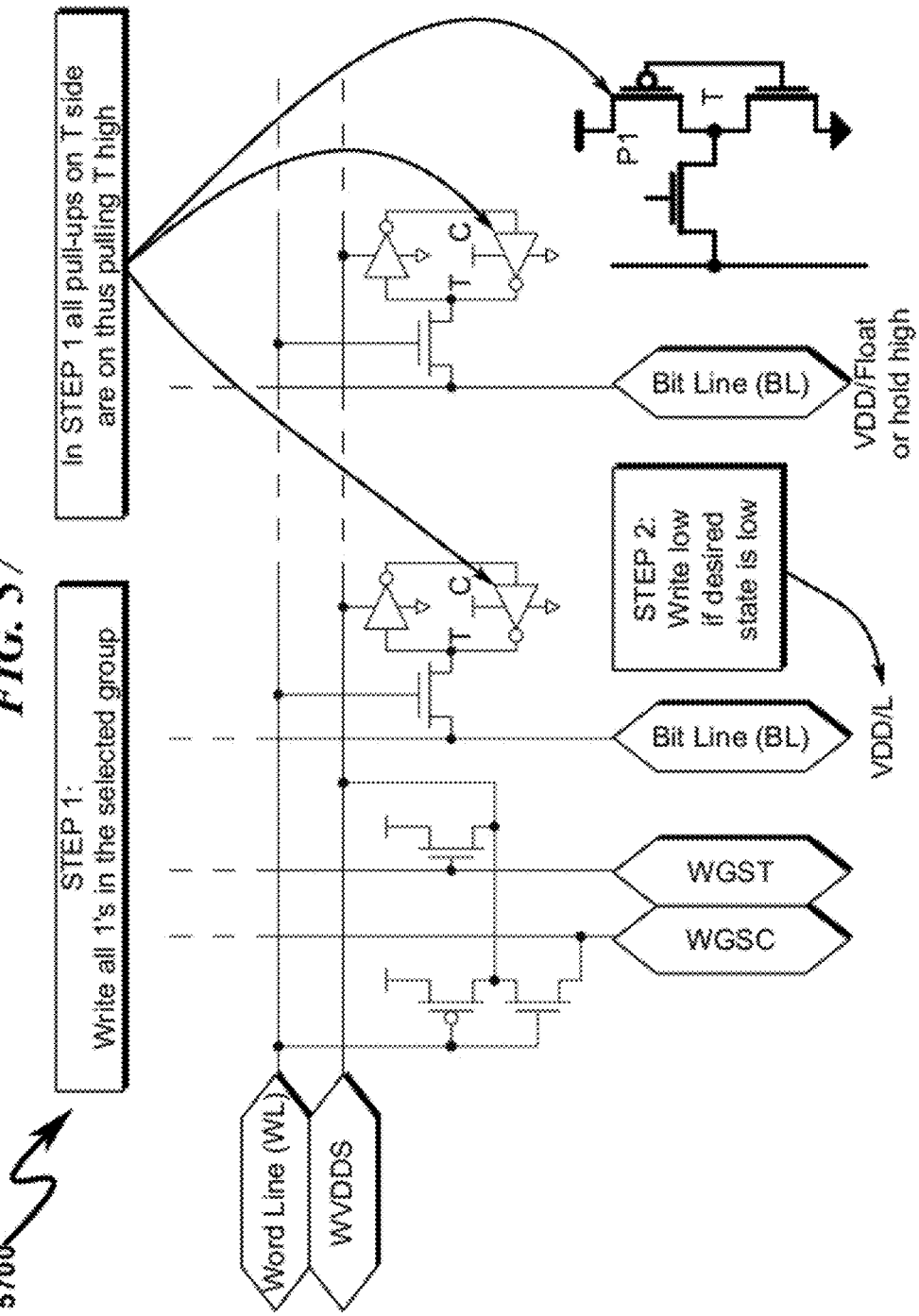
FIG. 57 illustrates an exemplary schematic circuit diagram of a single group demonstrating a TWO-STEP-WRITE with bit lines held at VDD during step 1

Another embodiment would be to drive and hold the Bit Lines high during step 1 to give maximum effect and speed of writing a high which may be necessary in some designs based on the worst case processes and conditions. Once a high is written, step 2 begins by pulling WVDDS back high and pulling the selected Bit Lines low that have a low required from the appropriate Data In. An example of forcing the Bit Line high to VDD during Step 1 is illustrated in FIG. 57 (5700).

Alternative TWO-STEP Write Methodology Waveforms (5800) (5900) (6000)

Figure 58:
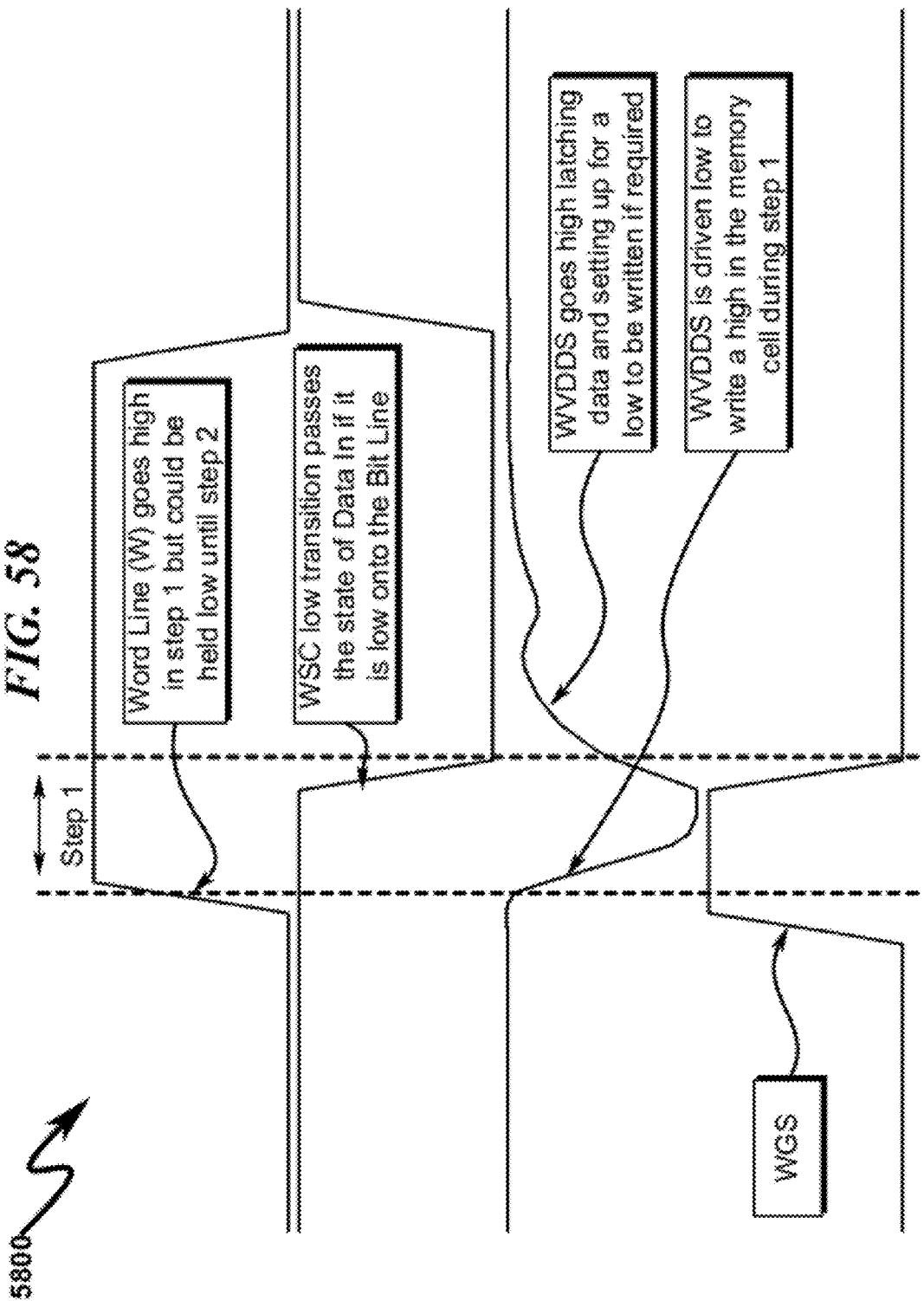
FIG. 58 illustrates waveforms demonstrating a TWO-STEP-WRITE with bit line held at VDD during step 1 of writing a high.
Figure 59:
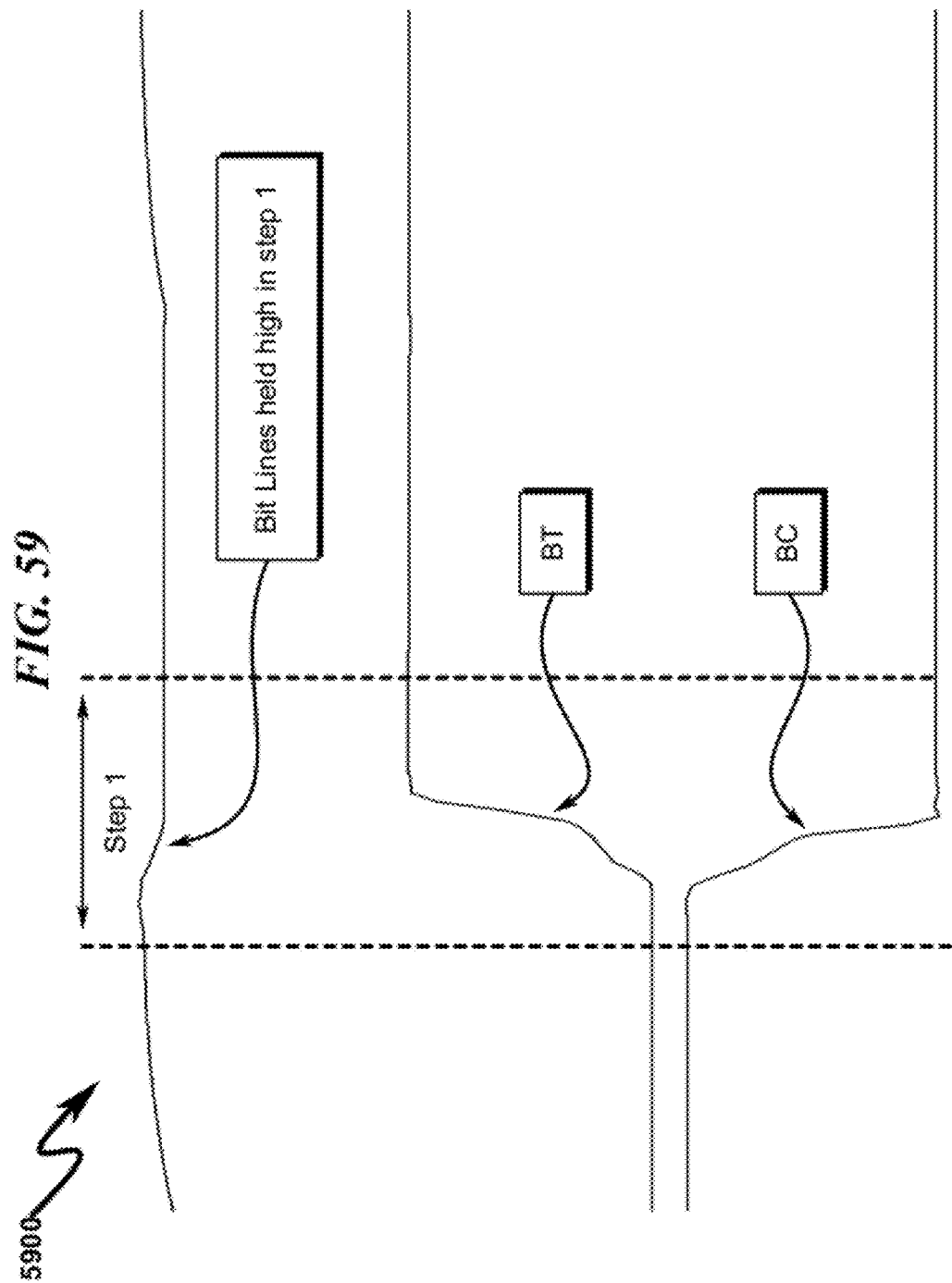
FIG. 59 illustrates waveforms demonstrating a TWO-STEP-WRITE with bit line held at VDD during step 1 of writing a high.
Figure 60:
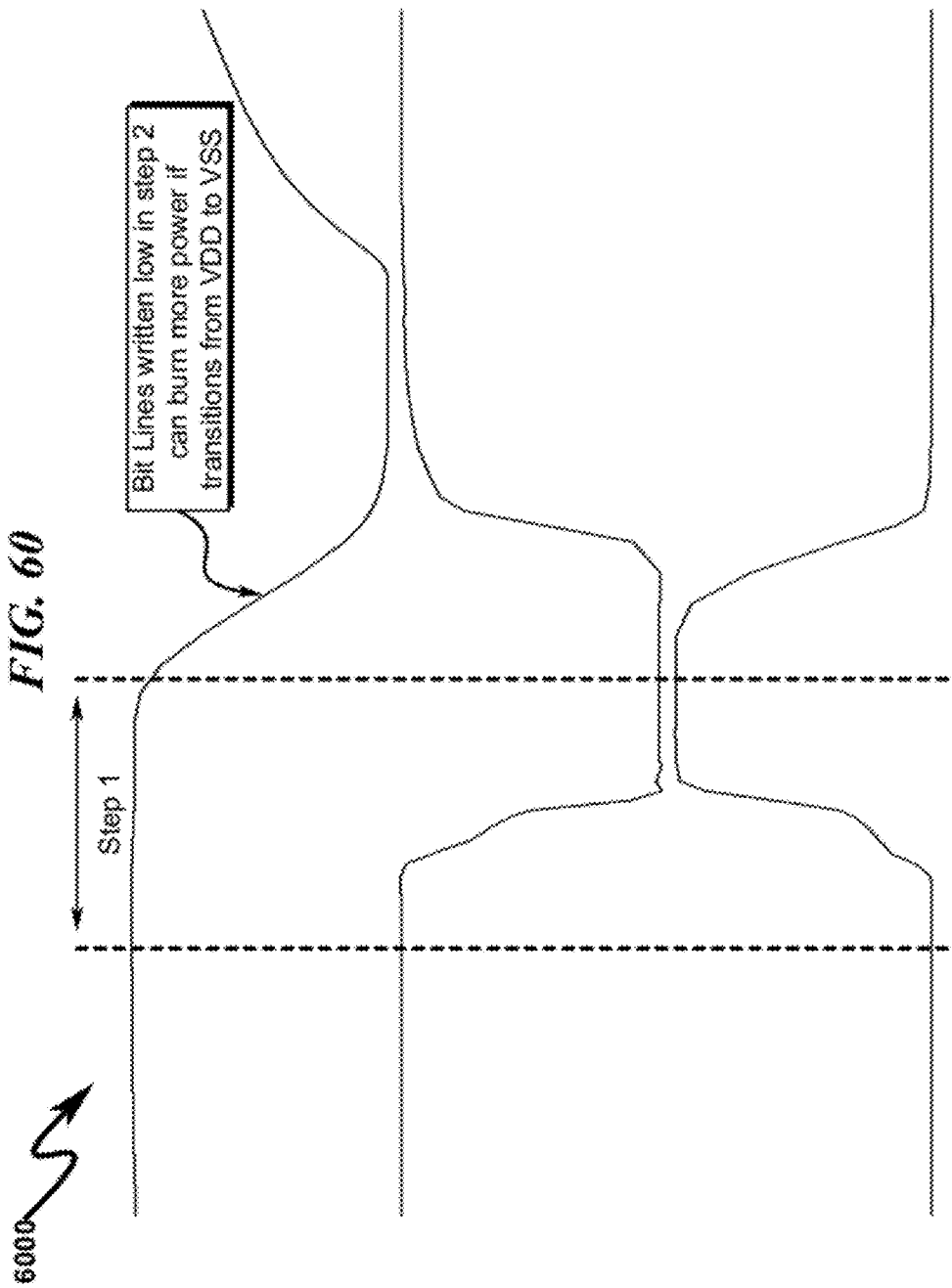
FIG. 60 illustrates waveforms demonstrating a TWO-STEP-WRITE with bit line held at VDD during step 1 of writing a high.

Waveforms associated with the alternative TWO-STEP write methodology discussed in the previous section are generally illustrated in FIG. 58 (5800), FIG. 59 (5900), and FIG. 60 (6000).

Holding the Bit Lines at VDD, or some other high voltage, during Step 1 of the write may be required to maximize the ability to write a high in the memory cell to overcome process variation and speed up the write time under worst case conditions. This embodiment variation is illustrated in the drawings associated with this and the previous section.

Bit Line Voltage Levels (6100)

There are several, choices as to what the voltage levels can be on the Bit Lines when WVDDS goes low (L) during a write. A few are listed below:
  Drive Bit Lines High, but not necessarily to VDD, for those associated with Data In being high. This has the possibility of the fastest write time to a "1".

Pull selected Bit Lines Low for those requiring a Low to be written into the memory cell based on Data In being Low at the start of the write cycle when WVDDS first goes low. This has the possibility of being the fastest write.

Pull selected Bit Lines Low for those requiring a Low to be written into the memory cell based on Data In being Low after WVDDS goes back high utilizing a TWO-STEP-WRITE.

Leave Bit Line pre-charged to desired level used for reading such as VDD, VDD/2 or lower, whereby the influence by the Bit Line is determined by the Pass Gate which could be off or have reduced drive strength.

Figure 61:
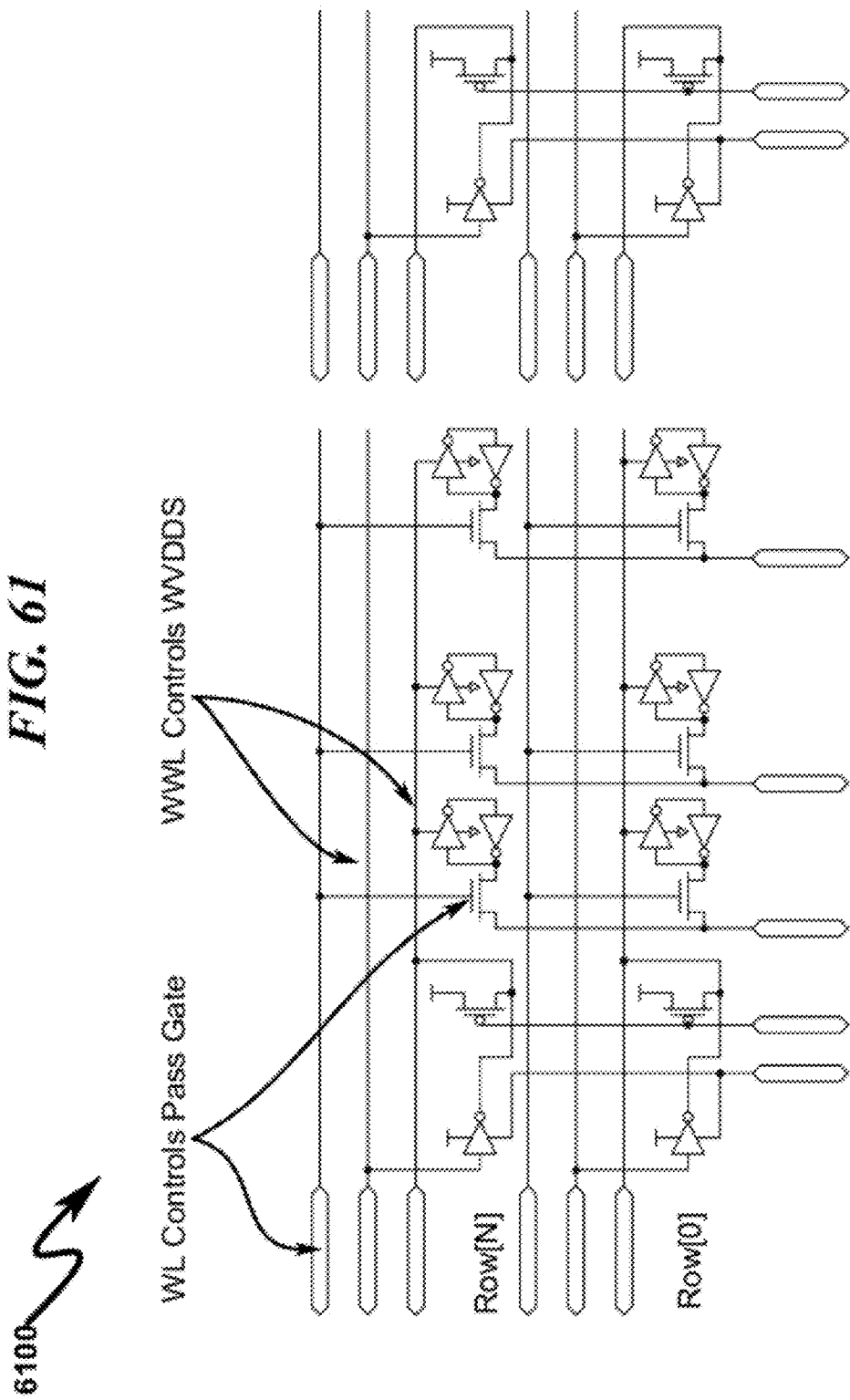
FIG. 61 illustrates an exemplary schematic circuit diagram embodiment with separate word line control for pass gate.

Another embodiment is to have separate control of the Word Line that is connected to the Pass Gate to offer additional options for controlling when the internal node t of the memory cell is exposed to the voltage on the highly capacitive Bit Line. An exemplary schematic illustrating this is given in FIG. 61 (6100).

TWO-STEP Write Method Flowchart (6200)

The present invention system described herein may be utilized in conjunction with a method as generally described in the flowchart illustrated in FIG. 62 (6200). The steps in this memory cell method generally comprise:

(1) Pre-charging bit lines high (but not necessarily to VDD), and optionally holding these bit lines high during STEP 1 of the write cycle (6201);

(2) As STEP 1 of the write cycle, driving VDD (using the multi-state control) low on the non-pass-gate (feedback) side of the cross-coupled latch through node WVDDS (6202);

(3) writing highs to all addressed memory cells (6203)

(4) Resupplying VDD to the switched side of the latch by taking WVDDS high (6204); and (5) As STEP 2 of the write cycle, writing a low into the addressed memory cells that are to have a low stored in them (6205).

One skilled in the art will recognize that this method may be inverted such that the VSS supply to the feedback amplifier may be driven to VDD instead to write a zero to the latch in step (3) and subsequently the STEP 2 of the write cycle would involve writing a high into the addressed memory cells that are to have a high stored in them. This mirroring of functionality is anticipated within the scope of the invention.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated the overall scope of the present invention.

Reading the 5T Memory Cell

A read occurs by taking the selected Word Line High and continuing to hold WVDDS high. Reading the memory cell can be done with traditional single-sided sensing such as what would be used in a DRAM or other techniques that are well known in the art. The ratio of the drive strength between the Pass Gate and the Pull Down must be considered such that a READ DISTURB doesn't occur, but in this case can be considered without the conflicting requirements of the write-ability. There is a lot of flexibility in determining what is the best case high level for pre-charging the Bit Lines which helps: reduce READ DISTURB issues, reduce the array power and can influence the sensing scheme.

One-Sided Sensing (6300)

Figure 63:
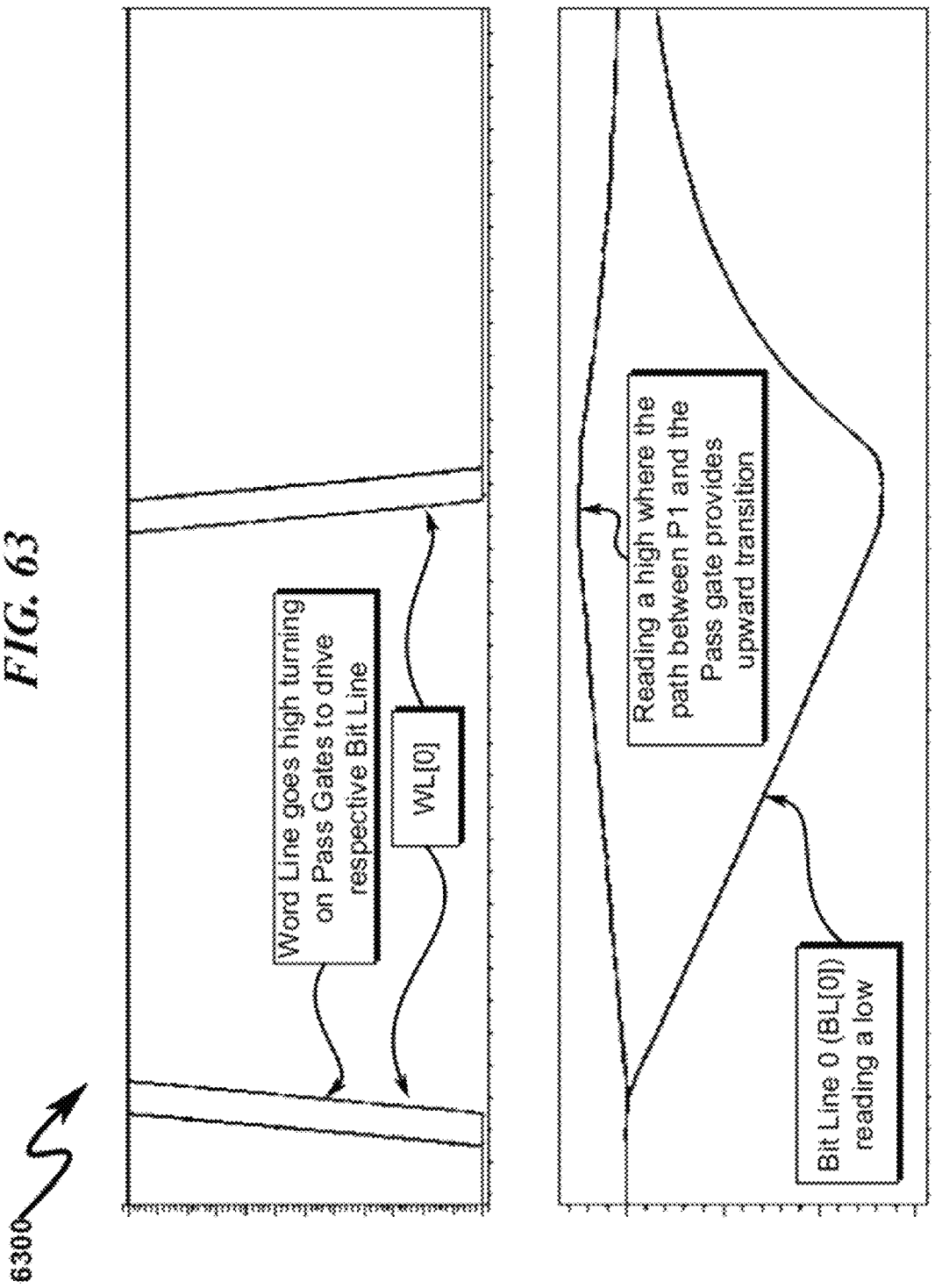
FIG. 63 illustrates signal waveforms associated with a one-sided read of a bit line that is pre-charged to VDD/2.

A typical approach to one-sided sensing as generally illustrated in FIG. 63 (6300) is to compare the voltage on the Bit Line to a reference voltage that might be another dummy Bit Line transition that is discharging at half the rate of the actual Bit Line or perhaps a fixed voltage that is half way between the possible low and high level of the Bit Line. In another embodiment the reference voltage could be the actual pre-charged value of the Bit Line where a high is read by the upward transition of the Bit Line as it is pulled through the series combination of the Pass Gate and P1 of the memory cell. The pull-up rate can be adjusted by their size (drive strengths) vs. the pull-down path through the Pass Gate and the pull-down N1. Care must be taken to prevent causing problems with writing a low, and other functions can be added to specifically help with writing a low such as reducing the overall VDD in the array during a write. Any movement upward on the Bit Line if reading a high can help in setting up the sensing scheme approach in any of the approaches listed above or others known in the art but not specifically itemized above.

Group Word Line

Another embodiment uses a local Word Line called Group Word Line (GWL) for selecting the pass gates which limits the number of memory cells that are accessed to just the individual group. This can substantially reduce the array power burned in a read and a write cycle, because all of the Bit Lines associated with the other groups are quiescent, and it eliminated READ DISTURB during a write.

Group Select Circuitry (6400)

Figure 64:
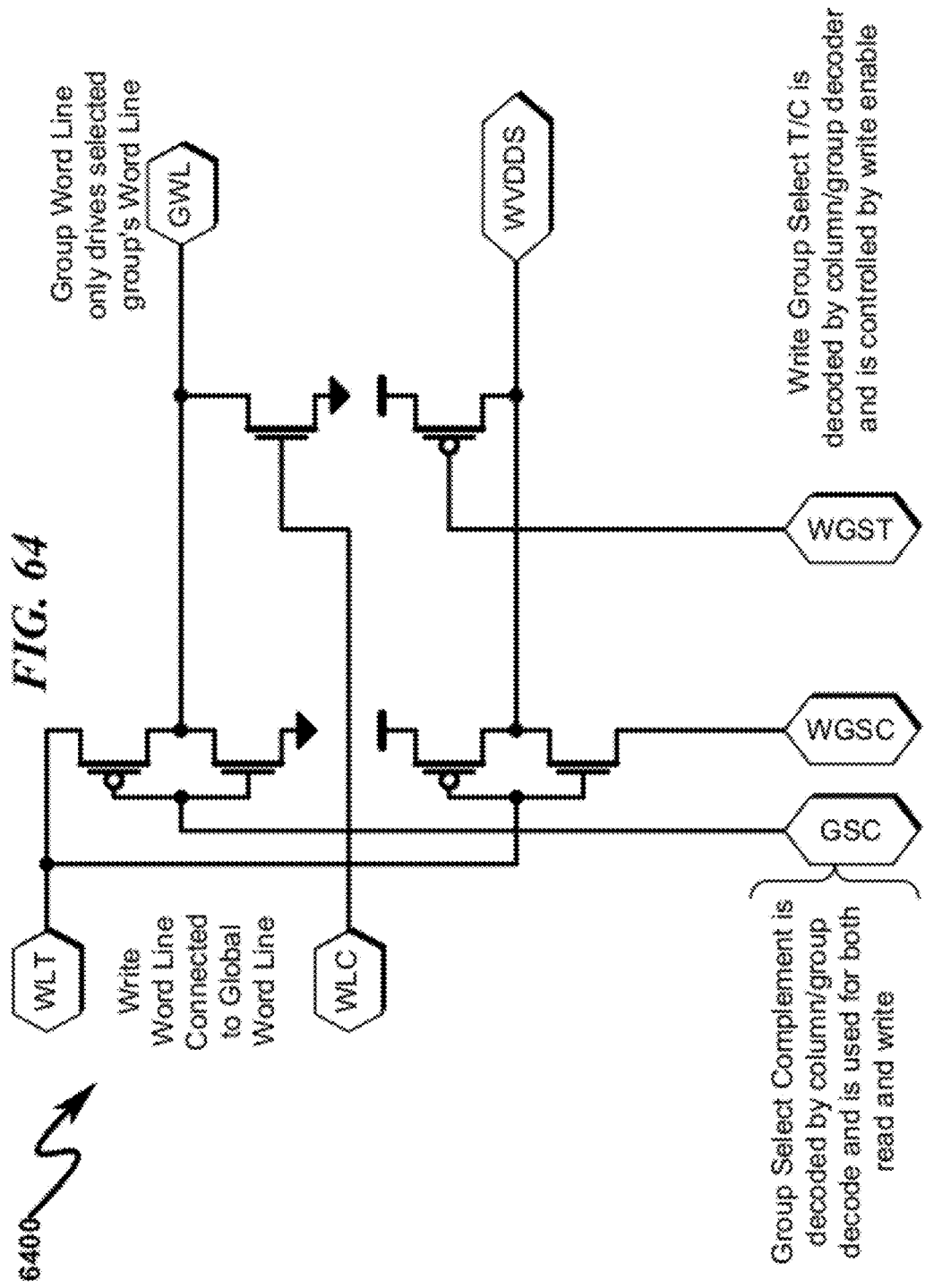
FIG. 64 illustrates an exemplary schematic circuit diagram of a group select circuit used in group word line embodiment.

The Global word Line (WL) discussed above has been changed to a Group Word Line (GWL) as generally illustrated in FIG. 64 (6400).

The design of the Group Select circuit may now provide the Group Word Line drive signal, such as illustrated in FIG. 64 (6400). The Group Select circuit shown in FIG. 64 (6400) and following drawings can be implemented in several ways and is not limited to that approach. Note that the MULTI-WRITE design discussed above applies to these circuits as well.

5T Memory Array with Local Group Word Lines (6500)

Figure 65:
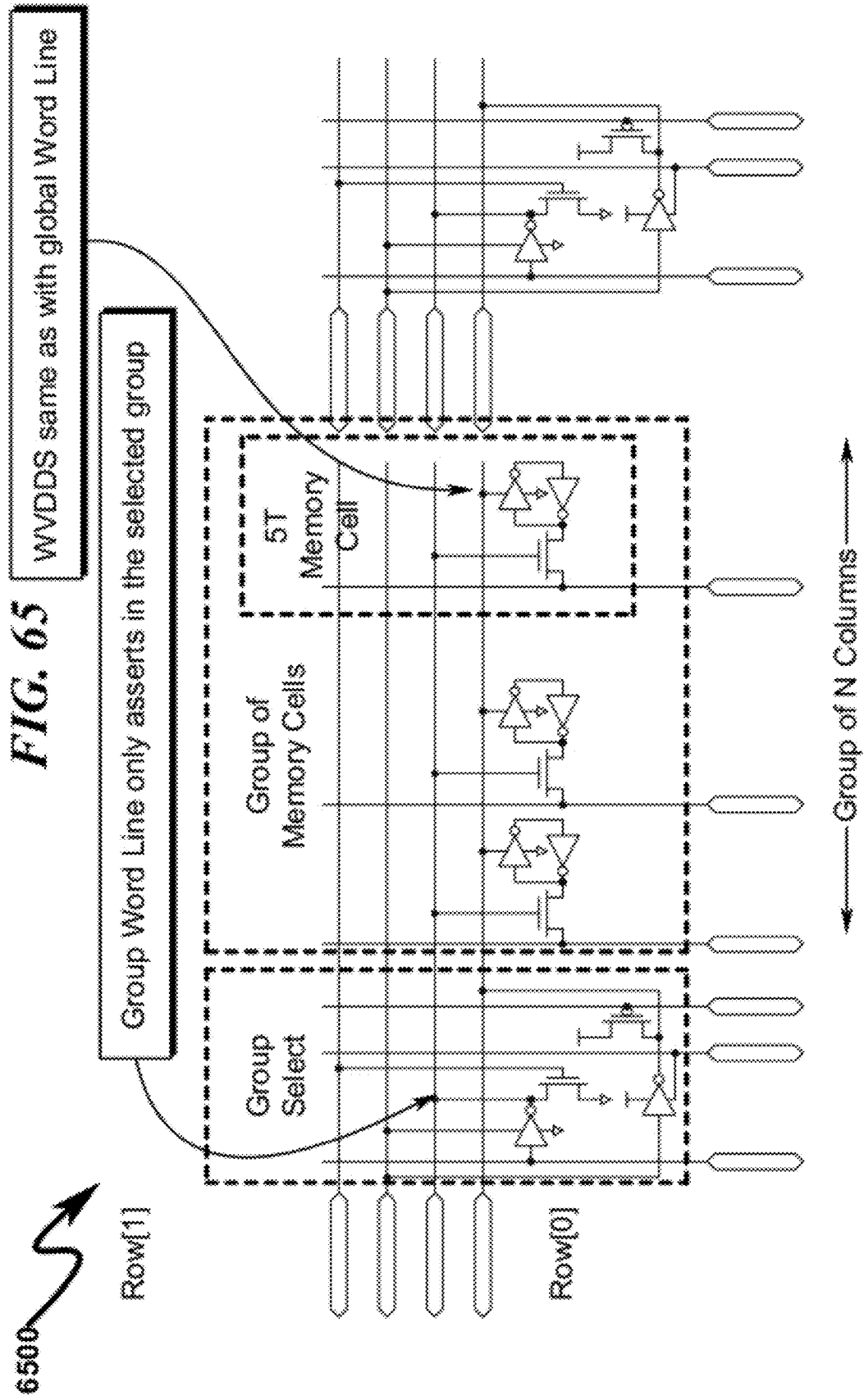
FIG. 65 illustrates an exemplary schematic circuit diagram of a transistor level 5T array with local group word lines accessing a single group of memory cells.

Within this context FIG. 65 (6500) generally illustrates group select, circuitry as applied to a memory array.

Single Group with Local Group Word Lines (6600)

Figure 66:
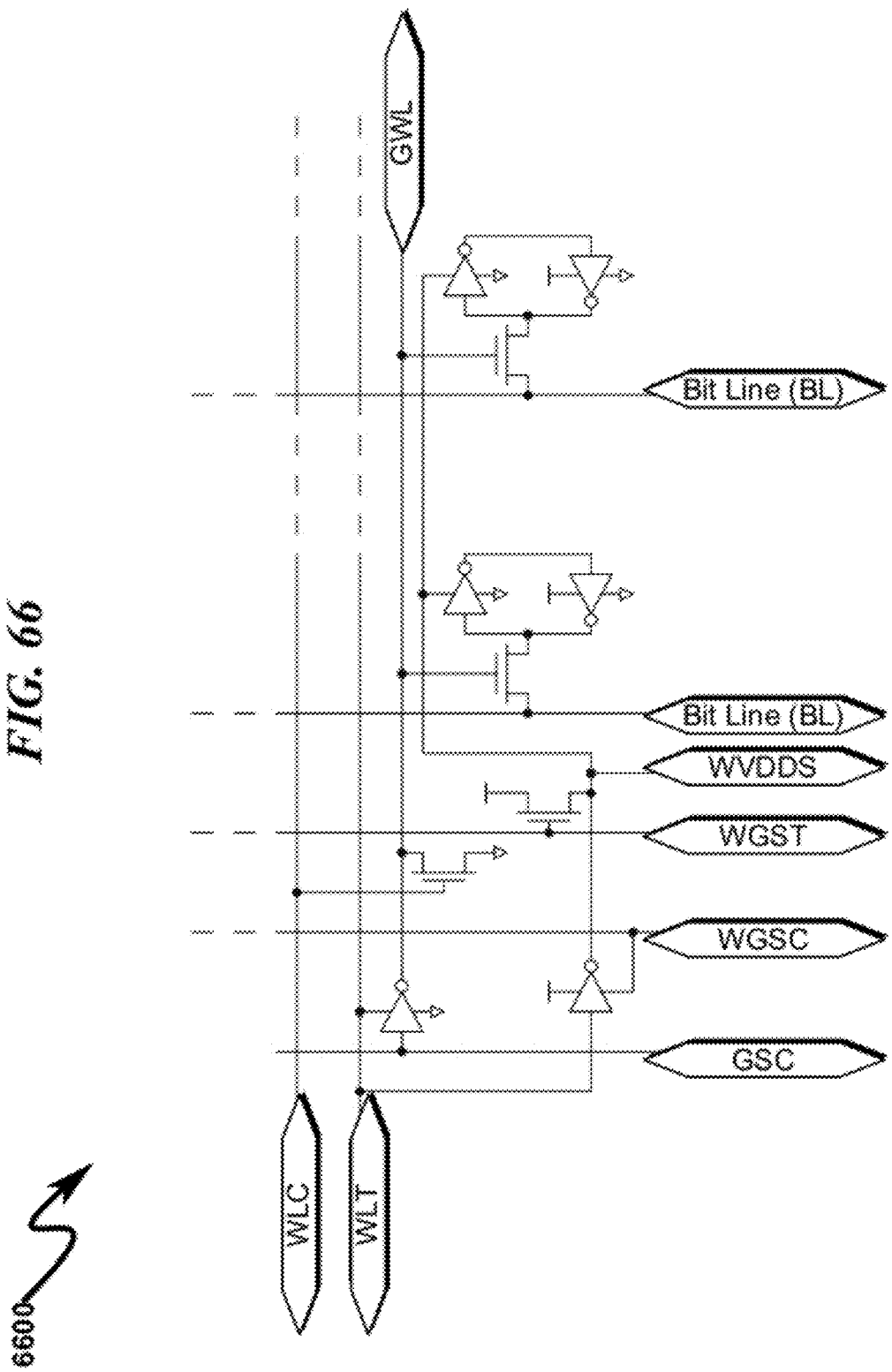
FIG. 66 illustrates an exemplary schematic circuit diagram of a single group with local group word line.

Within this context FIG. 66 (6600) generally illustrates how a single group operates with a local group word line.

Array Power Reduction (6700)

Several points have been made throughout the discussion herein about the various power reductions that can occur with the different design options presented above, and due to this very important issue, it is summarized in this section. As more requirements arise for portability of electronic devices such as cell phones, it becomes increasingly important for the power consumed by the memories to be reduced. Many ASICs utilize a large amount of memory on its chip, and this can result in the power consumption being too high. It can also be unacceptably high in non-portable applications. Some of the power reduction, benefits associated with the embodiments is listed below:

Changing the Global Word Line (WL) to a group decoded. Group Word Line (GWL) prevents all other groups of memory cells along the Word Line from being accessed during a read and a write, therefore keeping their respective Bit Lines quiescent.

In the traditional 6T memory cell writing the memory cell with a full voltage swing is required on the selected Bit Lines. Since the write is very easy to perform as described herein, it does not require the Bit Mines to have a full transition from VDD to Ground thus reducing the dv/dt.

It is possible in this embodiment to pre-charge the Bit Lines to a high level that is less than VDD which can also reduce the array power Any leakage currents associated with the Bit True and Bit Compliment in a traditional 6T memory cell will be much less in the 5T memory cell, because there is only one per memory cell.

Figure 67:
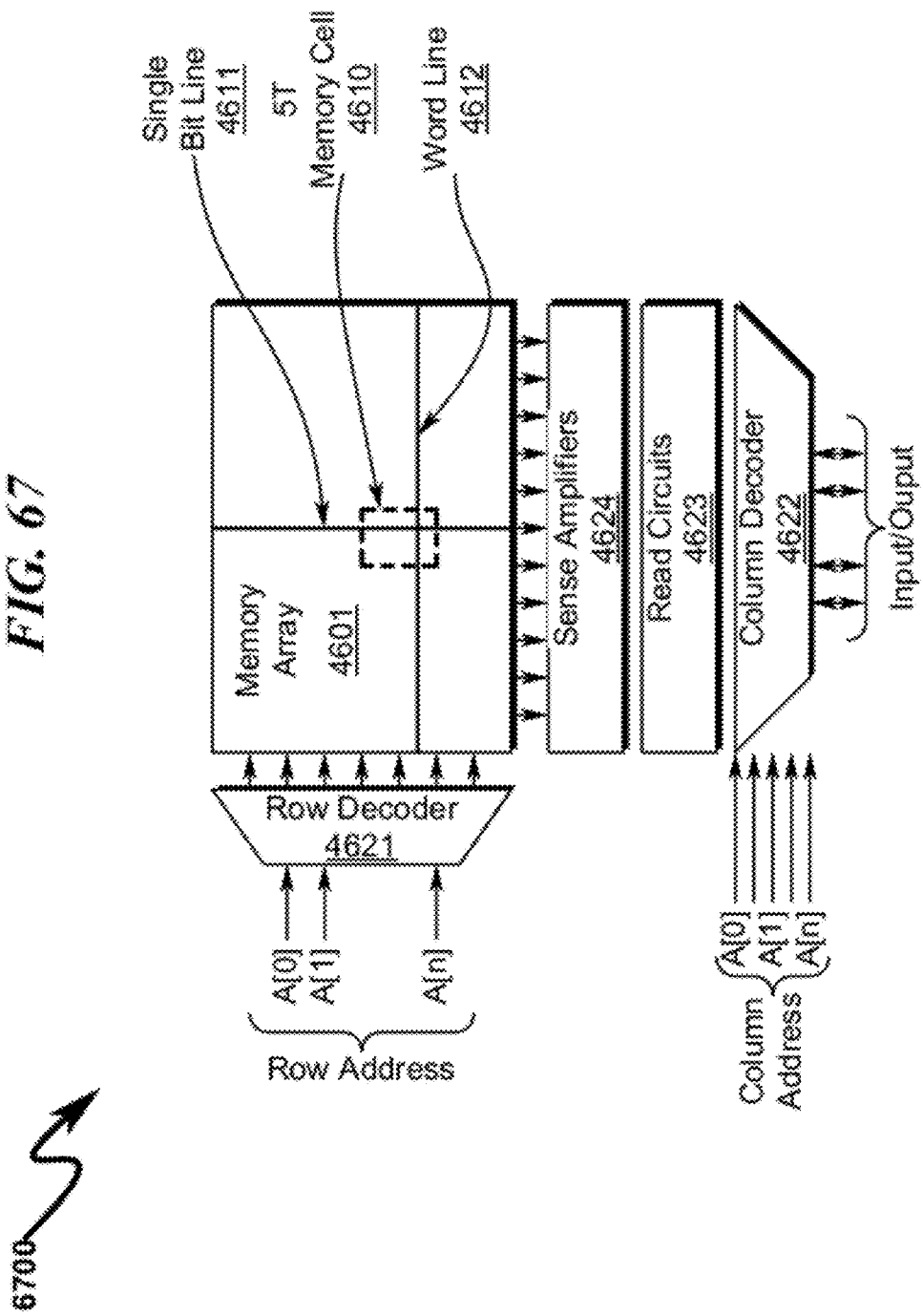
FIG. 67 illustrates a general block diagram of a single port SRAM utilizing the 5T memory cell with single bit line per memory cell.

An example of an embodiment of a block diagram of an SRAM utilizing the 5T memory cell is generally illustrated in FIG. 67 (6700).

5T Memory without Interspersed Group Select (6800)

Figure 68:
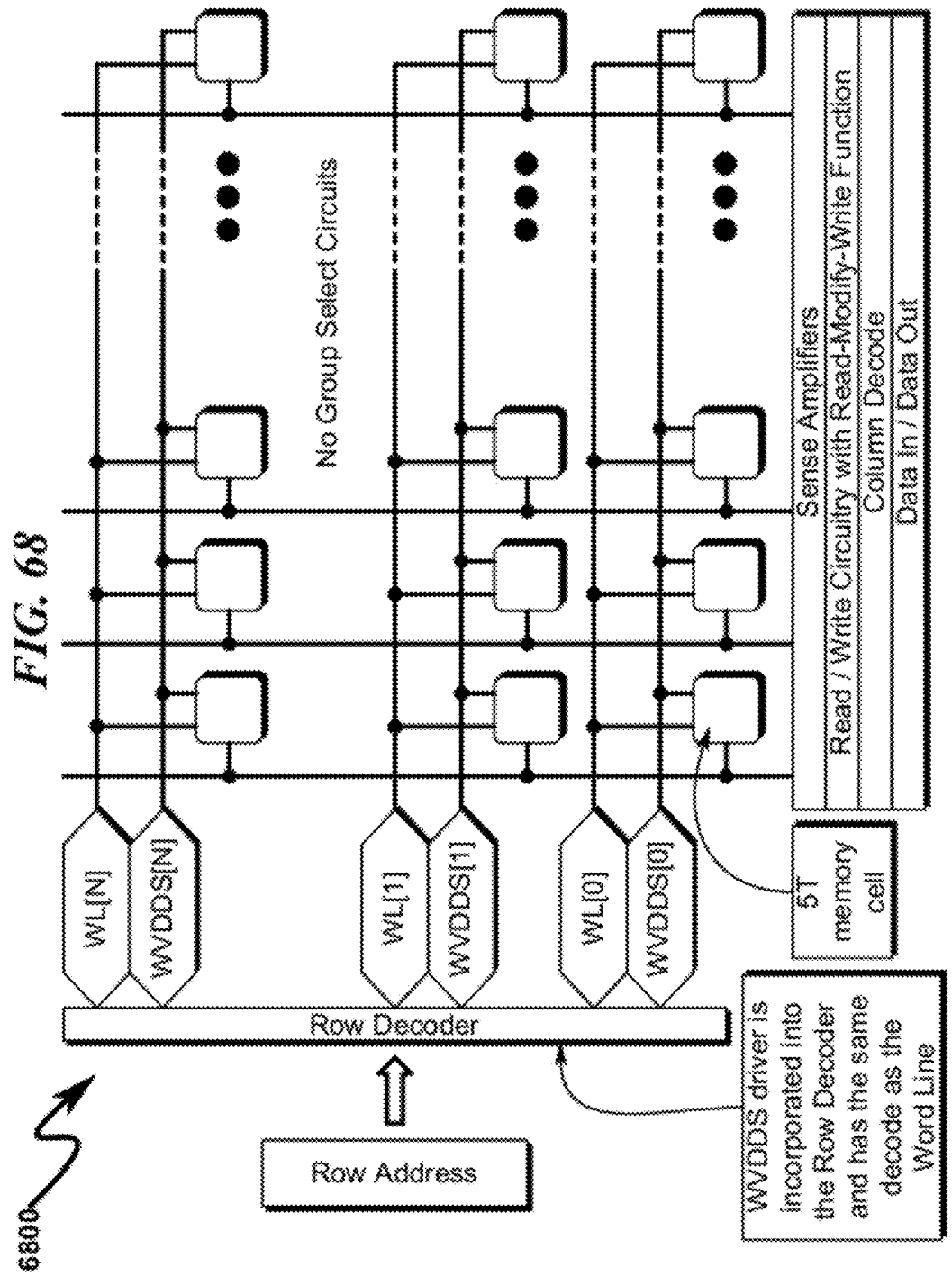
FIG. 68 illustrates a block diagram of single memory array without group select interspersed.

The most efficient array that will allow for smallest physical size will not have any interspersed group select circuits or can have very large groups that would be segmented at the block or sub-array level. A block diagram of a memory with a single array is illustrated in FIG. 68 (6800).

Exemplary Read-Modify-Write Cycle (6900)

Figure 69:
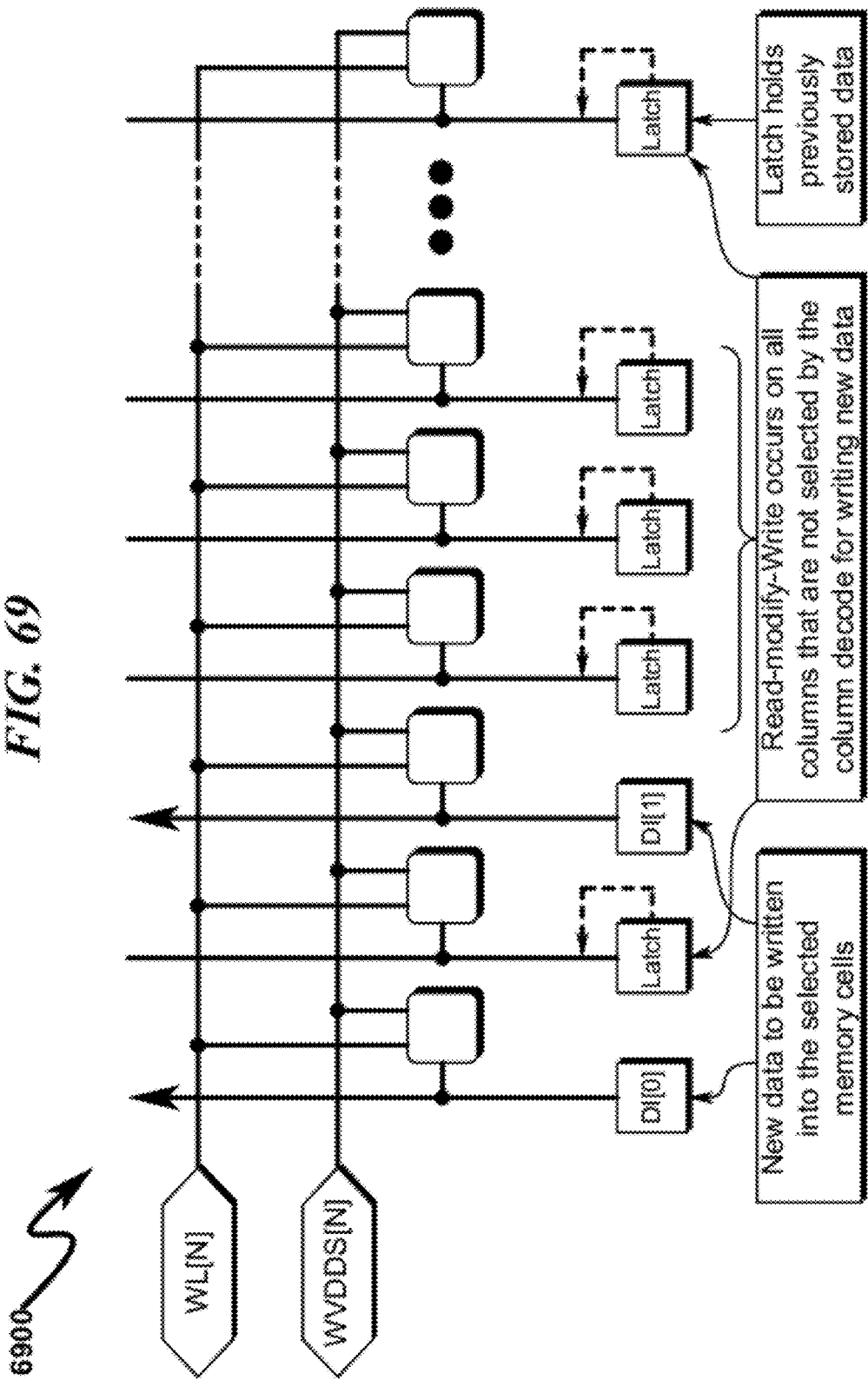
FIG. 69 illustrates example of read-modify-write for a two BPW configuration.

When a write cycle is initiated the Word Line selected by the Row Decoder will go high accessing all of the memory cells along the row and cause them to drive their stored state onto their respective Bit Line which must be sensed and stored before MULTI-WRITE begins. The Column Decode will determine which memory cells should be written with new data from Data In and which ones should be rewritten with the previously stored data. An example of, but not limited to, a read-modify-write for a memory configured to have 2 Bits Per Word (BPW) is illustrated in FIG. 69 (6900).

6T DFM Memory

Overview

A sixth transistor may be added to the 5T memory cell described herein that is used exclusively for reading the memory cell. This additional transistor creates independent read and write ports which completely removes the conflicts between READ DISTURB and write, eliminates READ DISTURB during a read, and in the Group Word Line embodiment presented later it eliminates READ DISTURB during a write. An important characteristic is that this approach completely removes the noise margin issue that traditional 6T memory cells have, thus creating the ultimate Design for Manufacturability (DFM) memory that can tolerate the larger variations that occur in today's submicron processes without increasing the size of the memory cell.

6T DFM Memory Cell (7000)

Figure 70:
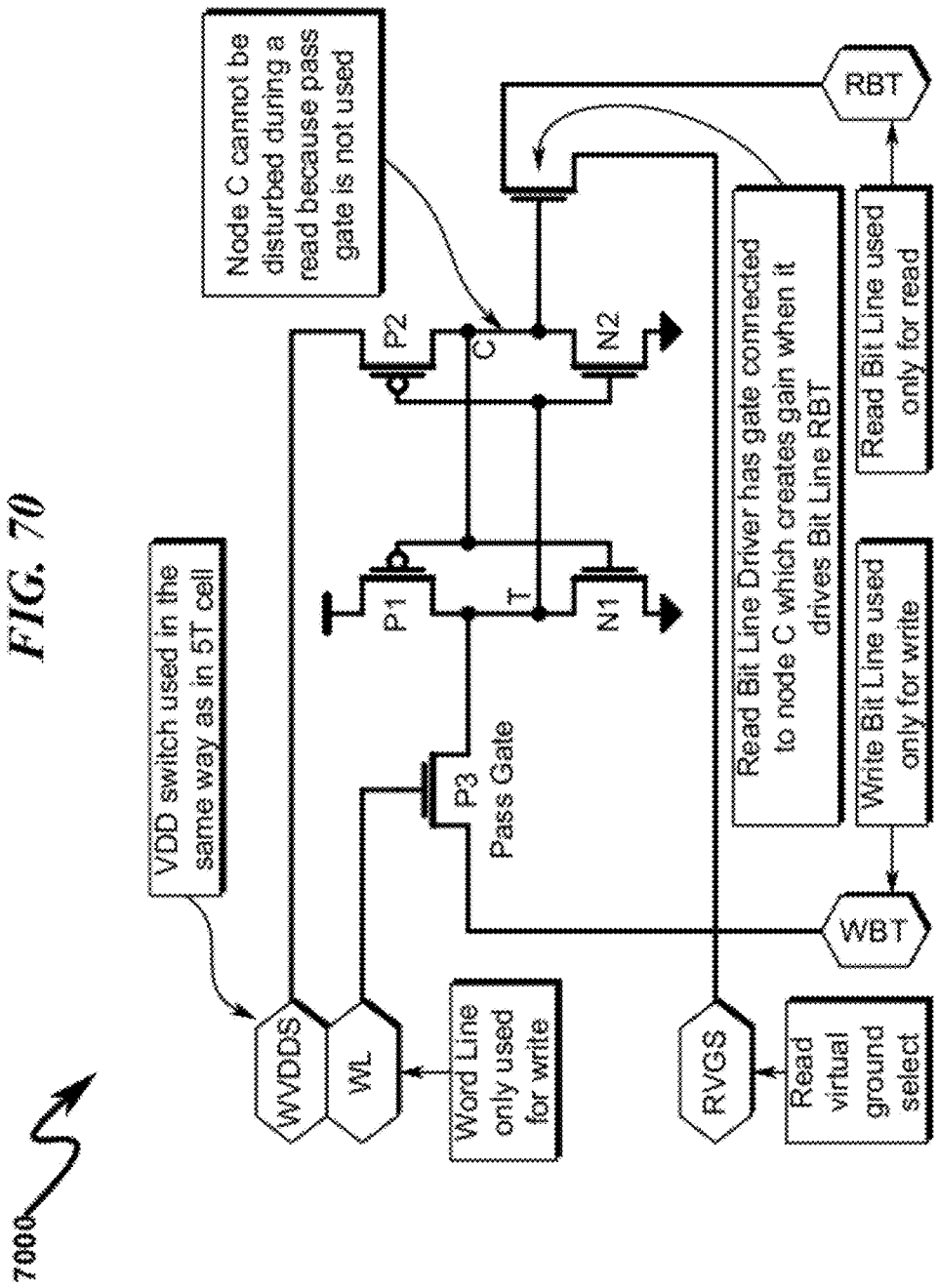
FIG. 70 illustrates a 6T DFM SRAM memory cell with separate single-sided read and write ports.

This present invention memory cell embodiment is illustrated in FIG. 70 (7000). Since it uses 6 transistors just like the conventional 6T memory cell in FIG. 2 (0200), it will not have a larger area and if fact may be smaller, because the transistors can be smaller. In addition to the MULTI-WRITE embodiment presented herein, some of the other primary embodiments taught by the present invention include but are not limited to:

One Transistor Read Port with gain.
Array Implementation with Global Write Word mines.
Array Implementation with Group Write Word Lines.
Array dynamic and leakage power reduction which includes the flexibility to reduce the voltage swing on the Bit Line.
Application of the 6T DFM memory cell as a Dual Port R/W SRAM.

These preferred embodiments may optimally be fabricated in memory arrays utilizing a Global Write Word Line as well as modified into memory arrays utilizing a Group Write Word Line.

Figure 2:
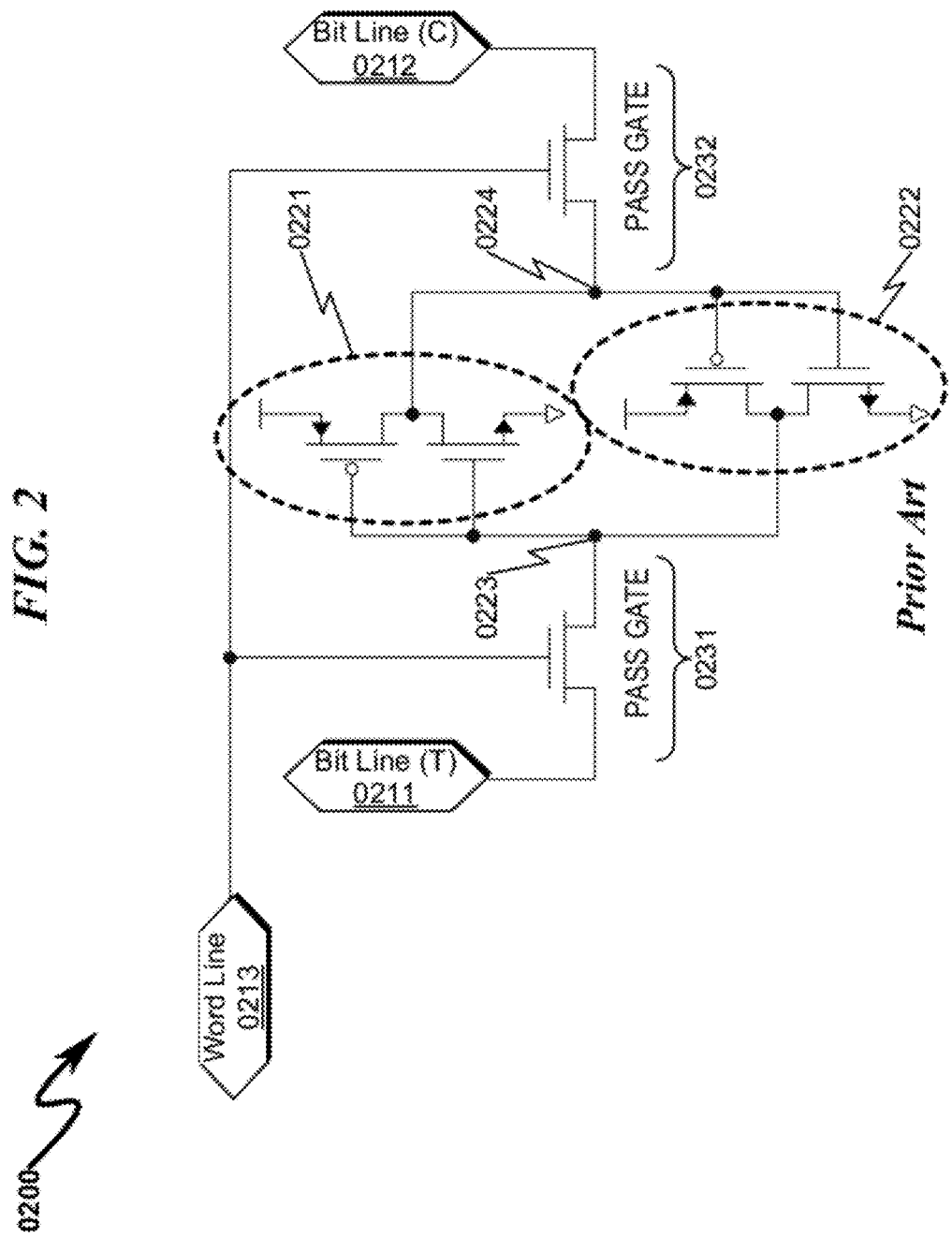
FIG. 2 illustrates a prior art static memory cell architecture compatible with the memory array architecture of FIG. 1.
Figure 3:
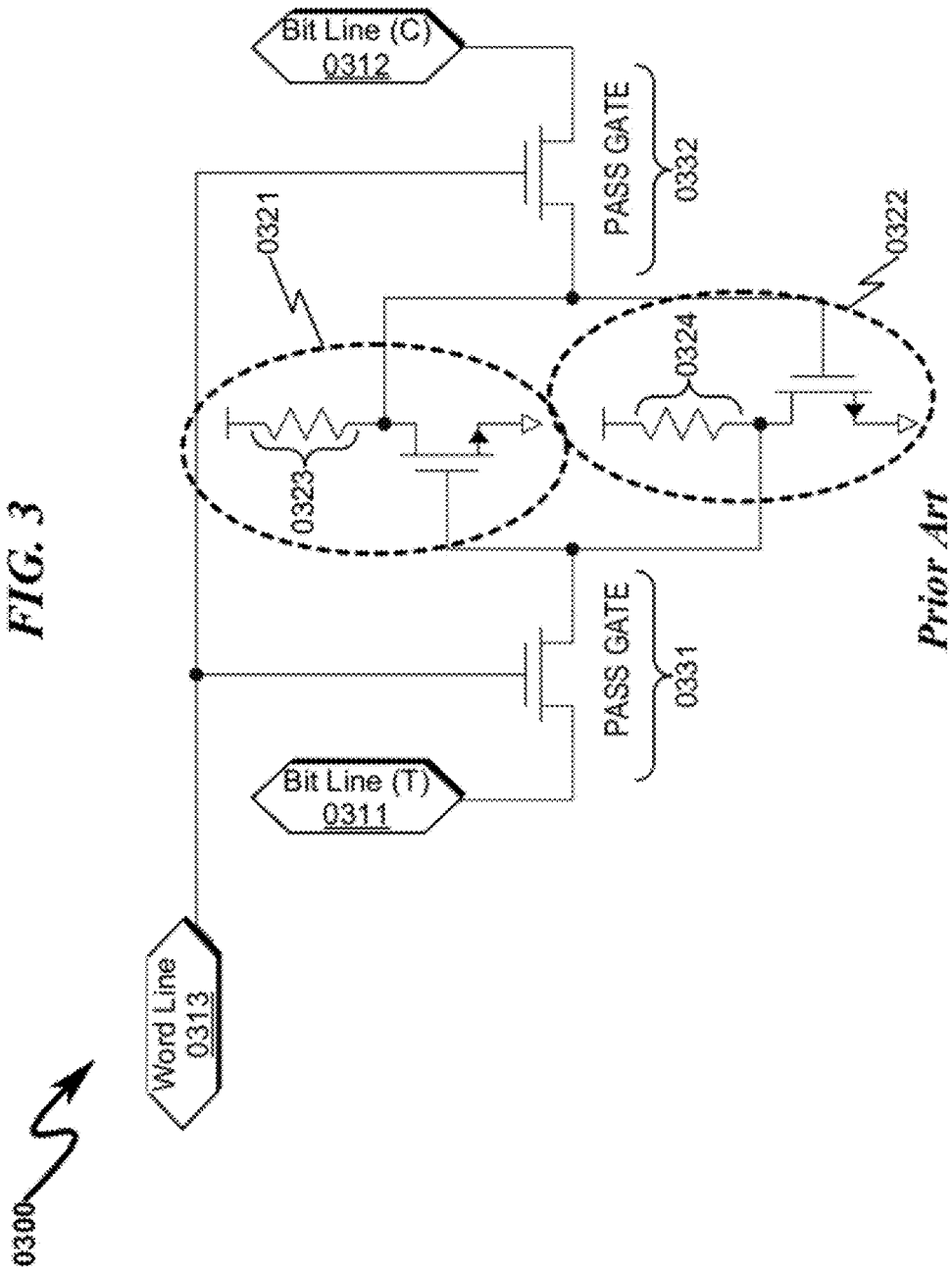
FIG. 3 illustrates a prior art non-static memory cell architecture compatible with the memory array architecture of FIG. 1.
Figure 4:
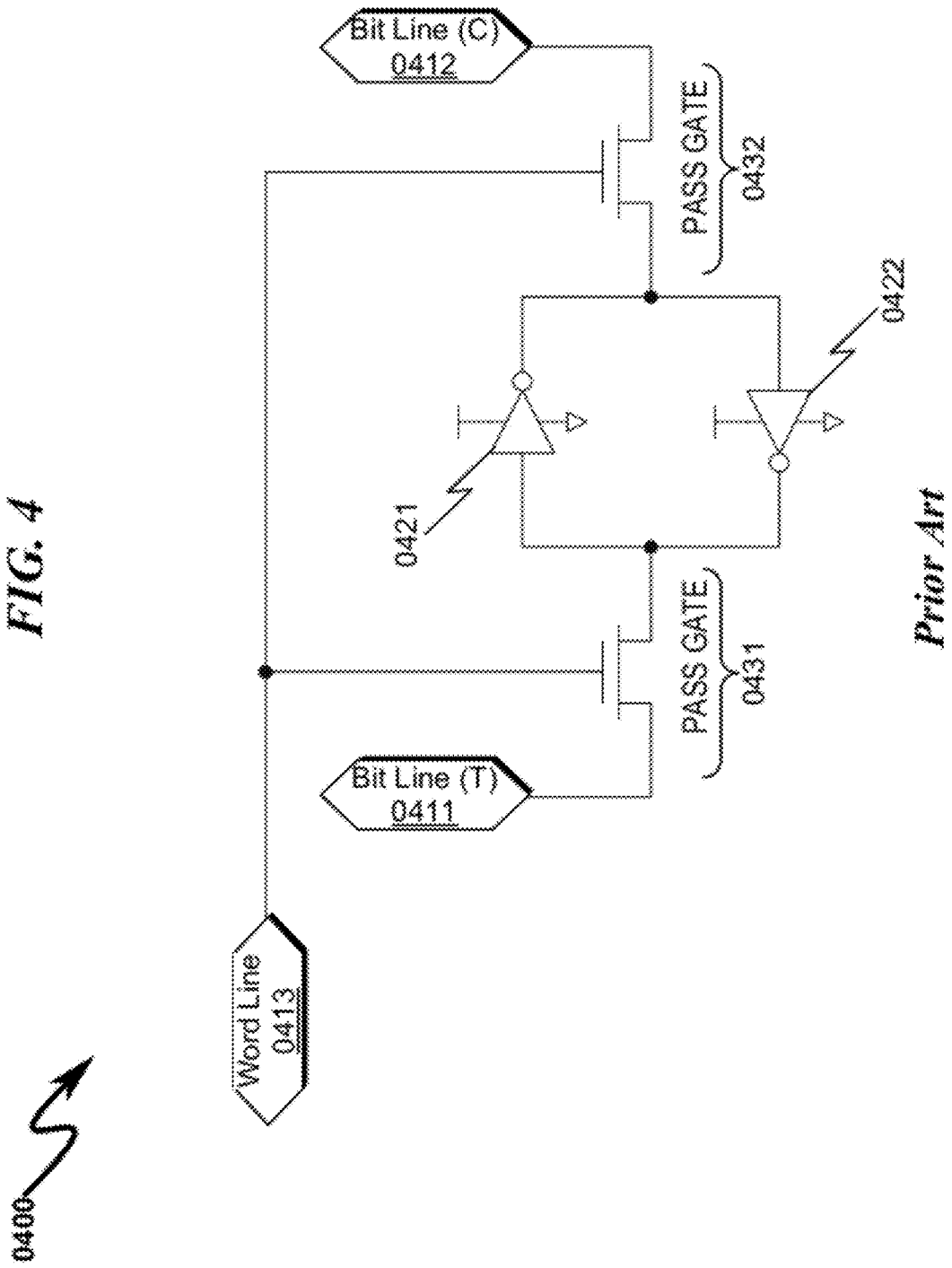
FIG. 4 illustrates a generalization of memory cell architectures compatible with the memory array architecture of FIG. 1.
Figure 5:
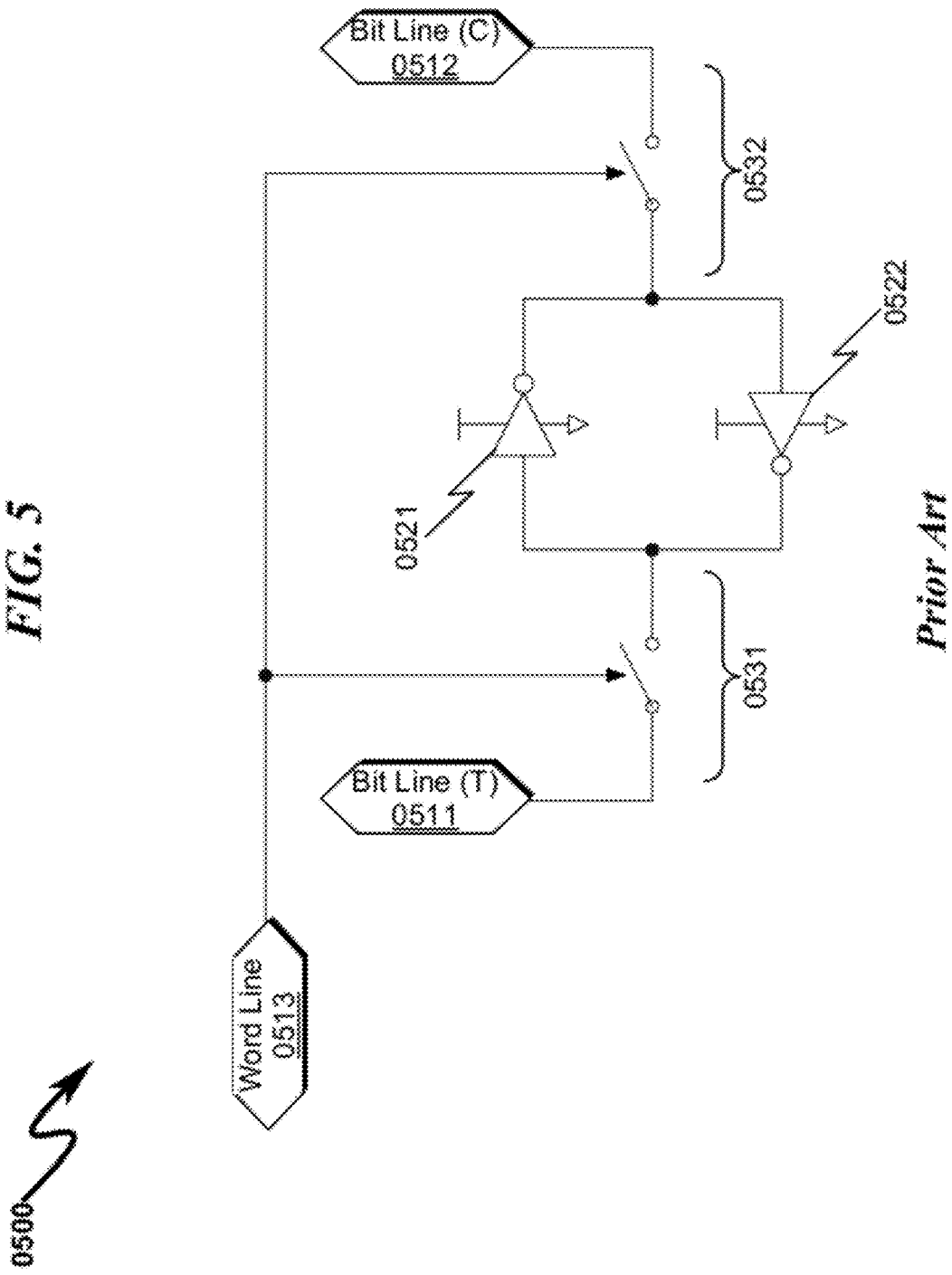
FIG. 5 illustrates a memory cell abstraction as applied to memory cell architectures of FIG. 2.
Figure 6:
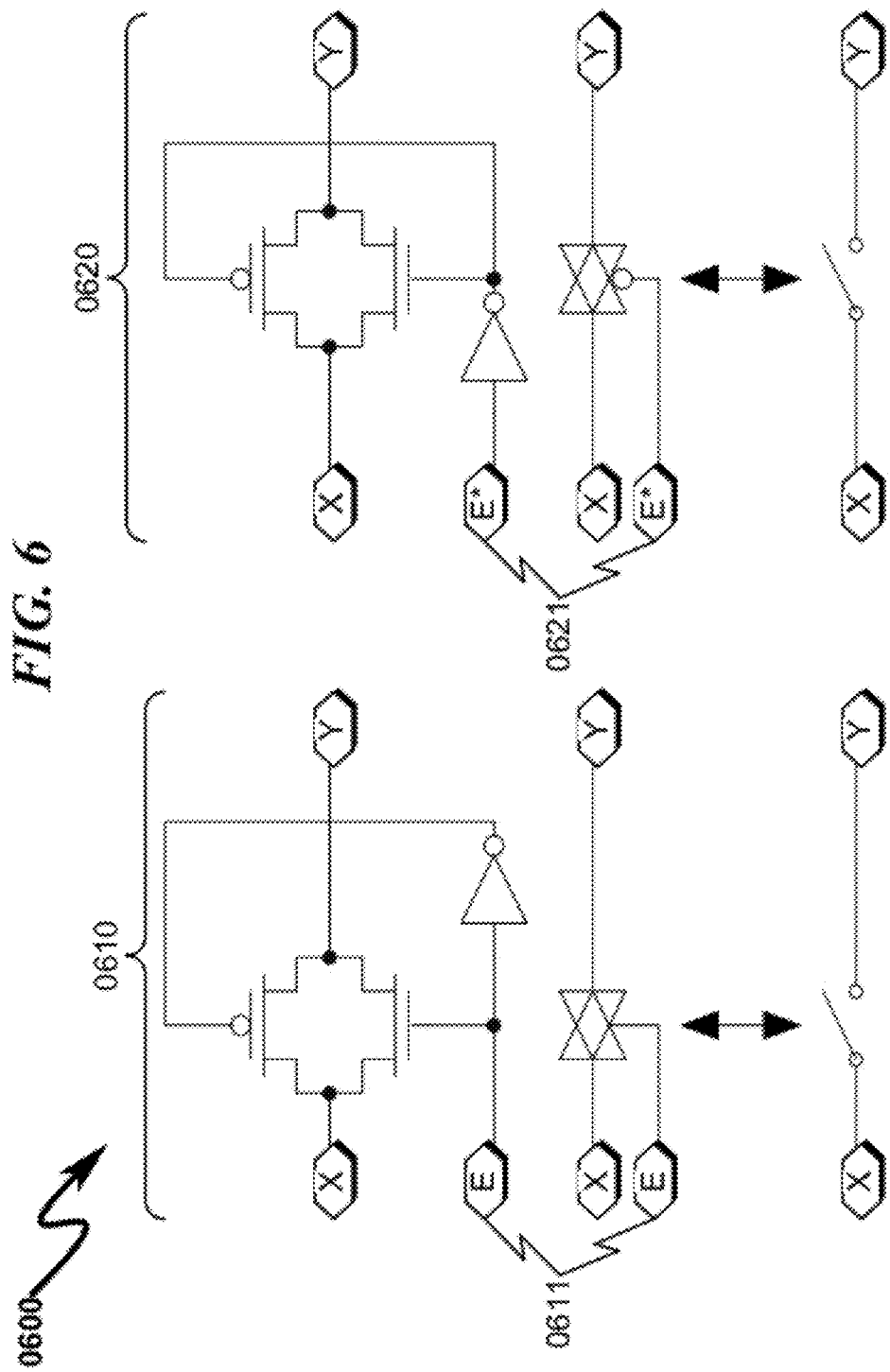
FIG. 6 illustrates a switch abstraction as applied to memory cell architectures of FIG. 2.
Figure 7:
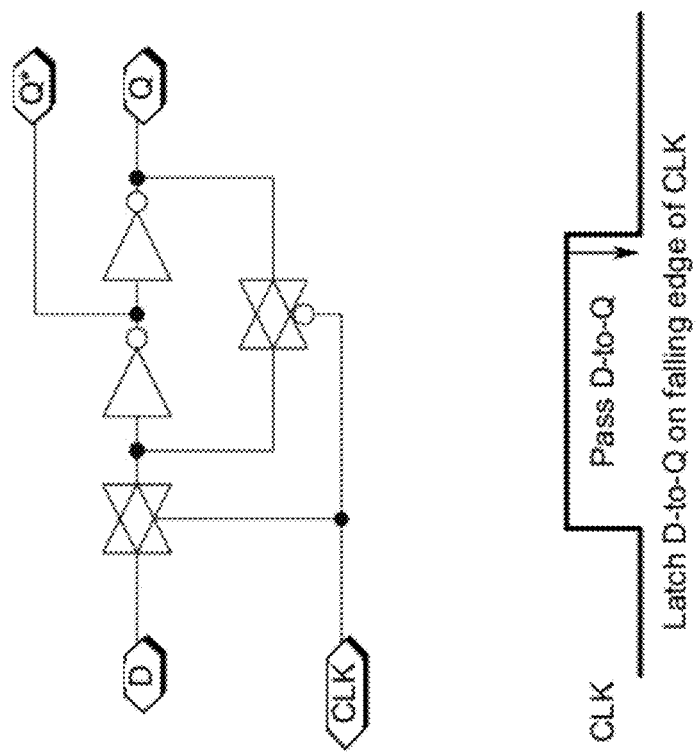
FIG. 7 illustrates a traditional prior art transparent latch memory cell circuit topology.
Figure 8:
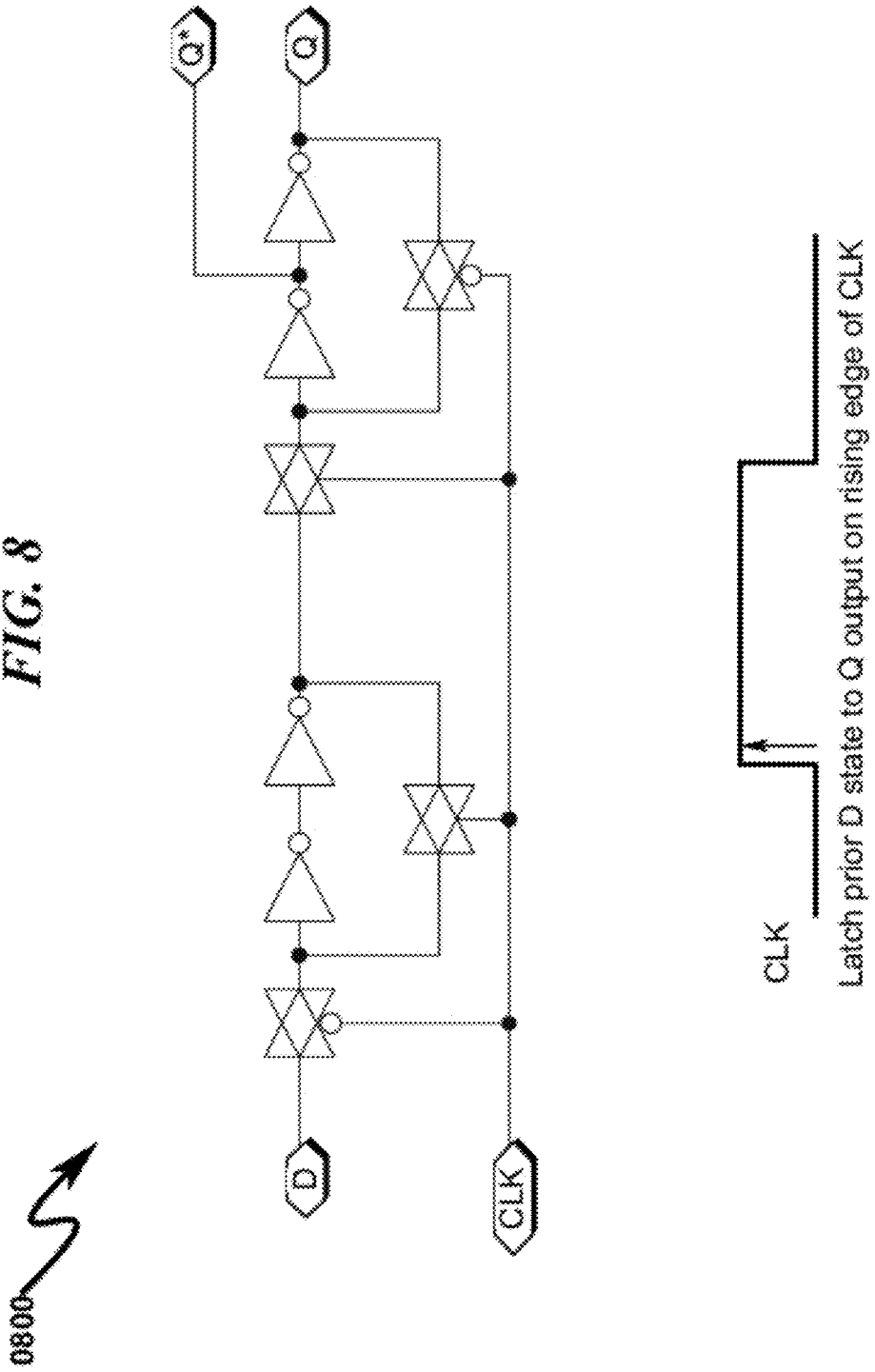
FIG. 8 illustrates a traditional prior art D-flip-flop memory cell circuit topology.
Figure 9:
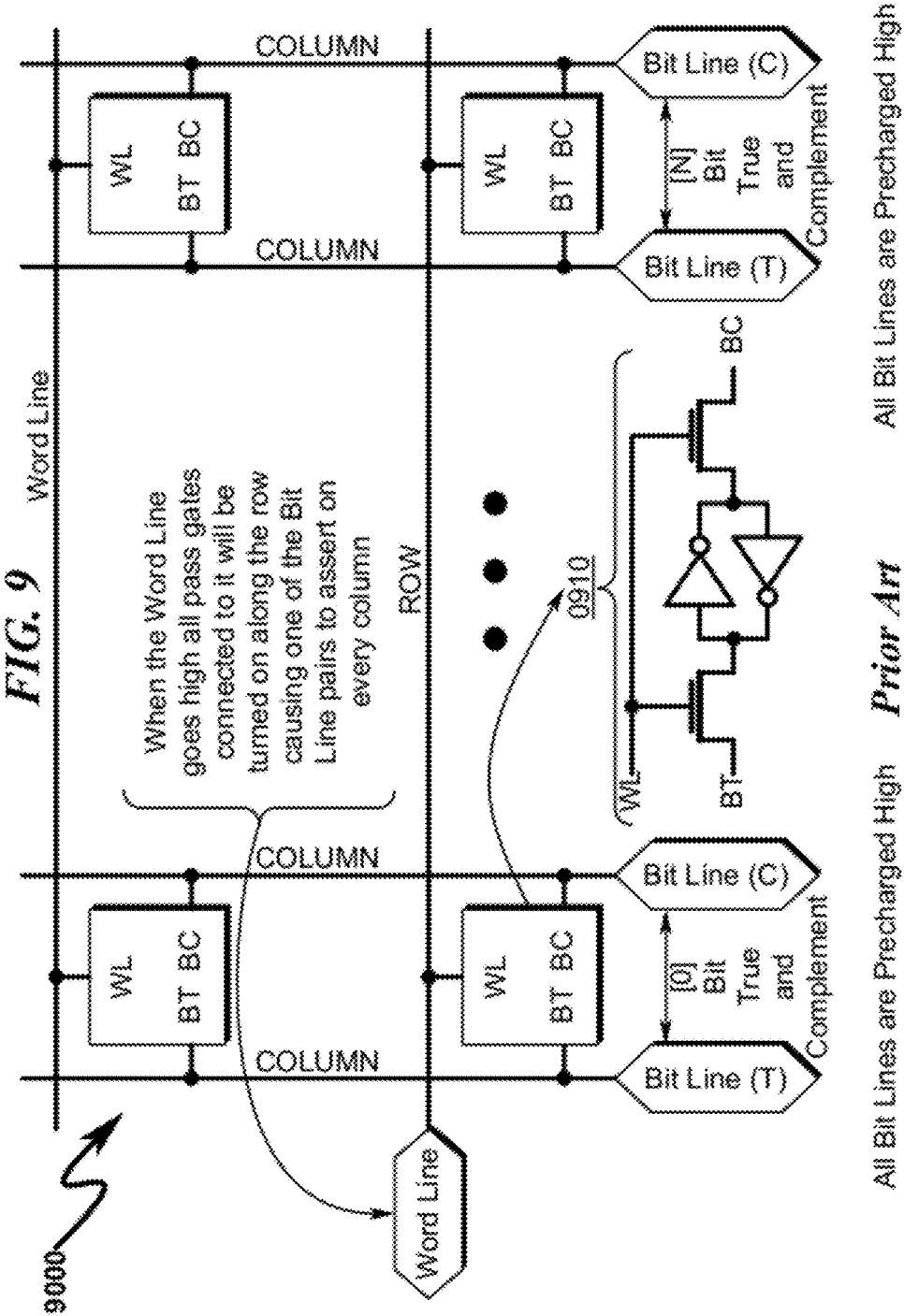
FIG. 9 illustrates a prior art memory array depicting interconnection of memory cells with Bit Lines and Word Lines.
Figure 10:
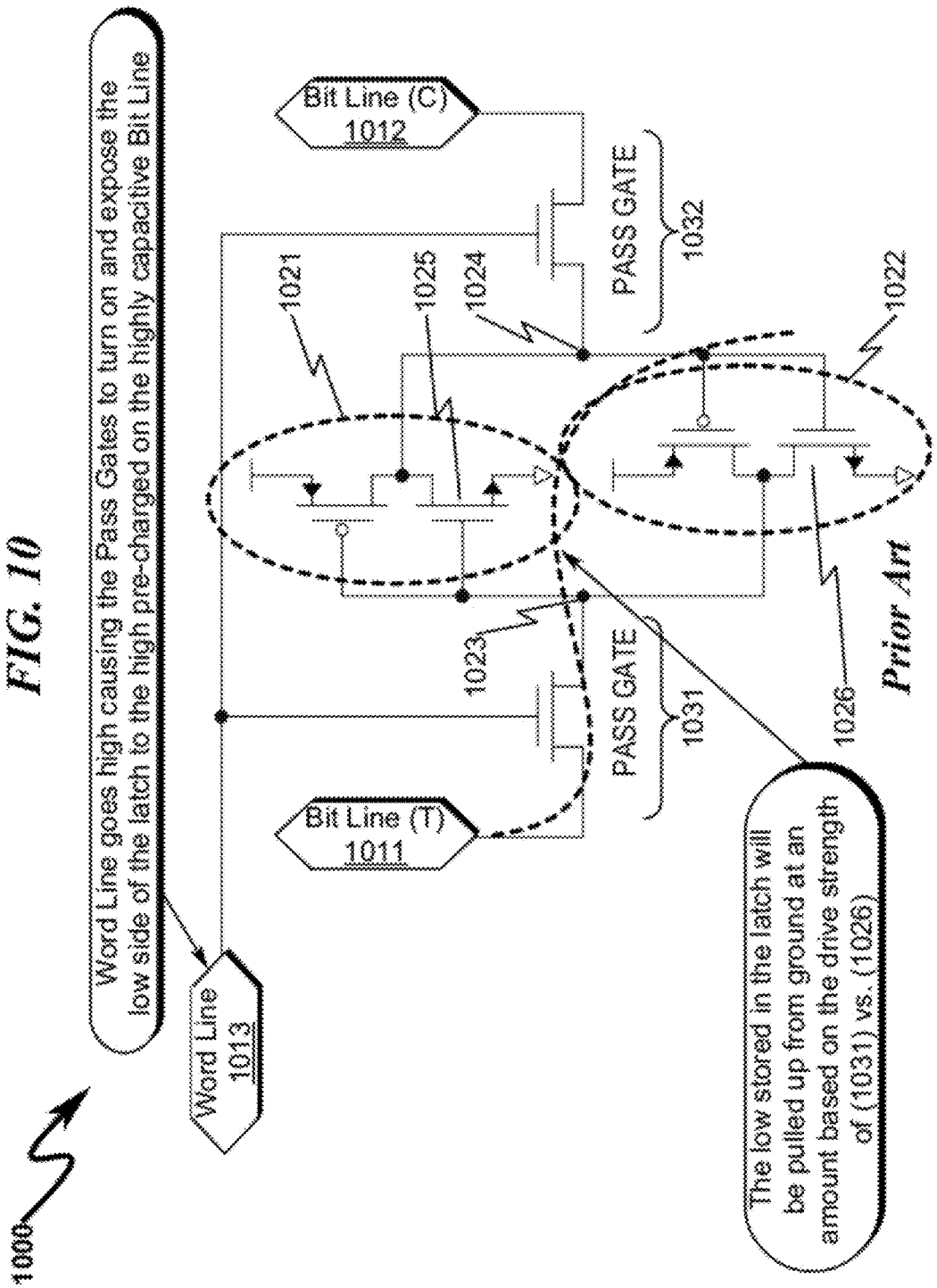
FIG. 10 illustrates a prior art 6T memory cell depicting READ DISTURB behavior.

Utilizing the Group Write Word Line completely removes the sensitivity to BETA RATIO and variations in the process between the pull down and pass gate which allows the transistors to be laid out at a minimum size, thus creating the potential of a memory cell that is smaller than the traditional memory cell shown in FIG. 2 (0200). Another benefit is the read can be faster because the read Bit Line driver has gain instead of being a much slower pass gate.

The 6T DFM memory cell utilizes the same MULTI-WRITE embodiment that is presented above, but the single bit line on the 5T now becomes a Write Bit Line ONLY, while a separate Read Bit Line is added along with the additional sixth transistor, and the Pass Gate (P3) is now turned on only for writing by a Write Word Line signal. The switching of VDD (WVDDS) remains the same.

6T DFM Memory Array (7100)

Figure 71:
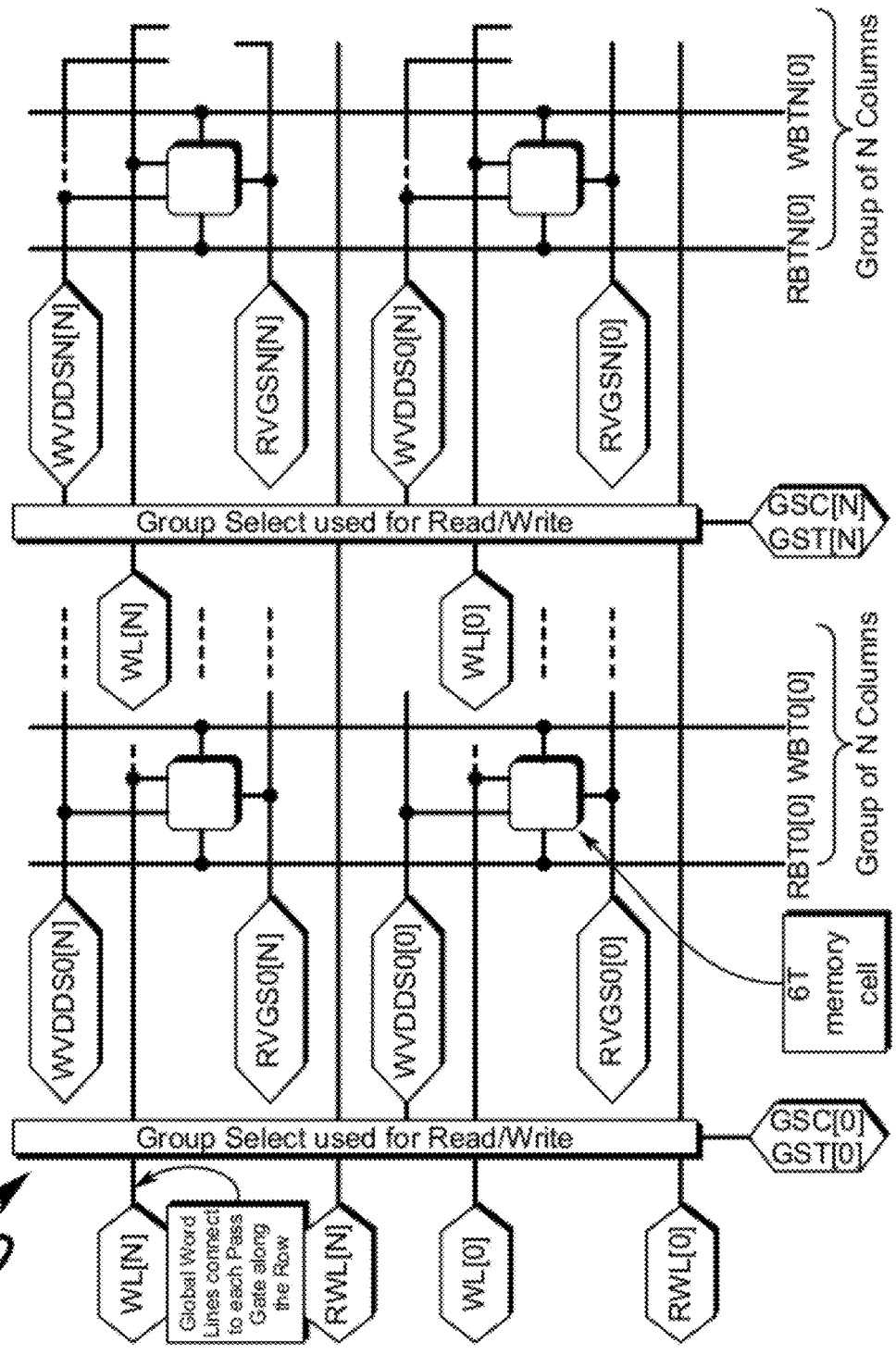
FIG. 71 illustrates an exemplary array of 6T DFM memory cells with global word lines.

An exemplary embodiment a memory array using 6T memory cells and its control by the Group Select circuitry is illustrated in FIG. 71 (7100).

6T Group Select Circuitry (7200)

Figure 72:
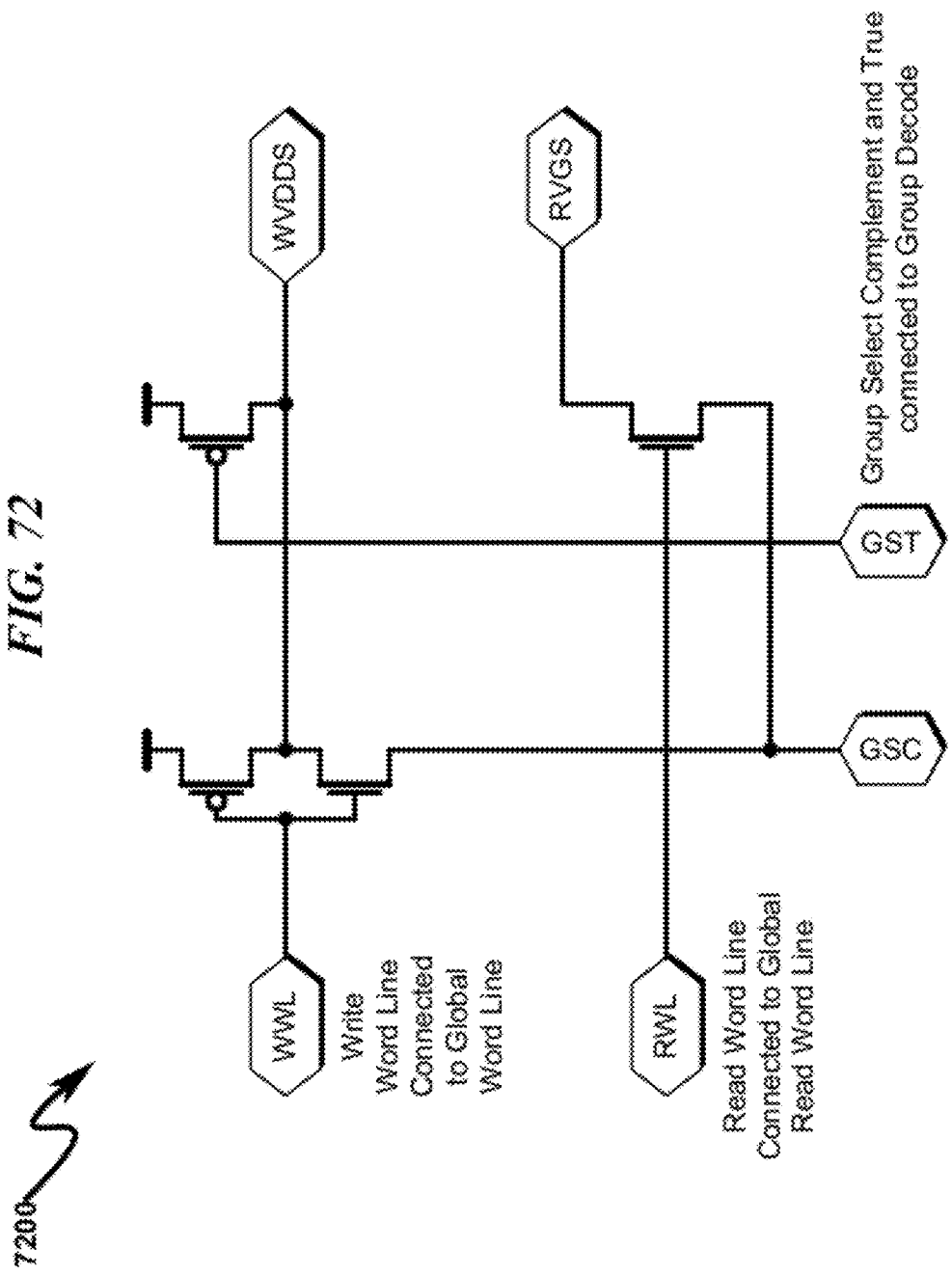
FIG. 72 illustrates an exemplary schematic circuit diagram of a group select circuit that creates write VDD switch and read virtual ground select.

An exemplary embodiment of Group Select Circuitry with VDD switching and Read Virtual Ground Select is illustrated in FIG. 72 (7200).

6T Memory Array Detail (7300)

Figure 73:
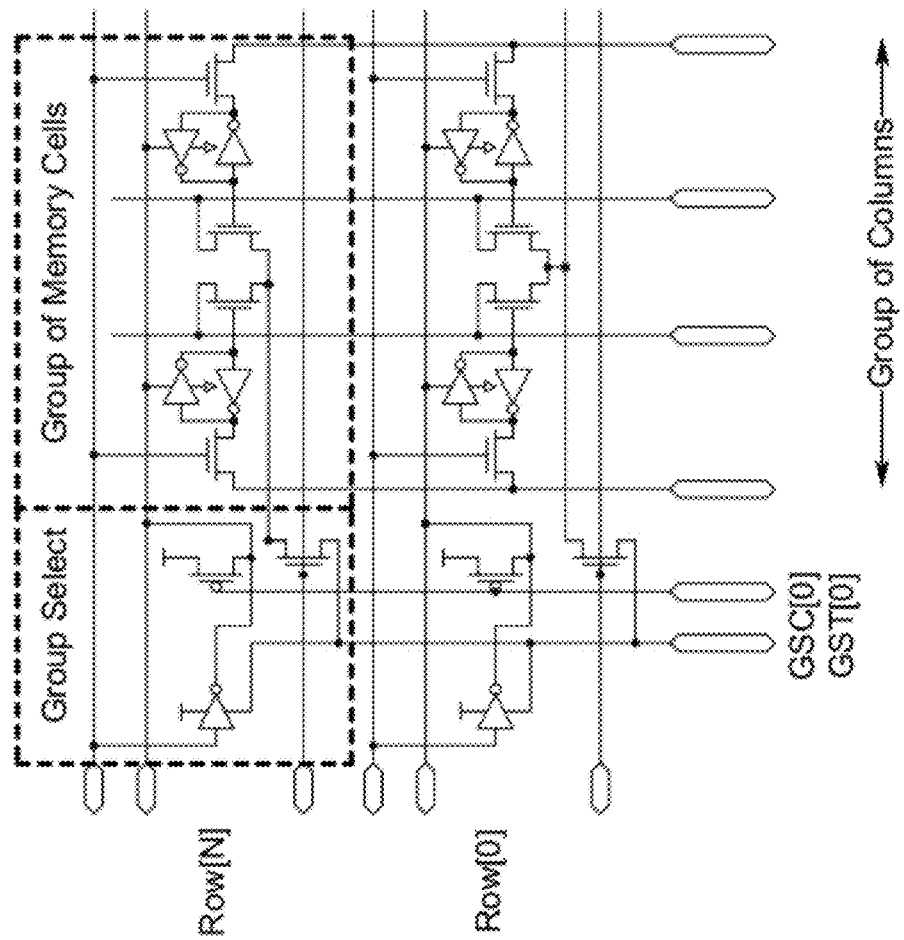
FIG. 73 illustrates internal transistors from array in FIG. 71.

An exemplary embodiment a memory array using 6T memory cells and its control by the Group Select circuitry is illustrated in greater detail in FIG. 73 (7300).

Most of the discussions above and the referenced drawings are based on the Global Write Word Line approach, but many of the approaches and designs will apply to the Group Write Word Line approach as well. The MULTI-WRITE and its structure within the array opens up many avenues to adjust the design based on the process that it will be built in and the goal for that particular memory product.

The Global Write Word Line shown in FIG. 73 (7300) common to all groups along the row where WVDDS and RVGS are only common within a single group. Using a Global Write Word Line connected directly to the Pass Gates will cause the unselected groups along the row to have their pass gates turned on and thus expose those cells to READ DISTURB. Therefore, the BETA PATIO must be adjusted to prevent this by having a weaker pass gate than the pull down in the inverter connected to the Pass Gate and/or lowering the pre-charged voltage on the write Bit Lines.

6T Group Select Connections (7400)

Figure 74:
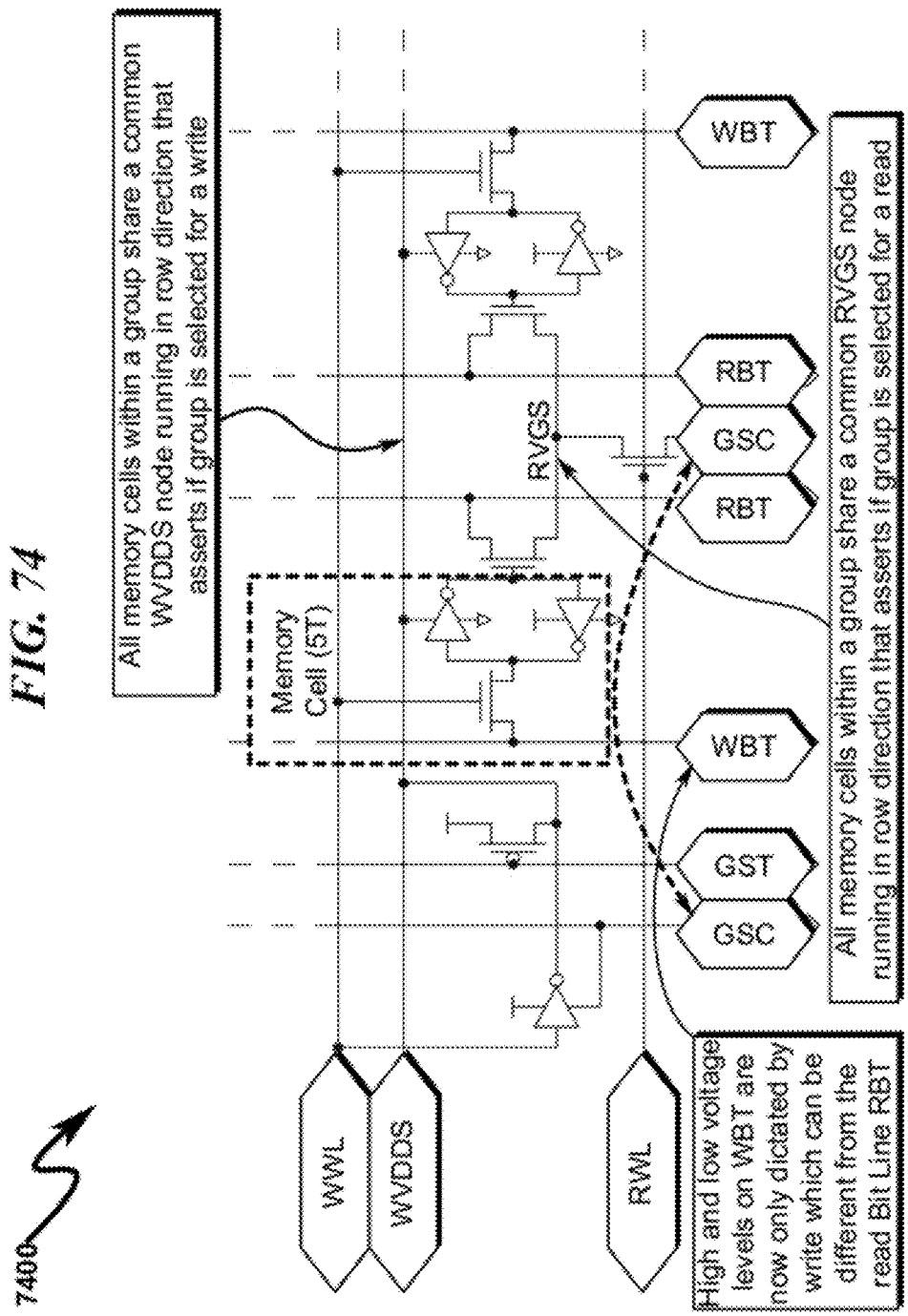
FIG. 74 illustrates Single Group of 6T DFM Memory Cells.

The connections and functions that are formed between the Group Select circuitry and a row of groups of memory cells are shown in FIG. 74 (7400). The MULTI-WRITE embodiment presented herein can be applied to the 6T embodiment as well. One difference is that the Bit Line is now not commonly used for both read and write. Write Bit True (WBT) is only used for writing data into the memory cell, and there is a separate Bit Line that is used for reading data out of the memory cell called RET (Read Bit True). Having separate read and write ports can provide several benefits in this embodiment:

The desired voltage that the Read Bit Line (RET) is pre-charged to for reading highs and lows can be optimized for reading without having to adjust to different levels for writing, because a single Bit Line isn't shared for both read and write. This can lead to adjusting the dv/dt to be lower and therefore reduce power.

Write recovery which occurs after a write and must prepare/pre-charge the Bit Line for the next cycle which could be a read will now not limit the cycle time because a separate Bit Line (RBT) can be prepared and waiting for a read in the next cycle. This will allow overall for a faster cycle time.

The desired voltage that the Write Bit Line (WBT) is driven to for writing highs and lows can be optimized for the best write voltages without having to adjust to different levels for reading, because a single Bit Line isn't shared for both read and write. This can lead to adjusting the dv/dt to be lower and therefore reduce power.

A group is selected for a write by the logical combination of the selected Write Word Line and group decode signals GST and GSC. This in turn sets up the 2 Step MULTI-WRITE by first driving WVDDS low on all of the memory cells connected to that local signal which writes a high in all of those memory cells. Then during step 2 WVDDS is driven back to VDD and those memory cells requiring a low to be written will have their specific WET lines pulled low while the others remain high. A Read-Modify-Write technique or other techniques can be used for cases where it is desired for the group to have more memory cells along its row than the number to be written, which usually is dictated by the Bits Per Word (BPW).

Pre-Charge Bit Line Control (7500)

Figure 75:
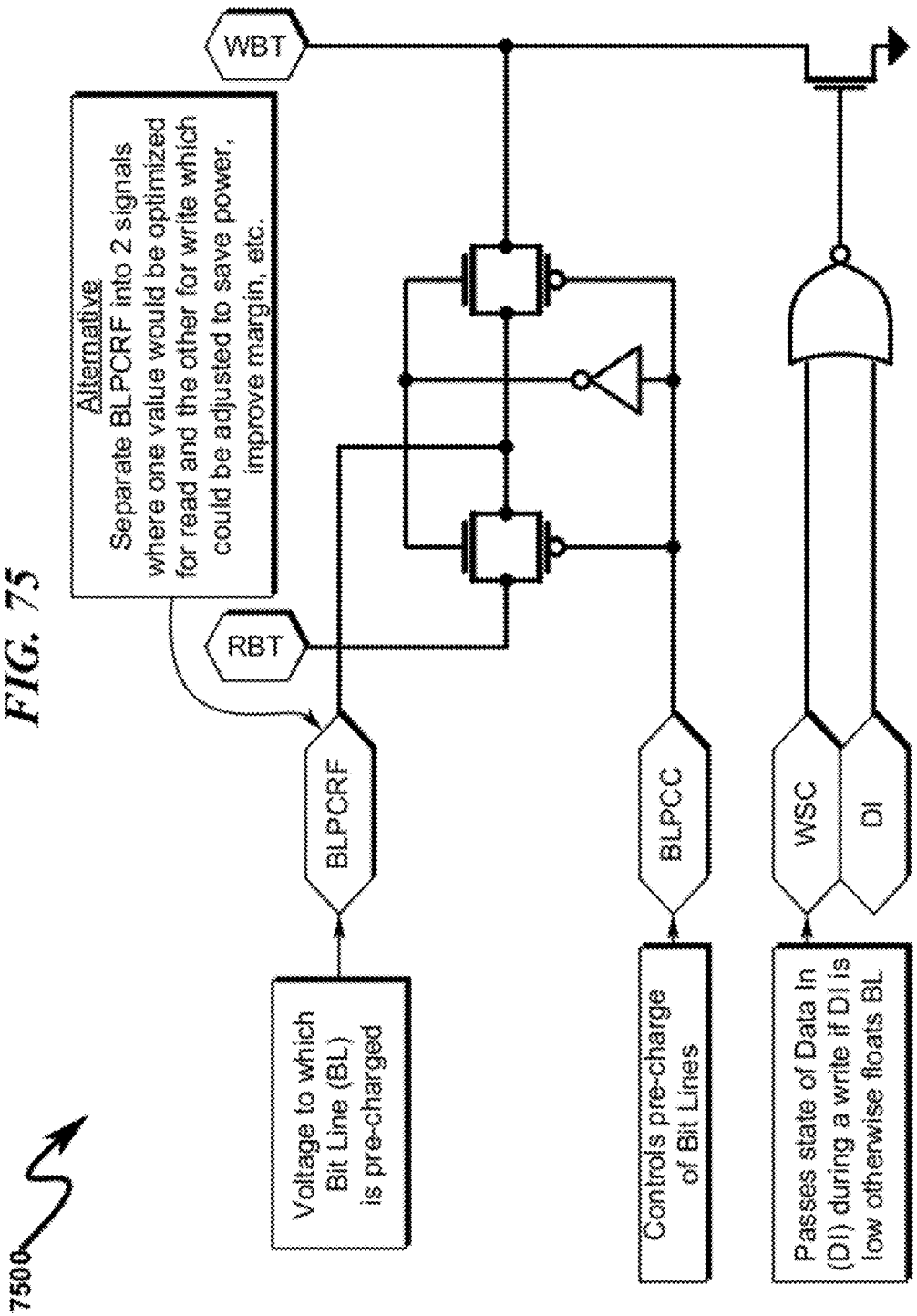
FIG. 75 illustrates circuit that controls pre-charge of bit lines and passing data in (if low) onto bit lines during a write.

As presented herein, the only goal of step 1 of the TWO-STEP-WRITE is to write a high into every memory cell that shares WVDDS within the selected group by taking WVDDS low which doesn't necessarily require that the Bit Line be pulled all the way to VDD. In this example the Bit Lines float at the pre-charged value of VDD/2, but other values for the high voltage on the Bit Lines can be chosen based on the process and design goals. An example of a circuit that only pulls the Bit Line Low when Data In (DI) is low is shown below and initially pre-charges the Bit Lines to a value equal to BLPCRF. This example also uses the same pre-charge voltage value (BLPCPF) for both the read and write Bit Lines, but separate pre-charge voltages could be used as well. There are many ways to set the pre-charge value such as the way it is done in a DRAM. The circuit illustrated in FIG. 75 (7500) is just one example of many possibilities.

Pre-Charge Bit Line Control Waveforms (7600) (7700) (7600)

Figure 76:
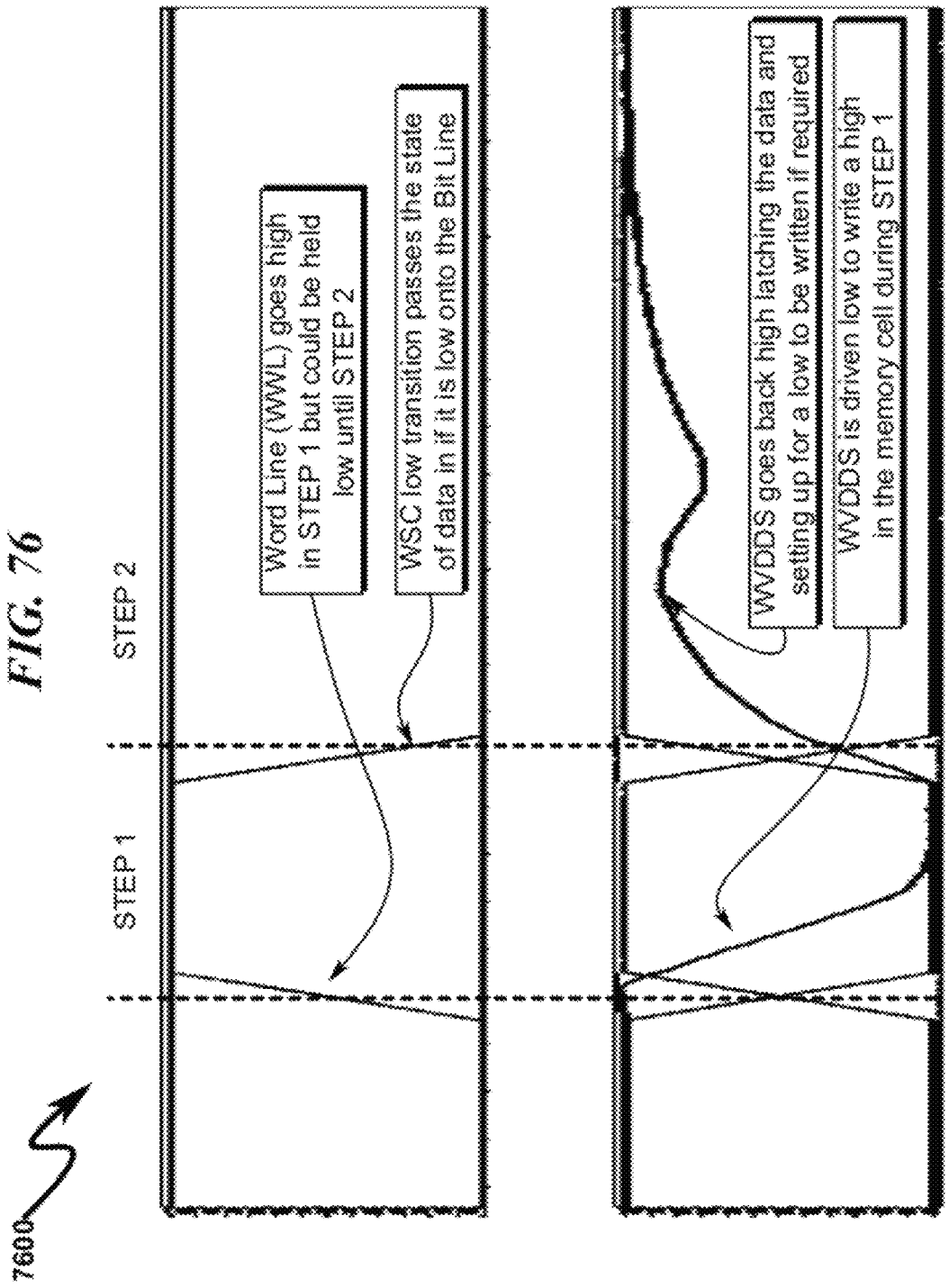
FIG. 76 illustrates exemplary TWO-STEP MULTI-WRITE signal waveforms and timing.
Figure 77:
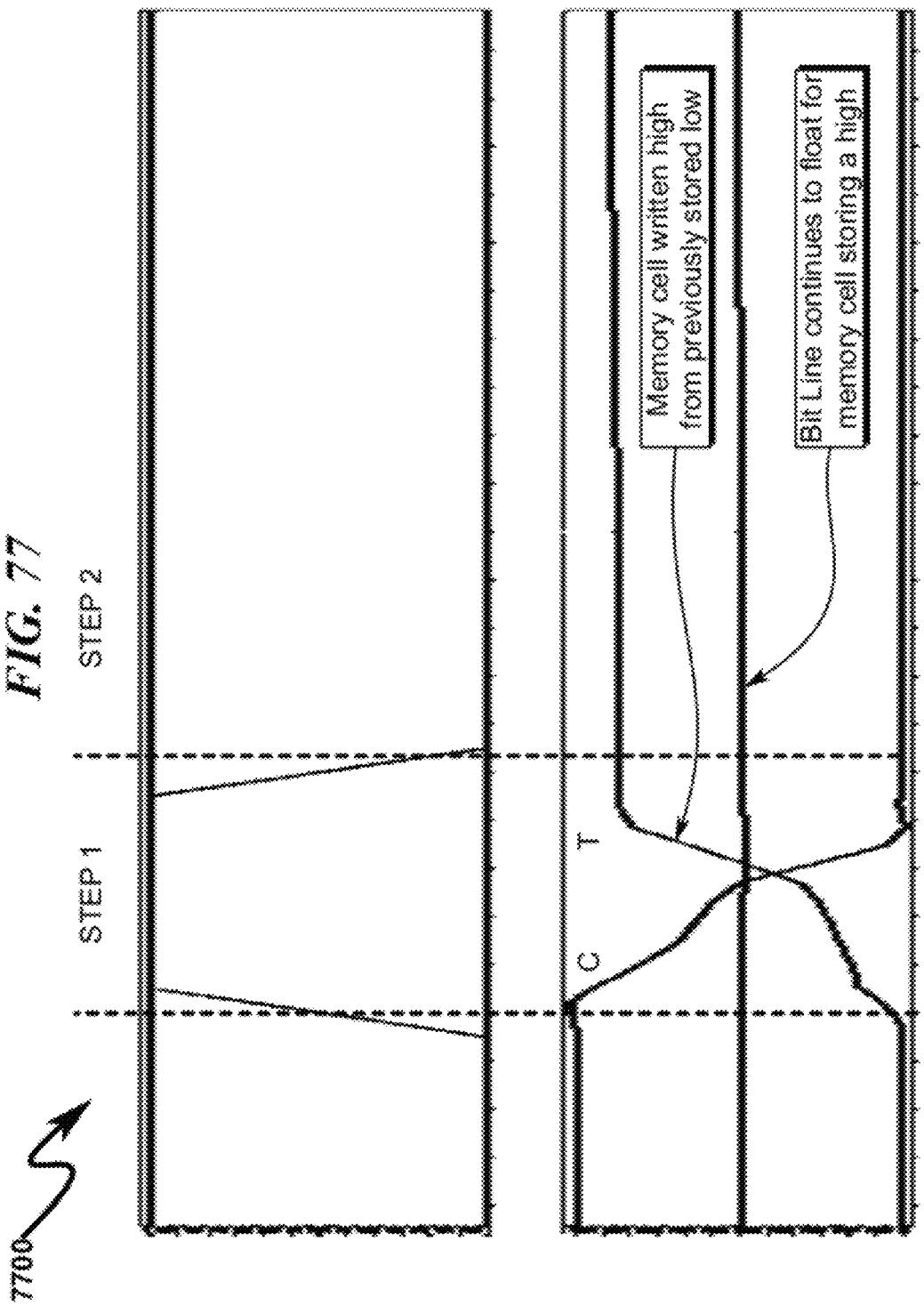
FIG. 77 illustrates exemplary TWO-STEP MULTI-WRITE signal waveforms and timing.
Figure 78:
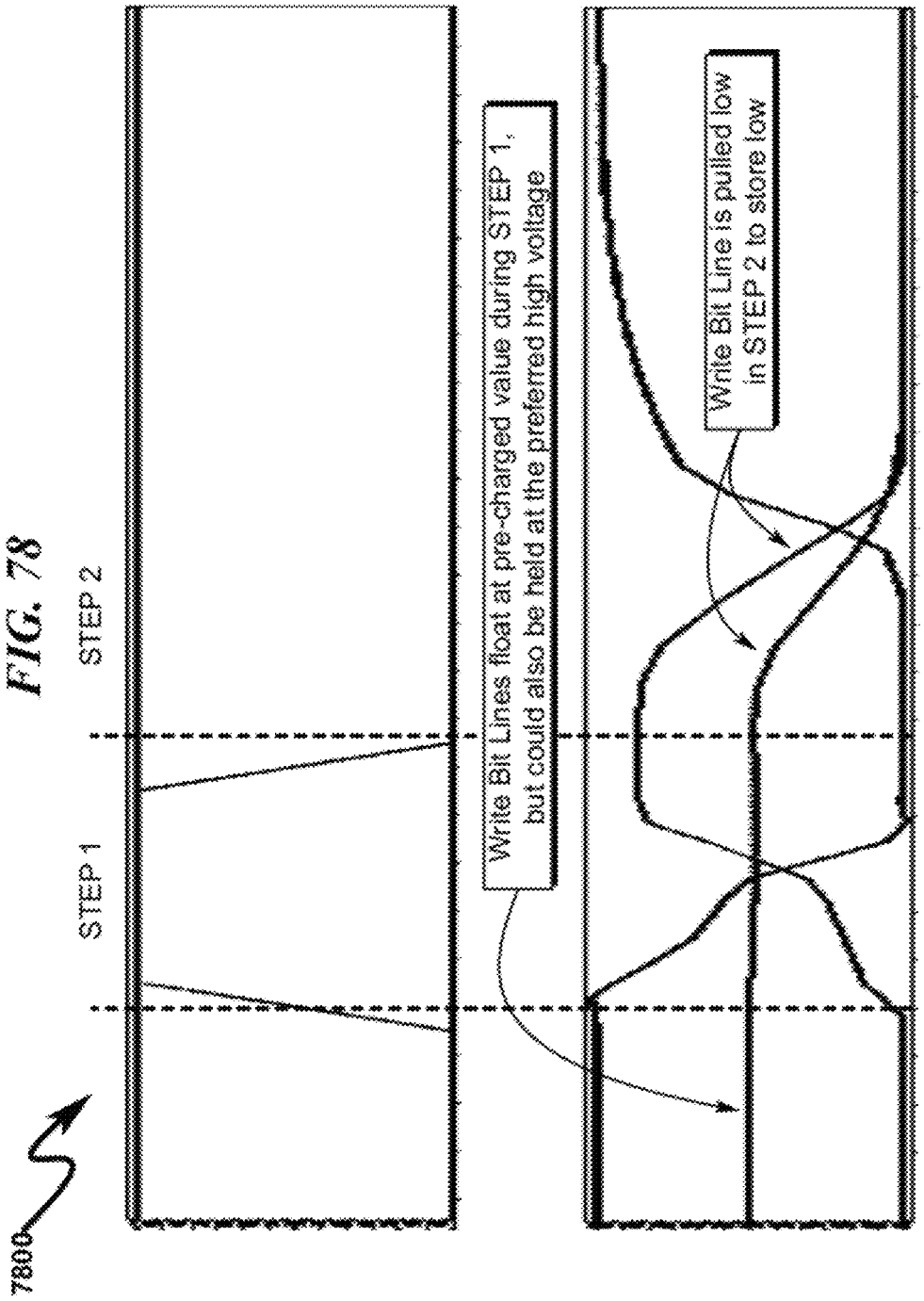
FIG. 78 illustrates exemplary TWO-STEP MULTI-WRITE signal waveforms and timing.

The signals associated with the MULTI-WRITE are similar in function to what was presented previously, and are shown in FIG. 76 (7600), FIG. 77 (7700), and FIG. 78 (7800).

Separate Read Port with Shared Virtual Ground

Overview

Another embodiment of the present invention associated with the read port which only requires one N-channel transistor (called Read Bit Line Driver) thus keeping the total transistors within the new DFM memory cell limited to 6. The source of the Read Bit Line Driver is connected to a shared virtual ground node (RVGS) that is only applied for the selected group to be read, keeping all other RBT Bit Lines in the other groups along the same row quiescent.

Exemplary Separate Read Port Schematic (7900)

Figure 79:
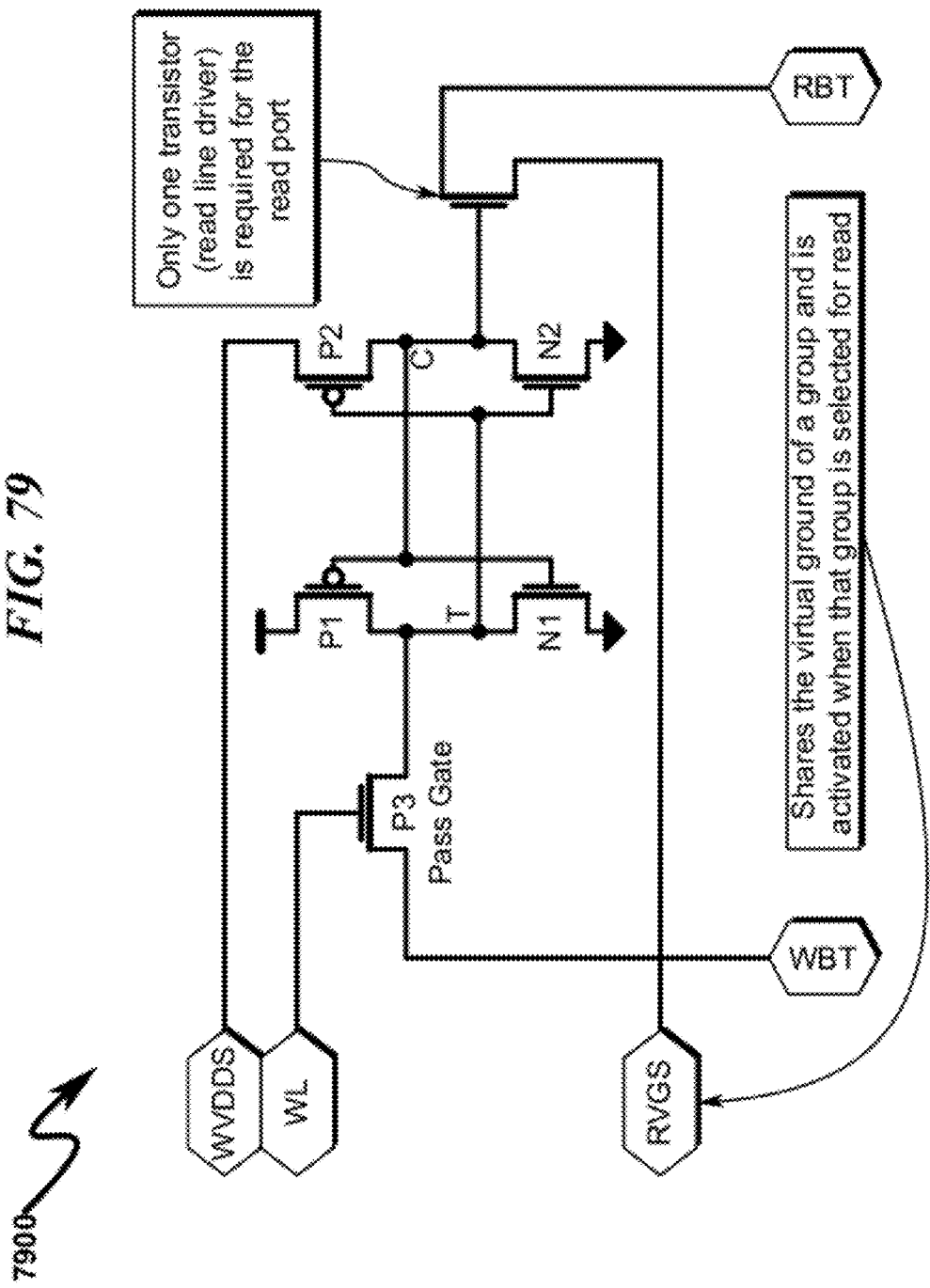
FIG. 79 illustrates an exemplary schematic circuit diagram of a 6T DEM memory cell read port embodiment.

Referencing the schematic of FIG. 79 (7900), having its gate connected to node C will result in the ability to drive the Read Bit Line (RBL) much faster than the series pass gate of the traditional 6T memory cell and prevent any coupling of voltage from the read Bit Line (RBT) onto the internal node of the latch (C). The elements associated with reading the new memory cell are generally illustrated in FIG. 79 (7900).

Exemplary Separate Read Port Memory Array (8000)

Figure 80:
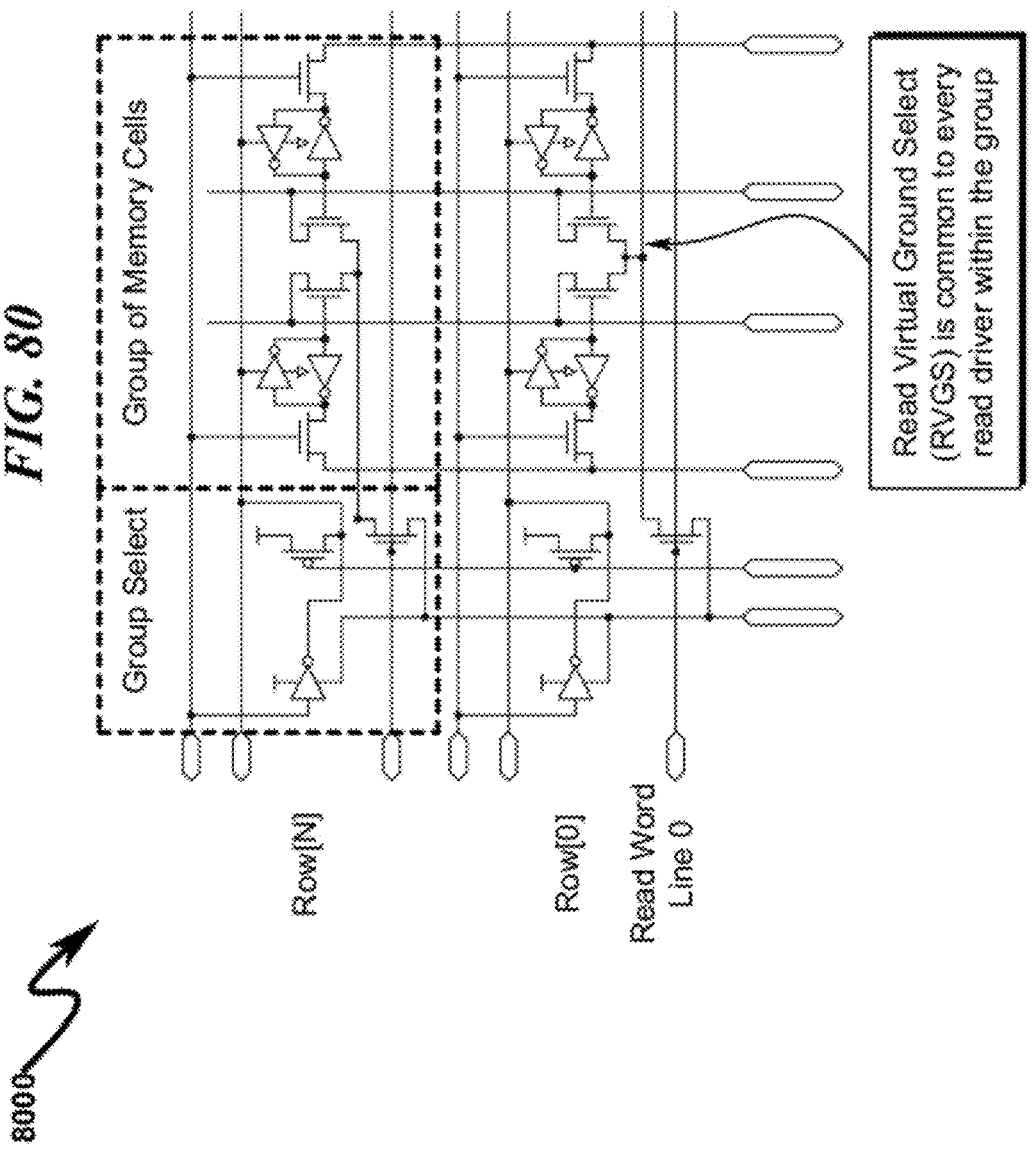
FIG. 80 illustrates an exemplary schematic circuit diagram of a read virtual ground select (RVGS) implementation.

The structure of the array for both the read and write is generally illustrated in FIG. 80 (8000). The assertion of RVGS within the array is determined by the logical combination of the decoded group address which creates Group Select Complement (GSC) and the decoded Read Word Line. One of the benefits with only selecting the read drivers within a group is that it saves substantial array power during a read, because the only RBT Bit Lines that are moving are the ones within the group. Pulling the selected RVGS low will cause the previously pre-charge RBT line to go low if the cell has a low stored in it, because the Read Bit Line Driver is on. The read Bit Line will remain high if the memory cell has a high stored in it and a 1 will be read.

Exemplary Single Group Read Schematic (8100)

Figure 81:
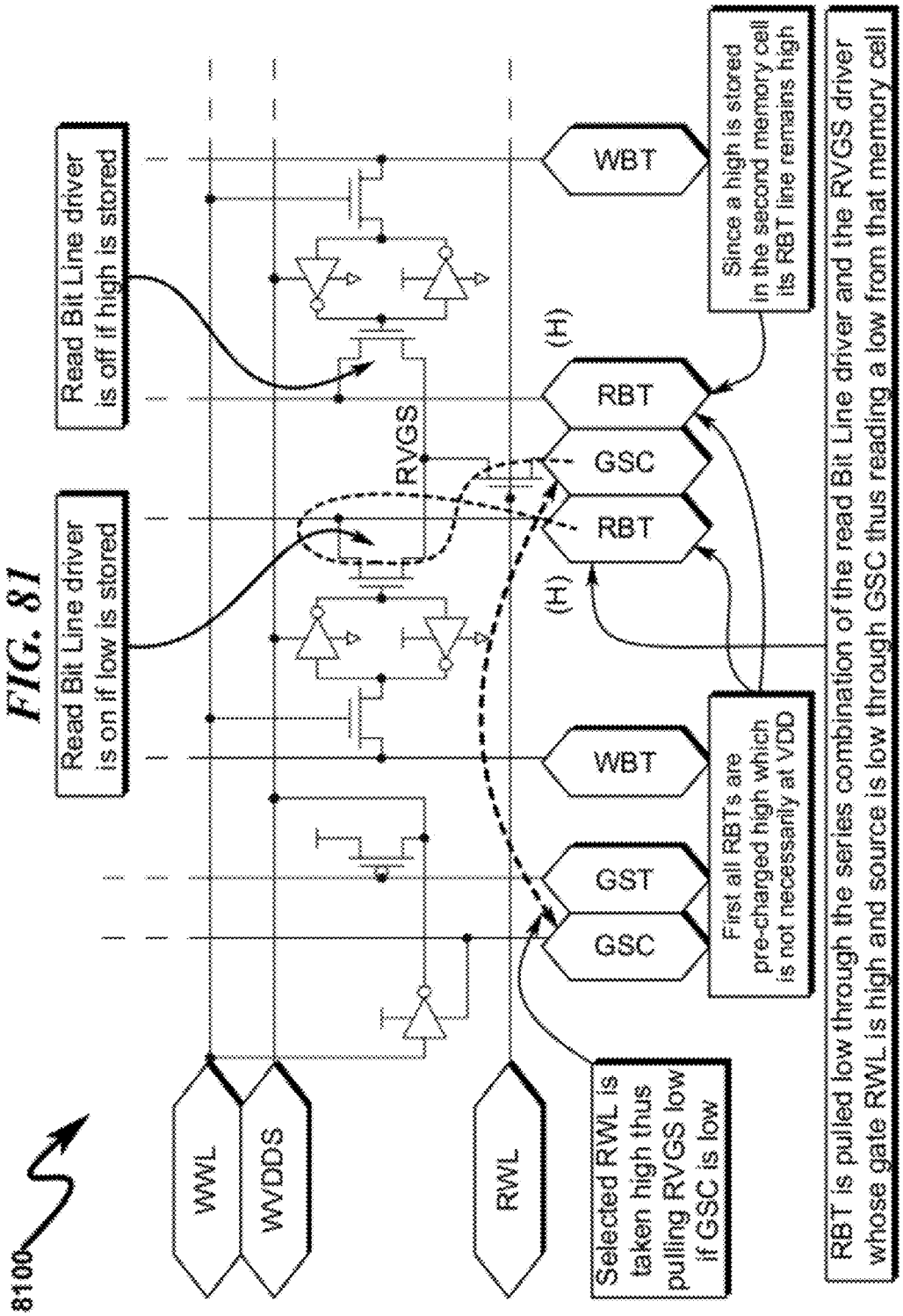
FIG. 81 illustrates reading a low from the first memory cell and a high from the second memory cell within the selected group.

A schematic of a single group being read is illustrated in FIG. 81 (8100).

Exemplary Single Group Read Timing Analysis—High is VDD (8200)

Figure 82:
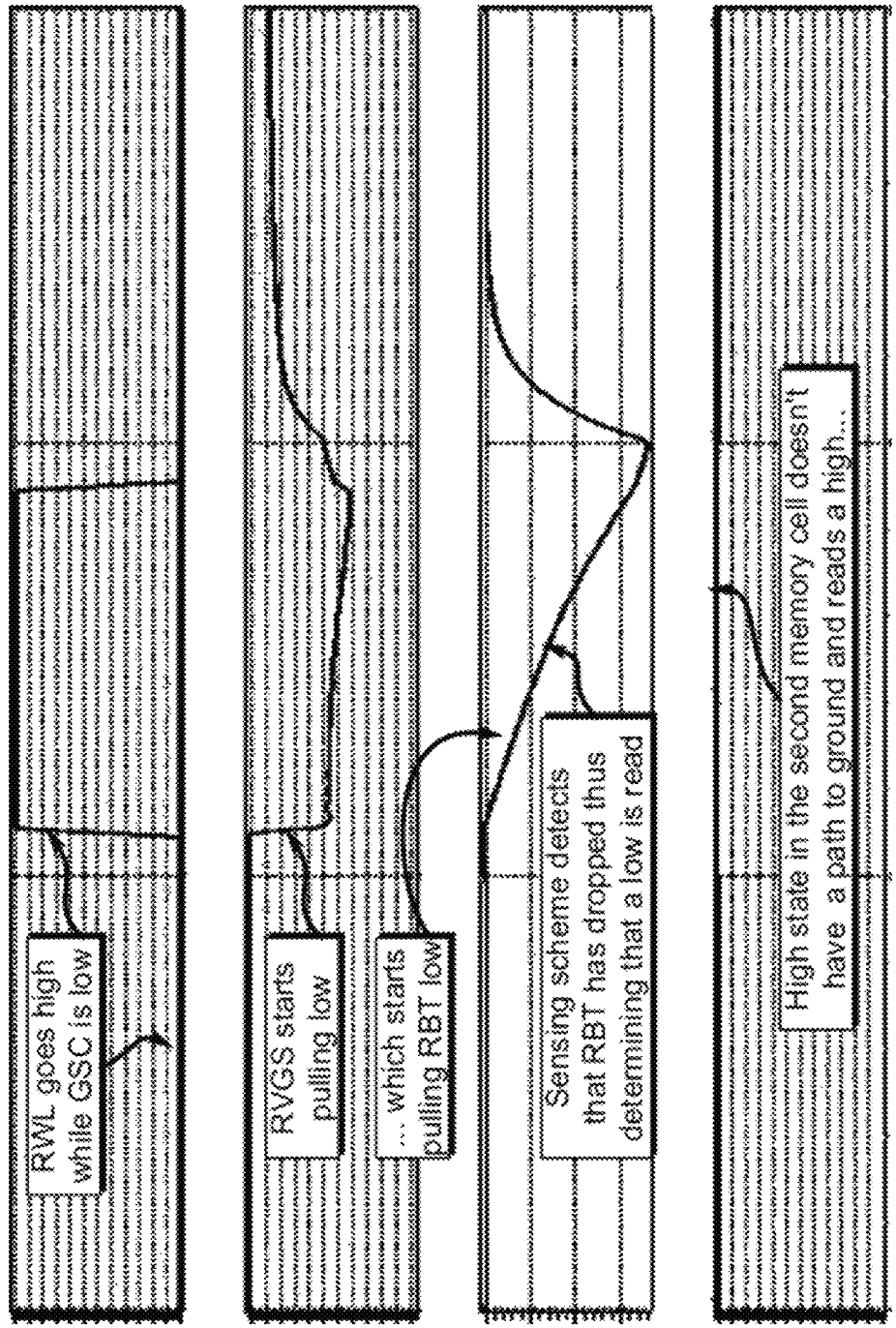
FIG. 82 illustrates an exemplary signal timing diagram of reading a low and a high where the value of high is VDD.

Waveform analysis of the Single Group Read with the high equal to VDD is presented in FIG. 82 (8200).

Exemplary Single Group Read Waveform Analysis (8300)

Figure 83:
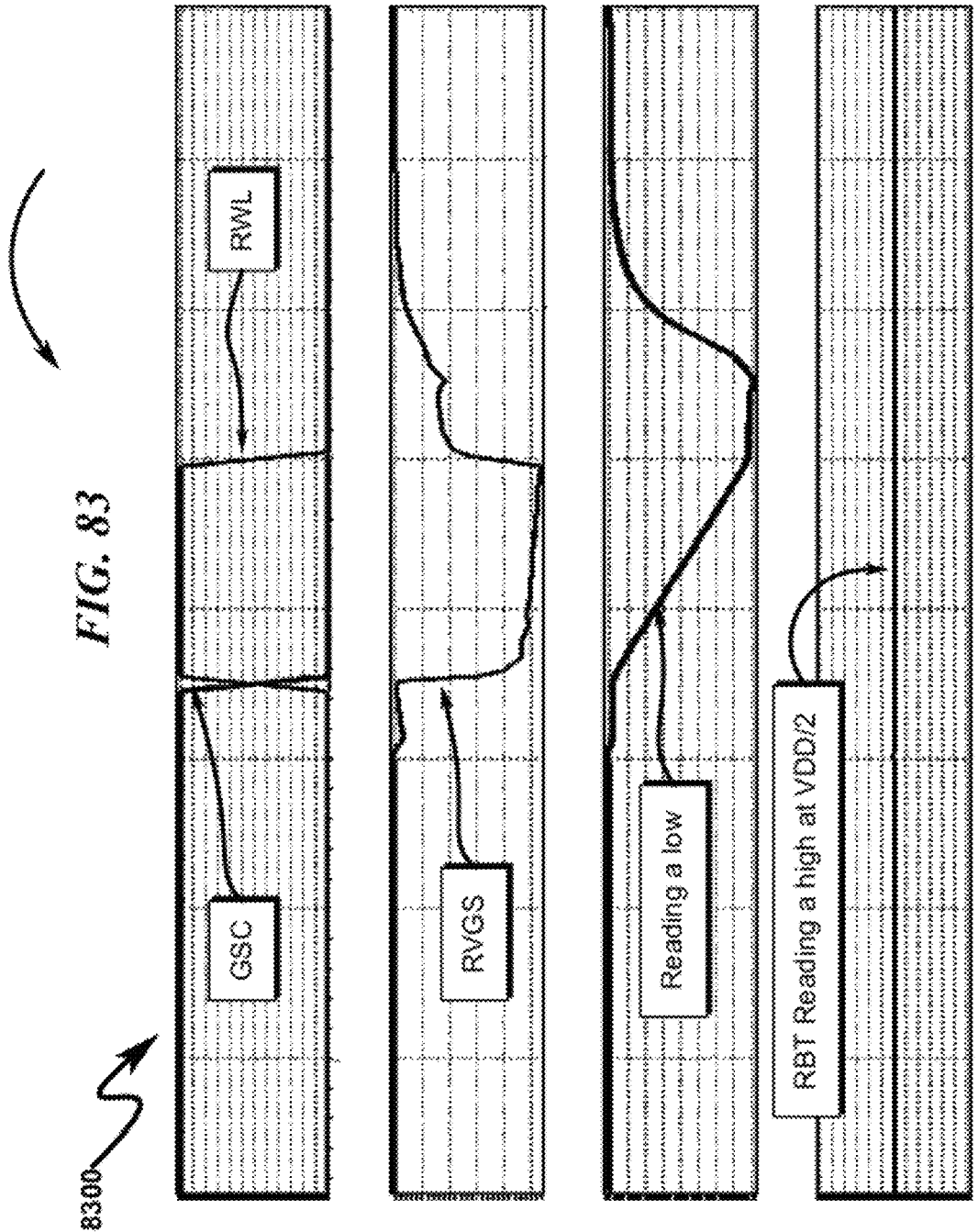
FIG. 83 illustrates an exemplary signal timing diagram of reading a low and a high where the value of high is VDD/2.

Waveform analysis of the Single Group Read with the high equal to VDD/2 is presented in FIG. 83 (8300).

RVGS Sharing Issues (8400)

Figure 84:
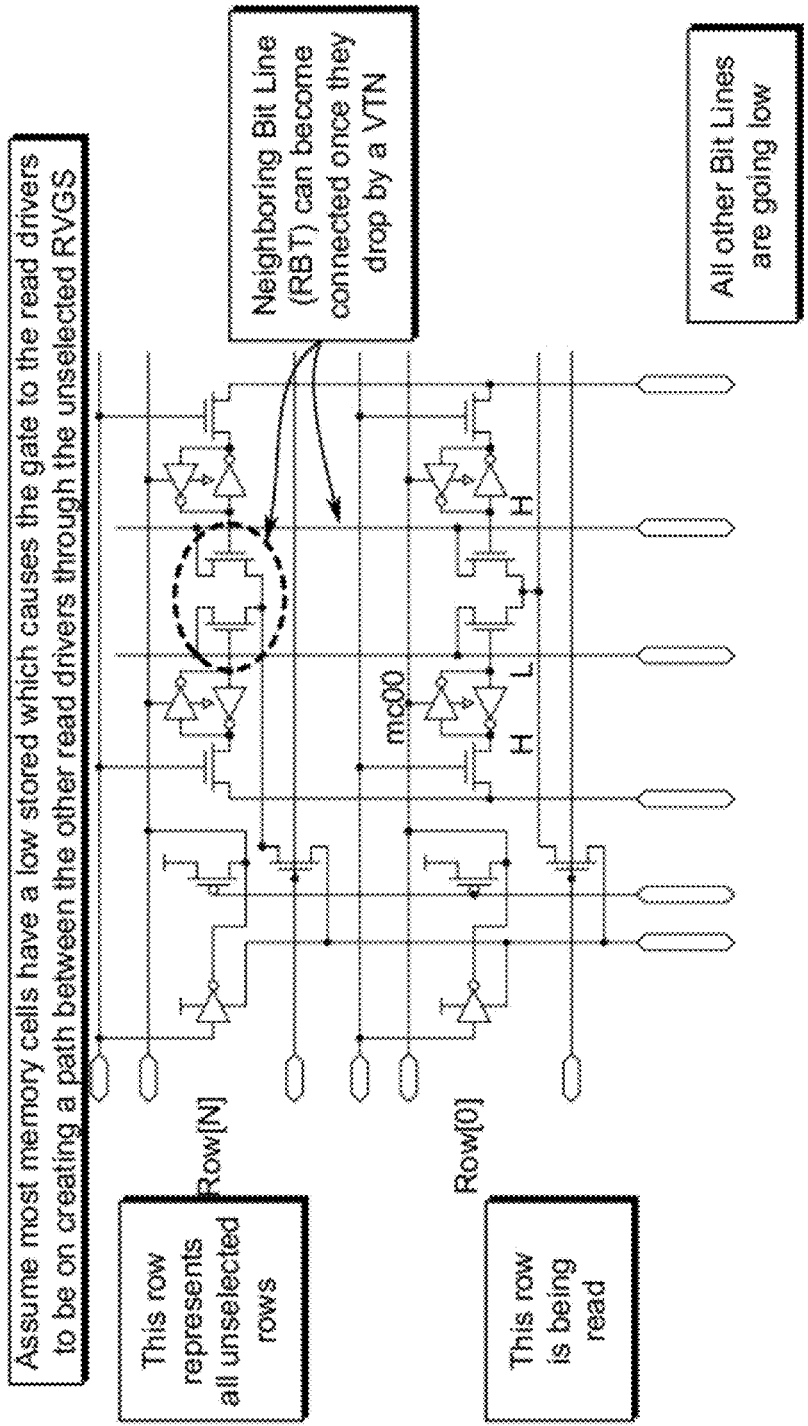
FIG. 84 illustrates clamping path through other read drivers on other rows but on same columns within group.

Because of the shared nature of RVGS, many paths can exist from RVGS to the RBT columns being read if the RBT Bit Lines drops by a N-channel threshold voltage (VTN). Once the Bit Line drops below a VTN from its initial pre-charged state it can cause the other read drivers to begin to turn on and essentially halt the downward movement of the Bit Line if it is trying to read a low. This is not an issue, because the word Line is pulled back low when sensing is complete which will occur before any of the Bit Lines being read can drop by as much as a VTN. This condition depends of the state stored in the memory cell. An example of this is illustrated in FIG. 84 (8400). It is assumed that most of the memory cells along the columns associated with the selected group have a low stored in them which results in the read drivers being on, because their gates are connect to their respective c node. As the RBT Bit Lines go low it will eventually turn on the other drivers that are connected to the same Bit Line on other rows. By turning on, they will begin to pull down the unselected RVGS on the unselected rows, thus creating a connection between the shared sources of the read drivers to other Bit Lines. The previous pre-charged high RBT Bit Lines have a lot of capacitance on them and can bring the low going Bit Line to a halt, but this is not a problem since the read will end before the Bit Lines ever drop that low by going back into pre-charge and taking the RWL back low.

P-Channel Embodiment (8500)

Figure 85:
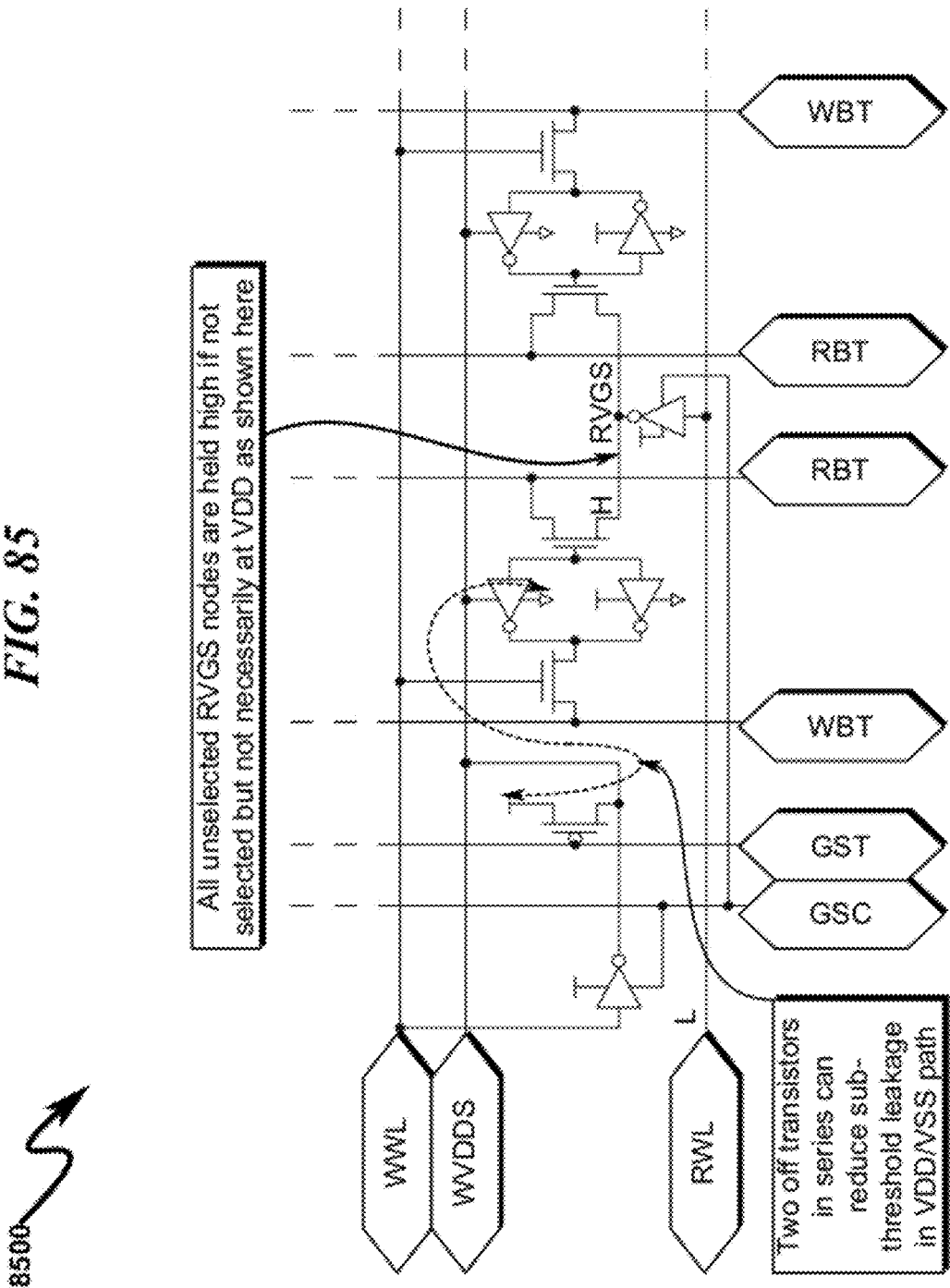
FIG. 85 illustrates P-channel pull-up added to RVGS driver to hold RVGS high when unselected.

In another preferred embodiment, a P-channel device is added to the RVGS driver which assures that all of the unselected RVGS nodes are held at high, which could be at VDD, VDD/2 or whatever value the Bit Lines are pre-charged to, and therefore, are not floating when unselected. The high voltage of RVGS needs to be the same as the high pre-charge voltage of the Bit Lines, because if not, the RVGS driver could be on if a low state is in the cell which would then create a crowbar current path between the Bit Lines and RVGS. This is illustrated in FIG. 85 (8500).

Group Select Variations

Other variations of accessing the memory cell through RVGS during a read exist for how the Group Select function can be used based on the goals for the SRAM product and the target manufacturing process. For example, in another embodiment the RVGS driver whose gate is connected to RWL in the group select circuits above can be moved to within the memory cells or shared by less memory cells than all within the group. This can give the designer a way to strengthen the pull down capability of RVGS and thus create a faster discharge of the Read Bit Line (RBT) which can speed up the access of the SRAM.

Strengthening the Pulldown Capability of RVGS (8600)

Figure 86:
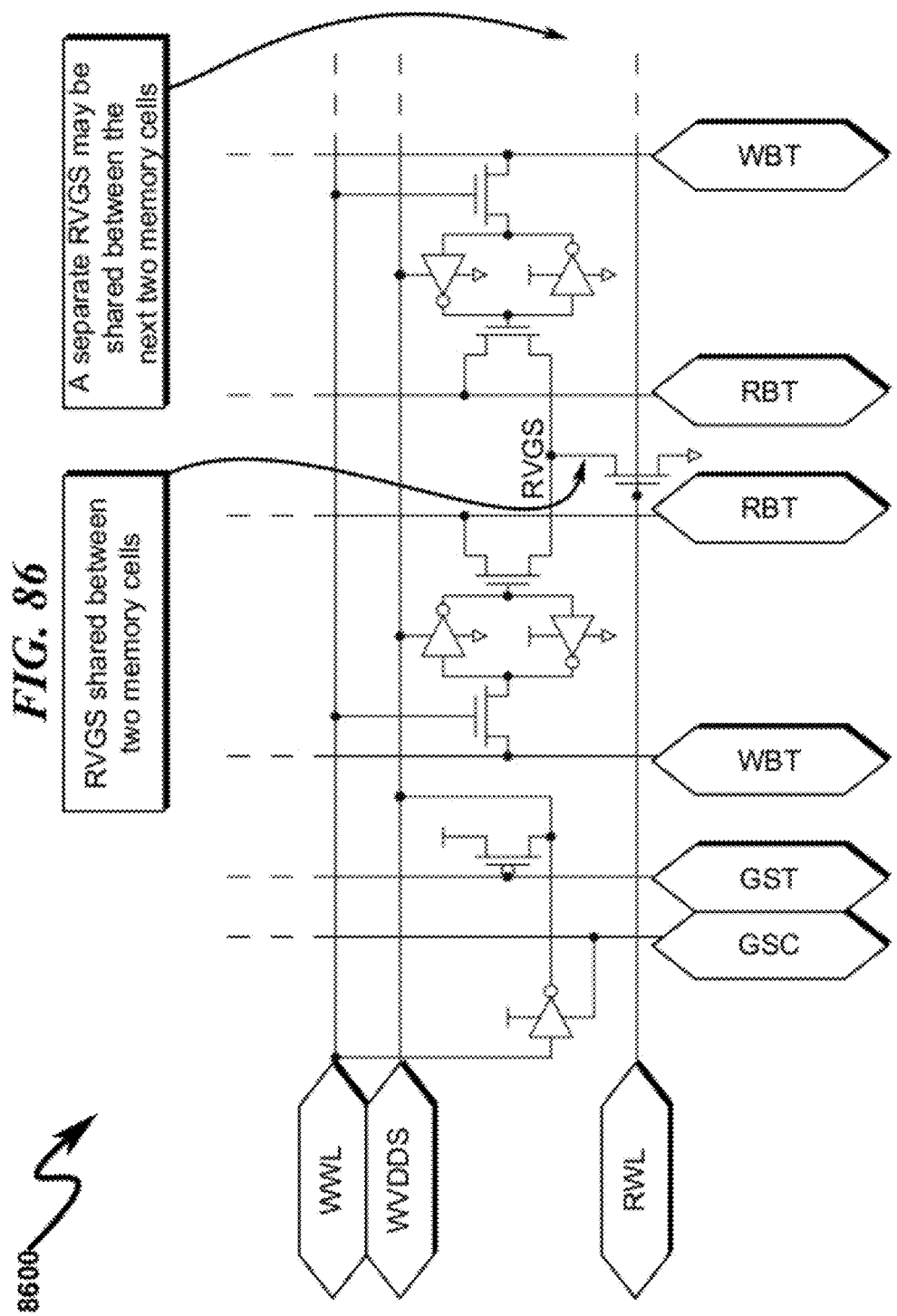
FIG. 86 illustrates an exemplary schematic circuit diagram of a single group showing a variation of how RVGS is shared with only two neighboring memory cells.

One exemplary embodiment of this is generally illustrated in FIG. 86 (8600), where RVGS is shared between two neighboring memory cells instead of all within the group. Therefore, only two (2) memory cells Read Bit Line drivers have to be pulled low if both memory cells are reading a low and pulling on their respective Read Bit Lines (RBT) instead of all within the same group. The number of cells that share RVGS can vary (2, 4, 8, or greater).

7T Memory Cell (8700)

Figure 87:
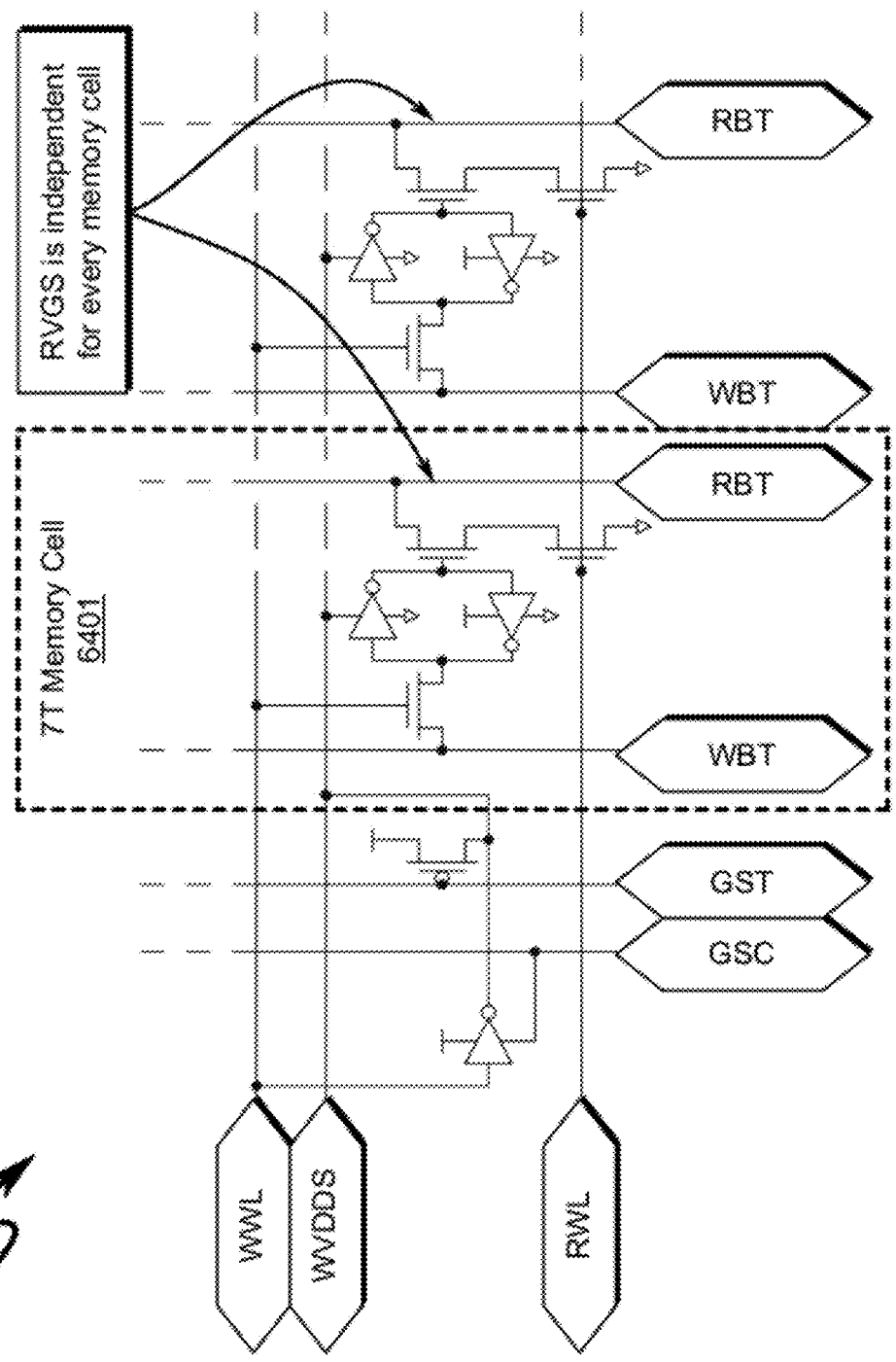
FIG. 87 illustrates an exemplary schematic circuit diagram of a group of 7T memory cells where the RVGS driver is not shared but is included in every memory cell.

Yet another variation in RVGS is to not share it at all, but instead add the RVGS driver into each memory cell, thus preventing any issues with sharing on the read port. This, of course, increases the number of transistors in the memory cell to 7 instead of 6 but has the advantage of not being effected by the data in the other cells within the group and will offer the fastest discharge rate of the Read Bit Line (RBT). As in the 6T version, this version has READ DISTURB eliminated and utilizes the MULTI-WRITE embodiment. This embodiment of a 7T memory cell is generally illustrated in FIG. 87 (8700).

Group Write Word Line

Overview

Another preferred invention embodiment uses a local write Word Line called Group Write Word Line (GWWL) to select the pass gates during a write which limits the number of memory cells that are accessed to just the individual group to be written, thus completely eliminating READ DISTURB during a write. With this approach, the noise margin issues discussed in the Background Section for both a write and a read do not exist. A normal read through the separate read port prevents READ DISTURB during a read, and during a write, the only memory cells that are accessed along the row are the ones to be written, therefore READ DISTURB of these cells does not apply since they are being written anyway. Finally, no special sizing tradeoffs for the Pass Gate vs. the Pull Down are necessary and will not be as affected by process variation, VDD reduction and other conditions as the traditional 6T memory cell would. This configuration eliminates the need to adjust the BETA RATIO and allows both the pull down and the pass gate to be minimum size, thus making the memory cell smaller.

Another benefit of this exemplary embodiment is the additional savings in array power during a write cycle. The only Bit Lines that transition are those within the selected group, thus reducing the array power during a write cycle.

Group Write Word Line (8800)

Figure 88:
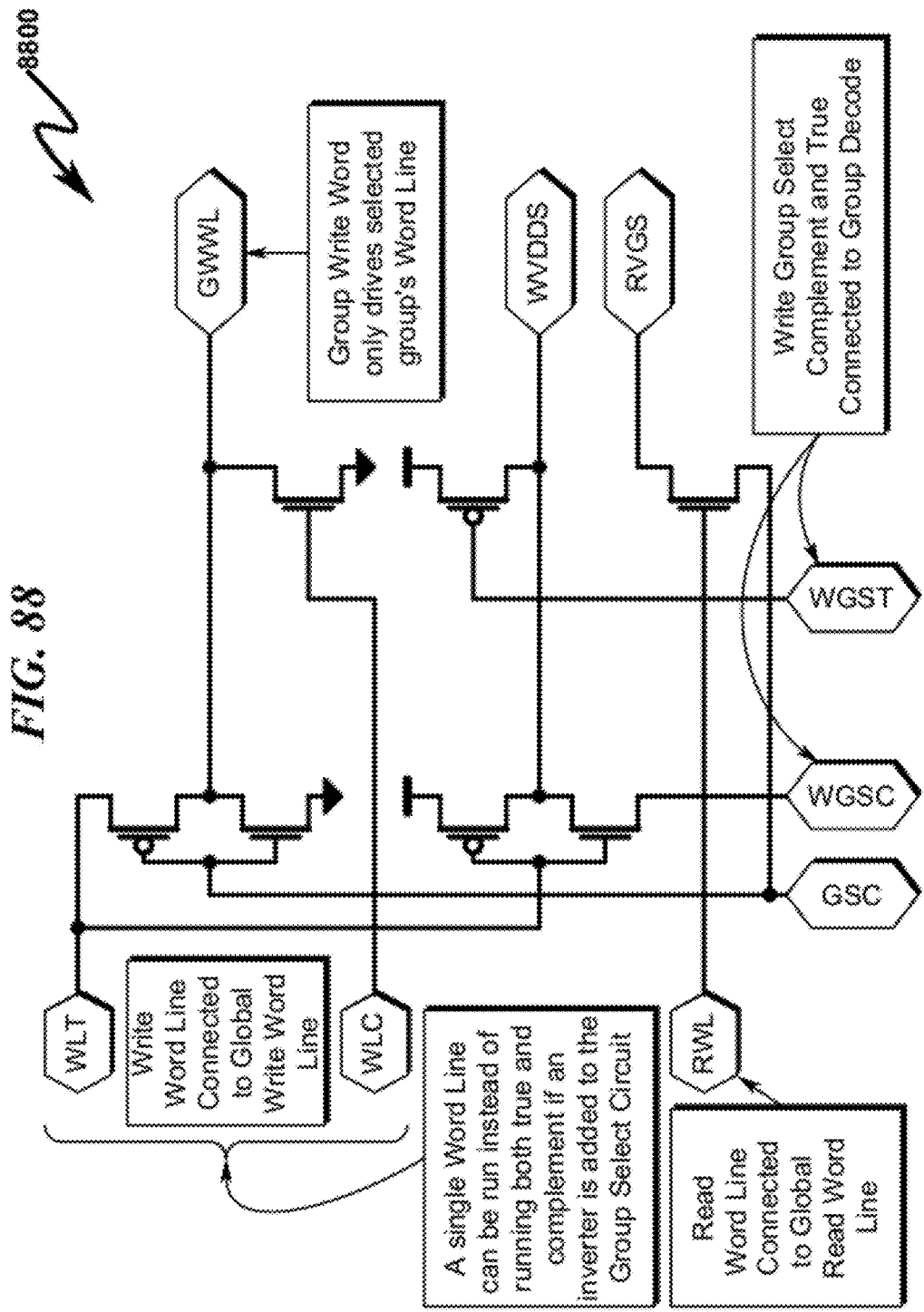
FIG. 88 illustrates an exemplary schematic circuit diagram depicting an exemplary group select decoder creating a group write word line, VDD select, and read virtual ground select.

The Global Write Word Line (WWL) discussed above has been modified in this embodiment to form a Group Write Word Line (GWWL) as shown in FIG. 88 (8800). The design of the Group Select circuit must now have the additional ability to create the Group Write Word Line.

Group Write Word Line Architecture (8900)

Figure 89:
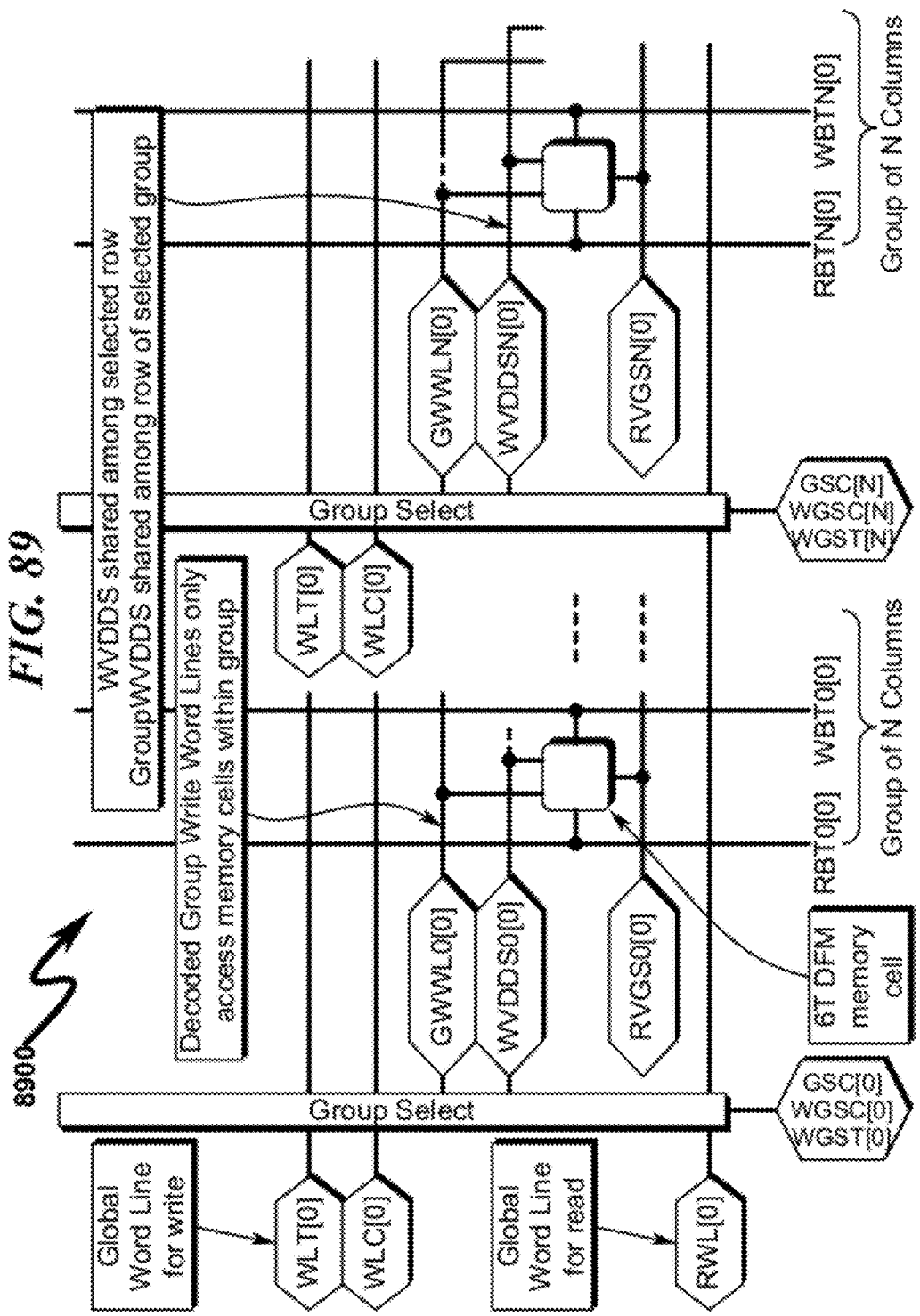
FIG. 89 illustrates array of 6T DFM memory cells with decoded group word lines accessing a group of memory cells.

One exemplary implementation of this approach is generally illustrated in FIG. 89 (8900).

Group Write Word Line Using Single Word Line (9000)

Figure 90:
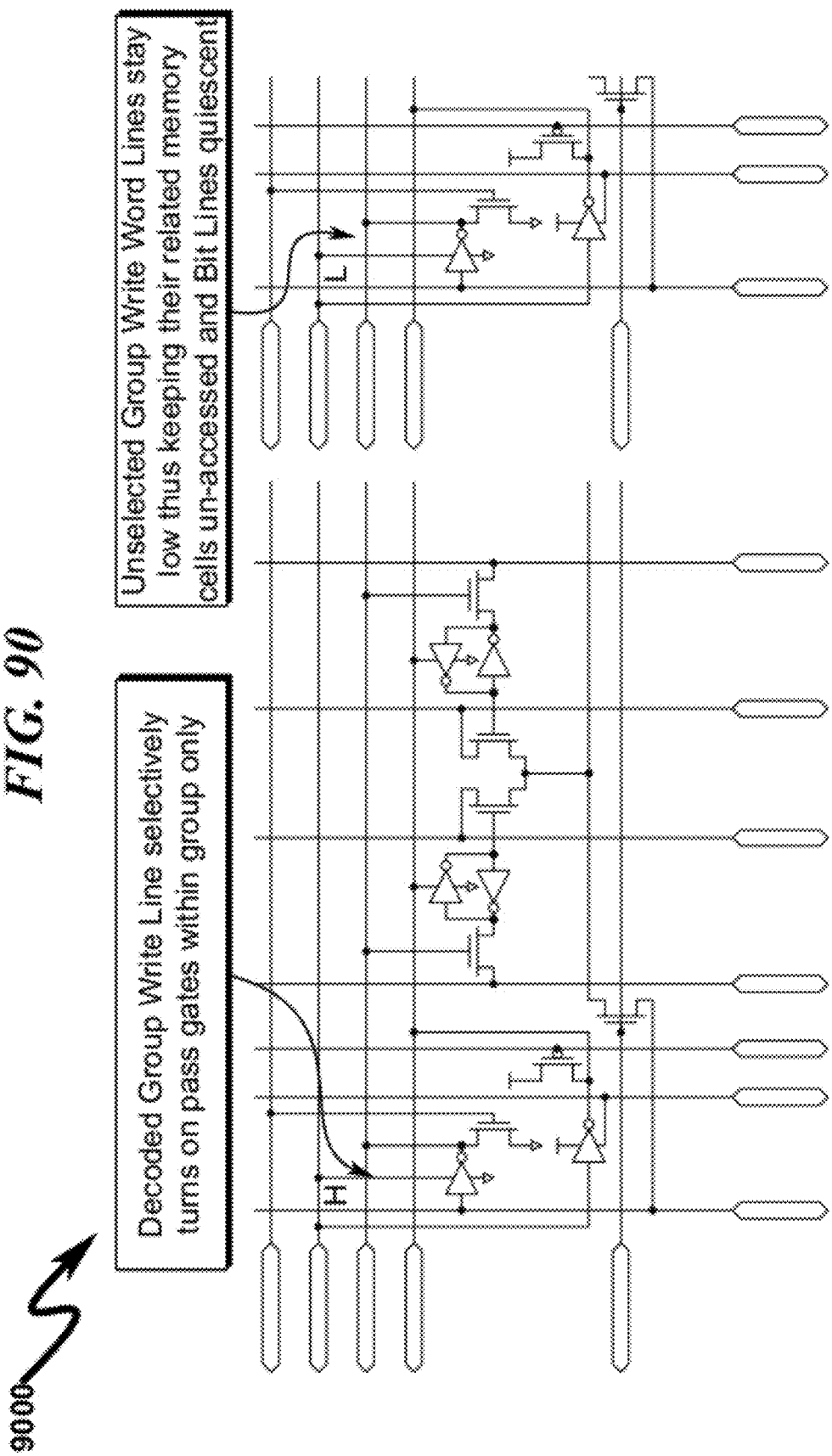
FIG. 90 illustrates an exemplary transistor level schematic circuit diagram of a group write word line approach.

One skilled in the art will recognize that other transistor arrangements and logic can be used to change the number of vertical and horizontal lines required based on the layout. For example a single Word Line signal can be run instead of running both true and complement as illustrated in FIG. 90 (9000). Note that the MULTI-WRITE design discussed above applies to these circuits as well.

Memory Array Power Reduction

The present invention in some preferred embodiments can result in a variety of power reductions in the overall memory array. As more requirements arise for portability of electronic devices such as cell phones, it becomes increasingly important for the power consumed by the memories to be reduced. Many ASICs utilize a large amount of memory on-chip, and this can result in considerable power consumption. This power consumption can also be unacceptably high in non-portable applications. Some of the power reduction benefits associated with several preferred embodiments of the present invention include, but are not limited to the following:

- The group decode of the Read Virtual Ground Select (RVGS) only allows for the selected memory cells within a group to assert, thus keeping all other Bit Lines along the row quiescent. This can substantially reduce the dynamic power burned in the array during a read cycle.
- Changing the Global Write Word Line (WWL) to a group decoded Group Write Word Line (GWWL) accomplishes the same power reduction noted above but occurs during a write cycle. In this situation all unselected memory cells along the row during a write are not accessed and therefore their respective Bit Lines remain quiescent.
- In the traditional 6T memory cell writing the memory cell with a full voltage swing is required on the selected Bit Lines. Since the write is very easy to perform using the present invention teachings, it does not require the Bit Lines to have a full transition from VDD to VSS. Several options exist to adjust the voltage swing on the Bit Lines during a write to less than a full VDD to VSS dv/dt. Reductions in dv/dt decrease the dynamic power consumed by the memory array.
- Leakage current has become a bigger and bigger problem as the transistor size continues to shrink with each new process that is developed, and can become a big problem for standby current. Sub-threshold conduction paths, as an example, are reduced or eliminated on several of the transistors that are stepped over and over in the array. A few examples of reduced or eliminated leakage current on all of the unselected memory cells are shown in FIG. 68 (6800) below.
- Removing the noise margin problems associated with READ DISTURB and Write-ability allows the VDD voltage to be reduced which is another embodiment. This has been difficult to do in today's submicron technologies, and in fact the array VDD may have to be higher than VDD for the other logic circuits within the ASIC. With the present invention, the memory array VDD can be scaled as it is in the surrounding logic circuits.

Exemplary 6T Memory without Interspersed Group Select

Overview (9100)

Figure 91:
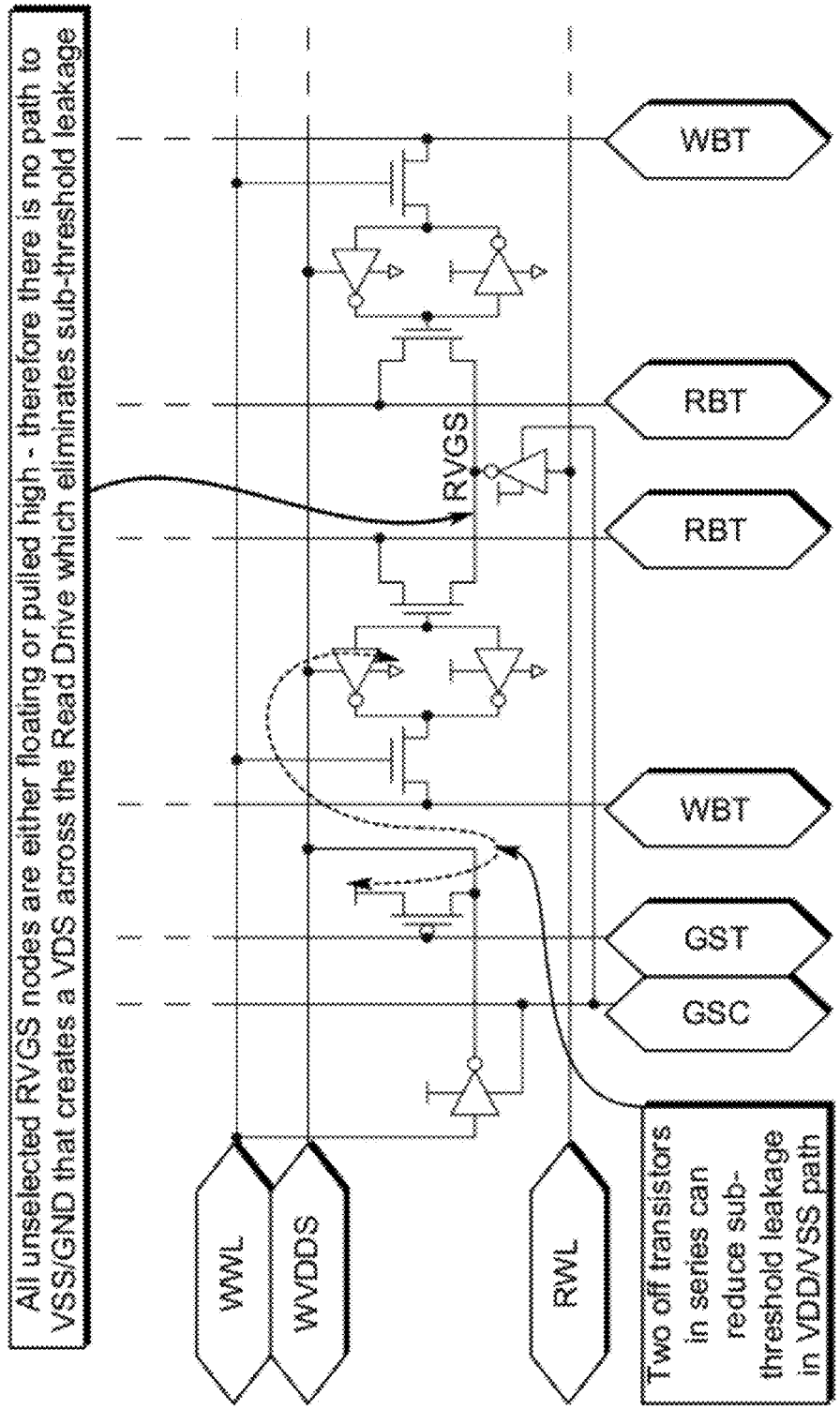
FIG. 91 illustrates example of reduction of sub-threshold conduction leakage of unelected groups.

In some preferred embodiments, the most efficient memory array configuration that will allow for the smallest physical size will not have any interspersed group select circuits or can have very large groups that would be segmented at the block or sub-array level. A block diagram of a memory with a single array is generally illustrated in FIG. 91 (9100).

Read-Modify-Write Example (9200)

Figure 92:
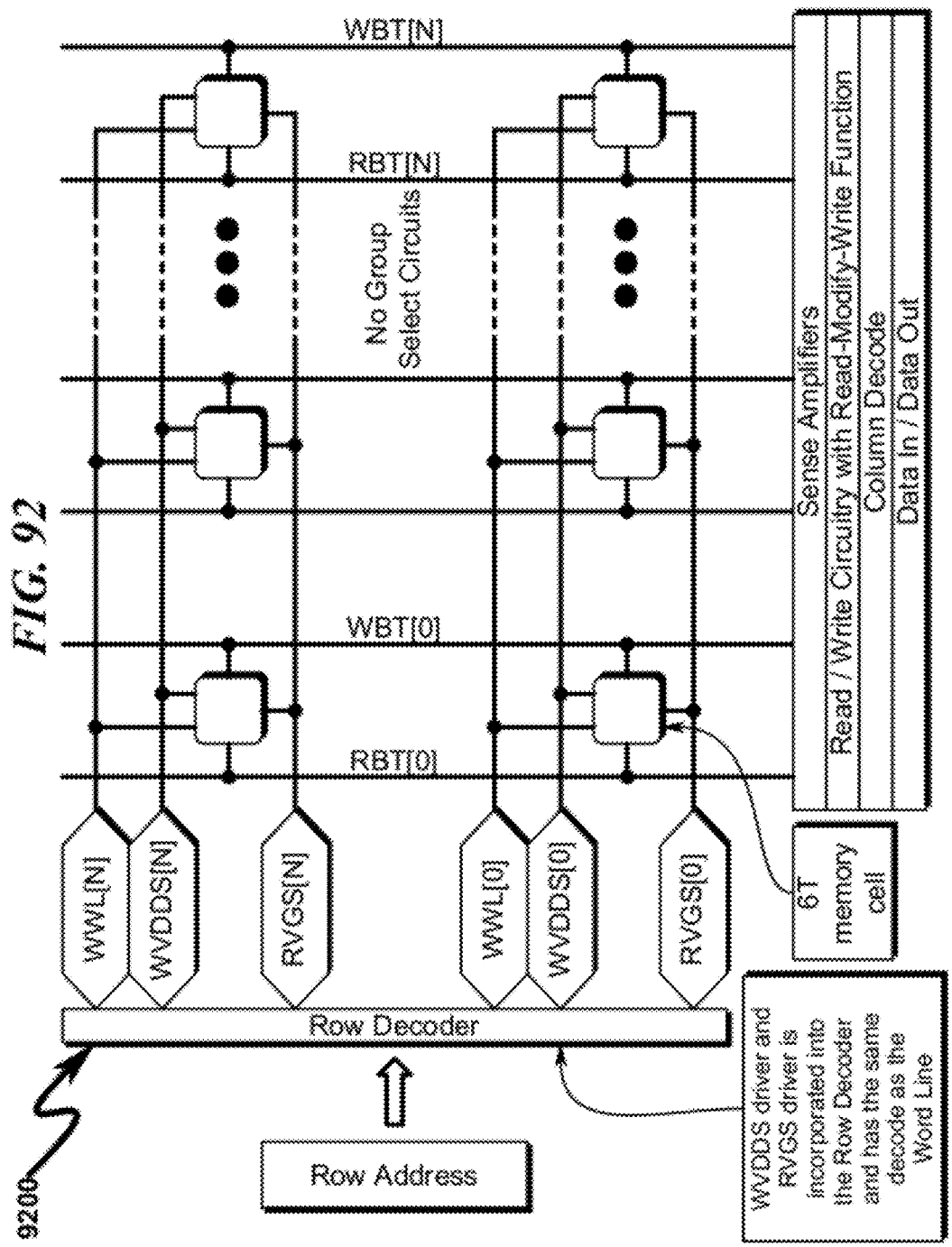
FIG. 92 illustrates block diagram of single array without group select circuit interspersed.

In this configuration, when a write cycle is initiated the Read Virtual Ground Select (RVGS) selected by the Row Decoder will go low allowing all of the memory cells along the row to convey their stored state to their respective Bit Line (RET) which must be sensed and stored before MULTI-WRITE begins. Then the Write Word Line can go high. The Column Decode will determine which memory cells should be written, with new data from Data In and which cells should be rewritten with the previously stored data. An exemplary read-modify-write cycle for a memory configured to have two (2) Bits Per Word (BPW) is generally illustrated in FIG. 92 (9200).

Exemplary 6T DFM Memory Cell (9300)

Figure 93:
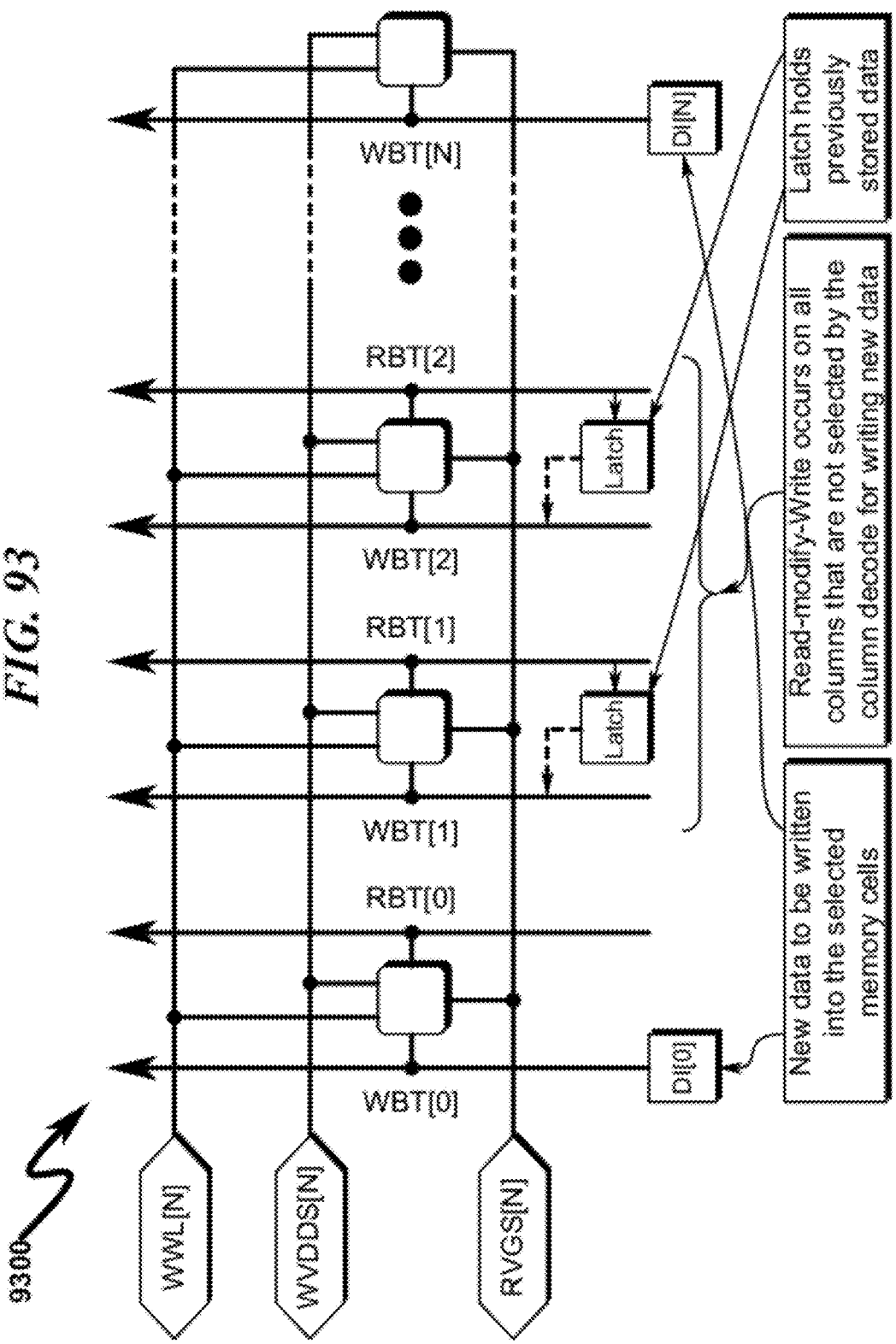
FIG. 93 illustrates example of read-modify-write for a two BPW configuration.

An exemplary Block Diagram for the Single Port 6T DFM memory cell is generally illustrated in FIG. 93 (9300).

Dual Port R/W Utilizing 6T Memory Cell

Overview

The present invention may also be advantageously applied to dual/multiport memory arrays. Within this context, a 6T Dual Port R/W SRAM can be created using only 6 transistors as compared to the conventional Dual Port SRAM that requires 8 transistors. This allows for the size of the new proposed 6T R/W Dual Port to be 25% smaller than the prior art. Since this embodiment separates the read cycle from the write cycle of the memory cell, it intrinsically creates a write port and a read port that can be addressed by separate addresses: one set of addresses can come from the read port and the other set of addresses can come from the write port. Just like the Dual Port SRAM, this allows independent access to reading one cell while at the same time writing a different memory cell from the other port. All of the invention embodiments describe herein may be applied to the Dual Port SRAM configuration as well.

8T Prior Art Dual Port Memory Cell Array Schematic (9400)

Figure 94:
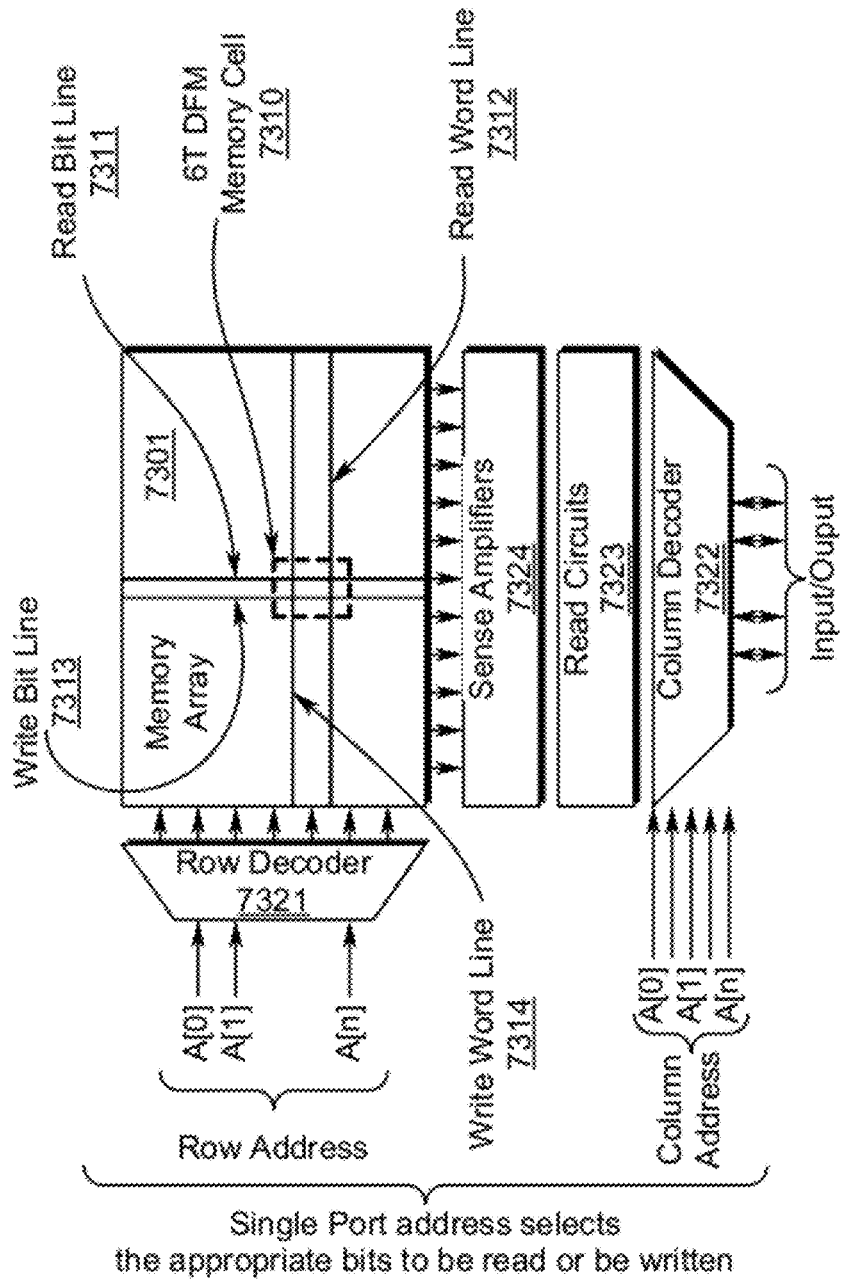
FIG. 94 illustrates block diagram of a 6T DFM single port SRAM.

The schematic for the conventional 8T Dual Port is illustrated in FIG. 94 (9400). Note that each memory cell has independent Word Lines (WLA, WLB) to access the cell as well as four Bit Lines (BTA,BCA,BTB,BCB) that are used to individually address the Pass Gates within each side of the feedthru/feedback amplifiers. The replication of Bit Lines within this configuration results in a significant dynamic power loss during operation that has not been addressed by the prior art.

6T Dual Port Memory Cell Array Schematic (9500)

Figure 95:
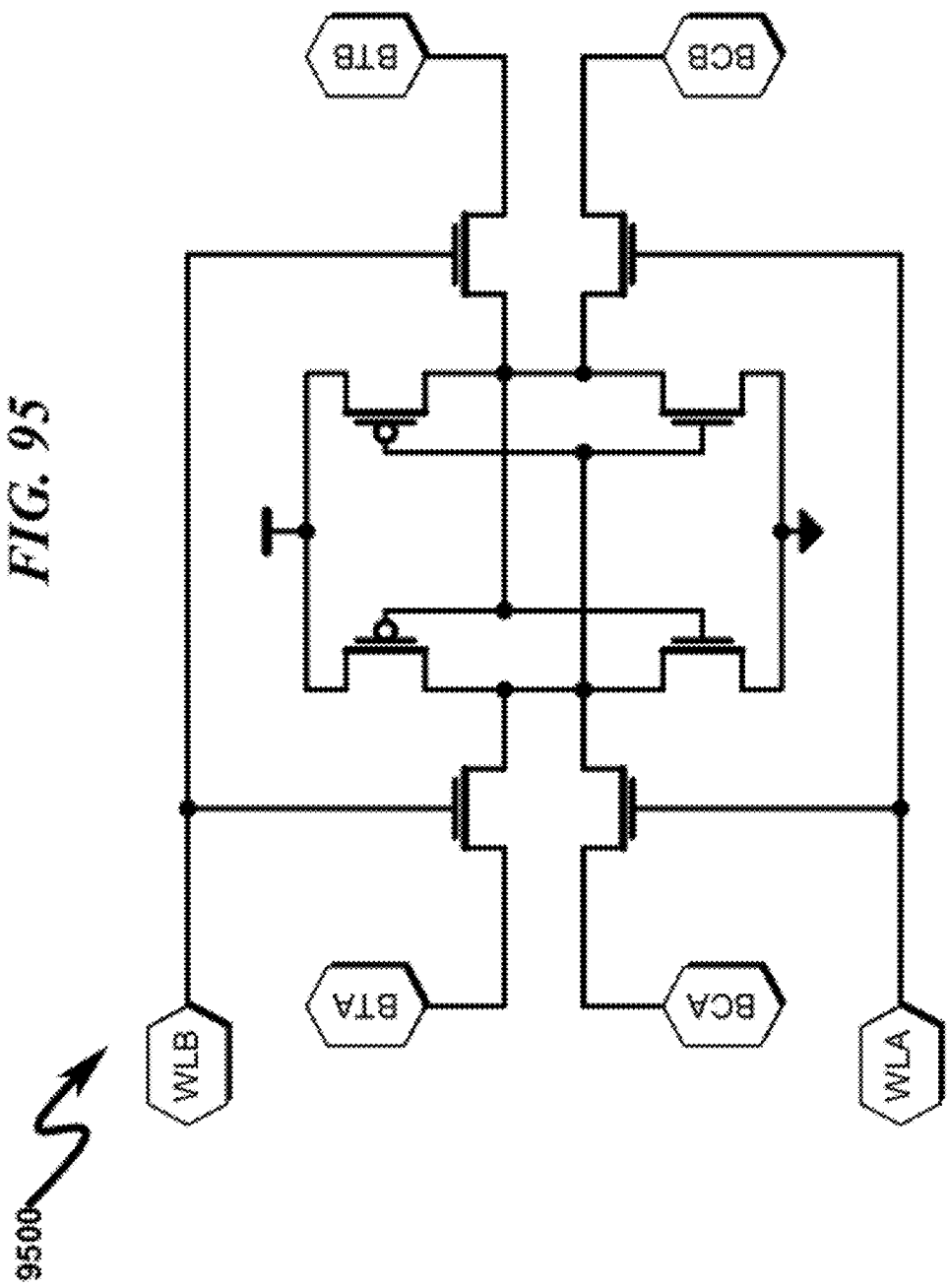
FIG. 95 illustrates conventional 8T dual port memory cell.
Figure 96:
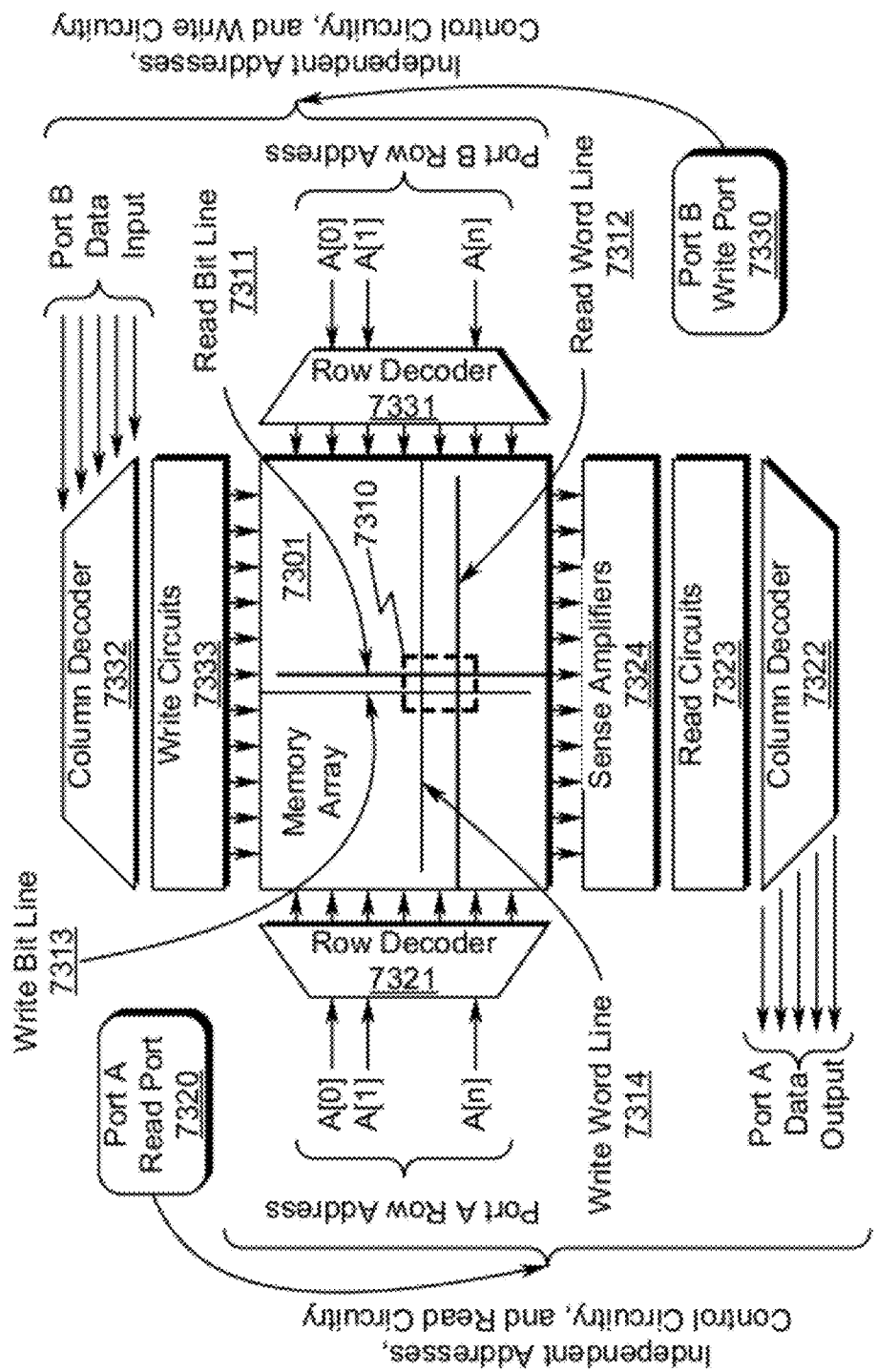
FIG. 96 illustrates block diagram of dual port SRAM utilizing same 6T DFM memory cell.

A block diagram of a preferred embodiment of present invention implementing a Dual Port memory array utilizing the 6T DFM memory cell is illustrated in FIG. 95 (9500). Note in this configuration each memory cell (9510) within the memory array (9501) has an independent read port (9520) and write port (9530) with associated. Bit Lines (9511, 9513) and Word Lines (9512, 9514). This configuration reduces the number of Bit Lines associated with the memory array (9501) by a factor of two, thus significantly reducing the dynamic power consumed by the memory system.

Secure Memory Arrays

The present invention permits a secure memory array to be fabricated that has the capability of a SCRAM-WRITE function such that under certain condition the memory array can be mass-written to a predetermined value. This capability is enabled by utilizing the feedback amplifier control input to force write entire rows of the array simultaneously to a known state. This capability may have application in creating secure memories that are wiped clean upon the detection of a specified event.

4T Memory Cell System Summary

The present invention 4T memory cell system anticipates a wide variety of variations in the basic theme of construction, but can be generalized as a memory cell system comprising:
(a) feedthru amplifier comprising an input port and an output port;
(b) feedback amplifier comprising an input port, an output port, and a control port; and
wherein
the input port of the feedthru amplifier is electrically connected to the output port of the feedback amplifier;
the output port of the feedthru amplifier is electrically connected to the input port of the feedback amplifier;
the control port of the feedback amplifier modulates the drive strength of the output port of the feedback amplifier permitting the output port of the feedthru amplifier to be written to a logic state that is the complement of the control port state.

This general system summary may be augmented by the various elements described herein to produce a wide variety of invention embodiments consistent with this overall design description.

5T Memory Cell System Summary

The present invention 5T memory cell system anticipates a wide variety of variations in the basic theme of construction, but can be generalized as a memory cell system comprising:
(a) feedthru amplifier comprising an input port and an output port;
(b) feedback amplifier comprising an input port, an output port, and a control port; and
(c) access device comprising an input port, an output port, and an enable port;
wherein
the input port of the feedthru amplifier is electrically connected to the output port of the feedback amplifier;
the output port of the feedthru amplifier is electrically connected to the input port of the feedback amplifier;
the control port of the feedback amplifier modulates the drive strength of the output port of the feedback amplifier;
the output port of the access device is electrically connected to the output port of the feedthru amplifier and the input port of the feedback amplifier;
the access device electrically connects the input port of the access device and the output port of the access device in response to the state of the enable port of the access device; and the access device input port permits read access to the state of the feedthru amplifier output port in response to the state of the access device enable port.

This general system summary may be augmented by the various elements described herein to produce a wide variety of invention embodiments consistent with this overall design description.

Method Summary

The present invention, memory cell, write method anticipates a wide variety of variations in the basic theme of implementation, but can be generalized as a memory cell method, the method operating in conjunction, with a memory cell system comprising:
(a) feedthru amplifier comprising an input port and an output port;
(b) feedback amplifier comprising an input port, an output port, and a control port;
(c) access device comprising an input port, an output port, and an enable port;
wherein
the input port of the feedthru amplifier is electrically connected to the output port of the feedback amplifier;
the output port of the feedthru amplifier is electrically connected to the input port of the feedback amplifier;
the control port of the feedback amplifier modulates the drive strength of the output port of the feedback amplifier;
the output port of the access device is electrically connected to the output port of the feedthru amplifier and the input port of the feedback amplifier;
the access device electrically connects the input port of the access device and the output port of the access device in response to the state of the enable port of the access device; and
the access device input port permits read access to the state of the feedthru amplifier output port in response to the state of the access device enable port;
wherein the method comprises storing data in the memory cell system via the steps of:
(1) writing a specified preset logic value into a subset of a memory cell group by modulating the logic level of the control port of respective feedback amplifiers replicated within the memory cell group;
(2) asserting the complement of the logic value on the bit line electrically connected to the input port of the access device to write the complement logic value to memory cells not within the memory cell group subset.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

Alternate Method Summary

The present invention alternative memory cell write method can be generalized as memory cell method, the method operating in conjunction with a memory cell system comprising:
(a) feedthru amplifier comprising an input port and an output port;
(b) feedback amplifier comprising an input port, an output port, and a control port; and
(c) access device comprising an input port, an output port, and an enable port;
wherein
input port of the feedthru amplifier is electrically connected to the output port of the feedback amplifier;
the output port of the feedthru amplifier is electrically connected to the input port of the feedback amplifier;
the control port of the feedback amplifier modulates the drive strength of the output port of the feedback amplifier;
the output port of the access device is electrically connected to the output port of the feedthru amplifier and the input port of the feedback amplifier;
the access device electrically connects the input port of the access device and the output port of the access device in response to the state of the enable port of the access device; and
the access device input port permits read access to the state of the feedthru amplifier output port in response to the state of the access device enable port;
wherein the method comprises storing data in the memory cell system via the steps of:
(1) reversing the drive strength of the feedback amplifier via the control port of the feedback amplifier to change the state of the memory cell system;
(2) activating the enable port of the access device;
(3) presenting write data at the input port of the access device;
(4) deactivating the enable port of the access device; and
(5) normalizing the drive strength of the feedback amplifier via the control port of the feedback amplifier.

This general method may be modified heavily depending on a number of factors, with rearrangement and/or addition/deletion of steps anticipated by the scope of the present invention. Integration of this and other preferred exemplary embodiment methods in conjunction with a variety of preferred exemplary embodiment systems described herein is anticipated by the overall scope of the present invention.

System/Method Variations

The present invention anticipates a wide variety of variations in the basic theme of construction. The examples presented previously do not represent the entire scope of possible usages. They are meant to cite a few of the almost limitless possibilities.

This basic system and method may be augmented with a variety of ancillary embodiments, including but not limited to:
An embodiment wherein the feedthru amplifier and the feedback amplifier are non-inverting amplifiers.
An embodiment wherein the feedthru amplifier and the feedback amplifier are inverting amplifiers.
An embodiment wherein the feedthru amplifier is an inverting CMOS amplifier.
An embodiment wherein the feedback amplifier is an inverting CMOS amplifier.
An embodiment wherein said feedthru amplifier and said feedback amplifier are inverting CMOS amplifiers.
An embodiment wherein the feedthru amplifier is an inverting NMOS amplifier.
An embodiment wherein the feedback amplifier is an inverting NMOS amplifier.
An embodiment wherein said control input port of said feedback amplifier actively drives the P-channel source connection within said feedback amplifier to the VSS of said feedback amplifier during a data write to said memory cell.

An embodiment wherein said control input port of said feedback amplifier actively drives the N-channel source connection within said feedback amplifier to the VDD of said feedback amplifier during a data write to said memory cell.

An embodiment wherein the control input port of the feedback amplifier disconnects the power/ground connections of the output port of the feedback amplifier during a data write to the input port of the feedthru amplifier.

An embodiment wherein the control input port of the feedback amplifier reduces the current sinking drive strength of the output port of the feedback amplifier during a lonic one data write to the input port of the feedthru amplifier.

An embodiment wherein the control input port of the feedback amplifier reduces the current sinking drive strength of the output port of the feedback amplifier during a logic one data write to the input port of the feedthru amplifier by reducing the available power supply sinking current to the feedback amplifier.

An embodiment wherein the control input port of the feedback amplifier reduces the current sinking drive strength of the output port of the feedback amplifier during a logic one data write to the input port of the feedthru amplifier by disconnecting the power supply ground reference to the feedback amplifier.

An embodiment wherein the control input port of the feedback amplifier reduces the current sourcing drive strength of the output port of the feedback amplifier during a logic zero data write to the input port of the feedthru amplifier.

An embodiment wherein the control input port of the feedback amplifier reduces the current sourcing drive strength of the output port of the feedback amplifier during a logic zero data write to the input port of the feedthru amplifier by reducing the available power supply sourcing current to the feedback amplifier.

An embodiment wherein the control input port of the feedback amplifier reduces the current sourcing drive strength of the output port of the feedback amplifier during a logic zero data write to the input port of the feedthru amplifier by disconnecting the power supply positive supply reference to the feedback amplifier.

An embodiment wherein said feedthru amplifier, said feedback amplifier, and said access device are configured as a 3T memory cell.

An embodiment wherein the feedthru amplifier, the feedback amplifier, and the access device comprise a 4T memory cell further comprising a secondary access device comprising an input port, an output port, and an enable port, the output port of the secondary access device being electrically connected to the output port of the feedthru amplifier and the input port of the feedback amplifier.

An embodiment wherein said feedthru amplifier, said feedback amplifier, and said access device are configured as a 5T memory cell.

An embodiment wherein said feedthru amplifier, said feedback amplifier, and said access device are configured as a 6T memory cell further comprising a secondary access device comprising an input port, an output port, and an enable port, said output port of said secondary access device being electrically connected to said output port of said feedthru amplifier and said input port of said feedback amplifier.

An embodiment wherein said feedthru amplifier, said feedback amplifier, and said access device are configured as a 6T dual port memory cell.

An embodiment wherein the feedthru amplifier, the feedback amplifier, and the access device comprise an 8T dual port memory cell further comprising a secondary access device comprising an input port, an output port, and an enable port, the output port of the secondary access device being electrically connected to the output port of the feedthru amplifier and the input port of the feedback amplifier.

An embodiment wherein the control port of the feedback amplifier reduces the drive strength of the output port of the feedback amplifier during a data write to the input port of the feedthru amplifier.

An embodiment wherein the control port of the feedback amplifier increases the drive strength of the output port of the feedback amplifier during a data non-write to the input port of the feedthru amplifier.

An embodiment wherein the control port of the feedback amplifier is electrically reversed during write cycles to the memory cell through the access device.

An embodiment wherein the access device input port permits write access to the state of the feedthru amplifier output port in response to the state of the access device enable port.

An embodiment wherein the input port of the access device is connected to a memory array bit line, the memory array bit line electrically compared to a reference voltage obtained from the pre-charge value associated with a dummy duplicate of the memory array bit line.

An embodiment wherein said memory cell is written using a TWO-STEP procedure with STEP 1 of the procedure writing a specified logic level to said memory cell using said control port of said feedback amplifier, and STEP 2 optionally writing the complement of said specified logic level to said memory cell via said access device input port using said access device enable port.

One skilled in the art will recognize that other embodiments are possible based on combinations of elements taught within the above invention description.

Generalized Computer Memory Array

As generally illustrated herein, the system/method embodiments of the present invention may be utilized to implement computer memory array structures of indeterminate size and capacity. Specifically anticipated within this application are 5T and 3T memory cell arrays and 6T and 4T memory cell arrays that utilize the present invention teachings with respect to the modulated feedback amplifier drive capabilities to enable shrinking of the effective area of the memory cell array as compared to the prior art 6T/4T memory cell array structures.

Advantages/Comparisons to the Prior Art

The present invention has significant advantages over prior art memory cell designs. Depending on the particular embodiment, some of these advantages and comparisons may include The present invention utilizes row-directed feedback amplifier drive strength modulation of the memory latch as compared to column-directed feedback amplifier drive drive strength modulation of the memory latch as taught by the prior art. This reduces READ DISTURB issues present with prior art memory arrays that utilize column-directed feedback amplifier drive strength modulation.

Prior art techniques that have depicted row-directed feedback amplifier drive strength modulation generates a clamping condition that can occur through all of the parallel paths of the pass gates. This prior art approach, also adjusts power on the ground side of the latch and counts on it to be floating to help the pass gate write the state instead of actually driving it to write the opposite voltage. This prior art methodology has the additional problem of having the ground power switch to the latch on the same side of the pass gate which makes it more susceptible to READ DISTURB. This drawback is mentioned as an issue in the prior art.

In contrast to the prior art, the present invention utilizes a memory cell writing methodology that allows for a group of memory cells to share the switched power and not have a clamping problem.

The present invention in many preferred embodiments forcibly switches the VDD/VCC supply to the feedback inverter from a positive supply to VSS/GND to force a state transition in the feedthru amplifier the feedback amplifier. This scenario is also taught in the reverse where the VSS/GND supply to the feedback inverter is forced to VDD/VCC supply levels to force a state transition in the feedthru amplifier by the feedback amplifier. These scenarios both permit the memory cell latch state to be transitioned without the need of a pass gate device.

The addition of a pass gate to the 4T memory cell configuration of the present invention also allows reading of the memory cell without conventional READ DISTURB memory cell state transition errors.

Prior art approaches that adjust the power in the column direction incur a risk of disturbing all of the cells along the column and causing them to lose data during a read or write operation. This behavior gets worse as transistor variations increase at smaller device geometries.

In contrast to the present invention, the prior art does not switch the power/ground connections in the memory latch to actually write a state into the memory cell. Instead, the prior art still relies on the pass gate to perform the read/write operation, leaving the memory cell susceptible to READ DISTURB.

One stilled in the art will no doubt find other advantages to the present invention as compared to the prior art. The above list is only exemplary of some known advantages and comparisons between the prior art and some preferred embodiments of the present invention.

CONCLUSION

A memory cell system/method incorporating reduced transistor counts and/or improved design-for-manufacturability (DFM) has been disclosed. The system/method incorporates cross-coupled feedthru (3410)/feedback (3420) amplifiers to implement memory cell state memory, wherein the feedback amplifier incorporates a multi-state output drive capability (3423) allowing the memory cell to be read/written using only one access device (3430) connected to the output (3412) of the feedthru (3410) amplifier. The multi-state output drive capability (3423) modulates the feedback amplifier (3420) drive strength to enable reading/writing of the feedthru amplifier (3410) state with greatly reduced memory cell input fan-in requirements. The invention anticipates replacement or traditional DP/8T/6T/4T memory cell structures with corresponding 6T/6T/5T/3T memory cell configurations, resulting in a 16%-25% transistor reduction depending on memory array application context.

What is claimed is:

1. A memory cell system comprising:
(a) feedthru amplifier comprising an input port and an output port;
(b) feedback amplifier comprising an input port, an output port, and a control port; and
(c) access device comprising an input port, an output port, and an enable port;
wherein
said input port of said feedthru amplifier is electrically connected to said output port of said feedback amplifier;
said output port of said feedthru amplifier is electrically connected to said input port of said feedback amplifier;
said control port of said feedback amplifier modulates the drive strength of said output port of said feedback amplifier;
said output port of said access device is electrically connected to said output port of said feedthru amplifier and said input port of said feedback amplifier;
said access device electrically connects said input port of said access device and said output port of said access device in response to the state of said enable port of said access device; and
said access device input port permits read access to the state of said feedthru amplifier output port in response to the state of said access device enable port.

2. The memory cell system of claim 1 wherein said feedthru amplifier and said feedback amplifier are inverting CMOS amplifiers.

3. The memory cell system of claim 1 wherein said control input port of said feedback amplifier actively drives the P-channel source connection within said feedback amplifier to the VSS of said feedback amplifier during a data write to said memory cell.

4. The memory cell system of claim 1 wherein said control input port of said feedback amplifier actively drives the N-channel source connection within said feedback amplifier to the VDD of said feedback amplifier during a data write to said memory cell.

5. The memory cell system of claim 1 wherein said feedthru amplifier, said feedback amplifier, and said access device are configured as a 3T memory cell.

6. The memory cell system of claim 1 wherein said feedthru amplifier, said feedback amplifier, and said access device are configured as a 5T memory cell.

7. The memory cell system of claim 1 wherein said feedthru amplifier, said feedback amplifier, and said access device are configured as a 6T memory cell further comprising a secondary access device comprising an input port, an output port, and an enable port, said output port of said secondary access device being electrically connected to said output port of said feedthru amplifier and said input port of said feedback amplifier.

8. The memory cell system of claim 1 wherein said feedthru amplifier, said feedback amplifier, and said access device are configured as a 6T dual port memory cell.

9. The memory cell system of claim 1 wherein said memory cell is written using a TWO-STEP procedure with STEP 1 of the procedure writing a specified logic level to said memory cell using said control port of said feedback amplifier, and STEP 2 optionally writing the complement of said specified logic level to said memory cell via said access device input port using said access device enable port.

10. A memory cell method, said method operating in conjunction with a memory cell system, said system comprising:
    (a) feedthru amplifier comprising an input port and an output port;
    (b) feedback amplifier comprising an input port, an output port, and a control port; and
    (c) access device comprising an input port, an output port, and an enable port;
    wherein
    said input port of said feedthru amplifier is electrically connected to said output port of said feedback amplifier;
    said output port of said feedthru amplifier is electrically connected to said input port of said feedback amplifier;
    said control port of said feedback amplifier modulates the drive strength of said output port of said feedback amplifier;
    said output port of said access device is electrically connected to said output port of said feedthru amplifier and said input port of said feedback amplifier;
    said access device electrically connects said input port of said access device and said output port of said access device in response to the state of said enable port of said access device; and
    said access device input port permits read access to the state of said feedthru amplifier output port in response to the state of said access device enable port;
    wherein said method comprises storing data in said memory cell system via the steps of:
    (1) writing a specified preset logic value into a subset of a memory cell group by modulating the logic level of the control port of respective feedback amplifiers replicated within said memory cell group;
    (2) asserting the complement of said logic value on the bit line electrically connected to said input port of said access device to write the complement logic value to memory cells not within said memory cell group subset.

11. The memory cell method of claim 10 wherein said feedthru amplifier and said feedback amplifier are inverting CMOS amplifiers.

12. The memory cell method of claim 10 wherein said control input port of said feedback amplifier actively drives the P-channel source connection within said feedback amplifier to the VSS of said feedback amplifier during a data write to said memory cell.

13. The memory cell method of claim 10 wherein said control input port of said feedback amplifier actively drives the N-channel source connection within said feedback amplifier to the VDD of said feedback amplifier during a data write to said memory cell.

14. The memory cell method of claim 10 wherein said feedthru amplifier, said feedback amplifier, and said access device are configured as a 3T memory cell.

15. The memory cell method of claim 10 wherein said feedthru amplifier, said feedback amplifier, and said access device are configured as a 5T memory cell.

16. The memory cell method of claim 10 wherein said feedthru amplifier, said feedback amplifier, and said access device are configured as a 6T memory cell further comprising a secondary access device comprising an input port, an output port, and an enable port, said output port of said secondary access device being electrically connected to said output port of said feedthru amplifier and said input port of said feedback amplifier.

17. The memory cell method of claim 10 wherein said feedthru amplifier, said feedback amplifier, and said access device are configured as a 6T dual port memory cell.

18. A memory array system constructed of memory cells, said memory cells comprising:
    (a) feedthru amplifier comprising an input port and an output port;
    (b) feedback amplifier comprising an input port, an output port, and a control port; and
    (c) access device comprising an input port, an output port, and an enable port;
    wherein
    said input port of said feedthru amplifier is electrically connected to said output port of said feedback amplifier;
    said output port of said feedthru amplifier is electrically connected to said input port of said feedback amplifier;
    said control port of said feedback amplifier modulates the drive strength of said output port of said feedback amplifier;
    said output port of said access device is electrically connected to said output port of said feedthru amplifier and said input port of said feedback amplifier;
    said access device electrically connects said input port of said access device and said output port of said access device in response to the state of said enable port of said access device; and
    said access device input port permits read access to the state of said feedthru amplifier output port in response to the state of said access device enable port;
    said memory cells are arrayed in rows and columns;
    said memory cells are written by row selection of said control port of said feedback amplifier;
    said memory cells are read by row selection of said enable port of said access device and by column selection of said input port of said access device.

19. The memory array system of claim 18 wherein said feedthru amplifier and said feedback amplifier are inverting CMOS amplifiers.

20. The memory array system of claim 18 wherein said control input port of said feedback amplifier actively drives the P-channel source connection within said feedback amplifier to the VSS of said feedback amplifier during a data write to said memory cell.

21. The memory array system of claim 18 wherein said control input port of said feedback amplifier actively drives the N-channel source connection within said feedback amplifier to the VDD of said feedback amplifier during a data write to said memory cell.

22. The memory array system of claim 18 wherein said feedthru amplifier, said feedback amplifier, and said access device are configured as a 3T memory cell.

23. The memory array system of claim 18 wherein said feedthru amplifier, said feedback amplifier, and said access device are configured as a 5T memory cell.

24. The memory array system of claim 18 wherein said feedthru amplifier, said feedback amplifier, and said access device are configured as a 6T memory cell further comprising a secondary access device comprising an input port, an output port, and an enable port, said output port of said secondary access device being electrically connected to said output port of said feedthru amplifier and said input port of said feedback amplifier.

25. The memory array system of claim 18 wherein said feedthru amplifier, said feedback amplifier, and said access device are configured as a 6T dual port memory cell.

26. The memory array system of claim 18 wherein said memory cell is written using a TWO-STEP procedure with STEP 1 of the procedure writing a specified logic level to said memory cell using said control port of said feedback amplifier, and STEP 2 optionally writing the complement of said specified logic level to said memory cell via said access device input port using said access device enable port.

* * * * *